United States Patent
Nogoshi

(10) Patent No.: US 12,117,729 B2
(45) Date of Patent: Oct. 15, 2024

(54) ON-PRESS DEVELOPMENT TYPE LITHOGRAPHIC PRINTING PLATE PRECURSOR, METHOD FOR PREPARING LITHOGRAPHIC PRINTING PLATE, AND LITHOGRAPHIC PRINTING METHOD

(71) Applicant: FUJIFILM Corporation, Tokyo (JP)

(72) Inventor: Keisuke Nogoshi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/558,779

(22) Filed: Dec. 22, 2021

(65) Prior Publication Data

US 2022/0113629 A1 Apr. 14, 2022

Related U.S. Application Data

(63) Continuation of application No. PCT/JP2020/025418, filed on Jun. 26, 2020.

(30) Foreign Application Priority Data

Jun. 28, 2019 (JP) .................................. 2019-122493
Aug. 30, 2019 (JP) .................................. 2019-158808
Sep. 18, 2019 (JP) .................................. 2019-169800

(51) Int. Cl.
*G03F 7/20* (2006.01)
*G03F 7/004* (2006.01)

(52) U.S. Cl.
CPC ............ *G03F 7/2014* (2013.01); *G03F 7/004* (2013.01)

(58) Field of Classification Search
CPC ....................................................... G03F 7/20
See application file for complete search history.

(56) References Cited

U.S. PATENT DOCUMENTS 6,085,656 A 7/2000 Lewis
2006/0024612 A1* 2/2006 Oshima ................. B41C 1/1008
430/270.1

(Continued)

FOREIGN PATENT DOCUMENTS

CN 1243073 A 2/2000
EP 2 549 331 A1 1/2013

(Continued)

OTHER PUBLICATIONS

Extended European Search Report dated Jul. 15, 2022 from the European Patent Office in EP Application No. 20832892.2.

(Continued)

*Primary Examiner* — Chanceity N Robinson
(74) *Attorney, Agent, or Firm* — Sughrue Mion, PLLC

(57) ABSTRACT

An on-press development type lithographic printing plate precursor has an aluminum support and an image-recording layer on the aluminum support, in which the image-recording layer contains an infrared-absorbing polymethine colorant having HOMO of −5.2 eV or less, a polymerization initiator, and a polymerizable compound having 7 or more polymerizable functional groups and contains or does not contain a polymer having a molecular weight 10,000 or more. In a case where the image-recording layer contains the polymer having a molecular weight of 10,000 or more, a ratio Wp/Wm of a content Wp of the polymer having a molecular weight of 10,000 or more to a content Wm of the polymerizable compound having 7 or more polymerizable functional groups is 1.00 or less.

20 Claims, 3 Drawing Sheets

(56) References Cited

U.S. PATENT DOCUMENTS

| | | |
|---|---|---|
| 2012/0152139 A1 | 6/2012 | Savariar-Hauck et al. |
| 2014/0224140 A1 | 8/2014 | Fujiki et al. |
| 2015/0198884 A1 | 7/2015 | Kamiya et al. |
| 2017/0123315 A1 | 5/2017 | Mizuno et al. |
| 2017/0217149 A1 | 8/2017 | Hayashi et al. |
| 2018/0207925 A1 | 7/2018 | Desmet |
| 2018/0326714 A1 | 11/2018 | Hayashi et al. |
| 2019/0217651 A1* | 7/2019 | Ikeyama ............... G03F 7/033 |
| 2019/0232703 A1 | 8/2019 | Kudo |
| 2019/0369495 A1 | 12/2019 | Ishiji et al. |
| 2020/0041899 A1 | 2/2020 | Ishiji et al. |
| 2020/0094542 A1 | 3/2020 | Hirano et al. |
| 2020/0110336 A1 | 4/2020 | Nozaki et al. |
| 2020/0147951 A1 | 5/2020 | Enomoto |
| 2020/0180299 A1 | 6/2020 | Araki et al. |
| 2023/0039348 A1* | 2/2023 | Sakaguchi ........... B41C 1/1016 |

FOREIGN PATENT DOCUMENTS

| | | | | |
|---|---|---|---|---|
| EP | 2 690 495 A1 | 1/2014 | | |
| EP | 3 409 499 A1 | 12/2018 | | |
| EP | 3 456 547 A1 | 3/2019 | | |
| EP | 3511174 A1 * | 7/2019 | ........... | B41C 1/1016 |
| EP | 3 991 985 A1 | 5/2022 | | |
| JP | 63-202497 A | 8/1988 | | |
| JP | 2000171974 A * | 6/2000 | | |
| JP | 2006-205394 A | 8/2006 | | |
| JP | 2013-504084 A | 2/2013 | | |
| JP | 2013-078851 A | 5/2013 | | |
| JP | 2014-079960 A | 5/2014 | | |
| JP | 6461447 B1 | 1/2019 | | |
| JP | 2019-504780 A | 2/2019 | | |
| JP | 2019-064269 A | 4/2019 | | |
| WO | 2016/027886 A1 | 2/2016 | | |
| WO | 2018/159640 A1 | 9/2018 | | |
| WO | 2018/221133 A1 | 12/2018 | | |
| WO | 2018/230412 A1 | 12/2018 | | |
| WO | 2019/021828 A1 | 1/2019 | | |
| WO | WO-2019013268 A1 * | 1/2019 | ........... | B41C 1/1008 |
| WO | WO-2019044566 A1 * | 3/2019 | ........... | B41C 1/1008 |

OTHER PUBLICATIONS

Office Action dated Oct. 28, 2022 issued by the Chinese Patent Office in Chinese Application No. 202080046510.6.
Office Action issued Mar. 7, 2023 in Japanese Application No. 2021-528303.
Office Action dated Aug. 30, 2022 issued in Japanese Application No. 2021-528303.
International Search Report dated Sep. 24, 2020 from the International Searching Authority in International Application No. PCT/JP2020/025418.
Written Opinion dated Sep. 24, 2020 from the International Searching Authority in International Application No. PCT/JP2020/025418.
International Preliminary Report on Patentability with the translation of Written Opinion dated Dec. 28, 2021 from the International Bureau in International Application No. PCT/JP2020/025418.
Chinese Office Action dated May 7, 2023 in Chinese Application No. 202080046510.6.
Communication issued Dec. 1, 2023 in European Application No. 20 832 892.2.

* cited by examiner

ON-PRESS DEVELOPMENT TYPE LITHOGRAPHIC PRINTING PLATE PRECURSOR, METHOD FOR PREPARING LITHOGRAPHIC PRINTING PLATE, AND LITHOGRAPHIC PRINTING METHOD

CROSS-REFERENCE TO RELATED APPLICATIONS

This application is a continuation application of International Application No. PCT/JP2020/025418, filed Jun. 26, 2020, the disclosure of which is incorporated herein by reference in its entirety. Further, this application claims priority from Japanese Patent Application No. 2019-122493, filed Jun. 28, 2019, Japanese Patent Application No. 2019-158808, filed Aug. 30, 2019, and Japanese Patent Application No. 2019-169800, filed Sep. 18, 2019, these disclosures of which are incorporated herein by reference in their entirety.

BACKGROUND OF THE INVENTION

1. Field of the Invention

The present disclosure relates to an on-press development type lithographic printing plate precursor, a method for preparing a lithographic printing plate, and a lithographic printing method.

2. Description of the Related Art

Generally, a lithographic printing plate consists of a lipophilic image area that receives ink in a printing process and a hydrophilic non-image area that receives dampening water. Lithographic printing is a method exploiting the mutual repulsion of water and oil-based ink, in which the lipophilic image area and the hydrophilic non-image area of a lithographic printing plate are used as an ink-receiving portion and a dampening water-receiving portion (that is, non-ink-receiving portion) respectively, the adhesiveness of ink is varied within the surface of the lithographic printing plate so that only the image area receives the ink, and then printing is performed by the transfer of the ink to a printing substrate such as paper.

In the related art, in order to prepare this lithographic printing plate, a lithographic printing plate precursor (also called PS plate) has been widely used which is obtained by providing a lipophilic photosensitive resin layer (also called image-recording layer) on a hydrophilic support. Generally, a lithographic printing plate is obtained by a plate making method of exposing a lithographic printing plate precursor through an original picture such as a lith film, then keeping a portion of an image-recording layer that will be an image area while removing other unnecessary portions of the image-recording layer by dissolving such portions in an alkaline developer or an organic solvent, and forming a non-image area by exposing the hydrophilic surface of a support.

In response to the intensifying interest in the global environment, an environmental issue of waste liquid generated by wet treatments such as a development treatment has gathered more attention.

Regarding the environmental issue described above, an attempt is made to simplify development or plate making or to remove treatments. As one of simple preparation methods, a method called "on-press development" is being carried out. That is, in this method, after being exposed, a lithographic printing plate precursor is immediately mounted on a printer without being developed as in the related art, and an unnecessary portion of the image-recording layer is removed at an early stage of the ordinary printing step.

Examples of the printing method using a lithographic printing plate and lithographic printing plate precursor in the related art include those described in JP2013-078851A and JP2019-504780A.

JP2013-078851A discloses a printing method using a lithographic printing plate precursor having an image-recording layer on an aluminum support, in which the image-recording layer is developed by the supply of at least any of a printing ink or dampening water, and the following steps (i) to (v) are performing in order of (i), (ii), (iii), (iv), and (v) or in order of (i), (iii), (ii), (iv), and (v) at the time of starting printing.

(i) Exposing a lithographic printing plate precursor in the shape of an image and then mounting the precursor on a plate cylinder of a printer.
(ii) Supplying at least any of dampening water or an organic solvent-containing aqueous solution on at least any of a dampening roller as a dampening water supply unit of the printer, a roller supplying water to the dampening roller, a roller for stabilizing amount of water, or a metering roller, by spray.
(iii) Rotating the water supply roller.
(iv) Bringing a lithographic printing plate precursor into contact with the dampening roller so that dampening water is supplied to the lithographic printing plate precursor from the dampening roller.
(v) Bringing the lithographic printing plate precursor into contact with an ink applicator roller so that a printing ink is supplied to the lithographic printing plate precursor from the ink applicator roller, and supplying printing paper simultaneously with or after the contact between the ink applicator roller and the lithographic printing plate precursor.

JP2019-504780A discloses an infrared-sensitive negative tone lithographic printing plate precursor having a substrate that has a hydrophilic surface and an infrared-sensitive image forming layer that is disposed on the hydrophilic surface of the substrate, in which the infrared-sensitive image forming layer contains an initiator composition and a main polymer binder, and the initiator composition contains one or more free radically polymerizable compounds, one or more infrared absorbers, a compound A represented by a specific structure (I), and one or more compounds represented by a specific structure (II) or structure (III) collectively as a compound B and produces free radicals by exposure of the infrared-sensitive image forming layer to infrared.

SUMMARY OF THE INVENTION

An object of an embodiment of the present invention is to provide an on-press development type lithographic printing plate precursor from which a lithographic printing plate having excellent printing durability is obtained even in a case where a UV ink is used and which exhibits excellent temporal stability under white light.

An object of another embodiment of the present invention is to provide a method for preparing a lithographic printing plate or a lithographic printing method using the on-press development type lithographic printing plate precursor.

Means for achieving the above objects include the following aspects.

<1> An on-press development type lithographic printing plate precursor having an aluminum support and an image-recording layer on the aluminum support, in which the image-recording layer contains an infrared-absorbing polymethine colorant having HOMO of −5.2 eV or less, a polymerization initiator, and a polymerizable compound having 7 or more functional groups and contains or does not contain a polymer having a molecular weight of 10,000 or more, and in a case where the image-recording layer contains the polymer having a molecular weight 10,000 or more, a ratio Wp/Wm of a content Wp of the polymer having a molecular weight 10,000 or more to a content Wm of the polymerizable compound having 7 or more functional groups is 1.00 or less.

<2> The on-press development type lithographic printing plate precursor described in <1>, in which a water contact angle on a surface of an outermost layer of the on-press development type lithographic printing plate precursor that is determined by an airborne water droplet method is 30° to 80°.

<3> The on-press development type lithographic printing plate precursor described in <1> or <2>, in which the number of functional groups in the polymerizable compound having 7 or more functional groups is 11 or more.

<4> The on-press development type lithographic printing plate precursor described in any one of <1> to <3>, in which the number of functional groups in the polymerizable compound having 7 or more functional groups is 15 or more.

<5> The on-press development type lithographic printing plate precursor described in any one of <1> to <4>, in which the polymerizable compound having 7 or more functional groups includes a compound having an ethylenically unsaturated bond valence of 5.0 mmol/g or more.

<6> The on-press development type lithographic printing plate precursor described in <5>, in which the compound having an ethylenically unsaturated bond valence of 5.0 mmol/g or more is a compound represented by Formula (I).

X—(Y)$_n$      Formula (I)

In Formula (I), X represents an n-valent organic group having a hydrogen bonding group, Y represents a monovalent group having 2 or more ethylenically unsaturated groups, n represents an integer of 2 or more, and molecular weight of X/(molecular weight of Y×n) is 1 or less.

<7> The on-press development type lithographic printing plate precursor described in <5> or <6>, in which the compound having an ethylenically unsaturated bond valence of 5.0 mmol/g or more has at least one kind of structure selected from the group consisting of an adduct structure, a biuret structure, and an isocyanurate structure.

<8> The on-press development type lithographic printing plate precursor described in any one of <1> to <7>, in which the image-recording layer further contains a compound having one or two ethylenically unsaturated groups.

<9> The on-press development type lithographic printing plate precursor described in any one of <1> to <8>, in which a water contact angle on a surface of the aluminum support on a side of the image-recording layer that is determined by an airborne water droplet method is 110° or less.

<10> The on-press development type lithographic printing plate precursor described in <9>, in which the water contact angle on the surface of the aluminum support on the side of the image-recording layer that is determined by the airborne water droplet method is 80° or less.

<11> The on-press development type lithographic printing plate precursor described in <10>, in which the water contact angle on the surface of the aluminum support on the side of the image-recording layer that is determined by the airborne water droplet method is 500 or less.

<12> The on-press development type lithographic printing plate precursor described in any one of <1> to <11>, in which a layer on the aluminum support contains a hydroxycarboxylic acid or a salt thereof.

<13> The on-press development type lithographic printing plate precursor described in <12>, in which the hydroxycarboxylic acid or a salt thereof includes a compound having two or more hydroxyl groups.

<14> The on-press development type lithographic printing plate precursor described in <12> or <13>, in which the hydroxycarboxylic acid or a salt thereof includes a compound having three or more hydroxyl groups.

<15> The on-press development type lithographic printing plate precursor described in any one of <1> to <14>, in which the polymer includes a polymer having a constitutional unit formed of an aromatic vinyl compound and a constitutional unit formed of an acrylonitrile compound.

<16> The on-press development type lithographic printing plate precursor described in any one of <1> to <15>, in which the infrared-absorbing polymethine colorant includes a cyanine dye having an electron-withdrawing group or a heavy atom-containing group in at least one of aromatic rings at both terminals.

<17> The on-press development type lithographic printing plate precursor described in any one of <1> to <16>, in which the image-recording layer contains an electron-accepting polymerization initiator, and LUMO of the electron-accepting polymerization initiator—LUMO of the infrared-absorbing polymethine colorant is 0.70 eV or less.

<18> The on-press development type lithographic printing plate precursor described in any one of <1> to <17>, in which the polymerization initiator includes an electron-accepting polymerization initiator, and the electron-accepting polymerization initiator includes a compound represented by Formula (II).

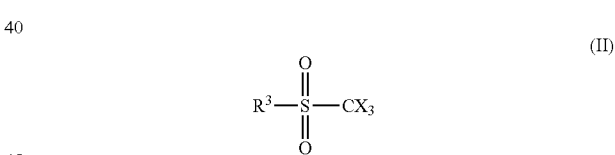

In Formula (II), X represents a halogen atom, and $R^3$ represents an aryl group.

<19> The on-press development type lithographic printing plate precursor described in any one of <1> to <18>, in which the image-recording layer contains an electron-donating polymerization initiator, and HOMO of the infrared-absorbing polymethine colorant— HOMO of the electron-donating polymerization initiator is 0.70 eV or less.

<20> The on-press development type lithographic printing plate precursor described in any one of <1> to <19>, in which the polymer includes polymer particles.

<21> The on-press development type lithographic printing plate precursor described in <20>, in which the polymer particles include polymer particles having a hydrophilic group.

<22> The on-press development type lithographic printing plate precursor described in <21>, in which the polymer particles have a group represented by Formula Z as the hydrophilic group.

\*-Q-W—Y      Formula Z

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, either W or Y has a hydrophilic structure, and * represents a binding site with other structures.

<23> The on-press development type lithographic printing plate precursor described in <21>, in which the polymer particles have a polyalkylene oxide structure as the hydrophilic group.

<24> The on-press development type lithographic printing plate precursor described in <23>, in which the polymer particles have a polypropylene oxide structure as the polyalkylene oxide structure.

<25> The on-press development type lithographic printing plate precursor described in <23> or <24>, in which the polymer particles have at least a polyethylene oxide structure and a polypropylene oxide structure as the polyalkylene oxide structure.

<26> The on-press development type lithographic printing plate precursor described in any one of <20> to <24>, in which the polymer particles include a resin having a structure obtained by reacting at least an isocyanate compound represented by Formula (Iso) and water.

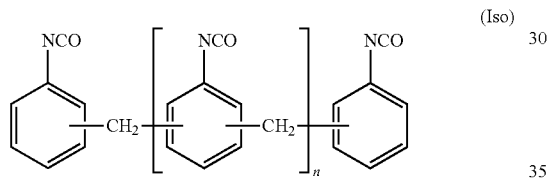

(Iso)

In Formula (Iso), n represents an integer of 0 to 10.

27> The on-press development type lithographic printing plate precursor described in <26>, in which the polymer particles include a resin having a structure obtained by reacting at least the isocyanate compound represented by Formula (Iso) and water and a polyethylene oxide structure and a polypropylene oxide structure as the polyalkylene oxide structure.

<28> The on-press development type lithographic printing plate precursor described in any one of <1> to <27>, in which the polymer includes polyvinyl acetal.

<29> The on-press development type lithographic printing plate precursor described in any one of <1> to <28>, in which the image-recording layer further contains a color developing agent.

<30> The on-press development type lithographic printing plate precursor described in <29>, in which the color developing agent is an acid color-developing agent.

<31> The on-press development type lithographic printing plate precursor described in <30>, in which the acid color-developing agent is a leuco colorant.

<32> The on-press development type lithographic printing plate precursor described in <31>, in which the leuco colorant is a leuco colorant having a phthalide structure or a fluoran structure.

<33> The on-press development type lithographic printing plate precursor described in <32>, in which the leuco colorant having a phthalide structure or a fluoran structure is a compound represented by any of Formula (Le-1) to Formula (Le-3).

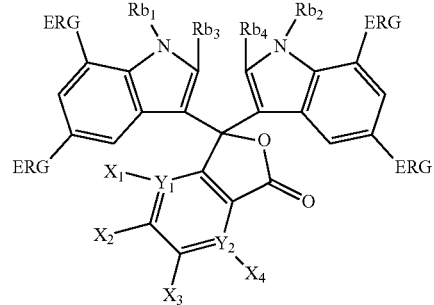

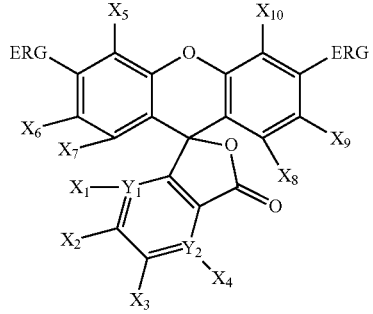

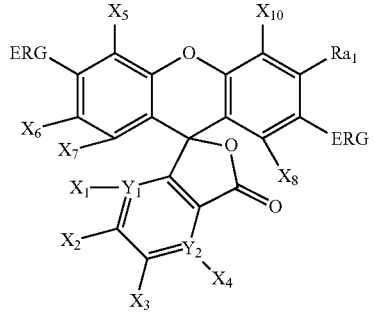

In Formula (Le-1) to Formula (Le-3), ERG each independently represents an electron donating group, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

<34> The on-press development type lithographic printing plate precursor described in <32> or <33>, in which the leuco colorant having a phthalide structure or a fluoran structure is a compound represented by any of Formula (Le-4) to Formula (Le-6).

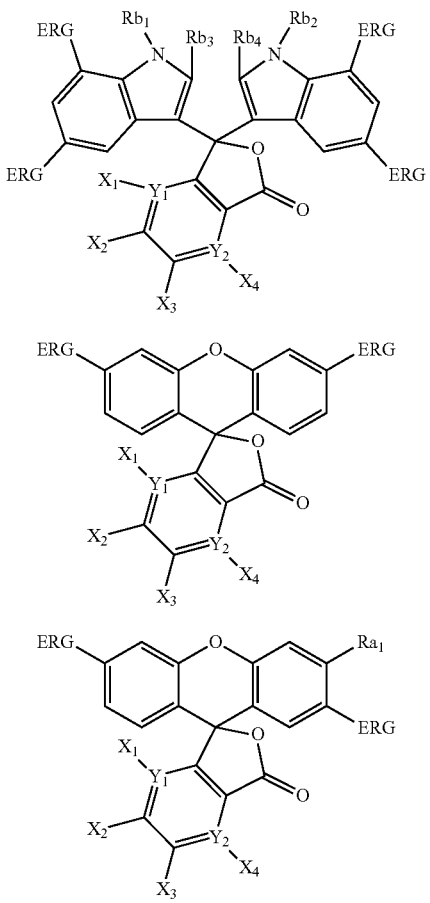

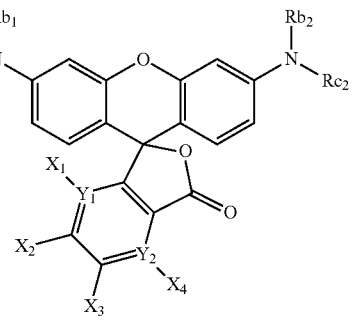

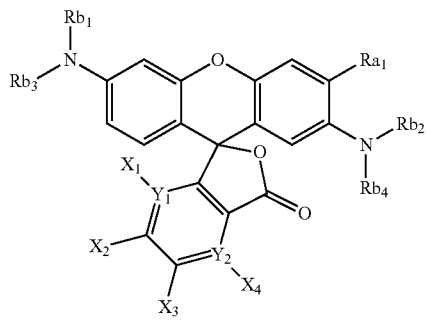

In Formula (Le-4) to Formula (Le-6), ERG each independently represents an electron donating group, $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

<35> The on-press development type lithographic printing plate precursor described in any one of <32> to <34>, in which the leuco colorant having a phthalide structure or a fluoran structure is a compound represented by any of Formula (Le-7) to Formula (Le-9).

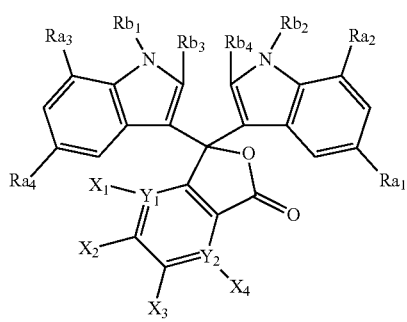

In Formula (Le-7) to Formula (Le-9), $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ to $Ra_4$ each independently represent a hydrogen atom, an alkyl group, or an alkoxy group, $Rb_1$ to $Rb_4$ each independently represent an alkyl group or an aryl group, and $Rc_1$ and $Rc_2$ each independently represent an aryl group.

<36> The on-press development type lithographic printing plate precursor described in <35>, in which $Ra_1$ to $Ra_4$ each independently represent an alkoxy group.

<37> The on-press development type lithographic printing plate precursor described in <35> or <36>, in which the leuco colorant having a phthalide structure or a fluoran structure is a compound represented by Formula (Le-5).

<38> The on-press development type lithographic printing plate precursor described in <37>, in which $X_1$ to $X_4$ each represent a hydrogen atom, and $Y_1$ and $Y_2$ each represent C.

<39> The on-press development type lithographic printing plate precursor described in <37> or <38>, in which $Rb_1$ and $Rb_2$ each independently represent an alkyl group.

<40> The on-press development type lithographic printing plate precursor described in any one of <1> to <39>, in which the infrared-absorbing polymethine colorant has an organic anion that satisfies $\delta_d \geq 16$, $16 \leq \delta_p \leq 32$, and $\delta_h \leq \delta_p \times 0.6$ in the Hansen solubility parameters.

<41> The on-press development type lithographic printing plate precursor described in <17> or <18>, in which the electron-accepting polymerization initiator has an organic anion that satisfies $\delta_d \geq 16$, $16 < \delta_p \leq 32$, and $\delta_h \leq \delta_p \times 0.6$ in the Hansen solubility parameters.

<42> The on-press development type lithographic printing plate precursor described in any one of <1> to <41>, in which the image-recording layer further contains a fluoroaliphatic group-containing copolymer.

<43> The on-press development type lithographic printing plate precursor described in <42>, in which the fluoroaliphatic group-containing copolymer has a constitutional unit formed of a compound represented by any of Formula (F1) or Formula (F2).

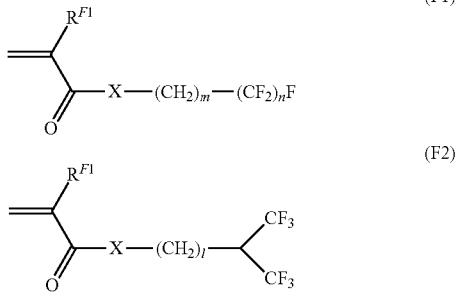

In Formulas (F1) and (F2), $R^{F1}$ each independently represents a hydrogen atom or a methyl group, X each independently represents an oxygen atom, a sulfur atom, or $-N(R^{F2})-$, m represents an integer of 1 to 6, n represents an integer of 1 to 10, l represents an integer of 0 to 10, and $R^{F2}$ represents a hydrogen atom or an alkyl group having 1 to 4 carbon atoms.

<44> The on-press development type lithographic printing plate precursor described in <43>, in which the fluoroaliphatic group-containing copolymer further has a constitutional unit formed of at least one kind of compound selected from the group consisting of poly(oxyalkylene) acrylate and poly(oxyalkylene) methacrylate.

<45> The on-press development type lithographic printing plate precursor described in any one of <1> to <41>, in which the image-recording layer is an outermost layer.

<46> An on-press development type lithographic printing plate precursor described in any one of <1> to <45>, further including a protective layer as an outermost layer on the image-recording layer,
in which the protective layer contains a hydrophobic polymer.

<47> An on-press development type lithographic printing plate precursor described in any one of <1> to <46>, further including a protective layer as an outermost layer on the image-recording layer,
in which the protective layer contains a discoloring compound.

<48> The on-press development type lithographic printing plate precursor described in <47>, in which the discoloring compound is an infrared absorber.

<49> The on-press development type lithographic printing plate precursor described in <47> or <48>, in which the discoloring compound includes a decomposable compound that decomposes due to exposure to infrared.

<50> The on-press development type lithographic printing plate precursor described in any one of <1> to <49>,
in which the aluminum support has an aluminum plate and an anodic oxide film of aluminum disposed on the aluminum plate,
the anodic oxide film is at a position closer to a side of the image-recording layer than the aluminum plate and has micropores extending in a depth direction from a surface of the anodic oxide film on the side of the image-recording layer,
an average diameter of the micropores within the surface of the anodic oxide film is more than 10 nm and 100 nm or less, and in the L*a*b* color space, a value of brightness L* of the surface of the anodic oxide film on the side of the image-recording layer is 70 to 100.

<51> The on-press development type lithographic printing plate precursor described in <50>, in which the micropores are each composed of a large diameter portion that extends to a position at a depth of 10 nm to 1,000 nm from the surface of the anodic oxide film and a small diameter portion that is in communication with a bottom portion of the large diameter portion and extends to a position at a depth of 20 nm to 2,000 nm from a communication position, an average diameter of the large diameter portion within the surface of the anodic oxide film is 15 nm to 100 nm, and
an average diameter of the small diameter portion at the communication position is 13 nm or less.

<52> A method for preparing a lithographic printing plate, including a step of exposing the on-press development type lithographic printing plate precursor described in any one of <1> to <51> in the shape of an image, and
a step of supplying at least one material selected from the group consisting of a printing ink and dampening water on a printer so as to remove an image-recording layer in a non-image area.

<53> A lithographic printing method, including a step of exposing the on-press development type lithographic printing plate precursor described in any one of <1> to <51> in the shape of an image,
a step of supplying at least one material selected from the group consisting of a printing ink and dampening water on a printer so as to remove an image-recording layer in a non-image area and to prepare a lithographic printing plate, and
a step of performing printing by using the obtained lithographic printing plate.

According to an embodiment of the present invention, it is possible to provide an on-press development type lithographic printing plate precursor from which a lithographic printing plate having excellent printing durability is obtained even in a case where a UV ink is used and which exhibits excellent temporal stability under white light.

According to another embodiment of the present invention, it is possible to provide a method for preparing a lithographic printing plate and a lithographic printing method using the on-press development type lithographic printing plate precursor.

DESCRIPTION OF THE PREFERRED EMBODIMENTS

Figure 1:
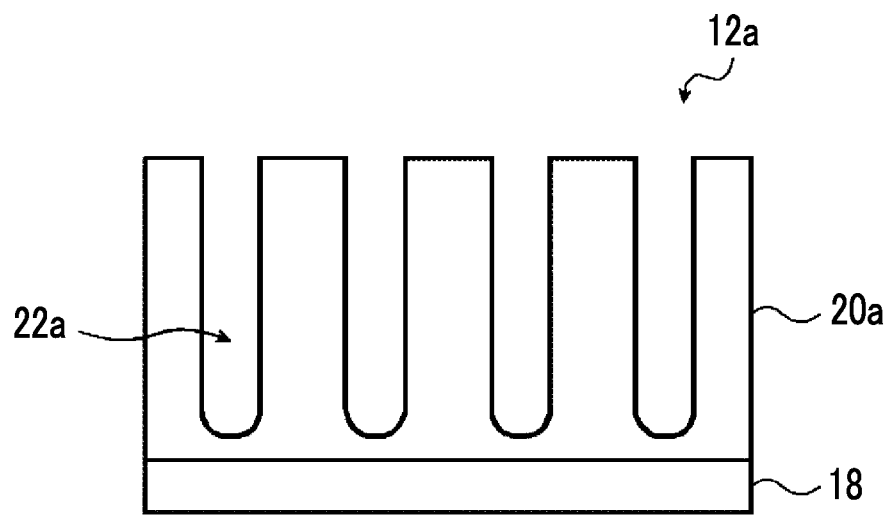
FIG. 1 is a schematic cross-sectional view of an embodiment of an aluminum support.

Hereinafter, the contents of the present disclosure will be specifically described. The following constituents will be described on the basis of typical embodiments of the present disclosure, but the present disclosure is not limited to such embodiments.

In the present disclosure, a numerical range expressed using "to" includes numerical values listed before and after "to" as the lower limit and the upper limit.

Regarding the numerical ranges described in stages in the present disclosure, the upper or lower limit of a numerical range may be replaced with the upper or lower limit of another numerical range described in stages. Furthermore, regarding the numerical ranges described in the present disclosure, the upper or lower limit of a numerical range may be replaced with values described in examples.

Furthermore, in the present disclosure, in a case where there is no description regarding whether a group (atomic group) is substituted or unsubstituted, such a group includes both a group having no substituent and a group having a substituent. For example, "alkyl group" includes not only an alkyl group having no substituent (unsubstituted alkyl group) but also an alkyl group having a substituent (substituted alkyl group).

In the present disclosure, "(meth)acryl" is a term used to explain a concept including both the acryl and methacryl, and "(meth)acryloyl" is a term used to explain a concept including both the acryloyl and methacryloyl.

In addition, the term "step" in the present disclosure means not only an independent step but also a step that cannot be clearly differentiated from other steps as long as the intended goal of the step is achieved.

In the present disclosure, "% by mass" has the same definition as "% by weight", and "part by mass" has the same definition as "part by weight".

In the present disclosure, a combination of two or more preferred aspects is a more preferred aspect.

In addition, in the present disclosure, unless otherwise specified, each of the weight-average molecular weight (Mw) and number-average molecular weight (Mn) is a molecular weight that is detected using a gel permeation chromatography (GPC) analysis device using TSKgel GMHxL, TSKgel G4000HxL, and TSKgel G2000HxL (trade names, manufactured by Tosoh Corporation) as columns, tetrahydrofuran (THF) as a solvent, and a differential refractometer, and expressed in terms of polystyrene as a standard substance.

In the present disclosure, the term "lithographic printing plate precursor" refers not only to a lithographic printing plate precursor but also to a key plate precursor. In addition, the term "lithographic printing plate" refers not only to a lithographic printing plate prepared by performing operations such as exposure and development as necessary on a lithographic printing plate precursor but also to a key plate. The key plate precursor is not necessarily subjected to the operations such as exposure and development. The key plate refers to a lithographic printing plate precursor to be mounted on a plate cylinder that is not used, in a case where monochromatic or dichromatic printing is carried out on a part of paper during, for example, color newspaper printing.

Hereinafter, the present disclosure will be specifically described.

(On-Press Development Type Lithographic Printing Plate Precursor)

The on-press development type lithographic printing plate precursor according to the present disclosure (hereinafter, also simply called "lithographic printing plate precursor") has an aluminum support and an image-recording layer on the aluminum support, in which the image-recording layer contains an infrared-absorbing polymethine colorant having HOMO of −5.2 eV or less, a polymerization initiator, and a polymerizable compound having 7 or more functional groups and contains or does not contain a polymer having a molecular weight of 10,000 or more, and in a case where the image-recording layer contains the polymer having a molecular weight 10,000 or more, a ratio Wp/Wm of a content Wp of the polymer having a molecular weight 10,000 or more to a content Wm of the polymerizable compound having 7 or more functional groups is 1.00 or less.

The lithographic printing plate precursor according to the present disclosure can be suitably used as a negative tone lithographic printing plate precursor.

There is a demand for a lithographic printing plate with which printing can be performed on a large number of sheets (hereinafter, this property will be also called "printing durability").

Particularly, in recent years, as a printing ink, an ink that is cured by the irradiation with ultraviolet rays (UV) (also called ("ultraviolet-curable ink or UV ink") has been used in some cases.

Being able to dry instantly, the UV ink has high productivity. Furthermore, because the UV ink contains a small amount of solvents or contains no solvent, environmental pollution is likely to be reduced. In addition, the UV ink makes it possible to form an image without performing heat drying or by reducing the time of heat drying. Therefore, the UV ink has advantages such as being applicable to printing on a wide variety of objects.

Accordingly, a lithographic printing plate precursor that can provide a lithographic printing plate exhibiting excellent printing durability even in a case where the UV ink is used is considered to be very useful in industry.

As a result of intensive studies, the inventors of the present invention have found that the lithographic printing plate precursor described in JP2013-078851A or JP2019-504780A provides a lithographic printing plate that exhibits insufficient printing durability (hereinafter, also called UV printing durability) particularly in a case where a UV ink is used as ink.

As a result of intensive studies, the inventors of the present invention have found that adopting the above constitution makes it possible to provide an on-press development type lithographic printing plate precursor that exhibits excellent printing durability (that is, UV printing durability) even in a case where an ultraviolet-curable ink (UV ink) is used, and exhibits excellent temporal stability under white light.

The detailed mechanism that brings about the aforementioned effect is unclear, but is assumed to be as below.

Presumably, because the image-recording layer contains a polymethine colorant having a specific oxidation potential, polymerization initiation efficiency may be increased. Further, presumably, because a polymerizable compound having 7 or more functional groups is also used, a lithographic printing plate having excellent printing durability and UV printing durability may be obtained. In addition, presumably, because the polymerizable compound having 7 or more functional groups has a small molecular weight unlike a polymer, the polymerizable compound may be dispersed in the image-recording layer, and the molecules may be distant from each other. It is considered that as a result, even though there are many molecules of such compound in the image-recording layer, a polymerization reaction may not be easily proceed under the condition where there are few polymerization initiation species. Moreover, in a case where the image-recording layer contains a polymer having a molecular weight of 10,000 or more, as long as the ratio of the content of such a polymer to the content of the polymerizable compound having 7 or more functional groups is 1.00 or less, under the condition where there are few polymerization initiation species, the polymer having a molecular weight higher than that of the polymerizable compound having 7 or more functional groups is likely to be suppressed from causing polymerization of the polymerizable compound. Presumably, as a result, in the image-recording layer under the condition where there are few polymerization initiation species, the formation of a three-dimensional crosslink may be suppressed, and developability is unlikely to deteriorate, which may result in excellent temporal stability under white light.

<<Image-Recording Layer>>

The image-recording layer used in the present disclosure contains an infrared-absorbing polymethine colorant having HOMO of −5.2 eV or less, a polymerization initiator, and a polymerizable compound having 7 or more functional groups and contains or does not contain a polymer having a molecular weight of 10,000 or more. In a case where the image-recording layer contains the polymer having a molecular weight of 10,000 or more, a ratio Wp/Wm of a content Wp of the polymer having a molecular weight of 10,000 or more to a content Wm of the polymerizable compound having 7 or more functional groups is 1.00 or less. The image-recording layer used in the present disclosure is preferably an on-press development type image-recording layer.

Furthermore, from the viewpoint of receptivity, the image-recording layer in the lithographic printing plate precursor according to the present disclosure is preferably the outermost layer.

Hereinafter, each of the components contained in the image-recording layer will be specifically described.

<<Infrared-Absorbing Polymethine Colorant>>

The image-recording layer contains an infrared-absorbing polymethine colorant having HOMO (highest occupied molecular orbital) of −5.2 eV or less (hereinafter, also called "specific polymethine colorant").

HOMO of the specific polymethine colorant is −5.2 eV or less. From the viewpoint of UV printing durability and on-press developability, HOMO of the specific polymethine colorant is preferably −5.25 eV or less, more preferably −5.3 eV or less, even more preferably −6.0 eV or more and −5.3 eV or less, and particularly preferably −5.6 eV or more and −5.3 eV or less.

In the present disclosure, the highest occupied molecular orbital (HOMO) and the lowest unoccupied molecular orbital (LUMO) are calculated by the following methods.

First, the counteranion in the compound as a subject of calculation is ignored.

The structural optimization is carried out by DFT (B3LYP/6−31G(d)) using quantum chemical calculation software Gaussian 09.

The molecular orbital (MO) energy is calculated by DFT (B3LYP/6−31+G(d,p)/CPCM (solvent=methanol)) using the structure obtained by the structural optimization.

By the following formula, the MO energy Ebare (unit: hartree) obtained by the above MO energy calculation is converted into Escaled (unit: eV) used as the values of HOMO and LUMO in the present disclosure.

Escaled=0.823168×27.2114×Ebare−1.07634

27.2114 is a simply a coefficient for converting hartree into eV, and 0.823168 and −1.07634 are adjustment coefficients. These are determined such that the calculated values of HOMO and LUMO of the compound as a calculation object match the measured values.

Examples of the specific polymethine colorant include colorants having a polymethine chain. Preferable examples thereof include a cyanine dye, a pyrylium colorant, a thiopyrylium colorant, an azulenium colorant, and the like. From the viewpoint of ease of availability, solubility in a solvent during an introduction reaction, and the like, a cyanine dye is preferable.

Furthermore, the specific polymethine colorant may be a pigment or a dye.

From the viewpoint of UV printing durability, temporal stability under white light, and on-press developability, the polymethine colorant preferably includes a cyanine dye having an electron-withdrawing group or a heavy atom-containing group in at least one of the aromatic rings at both terminals.

Furthermore, from the viewpoint of UV printing durability, temporal stability under white light, and on-press developability, the polymethine colorant preferably includes a cyanine dye having an electron-withdrawing group or a heavy atom-containing group in each of the aromatic rings at both terminals.

In addition, from the viewpoint of UV printing durability, temporal stability under white light, and on-press developability, the polymethine colorant preferably includes a cyanine dye having an electron-withdrawing group in at least one of the aromatic rings at both terminals.

In the present disclosure, in a case where a group corresponds to both the electron-withdrawing group and the heavy atom-containing group, the electron-withdrawing group containing a heavy atom is regarded as an electron-withdrawing group.

Specifically, the polymethine colorant more preferably includes a cyanine dye having a halogen atom, a cyano group, a nitro group, a carbonyl group, an aryl group, or a vinyl group in at least one of the aromatic rings at both terminals, even more preferably includes a cyanine dye having a halogen atom in at least one of the aromatic rings at both terminals, and particularly preferably includes a cyanine dye having a chlorine atom in at least one of the aromatic rings at both terminals.

As the electron-withdrawing group, from the viewpoint of UV printing durability, temporal stability under white light, and on-press developability, a group that satisfies σpara ≥0.01 is preferable in which σpara represents a Hammett substituent constant. From the viewpoint of UV printing durability, temporal stability under white light, and on-press developability, the electron-withdrawing group more preferably satisfies σpara ≥0.05, even more preferably satisfies σpara ≥0.20, and particularly preferably satisfies σpara ≥0.30.

Examples of the group that satisfies σpara ≥0.05 include halogen atoms such as a fluorine atom (0.06), a chlorine atom (0.30), a bromine atom (0.27), and an iodine atom (0.30); carbonyl substituents such as —CHO(0.22), —COCH$_3$(0.50), —COC$_6$H$_5$(0.46), —CONH$_2$(0.36), —COO$^-$ (0.30), —COOH (0.41), —COOCH$_3$ (0.39), and —COOC$_2$H$_5$ (0.45); sulfonyl or sulfinyl substituents such as —SOCH$_3$ (0.49), —SO$_2$CH$_3$ (0.72), —SO$_2$C$_6$H$_5$, —SO$_2$CF$_3$ (0.93), —SO$_2$NH$_2$ (0.57), —SO$_2$OC$_6$H$_5$, —SO$_3^-$ (0.09), and —SO$_3$H (0.50); nitrogen-containing substituents such as —CN (0.01), —N(CH$_3$)$_3^+$ (0.82) and —N(CF$_3$)$_2$ (0.53); and halogen atom-containing substituents such as —CCl$_3$, —CH$_2$Cl (0.18), —CHCl$_2$, and —CF$_3$ (0.54). The numerical value in the parentheses is the σpara value of each compound.

Specifically, suitable examples of such an electron-withdrawing group include a substituent having an unshared electron pair. Examples of the substituent having an unshared electron pair include a halogen atom, a carbonyl group-containing group, a sulfonyl group-containing group, a sulfinyl group-containing group, and an ether bond-containing group. Among these, a halogen atom or a carbonyl group-containing group is preferable, a halogen atom, an alkoxycarbonyl group, or an aryloxycarbonyl group is more preferable, a halogen atom is even more preferable, and a chlorine atom is particularly preferable.

Specific examples of the carbonyl group-containing group include an acyl group such as an acetyl group or a benzoyl group; an alkoxycarbonyl group or an aryloxycarbonyl group such as a methoxycarbonyl group or a toluyloxycarbonyl group; an amide group such as a diethylaminocarbonyl group; and a carboxy group. These may be bonded to an aromatic ring or heterocycle of the cyanine dye through a linking group having a valency of 2 or more.

In the present disclosure, "heavy atom-containing group" means a group containing an atom having an atomic weight of 28 or more. Suitable examples of the atom having an atomic weight of 28 or more include a silicon atom (28.09), a phosphorus atom (30.97), a sulfur atom (32.07), a chlorine atom (35.45), a germanium atom (72.61), an arsenic atom (74.92), a selenium atom (78.96), a bromine atom (79.90), a tin atom (118.71), an antimony atom (121.76), a tellurium atom (127.60), and an iodine atom (126.90). The numerical value in the parentheses is the atomic weight of each atom.

Among these, from the viewpoint of safety and availability of raw materials, a group containing a silicon atom, a phosphorus atom, or a halogen atom is preferable.

It is preferable that the groups containing the above atoms having an atomic weight of 28 or more (that is, heavy atom-containing group) act as substituents on the aromatic ring of the cyanine dye, alone or in combination with other atoms. Furthermore, such substituents may be bonded to the aromatic ring of the cyanine dye through a linking group having a valency of 2 or more.

Examples of the silicon atom-containing group include a group having an alkyl group or an aryl group on a silicon atom, such as a trimethylsilyl group, a t-butyldimethylsilyl group, and a dimethylphenylsilyl group.

Examples of the phosphorus atom-containing group include a group having an alkyl group or an aryl group on a phosphorus atom, such as a dimethylphosphino group and a diphenylphosphino group; and a phosphono group.

Examples of the sulfur atom-containing group partially overlap the examples of the aforementioned electron-withdrawing group, and include an alkylsulfonyl group or an arylsulfonyl group such as a methylsulfonyl group or a phenylsulfonyl group; an alkylsulfinyl group or an arylsulfinyl group such as an ethylsulfinyl group or a toluylsulfinyl group; a sulfuric acid group or a salt or ester derivative thereof such as a sulfo group, a sulfino group, or a sulfeno group; and an alkylthio group or an arylthio group such as a methylthio group or a phenylthio group.

Examples of the group containing a halogen atom include a halogen atom, a halogen-substituted alkyl group, and a halogen-substituted aryl group, which partially overlap with the electron-withdrawing group described above.

Specific examples of the specific polymethine colorant include those having HOMO of −5.2 eV or less among the following colorants.

Specific examples of the cyanine dye include the compounds described in paragraphs "0017" to "0019" of JP2001-133969A, paragraphs "0016" to "0021" of JP2002-023360A, and paragraphs "0012" to "0037" of JP2002-040638A. Specifically, preferable examples of the cyanine dye include the compounds described in paragraphs "0034" to "0041" of JP2002-278057A and in paragraphs "0080" to "0086" of JP2008-195018A. Specifically, particularly preferable examples of the cyanine dye include the compounds described in paragraphs "0035" to "0043" of JP2007-90850A and in paragraphs "0105" to "0113" of JP2012-206495A.

Furthermore, as the cyanine dye, specifically, for example, the compounds described in paragraphs "0008" and "0009" of JP1993-5005A (JP-H05-5005A) and in paragraphs "0022" to "0025" of JP2001-222101A can also be preferably used.

In addition, as the specific polymethine colorant, a polymethine colorant that decomposes by exposure to infrared (also called "decomposable polymethine colorant") can also be suitably used.

As the polymethine colorant that decomposes by exposure to infrared, those described in JP2008-544322A, WO2016/027886A, WO2017/141882A, or WO2018/043259A can also be suitably used.

One kind of specific polymethine colorant may be used alone, or two or more kinds of specific polymethine colorants may be used in combination. In addition, as the specific polymethine colorant, a pigment and a dye may be used in combination.

The content of the specific polymethine colorant in the image-recording layer with respect to the total mass of the image-recording layer is preferably 0.1% by mass to 10.0% by mass, and more preferably 0.5% by mass to 5.0% by mass.

<<Polymerization Initiator>>

The image-recording layer used in the present disclosure contains a polymerization initiator.

The polymerization initiator is not particularly limited, and examples thereof include an electron-accepting polymerization initiator, an electron-donating polymerization initiator, and the like.

[Electron-Accepting Polymerization Initiator]

The image-recording layer preferably contains an electron-accepting polymerization initiator.

The electron-accepting polymerization initiator used in the present disclosure is a compound that generates a polymerization initiation species such as a radical or a cation by either or both of light energy and heat energy, and can be appropriately selected from known thermal polymerization initiators, compounds having a bond that can be dissociated by little energy, photopolymerization initiators, and the like.

The electron-accepting polymerization initiator is preferably a radical polymerization initiator and more preferably an onium compound.

In addition, as the electron-accepting polymerization initiator, an infrared-ray-sensitive polymerization initiator is preferable.

One kind of electron-accepting polymerization initiator may be used alone, or two or more kinds of electron-accepting polymerization initiators may be used in combination.

Examples of the radical polymerization initiator include (a) organic halide, (b) carbonyl compound, (c) azo compound, (d) organic peroxide, (e) metallocene compound, (f) azide compound, (g) hexaarylbiimidazole compound, (i) disulfone compound, (j) oxime ester compound, and (k) onium compound.

As (a) organic halide, for example, the compounds described in paragraphs "0022" and" 0023" of JP2008-195018A are preferable.

As (b) carbonyl compound, for example, the compounds described in paragraph "0024" of JP2008-195018A are preferable.

As (c) azo compound, for example, the azo compounds described in JP1996-108621A (JP-H08-108621A) and the like can be used.

As (d) organic peroxide, for example, the compounds described in paragraph "0025" of JP2008-195018A are preferable.

As (e) metallocene compound, for example, the compounds described in paragraph "0026" of JP2008-195018A are preferable.

Examples of (f) azide compound include compounds such as 2,6-bis(4-azidobenzylidene)-4-methylcyclohexanone.

As (g) hexaarylbiimidazole compound, for example, the compounds described in paragraph "0027" of JP2008-195018A are preferable.

Examples of (i) disulfone compound include the compounds described in JP1986-166544A (JP-S61-166544A) and JP2002-328465A.

As (j) oxime ester compound, for example, the compounds described in paragraphs "0028" to "0030" of JP2008-195018A are preferable.

Among the above electron-accepting polymerization initiators, from the viewpoint of curing properties, an oxime ester compound and an onium compound are preferable. Particularly, from the viewpoint of UV printing durability, an iodonium salt compound, a sulfonium salt compound, or an azinium salt compound is preferable, an iodonium salt compound or a sulfonium salt compound is more preferable, and an iodonium salt compound is even more preferable.

Specific examples of these compounds will be shown below, but the present disclosure is not limited thereto.

As the iodonium salt compound, for example, a diaryl iodonium salt compound is preferable. Particularly, a diphenyl iodonium salt compound substituted with an electron donating group such as an alkyl group or an alkoxyl group is more preferable. Furthermore, an asymmetric diphenyl iodonium salt compound is preferable. Specific examples thereof include diphenyliodonium=hexafluorophosphate, 4-methoxyphenyl-4-(2-methylpropyl) phenyliodonium=hexafluorophosphate, 4-(2-methylpropyl) phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, bis(4-t-butylphenyl) iodonium=hexafluorophosphate, and the like.

As the sulfonium salt compound, for example, a triarylsulfonium salt compound is preferable. Particularly, a triarylsulfonium salt compound is preferable in which at least some of electron-withdrawing groups such as groups on an aromatic ring are substituted with halogen atoms, and a triarylsulfonium salt compound is more preferable in which the total number of halogen atoms as substituents on an aromatic ring is 4 or more. Specific examples thereof include triphenylsulfonium=hexafluorophosphate, triphenylsulfonium=benzoyl formate, bis(4-chlorophenyl) phenylsulfonium=benzoyl formate, bis(4-chlorophenyl)-4-methylphenylsulfonium=tetrafluoroborate, tris(4-chlorophenyl)sulfonium=3,5-bis(methoxycarbonyl) benzenesulfonate, tris(4-chlorophenyl)sulfonium=hexafluorophosphate, tris(2,4-dichlorophenyl) sulfonium=hexafluorophosphate, and the like.

As a counteranion of the iodonium salt compound and the sulfonium salt compound, a sulfonamide anion or a sulfonimide anion is preferable, and a sulfonimide anion is more preferable.

As the sulfonamide anion, an aryl sulfonamide anion is preferable.

As the sulfonimide anion, a bisaryl sulfonimide anion is preferable.

Specific examples of the sulfonamide anion or the sulfonimide anion will be shown below, but the present disclosure is not limited thereto. In the following specific examples, Ph represents a phenyl group, Me represents a methyl group, and Et represents an ethyl group.

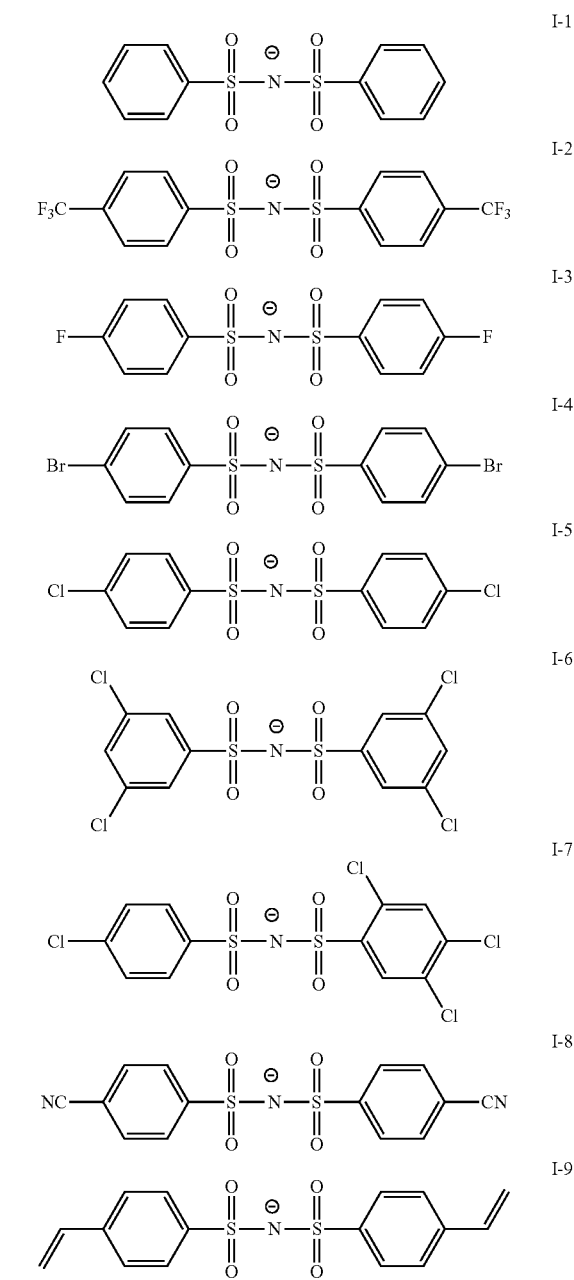

-continued

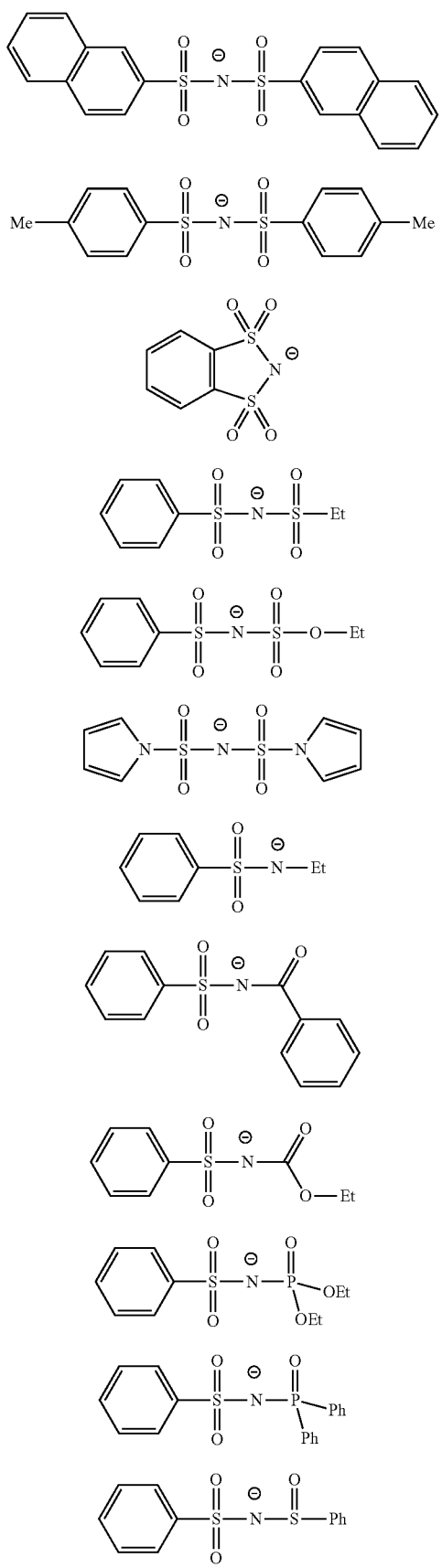

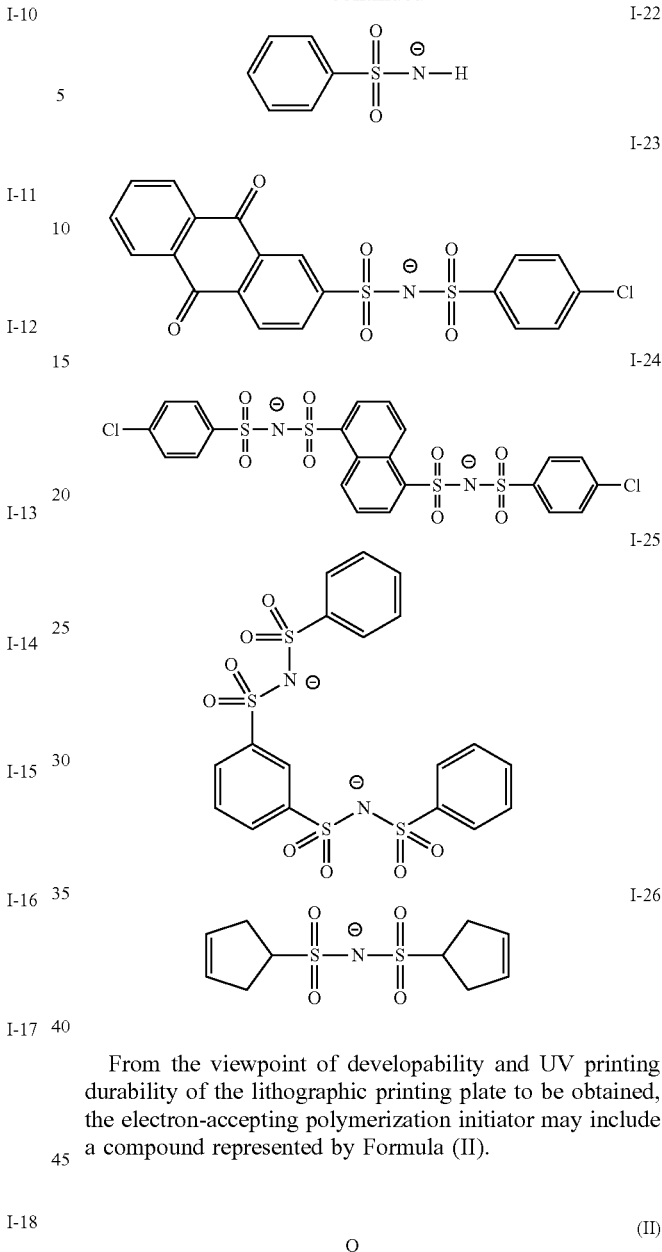

From the viewpoint of developability and UV printing durability of the lithographic printing plate to be obtained, the electron-accepting polymerization initiator may include a compound represented by Formula (II).

$$R^3-\overset{O}{\underset{O}{S}}-CX_3 \qquad (II)$$

In Formula (II), X represents a halogen atom, and $R^3$ represents an aryl group.

Specifically, examples of X in Formula (II) include a fluorine atom, a chlorine atom, a bromine atom, and an iodine atom. Among these, a chlorine atom or a bromine atom is preferable because these have excellent sensitivity, and a bromine atom is particularly preferable. Furthermore, from the viewpoint of excellent balance between sensitivity and storage stability, $R^3$ in Formula (II) is preferably an aryl group substituted with an amide group.

Specific examples of the electron-accepting polymerization initiator represented by Formula (II) include compounds represented by the following formulas. However, the present disclosure is not limited thereto.

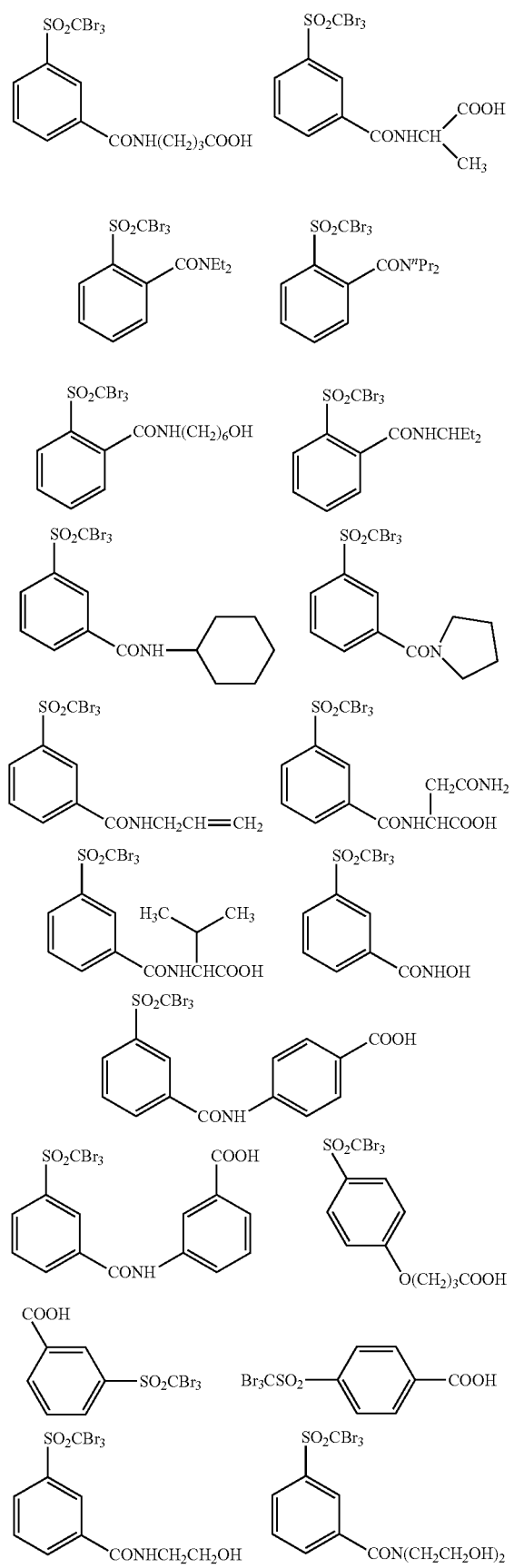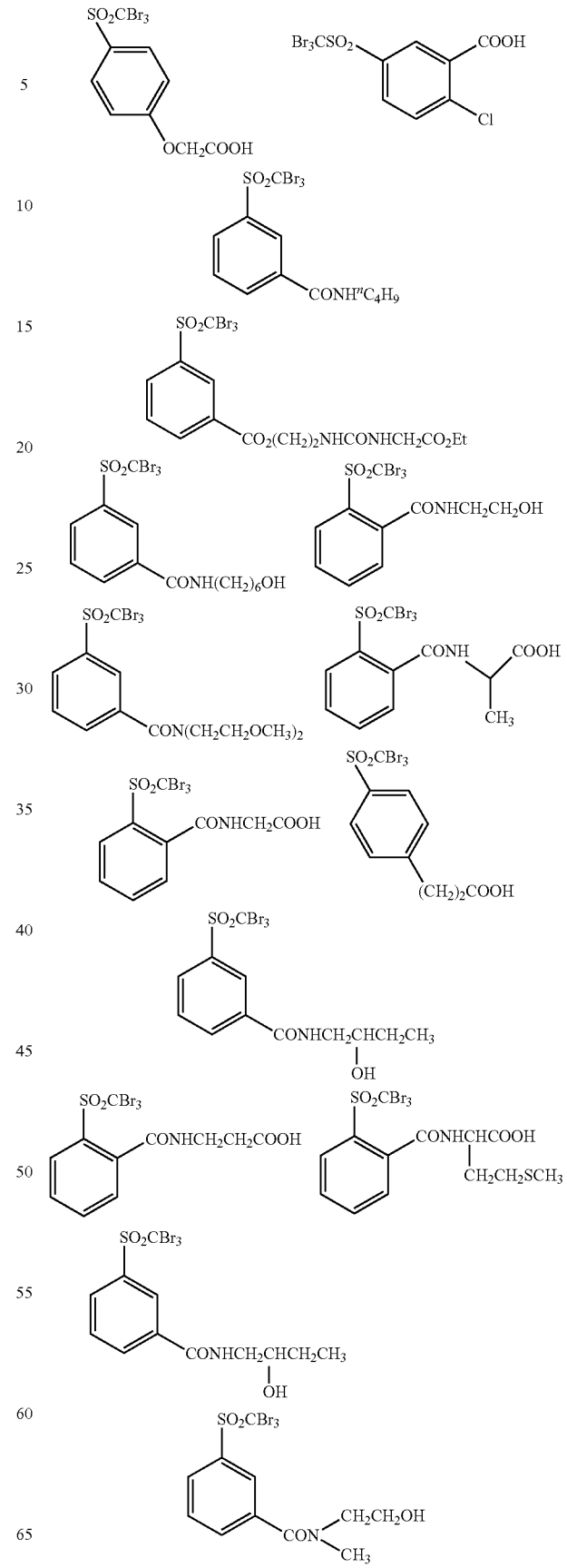

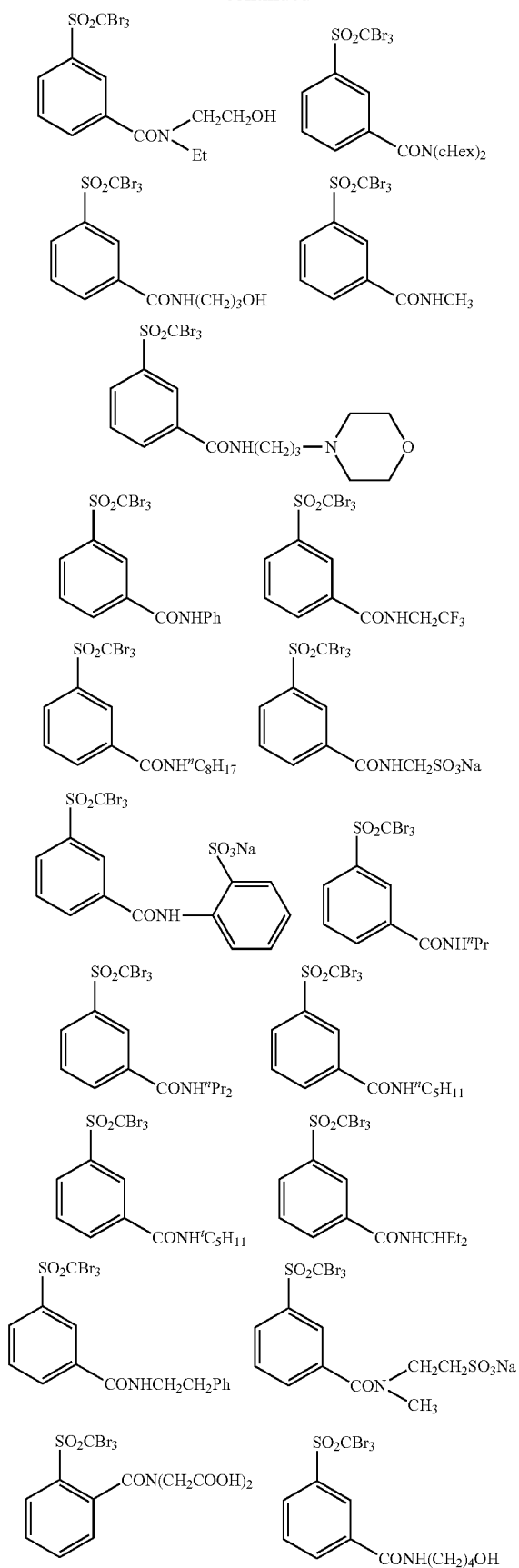
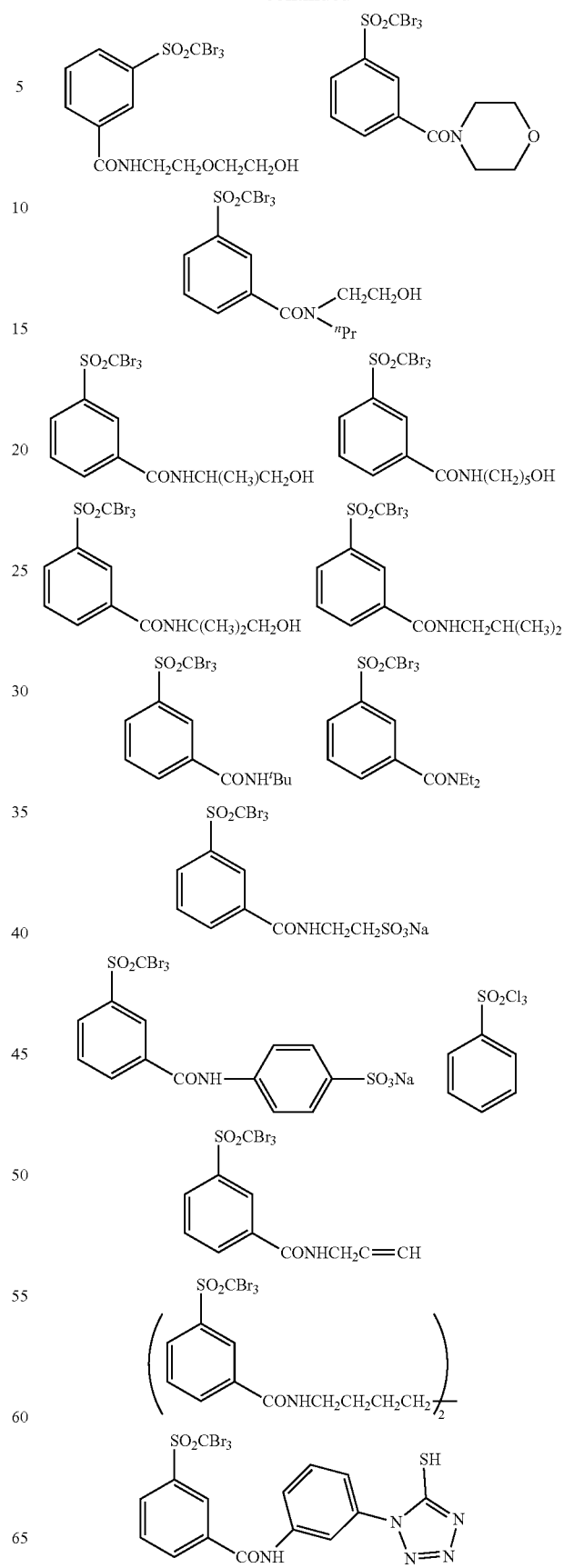

-continued
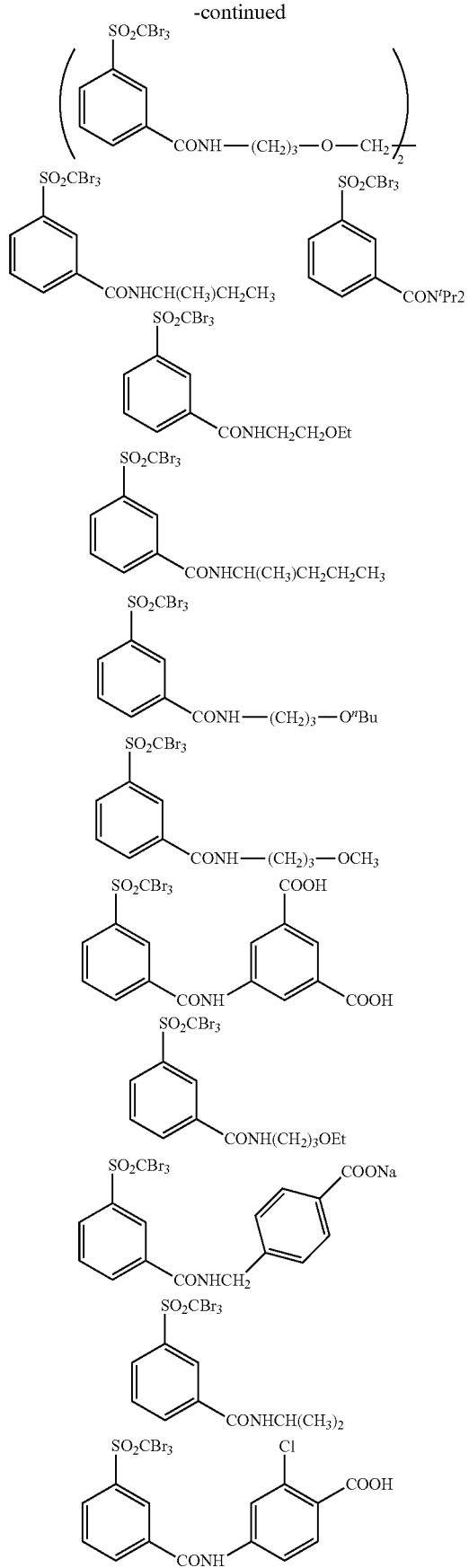
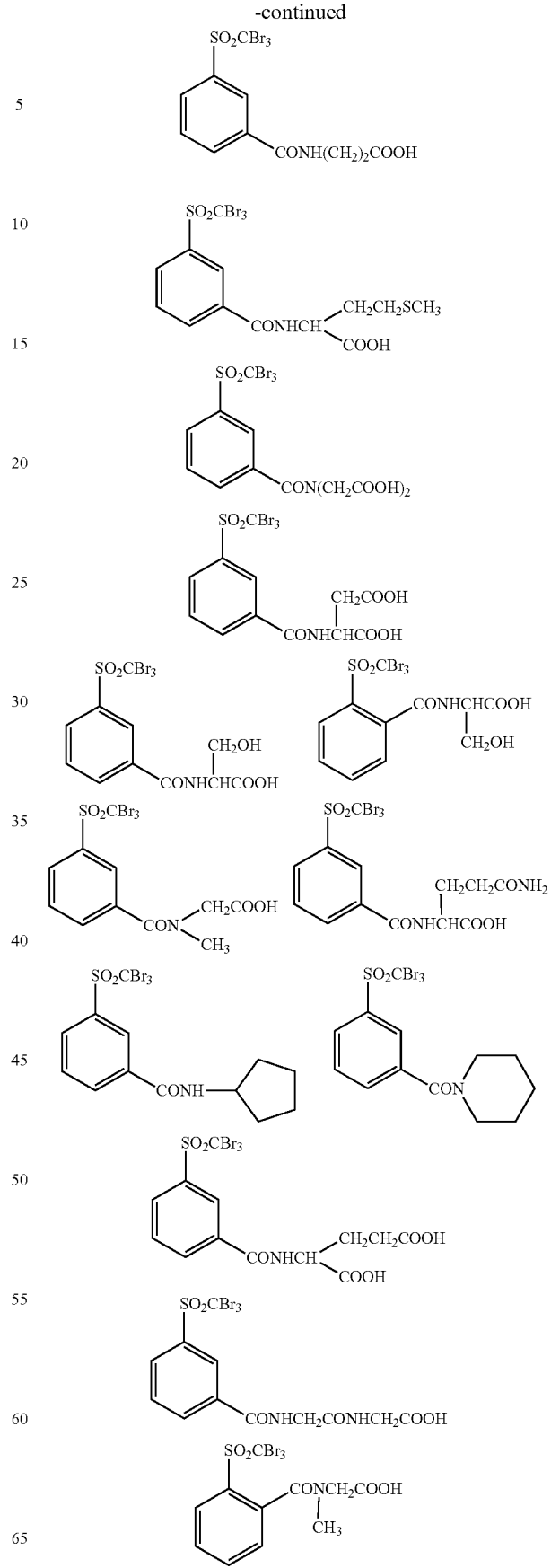

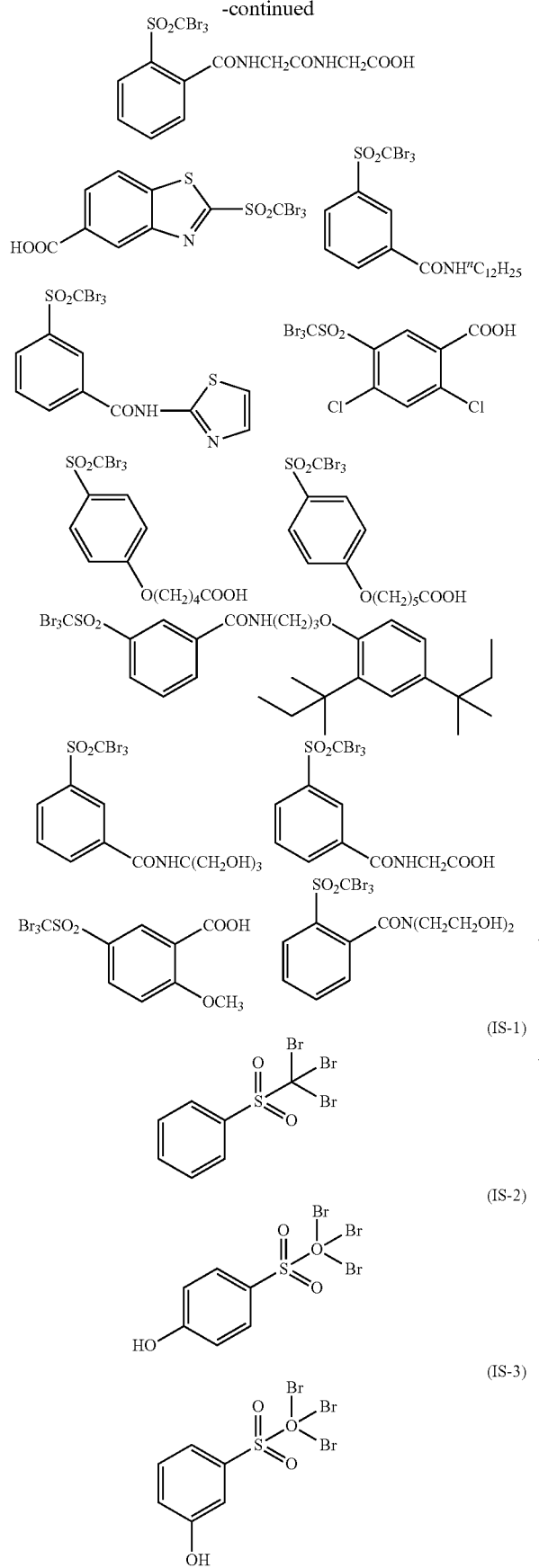
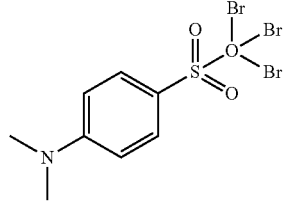
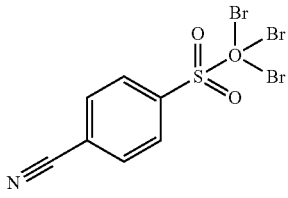
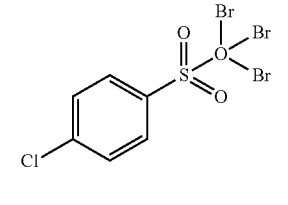
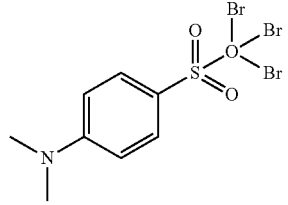
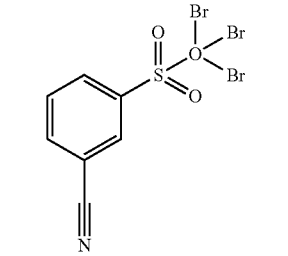
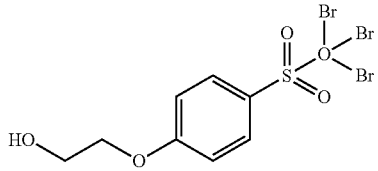
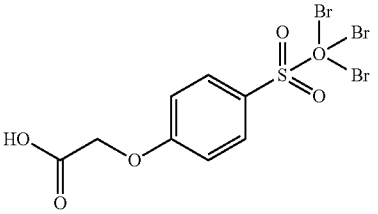

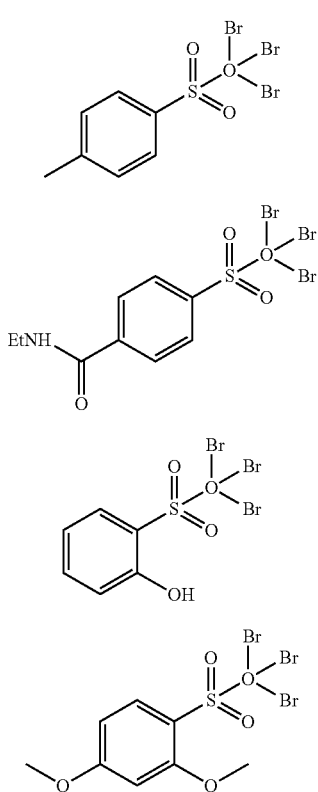

From the viewpoint of on-press developability and UV printing durability, the lowest unoccupied molecular orbital (LUMO) of the electron-accepting polymerization initiator is preferably −3.00 eV or less, and more preferably −3.02 eV or less.

The lower limit of LUMO of the electron-accepting polymerization initiator is preferably −3.80 eV or more, and more preferably −3.60 eV or more.

—Content of Electron-Accepting Polymerization Initiator—

The content of the electron-accepting polymerization initiator with respect to the total mass of the image-recording layer is preferably 0.1% by mass to 50% by mass, more preferably 0.5% by mass to 30% by mass, and particularly preferably 0.8% by mass to 20% by mass.

One kind of electron-accepting polymerization initiator may be used alone, or two or more kinds of electron-accepting polymerization initiators may be used in combination.

[Relationship Between Electron-Accepting Polymerization Initiator and Specific Polymethine Colorant]

From the viewpoint of UV printing durability and temporal stability under white light, the image-recording layer in the present disclosure contains the electron-accepting polymerization initiator and the specific polymethine colorant described above. LUMO of the electron-accepting polymerization initiator—LUMO of the specific polymethine colorant (value obtained by subtracting LUMO of the specific polymethine colorant from LUMO of the electron-accepting polymerization initiator) is preferably 0.70 eV or less, and more preferably 0.70 eV to −0.10 eV.

The negative sign means that LUMO of the specific polymethine colorant is higher than LUMO of the electron-accepting polymerization initiator.

[Electron-Donating Polymerization Initiator (Polymerization Aid)]

The image-recording layer preferably contains, as a polymerization initiator, an electron-donating polymerization initiator (also called "polymerization aid"), and more preferably contains an electron-accepting polymerization initiator and an electron-donating polymerization initiator.

The electron-donating polymerization initiator in the present disclosure is a compound which donates one electron by intermolecular electron transfer to an orbit of an infrared absorber that has lost one electron in a case where electrons of the infrared absorber are excited or perform intramolecular transfer by exposure to infrared, and thus generates polymerization initiation species such as radicals.

The electron-donating polymerization initiator is preferably an electron-donating radical polymerization initiator.

From the viewpoint of improving the printing durability of the lithographic printing plate, the image-recording layer more preferably contains the electron-donating polymerization initiator that will be described below. Examples thereof include the following 5 initiators.

(i) Alkyl or arylate complex: considered to generate active radicals by oxidative cleavage of carbon-hetero bond. Specifically, a borate compound is preferable.

(ii) N-arylalkylamine compound: considered to generate active radicals by oxidation-induced cleavage of C—X bond on carbon adjacent to nitrogen. X is preferably a hydrogen atom, a carboxyl group, a trimethylsilyl group, or a benzyl group. Specifically, examples thereof include N-phenylglycines (which may or may not have a substituent on a phenyl group) and N-phenyl iminodiacetic acids (which may or may not have a substituent on a phenyl group).

(iii) Sulfur-containing compound: compound obtained by substituting nitrogen atoms of the aforementioned amines with sulfur atoms and capable of generating active radicals by the same action as that of the amines. Specific examples thereof include phenylthioacetic acids (which may or may not have a substituent on a phenyl group).

(iv) Tin-containing compound: compound obtained by substituting nitrogen atoms of the aforementioned amines with tin atoms and capable of generating active radicals by the same action as that of the amines.

(v) Sulfinates: capable of generating active radicals by oxidation. Specifically, examples thereof include sodium aryl sulfinate and the like.

From the viewpoint of printing durability, the image-recording layer preferably contains a borate compound among the above.

From the viewpoint of printing durability and color developability, the borate compound is preferably a tetraaryl borate compound or a monoalkyl triaryl borate compound, and more preferably a tetraaryl borate compound.

A countercation that the borate compound has is not particularly limited, but is preferably an alkali metal ion or a tetraalkyl ammonium ion and more preferably a sodium ion, a potassium ion, or a tetrabutylammonium ion.

Specifically, as the borate compound, for example, sodium tetraphenyl borate is preferable.

Specifically, as the electron-donating polymerization initiator, for example, the following B-1 to B-11 are preferable. It goes without saying that the present disclosure is not limited thereto. In the following chemical formulas, Ph represents a phenyl group, and Bu represents a n-butyl group.

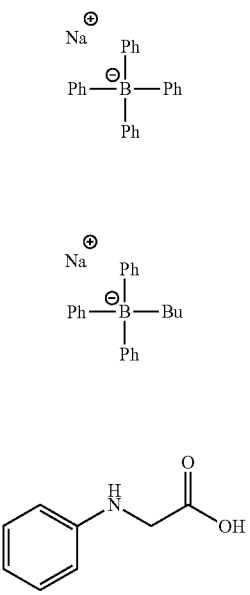

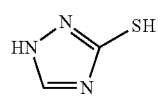

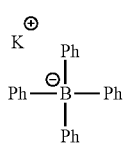

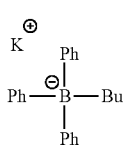

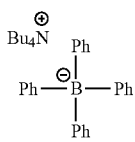

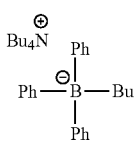

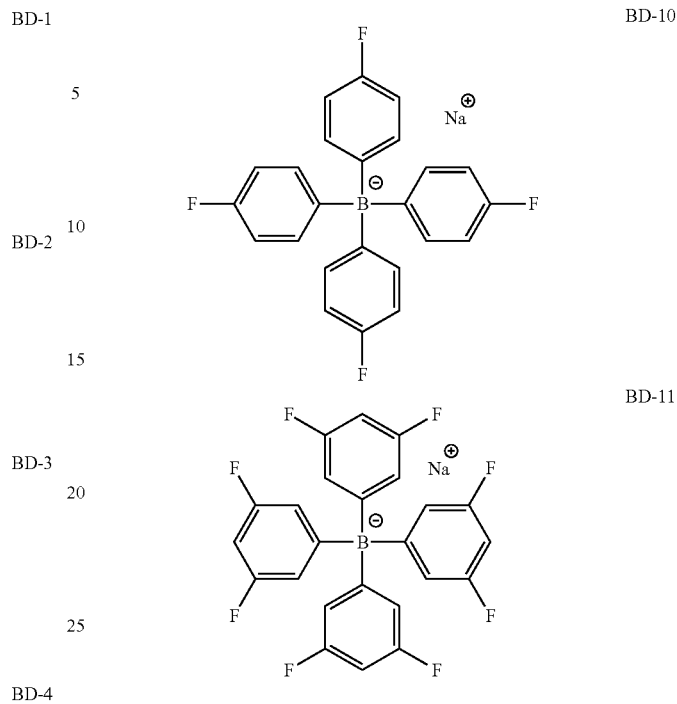

From the viewpoint of improving sensitivity and suppressing the occurrence of plate missing, the highest occupied molecular orbital (HOMO) of the electron-donating polymerization initiator used in the present disclosure is preferably −6.00 eV or more, more preferably −5.95 eV or more, and even more preferably −5.93 eV or more.

The upper limit of HOMO of the electron-donating polymerization initiator is preferably −5.00 eV or less, and more preferably −5.40 eV or less.

—Content of Electron-Donating Polymerization Initiator—

Only one kind of electron-donating polymerization initiator may be added to the image-recording layer, or two or more kinds of electron-donating polymerization initiators may be used in combination.

From the viewpoint of sensitivity and printing durability, the content of the electron-donating polymerization initiator with respect to the total mass of the image-recording layer is preferably 0.01% by mass to 30% by mass, more preferably 0.05% by mass to 25% by mass, and even more preferably 0.1% by mass to 20% by mass.

In the present disclosure, in a case where the image-recording layer contains an onium ion and an anion of the aforementioned electron-donating polymerization initiator, the image-recording layer is regarded as containing an electron-accepting polymerization initiator and the electron-donating polymerization initiator described above.

One of the preferred aspects of the present disclosure is an aspect in which the aforementioned electron-accepting polymerization initiator and the aforementioned electron-donating polymerization initiator form a salt.

Specific examples thereof include an aspect in which the aforementioned onium compound is a salt formed of an onium ion and an anion of the electron-donating polymerization initiator (for example, a tetraphenyl borate anion). Furthermore, for example, an iodonium borate compound is more preferable which is a salt formed of an iodonium cation of the aforementioned iodonium salt compound (for example, a di-p-tolyl iodonium cation) and a borate anion of the aforementioned electron-donating polymerization initiator.

Specific examples of the aspect in which the electron-accepting polymerization initiator and the electron-donating polymerization initiator form a salt will be shown below. However, the present disclosure is not limited thereto.

(IA-1)
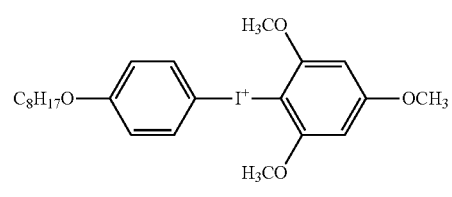

(IA-2)
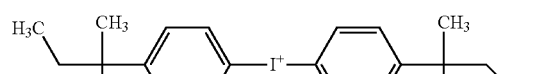

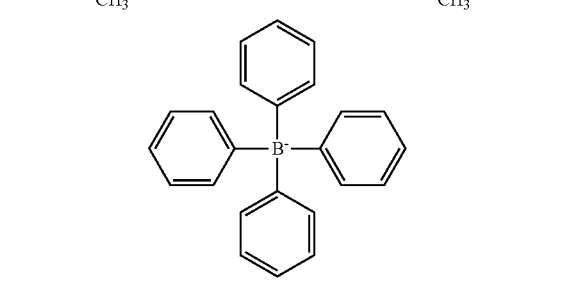

(IA-3)
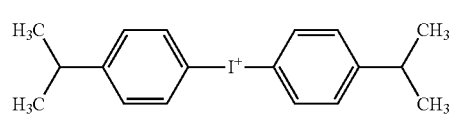

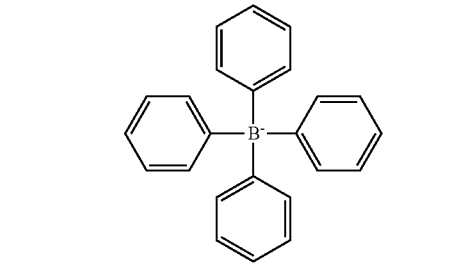

(IA-4)
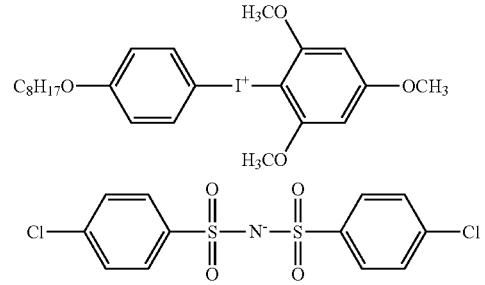

(IA-5)
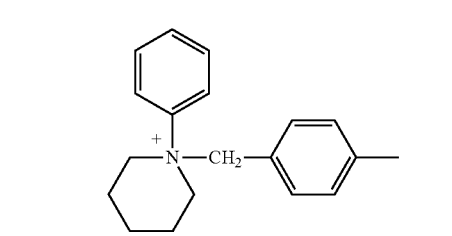

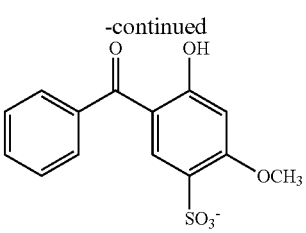

In the present disclosure, in a case where the image-recording layer contains an onium ion and an anion of the aforementioned electron-donating polymerization initiator, the image-recording layer is regarded as containing an electron-accepting polymerization initiator and the electron-donating polymerization initiator described above.

[Relationship Between Electron-Donating Polymerization Initiator and Specific Polymethine Colorant]

From the viewpoint of UV printing durability and temporal stability under white light, the image-recording layer in the present disclosure contains the electron-donating polymerization initiator and the specific polymethine colorant described above. HOMO of the specific polymethine colorant—HOMO of the electron-donating polymerization initiator (value obtained by subtracting HOMO of the electron-donating polymerization initiator from HOMO of the specific polymethine colorant) is preferably 0.70 eV or less, and more preferably 0.70 eV to −0.10 eV.

The negative sign means that HOMO of the electron-donating polymerization initiator is higher than HOMO of the specific polymethine colorant.

—Preferred Aspect of Specific Polymethine Colorant and Electron-Accepting Polymerization Initiator—

From the viewpoint of improving sensitivity and suppressing the occurrence of plate missing, in a preferred aspect, the specific polymethine colorant in the present disclosure has an organic anion that satisfies δd≥16, δp=16 to 32, and δh≥δp×0.6 in the Hansen solubility parameters.

From the viewpoint of improving sensitivity and suppressing the occurrence of plate missing, in a preferred aspect, the electron-accepting polymerization initiator in the present disclosure has an organic anion that satisfies δd≥16, δp=16 to 32, and δh≤δp×0.6 in the Hansen solubility parameters.

In the present disclosure, as δd, δp, and δh in the Hansen solubility parameters, the dispersion element δd [unit: $MPa^{0.5}$] and the polarity element δp [unit: $MPa^{0.5}$] in the Hansen solubility parameters are used. The Hansen solubility parameters are obtained by dividing the solubility parameters introduced by Hildebrand into three components, a dispersion element δd, a polarity element δp, and a hydrogen bond element δh, and expressing the parameters in a three-dimensional space.

Details of the Hansen solubility parameters are described in the document "Hansen Solubility Parameters; A Users Handbook (CRC Press, 2007)" written by Charles M. Hansen.

In the present disclosure, δd, δp, and δh of the organic anion in the Hansen solubility parameters are values estimated from the chemical structure by using the computer software "Hansen Solubility Parameters in Practice (HSPiP ver. 4.1.07)".

Specifically, suitable examples of the organic anion that satisfies δd≥16, δp=16 to 32, and δh≤δp×0.6 in the Hansen solubility parameters include specific examples (I-1) to (I-26) of the sulfonamide anion or sulfonimide anion in the aforementioned electron-accepting polymerization initiator. However, it goes without saying that the organic anion is not limited thereto.

<<Polymerizable Compound>>

The image-recording layer contains a polymerizable compound having 7 or more functional groups (hereinafter, also called "specific polymerizable compound"). Herein, "7 or more functional groups" means that the number of polymerizable groups (also called number of functional groups) in the molecule is 7 or more.

In the present disclosure, the specific polymerizable compound has a molecular weight of less than 10,000. The specific polymerizable compound does not include a polymer having a molecular weight of 10,000 or more that will be described later.

From the viewpoint of UV printing durability and temporal stability under white light, the number of functional groups in the specific polymerizable compound is preferably 11 or more, and more preferably 15 or more. The upper limit of the number of functional groups in the specific polymerizable compound is, for example, 50.

Furthermore, the image-recording layer may contain a polymerizable compound having 6 or less functional groups.

The specific polymerizable compound used in the present disclosure may be, for example, a radically polymerizable compound or a cationically polymerizable compound. The specific polymerizable compound preferably includes an addition polymerizable compound (ethylenically unsaturated compound) having at least 7 ethylenically unsaturated bonds. From the viewpoint of UV printing durability and temporal stability under white light, the ethylenically unsaturated compound preferably includes a compound having at least 7 terminal ethylenically unsaturated bonds, more preferably includes a compound having 11 or more terminal ethylenically unsaturated bonds, and even more preferably includes a compound having 15 or more terminal ethylenically unsaturated bonds.

The chemical form of the specific polymerizable compound is, for example, a monomer, a prepolymer which is in other words a dimer, a trimer, or an oligomer, a mixture of these, or the like.

Examples of the monomer include unsaturated carboxylic acids (for example, acrylic acid, methacrylic acid, itaconic acid, crotonic acid, isocrotonic acid, maleic acid, and the like), and esters and amides thereof. Among these, esters of unsaturated carboxylic acids and polyhydric alcohol compounds and amides of unsaturated carboxylic acids and polyvalent amine compounds are preferably used. In addition, products of an addition reaction between unsaturated carboxylic acid esters or amides having a nucleophilic substituent such as a hydroxyl group, an amino group, or a mercapto group and monofunctional or polyfunctional isocyanates or epoxies, products of a dehydrocondensation reaction between the aforementioned unsaturated carboxylic acid esters or amides and a monofunctional or polyfunctional carboxylic acid, and the like are also suitably used. Furthermore, products of an addition reaction between unsaturated carboxylic acid esters or amides having an electrophilic substituent such as an isocyanate groups or an epoxy group and monofunctional or polyfunctional alcohols, amines, or thiols, and products of a substitution reaction between unsaturated carboxylic acid esters or amides having a dissociable substituent such as a halogen atom or a tosyloxy group and monofunctional or polyfunctional alcohols, amines, or thiols are also suitable. Moreover, for example, it is also possible to use a group of compounds obtained by substituting the unsaturated carboxylic acid with an unsaturated phosphonic acid, styrene, a vinyl ether, or the like. These compounds are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-294935A, JP2006-243493A, JP2002-275129A, JP2003-64130A, JP2003-280187A, JP1998-333321A (JP-H10-333321A), and the like.

Specific examples of monomers of esters of polyhydric alcohol compounds and unsaturated carboxylic acids include acrylic acid esters such as ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, and polyester acrylate oligomers, and methacrylic acid esters such as tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl] dimethyl methane, and bis[p-(methacryloxyethoxy)phenyl] dimethyl methane. In addition, specific examples of monomers of amides of polyvalent amine compounds and unsaturated carboxylic acids include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, xylylene bismethacrylamide, and the like.

As the specific polymerizable compound, from the viewpoint of UV printing durability and temporal stability under white light, urethane-based addition polymerizable compounds produced using an addition reaction between an isocyanate and a hydroxyl group are also suitable, and specific examples thereof include vinyl urethane compounds having two or more polymerizable vinyl groups in one molecule obtained by adding vinyl monomers having a hydroxyl group represented by Formula (M) to a polyisocyanate compound having two or more isocyanate groups in one molecule which is described in, for example, JP1973-41708B (JP-S48-41708B1).

$$CH_2=C(R^{M4})COOCH_2CH(R^{M5})OH \quad (M)$$

In Formula (M), $R^{M4}$ and $R^{M5}$ each independently represent a hydrogen atom or a methyl group.

Furthermore, as the specific polymerizable compound, urethane acrylates described in JP1976-37193A (JP-S51-37193A), JP1990-32293B (JP-H02-32293B), JP1990-16765B (JP-H02-16765B), JP2003-344997A, and JP2006-65210A; urethane compounds having an ethylene oxide-based skeleton described in JP1983-49860B (JP-S58-49860B), JP1981-17654B (JP-S56-17654B), JP1987-39417B (JP-S62-39417B), JP1987-39418B (JP-S62-39418B), JP2000-250211A, and JP2007-94138A; urethane compounds having a hydrophilic group described in U.S. Pat. No. 7,153,632B, JP1996-505958A (JP-H08-505958A), JP2007-293221A, and JP2007-293223A, and the like are also suitable.

(Specific Polymerizable Compound M1)

From the viewpoint of improving printing durability, the specific polymerizable compound may include a compound having an ethylenically unsaturated bond valence of 5.0 mmol/g or more (hereinafter, also called specific polymerizable compound M1).

The ethylenically unsaturated bond valence of the specific polymerizable compound M1 is preferably 5.5 mmol/g or more, and more preferably 6.0 mmol/g or more. The upper limit of the ethylenically unsaturated bond valence of the specific polymerizable compound M1 is, for example, 10.0 mmol/g or less, and more preferably 8.5 mmol/g or less.

In the present disclosure, the ethylenically unsaturated bond valence of a compound is determined by the following method. First, for a predetermined amount (for example, 0.2 g) of sample compound, the structure of the compound is specified using, for example, pyrolysis GC/MS, FT-IR, NMR, TOF-SIMS, and the like, and the total amount (mmol) of ethylenically unsaturated groups is determined. The determined total amount (mmol) of ethylenically unsaturated groups is divided by the amount (g) of the sample compound, thereby calculating the ethylenically unsaturated bond valence of the compound.

The specific polymerizable compound M1 is preferably a compound represented by Formula (I), because such a compound satisfies the C=C valence described above.

$$X—(Y)n \quad \text{Formula (I)}$$

In Formula (I), X represents an n-valent organic group having a hydrogen bonding group, Y represents a monovalent group having 2 or more ethylenically unsaturated groups, n represents an integer of 2 or more, and molecular weight of X/(molecular weight of Y×n) is 1 or less.

The hydrogen bonding group represented by X in Formula (I) is not particularly limited as long as it is a group capable of forming a hydrogen bond. The hydrogen bonding group may be a hydrogen bond donating group or a hydrogen bond accepting group. Examples of the hydrogen bonding group include a hydroxyl group, a carboxy group, an amino group, a carbonyl group, a sulfonyl group, a urethane group, a urea group, an imide group, an amide group, a sulfonamide group, and the like. Particularly, from the viewpoint of on-press developability and printing durability, the hydrogen bonding group preferably includes at least one kind of group selected from the group consisting of a urethane group, a urea group, an imide group, an amide group, and a sulfonamide group, more preferably includes at least one kind of group selected from the group consisting of a urethane group, a urea group, an imide group, and an amide group, even more preferably includes at least one kind of group selected from the group consisting of a urethane group, a urea group, and an imide group, and particularly preferably includes at least one kind of group selected from the group consisting of a urethane group and a urea group.

X in Formula (I) is preferably an organic group that does not have an ethylenically unsaturated bond.

Furthermore, from the viewpoint of on-press developability and printing durability, X in Formula (I) is preferably a group obtained by combining two or more kinds of structures selected from the group consisting of a mono-to n-valent aliphatic hydrocarbon group, a mono to n-valent aromatic hydrocarbon group, a urethane bond, a urea bond, a biuret bond, and an allophanate bond, and more preferably a group obtained by combining two or more kinds of structures selected from the group consisting of a mono- to n-valent aliphatic hydrocarbon group, a mono- to n-valent aromatic hydrocarbon group, a urethane bond, a urea bond, and a biuret bond.

From the viewpoint of on-press developability and printing durability, X in Formula (I) is preferably a group obtained by removing a terminal isocyanate group from a substance prepared by multimerization of a polyfunctional isocyanate compound (including an adduct of a polyfunctional alcohol compound such as trimethylolpropane adduct), more preferably a group obtained by removing a terminal isocyanate group from a substance prepared by multimerization of a difunctional isocyanate compound (including an adduct of a polyfunctional alcohol compound), and particularly preferably a group obtained by removing a terminal isocyanate group from a substance prepared by multimerization of hexamethylene diisocyanate (including an adduct of a polyfunctional alcohol compound).

From the viewpoint of on-press developability and printing durability, the molecular weight of X in Formula (I) is preferably 100 to 1,000, more preferably 150 to 800, and particularly preferably 150 to 500.

The ethylenically unsaturated group represented by Y in Formula (I) is not particularly limited. From the viewpoint of reactivity, on-press developability, and printing durability, the ethylenically unsaturated group is preferably at least one kind of group selected from the group consisting of a vinyl phenyl group, a vinyl ester group, a vinyl ether group, an allyl group, a (meth)acryloxy group, and a (meth)acrylamide group. From the same viewpoint as above, the ethylenically unsaturated group represented by Y in Formula (I) is more preferably at least one kind of group selected from the group consisting of a vinyl phenyl group, a (meth)acryloxy group, and a (meth)acrylamide group, and even more preferably a (meth)acryloxy group. That is, from the viewpoint of on-press developability and printing durability, the ethylenically unsaturated group represented by Y in Formula (I) preferably includes a (meth)acryloxy group.

Y in Formula (I) is preferably a group having 3 or more (meth)acryloxy groups, more preferably a group having 5 or more (meth)acryloxy groups, and even more preferably a group having 5 to 12 (meth)acryloxy groups.

From the viewpoint of on-press developability and printing durability, Y in Formula (I) may have a structure represented by Formula (Y-1) or Formula (Y-2).

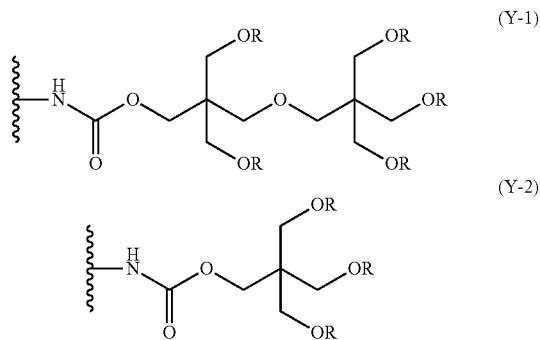

In Formula (Y-1) and Formula (Y-2), R each independently represents an acryloyl group or a methacryloyl group, and the portion of the wavy line represents a binding position with other structures.

It is preferable that all Rs in Formula (Y-1) or Formula (Y-2) be the same group. Furthermore, it is preferable that R in Formula (Y-1) or Formula (Y-2) be an acryloyl group.

It is preferable that all the n pieces of Y in Formula (I) be the same group.

From the viewpoint of on-press developability and printing durability, the molecular weight of Y in Formula (I) is preferably 200 or more and 1,000 or less, and more preferably 250 or more and 800 or less.

n in Formula (I) is an integer of 2 or more. From the viewpoint of on-press developability and printing durability, n is more preferably 2 or 3.

Molecular weight of X/(molecular weight of Y×n) is 1 or less. From the viewpoint of on-press developability and printing durability, the value of the expression is preferably 0.01 to 0.8, and more preferably 0.1 to 0.5.

As the structure of the specific polymerizable compound M1, for example, a structure is preferable which is established by sealing a terminal isocyanate group of a multimerized substance (including an adduct) of a polyfunctional isocyanate compound with a compound having an ethylenically unsaturated group as described above. As the multimerized substance of the polyfunctional isocyanate compound, particularly, a multimerized substance of a difunctional isocyanate compound is preferable.

From the viewpoint of on-press developability and printing durability, the specific polymerizable compound M1 is preferably a compound obtained by reacting a terminal isocyanate group of a multimerized substance prepared by multimerizing a polyfunctional isocyanate compound with a polyfunctional ethylenically unsaturated compound having a hydroxyl group (also called hydroxy group) on a terminal. Furthermore, from the same viewpoint as above, the specific polymerizable compound M1 is more preferably a compound obtained by reacting a terminal isocyanate group of a multimerized substance prepared by multimerizing a difunctional isocyanate compound (including an adduct of a polyfunctional alcohol compound) with a polyfunctional ethylenically unsaturated compound having a hydroxyl group. Furthermore, from the same viewpoint as above, the specific polymerizable compound M1 is particularly preferably a compound obtained by reacting a terminal isocyanate group of a multimerized substance prepared by multimerizing hexamethylene diisocyanate (including an adduct of a polyfunctional alcohol compound) with a polyfunctional ethylenically unsaturated compound having a hydroxyl group.

As the polyfunctional isocyanate compound, known compounds can be used without particular limitation. This compound may be an aliphatic polyfunctional isocyanate compound or an aromatic polyfunctional isocyanate compound. As the polyfunctional isocyanate compound, specifically, for example, 1,3-bis(isocyanatomethyl) cyclohexane, isophorone diisocyanate, trimethylene diisocyanate, tetramethylene diisocyanate, pentamethylene diisocyanate, hexamethylene diisocyanate, 1,3-cyclopentane diisocyanate, 9h-fluorene-2,7-diisocyanate, 9h-fluoren-9-on-2,7-diisocyanate, 4,4'-diphenylmethane diisocyanate, 1,3-phenylene diisocyanate, tolylene-2,4-diisocyanate, tolylene-2,6-diisocyanate, 1,3-bis(isocyanatomethyl) cyclohexane, 2,2-bis(4-isocyanatophenyl) hexafluoropropane, 1,5-diisocyanatonaphthalene, a dimer or trimer (isocyanurate bond) of these polyisocyanates, and the like are preferable. Furthermore, a biuret compound obtained by reacting the above polyisocyanate compound with a known amine compound may also be used.

Furthermore, the polyfunctional ethylenically unsaturated compound having a hydroxyl group is preferably a hydroxyl group-containing ethylenically unsaturated compound having 3 or more functional groups, and more preferably a hydroxyl group-containing ethylenically unsaturated compound having 5 or more functional groups. The aforementioned hydroxyl group-containing polyfunctional ethylenically unsaturated compound is preferably a polyfunctional (meth)acrylate compound having a hydroxyl group.

From the viewpoint of on-press developability and printing durability, the specific polymerizable compound M1 preferably has at least one kind of structure selected from the group consisting of an adduct structure, a biuret structure, and an isocyanurate structure. From the same viewpoint as above, the specific polymerizable compound M1 more preferably has at least one kind of structure selected from the group consisting of a trimethylolpropane adduct structure, a biuret structure, and an isocyanurate structure, and particularly preferably has a trimethylolpropane adduct structure.

From the viewpoint of on-press developability and printing durability, the specific polymerizable compound M1 preferably has a structure represented by any of Formula (A-1) to Formula (A-3), and more preferably has a structure represented by Formula (A-1).

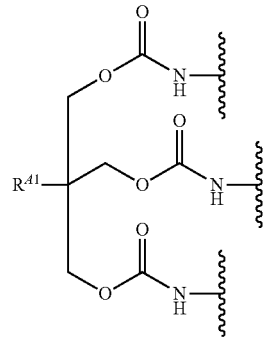

(A-1)

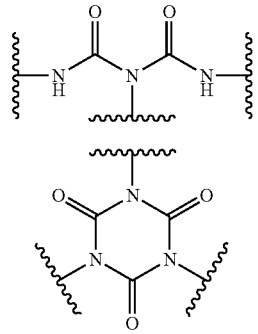

(A-2)

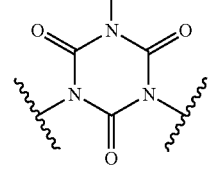

(A-3)

In Formula (A-1), $R^{41}$ represents a hydrogen atom or an alkyl group having 1 to 8 carbon atoms, and the portion of the wavy line represents a binding position with other structures.

From the viewpoint of on-press developability and printing durability, $R^{41}$ in Formula (A-1) is preferably a hydrogen atom or an alkyl group having 1 to 4 carbon atoms, more preferably an alkyl group having 1 to 3 carbon atoms, even more preferably a methyl group or an ethyl group, and particularly preferably an ethyl group.

From the viewpoint of on-press developability and printing durability, the specific polymerizable compound M1 is preferably a (meth)acrylate compound having a urethane group, that is, a urethane (meth)acrylate oligomer.

As long as the specific polymerizable compound M1 has an ethylenically unsaturated bond valence of 5.0 mmol/g or more, the specific polymerizable compound M1 may be an oligomer having a polyester bond (hereinafter, also called polyester (meth)acrylate oligomer) or an oligomer having an epoxy residue (hereinafter, also called epoxy (meth)acrylate oligomer).

The epoxy residue in the epoxy (meth)acrylate oligomer is as described above.

The number of ethylenically unsaturated groups in the polyester (meth)acrylate oligomer as the specific polymerizable compound M1 is preferably 3 or more, and more preferably 6 or more.

The epoxy (meth)acrylate oligomer as the specific polymerizable compound M1 is preferably a compound containing a hydroxyl group. The number of ethylenically unsaturated groups in the epoxy (meth)acrylate oligomer is preferably 2 to 6, and more preferably 2 or 3. The epoxy (meth)acrylate oligomer can be obtained, for example, by reacting a compound having an epoxy group with an acrylic acid.

The molecular weight of the specific polymerizable compound M1 (weight-average molecular weight in a case where the compound has molecular weight distribution) may be more than 1,000, and is preferably 1,100 to 10,000 and more preferably 1,100 to 5,000.

As the specific polymerizable compound M1, a synthetic product or a commercially available product may be used.

Specific examples of the specific polymerizable compound M1 include the following commercially available products. However, the specific polymerizable compound M1 used in the present disclosure is not limited thereto. The number of functional groups (or the average number of functional groups) and C=C valence of the ethylenically unsaturated group are shown in each bracket.

Specific examples of the specific polymerizable compound M1 include urethane (meth)acrylate oligomers such as U-10HA (number of functional groups: 10, C=C valence: 8 mmol/g) and U-15HA (number of functional groups: 15, C=C valence: 6 mmol/g) manufactured by SHIN-NAKAMURA CHEMICAL CO, LTD., UA-510H (number of functional groups: 10, C=C valence: 8 mmol/g) manufactured by KYOEISHA CHEMICAL Co., LTD., KRM8452 (number of functional groups: 10, C=C valence: 7 mmol/g) manufactured by DAICEL-ALLNEX LTD., and CN8885NS (number of functional groups: 9, C=C valence: 6 mmol/g) and CN9013NS (number of functional groups: 9, C=C valence: 6 mmol/g) manufactured by Sartomer Company Inc.

Specific examples of the specific polymerizable compound M1 also include epoxy (meth)acrylate oligomers such as NK OLIGO EA-7420/PGMAc (number of functional groups: 10 to 15, C=C valence: 5 mmol/g) manufactured by SHIN-NAKAMURA CHEMICAL CO, LTD., and CN153 (C=C valence: 5 mmol/g) manufactured by Sartomer Company Inc.

Specific examples of the specific polymerizable compound M1 also include polyester (meth)acrylate oligomers such as CN2267 (C=C valence: 5 mmol/g) manufactured by Sartomer Company Inc.

In a case where the specific polymerizable compound M1 is used, the content of the specific polymerizable compound M1 with respect to the total mass of the specific polymerizable compounds in the image-recording layer is preferably 10% by mass to 100% by mass, more preferably 50% by mass to 100% by mass, and even more preferably 80% by mass to 100% by mass.

The details of how to use the polymerizable compound, such as the structure of the compound, whether the compound is used alone or used in combination with other compounds, and the amount of the compound to be added, can be randomly set.

The content Wm of the specific polymerizable compound with respect to the total mass of the image-recording layer is preferably 5% by mass to 75% by mass, more preferably 10% by mass to 70% by mass, and particularly preferably 15% by mass to 60% by mass.

In a case where the image-recording layer contains a polymerizable compound having 6 or less functional groups, a content Wm2 of the polymerizable compound having 6 or less functional groups with respect to the total mass of the image-recording layer is preferably 10% by mass or less, and more preferably 5% by mass or less.

The ratio of the content Wm of the specific polymerizable compound to the content Wm2 of the polymerizable compound having 6 or less functional groups is preferably Wm:Wm2=4:1 to 1:1, and more preferably Wm:Wm2=3:1 to 1:1.

(Polymerizable Compound M2)

The image-recording layer may contain a polymerizable compound other than the specific polymerizable compound (that is, a polymerizable compound having 6 or less functional groups).

As the polymerizable compound having 6 or less functional groups, known polymerizable compounds used in an image-recording layer of a lithographic printing plate precursor can be used.

For example, the polymerizable compound having 6 or less functional groups may include a compound having one or two ethylenically unsaturated bonding groups (hereinafter, also called polymerizable compound M2).

Preferred aspects of the ethylenically unsaturated group contained in the polymerizable compound M2 are the same as preferred aspects of the ethylenically unsaturated group in the specific polymerizable compound M1.

Furthermore, from the viewpoint of inhibiting the deterioration of on-press developability, the polymerizable compound M2 is preferably a compound having two ethylenically unsaturated bonding groups (that is, a difunctional polymerizable compound).

From the viewpoint of on-press developability and printing durability, the polymerizable compound M2 is preferably a methacrylate compound, that is, a compound having a methacryloxy group.

From the viewpoint of on-press developability, the polymerizable compound M2 preferably has an alkyleneoxy structure or a urethane bond.

The molecular weight of the polymerizable compound M2 (weight-average molecular weight in a case where the compound has molecular weight distribution) is preferably 50 or more and less than 1,000, more preferably 200 to 900, and even more preferably 250 to 800.

Specific examples of the polymerizable compound M2 will be shown below. However, the polymerizable compound M2 used in the present disclosure is not limited thereto. In the following compound (2), for example, n+m=10.

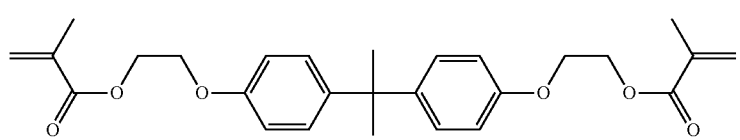

(1)

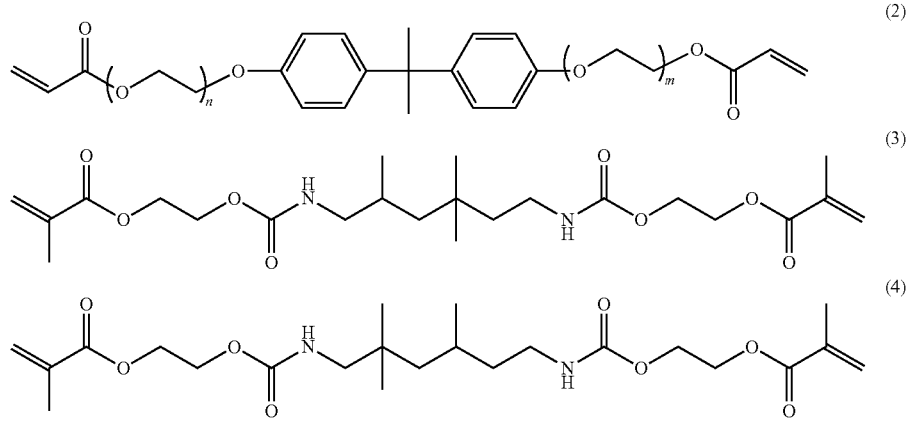

As the polymerizable compound M2, the following commercially available products may be used. However, the polymerizable compound M2 used in the present disclosure is not limited thereto.

Specific examples of the polymerizable compound M2 include ethoxylated bisphenol A dimethacrylate such as BPE-80N (the above compound (1)), BPE-100, BPE-200, and BPE-500 manufactured by SHIN-NAKAMURA CHEMICAL CO, LTD., and CN104 (the above compound (1)) manufactured by Sartomer Company Inc.

Specific examples of the polymerizable compound M2 include ethoxylated bisphenol A diacrylates such as A-BPE-10 (the above compound (2)) and A-BPE-4 manufactured by SHIN-NAKAMURA CHEMICAL CO, LTD.

Furthermore, specific examples of the polymerizable compound M2 include difunctional methacrylate such as FST 510 manufactured by AZ Electronics.

"FST 510" described above is a product of a reaction between 1 mol of 2,2,4-trimethylhexamethylene diisocyanate and 2 mol of hydroxyethyl methacrylate, which is an 82% by mass methyl ethyl ketone solution of the compound (3).

In a case where the polymerizable compound M2 is used, the content of the polymerizable compound M2 with respect to the total mass of the polymerizable compound having 6 or less functional groups in the image-recording layer is preferably 10% by mass to 100% by mass, more preferably 50% by mass to 100% by mass, and even more preferably 80% by mass to 100% by mass.

<<Polymer Having Molecular Weight of 10,000 or More>>

The image-recording layer contains a polymer having a molecular weight of 10,000 or more.

The molecular weight of the polymer is preferably 10,000 to 300,000, and more preferably 10,000 to 100,000.

Furthermore, the polymer used in the image-recording layer may have molecular weight distribution. In a case where a polymer having molecular weight distribution is used, and the weight-average molecular weight (Mw) of the polymer is 10,000 or more, the content of such a polymer is called "content Wp of the polymer" described above. In a case where a polymer has a weight-average molecular weight (Mw) of less than 10,000 and has a polymerizable group (for example, an ethylenically unsaturated bond), such a polymer is regarded as a polymerizable compound.

The polymer contained in the image-recording layer in the lithographic printing plate precursor according to the present disclosure preferably contains a polymer having a constitutional unit formed of an aromatic vinyl compound and a constitutional unit formed of an acrylonitrile compound.

Furthermore, in one of the preferred aspects, the polymer contained in the image-recording layer of the lithographic printing plate precursor according to the present disclosure contains polyvinyl acetal.

Furthermore, in one of the preferred aspects, from the viewpoint of UV printing durability, temporal stability under white light, and on-press developability, the polymer contained in the image-recording layer of the lithographic printing plate precursor according to the present disclosure is partially or totally polymer particles.

[Constitutional Unit Formed of Aromatic Vinyl Compound]

The polymer contained in the image-recording layer of the lithographic printing plate precursor according to the present disclosure preferably has a constitutional unit formed of an aromatic vinyl compound.

The aromatic vinyl compound has no limitations as long as it has a structure composed of an aromatic ring and a vinyl group bonded thereto. Examples of the compound include a styrene compound, a vinylnaphthalene compound, and the like. Among these, a styrene compound is preferable, and styrene is more preferable.

Examples of the styrene compound include styrene, p-methylstyrene, p-methoxystyrene, β-methylstyrene, p-methyl-β-methylstyrene, α-methylstyrene, p-methoxy-β-methylstyrene, and the like. Among these, for example, styrene is preferable.

Examples of the vinylnaphthalene compound include 1-vinylnaphthalene, methyl-1-vinylnaphthalene, β-methyl-1-vinylnaphthalene, 4-methyl-1-vinylnaphthalene, 4-methoxy-1-vinylnaphthalene, and the like. Among these, for example, 1-vinylnaphthalene is preferable.

As the constitutional unit formed of an aromatic vinyl compound, for example, a constitutional unit represented by Formula A1 is preferable.

Formula A1

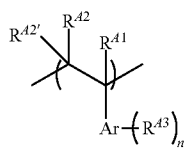

In Formula A1, $R^{A1}$, $R^{A2}$, and $R^{A2'}$ each independently represent a hydrogen atom or an alkyl group, Ar represents an aromatic ring group, $R^{A3}$ represents a substituent, and n represents an integer equal to or less than the maximum number of substituents of Ar.

In Formula A1, $R^{A1}$, $R^{A2}$ and $R^{A2'}$ preferably each independently represent a hydrogen atom or an alkyl group having 1 to 4 carbon atoms, more preferably each independently represent a hydrogen atom or a methyl group, and even more preferably both represent a hydrogen atom.

In Formula A1, Ar is preferably a benzene ring or a naphthalene ring, and more preferably a benzene ring.

In Formula A1, $R^{A3}$ is preferably an alkyl group or an alkoxy group, more preferably an alkyl group having 1 to 4 carbon atoms or an alkoxy group having 1 to 4 carbon atoms, and even more preferably a methyl group or a methoxy group.

In a case where there is a plurality of $R^{A3}$'s in Formula A1, the plurality of $R^{A3}$'s may be the same as or different from each other.

In Formula A1, n is preferably an integer of 0 to 2, more preferably 0 or 1, and even more preferably 0.

In the polymer, the content of the constitutional unit formed of an aromatic vinyl compound with respect to the total mass of the polymer is preferably 10% by mass to 90% by mass, more preferably 20% by mass to 80% by mass, even more preferably 35% by mass to 75% by mass, and particularly preferably 30% by mass to 60% by mass.

[Constitutional Unit Formed of Acrylonitrile Compound]

The polymer contained in the image-recording layer in the lithographic printing plate precursor according to the present disclosure preferably has a constitutional unit formed of an acrylonitrile compound.

Examples of the acrylonitrile compound include (meth)acrylonitrile and the like. Among these, for example, acrylonitrile is preferable.

Preferable examples of the constitutional unit formed of an acrylonitrile compound include a constitutional unit represented by Formula B1.

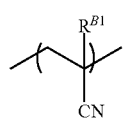

Formula B1

In Formula B1, $R^{B1}$ represents a hydrogen atom or an alkyl group.

In Formula B1, $R^{B1}$ is preferably a hydrogen atom or an alkyl group having 1 to 4 carbon atoms, more preferably a hydrogen atom or a methyl group, and even more preferably a hydrogen atom.

In the polymer, the content of the constitutional unit formed of an acrylonitrile compound with respect to the total mass of the polymer is preferably 10% by mass to 90% by mass, more preferably 20% by mass to 80% by mass, even more preferably 20% by mass to 70% by mass, and particularly preferably 30% by mass to 60% by mass.

—Constitutional Unit Formed of N-Vinyl Heterocyclic Compound—

From the viewpoint of printing durability and chemical resistance, the polymer contained in the image-recording layer of the lithographic printing plate precursor according to the present disclosure preferably further has a constitutional unit formed of a N-vinyl heterocyclic compound.

Examples of the N-vinyl heterocyclic compound include N-vinylpyrrolidone, N-vinylcarbazole, N-vinylpyrrole, N-vinylphenothiazine, N-vinylsuccinic acid imide, N-vinylphthalimide, N-vinylcaprolactam, and N-vinylimidazole. Among these, N-vinylpyrrolidone is preferable.

As the constitutional unit formed of a N-vinyl heterocyclic compound, for example, a constitutional unit represented by Formula C1 is preferable.

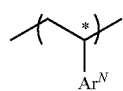

Formula C1

In Formula C1, $Ar^N$ represents a nitrogen atom-containing heterocyclic structure, and the nitrogen atom in $Ar^N$ is bonded to the carbon atom represented by *.

In Formula C1, the heterocyclic structure represented by $Ar^N$ is preferably a pyrrolidone ring, a carbazole ring, a pyrrole ring, a phenothiazine ring, a succinimide ring, a phthalimide ring, a caprolactam ring, or an imidazole ring, and more preferably a pyrrolidone ring.

Furthermore, the heterocyclic structure represented by $Ar^N$ may have a known substituent.

In the polymer, the content of the constitutional unit formed of a N-vinyl heterocyclic compound with respect to the total mass of the polymer is preferably 5% by mass to 40% by mass, and more preferably 10% by mass to 30% by mass.

—Ethylenically Unsaturated Group-Containing Constitutional Unit—

The polymer contained in the image-recording layer in the lithographic printing plate precursor according to the present disclosure may further have an ethylenically unsaturated group-containing constitutional unit.

The ethylenically unsaturated group is not particularly limited, and examples thereof include a vinyl group, an allyl group, a vinylphenyl group, a (meth)acrylamide group, a (meth)acryloyloxy group, and the like. From the viewpoint of reactivity, the ethylenically unsaturated group is preferably a (meth)acryloyloxy group.

The ethylenically unsaturated group-containing constitutional unit can be introduced into the polymer by a polymer reaction or copolymerization. Specifically, the ethylenically unsaturated group-containing constitutional unit can be introduced into the polymer, for example, by a method of reacting a compound (such as glycidyl methacrylate) having an epoxy group or an ethylenically unsaturated group with a polymer into which a constitutional unit having a carboxy group such as methacrylic acid is introduced, a method of reacting a compound (such as 2-isocyanatoethyl methacrylate) having an isocyanate group and an ethylenically unsaturated group with a polymer into which a constitutional unit having an active hydrogen-containing group such as a hydroxyl group is introduced, and the like.

Furthermore, the ethylenically unsaturated group-containing constitutional unit may be introduced into the polymer by a method of reacting a compound having a carboxy group and an ethylenically unsaturated group with a polymer into which a constitutional unit having an epoxy group such as glycidyl (meth)acrylate is introduced.

In addition, the ethylenically unsaturated group-containing constitutional unit may be introduced into the polymer, for example, by using a monomer having a partial structure represented by Formula d1 or Formula d2. Specifically, for example, after polymerization is performed using at least the aforementioned monomer, an ethylenically unsaturated group is formed in the partial structure represented by Formula d1 or Formula d2 by a dissociation reaction using a base compound so that the ethylenically unsaturated group-containing constitutional unit is introduced into the polymer.

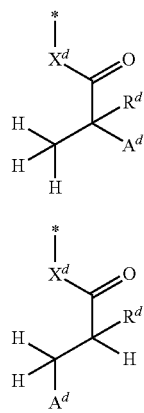

Formula d1

Formula d2

In Formula d1 and Formula d2, $R^d$ represents a hydrogen atom or an alkyl group, $A^d$ represents a halogen atom, $X^d$ represents —O— or —$NR^N$—, $R^N$ represents a hydrogen atom or an alkyl group, and * represents a binding site with other structures.

In Formula d1 and Formula d2, $R^d$ is preferably a hydrogen atom or a methyl group.

In Formula d1 and Formula d2, $A^d$ is preferably a chlorine atom, a bromine atom, or an iodine atom.

In Formula d1 and Formula d2, $X^d$ is preferably —O—. In a case where $X^d$ represents —$NR^N$—, $R^N$ is preferably a hydrogen atom or an alkyl group having 1 to 4 carbon atoms, and more preferably a hydrogen atom.

Examples of the ethylenically unsaturated group-containing constitutional unit include a constitutional unit represented by Formula D1.

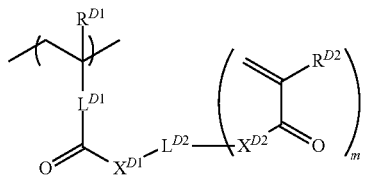

Formula D1

In Formula D1, $L^{D1}$ represents a single bond or a divalent linking group, $L^{D2}$ represents an (m+1)-valent linking group, $X^{D1}$ and $X^{D2}$ each independently represent —O— or —$NR^N$—, $R^N$ represents a hydrogen atom or an alkyl group, $R^{D1}$ and $R^{D2}$ each independently represent a hydrogen atom or a methyl group, and m represents an integer of 1 or more.

In Formula D1, $L^{D1}$ is preferably a single bond. In a case where $L^{D1}$ represents a divalent linking group, an alkylene group, an arylene group, or a divalent group in which two or more of these are bonded is preferable, and an alkylene group having 2 to 10 carbon atoms or a phenylene group is more preferable.

In Formula D1, $L^{D2}$ is preferably a group represented by any of Formula D2 to Formula D6.

In Formula D1, $X^{D1}$ and $X^{D2}$ preferably both represent —O—. In a case where at least one of $X^{D1}$ or $X^{D2}$ represents —$NR^N$—, $R^N$ is preferably a hydrogen atom or an alkyl group having 1 to 4 carbon atoms, and more preferably a hydrogen atom.

In Formula D1, $R^{D1}$ is preferably a methyl group.

In Formula D1, at least one of m pieces of $R^{D2}$ is preferably a methyl group.

In Formula D1, m is preferably an integer of 1 to 4, more preferably 1 or 2, and even more preferably 1.

Formula D2

Formula D3

Formula D4

Formula D5

Formula D6

In Formula D2 to Formula D6, $L^{D3}$ to $L^{D7}$ each represent a divalent linking group, $L^{D5}$ and $L^{D6}$ may be different from each other, * represents a binding site with $X^{D1}$ in Formula D1, and the portion of the wavy line represents a binding site with $X^{D2}$ in Formula D1.

In Formula D3, $L^{D3}$ is preferably an alkylene group, an arylene group, or a group in which two or more of these are bonded, and more preferably an alkylene group having 1 to 10 carbon atoms, a phenylene group, or a group in which two or more of these are bonded.

In Formula D4, $L^{D4}$ is preferably an alkylene group, an arylene group, or a group in which two or more of these are bonded, and more preferably an alkylene group having 1 to 10 carbon atoms, a phenylene group, or a group in which two or more of these are bonded.

In Formula D5, $L^{D5}$ is preferably an alkylene group, an arylene group, or a group in which two or more of these are bonded, and more preferably an alkylene group having 1 to 10 carbon atoms, a phenylene group, or a group in which two or more of these are bonded.

In Formula D5, $L^{D6}$ is preferably an alkylene group, an arylene group, or a group in which two or more of these are bonded, and more preferably an alkylene group having 1 to 10 carbon atoms, a phenylene group, or a group in which two or more of these are bonded.

In Formula D6, $L^{D7}$ is preferably an alkylene group, an arylene group, or a group in which two or more of these are bonded, and more preferably an alkylene group having 1 to 10 carbon atoms, a phenylene group, or a group in which two or more of these are bonded.

Specific examples of the ethylenically unsaturated group-containing constitutional unit will be shown below. However, the ethylenically unsaturated group-containing constitutional unit contained in the polymer is not limited thereto. In the following specific examples, R each independently represents a hydrogen atom or a methyl group.

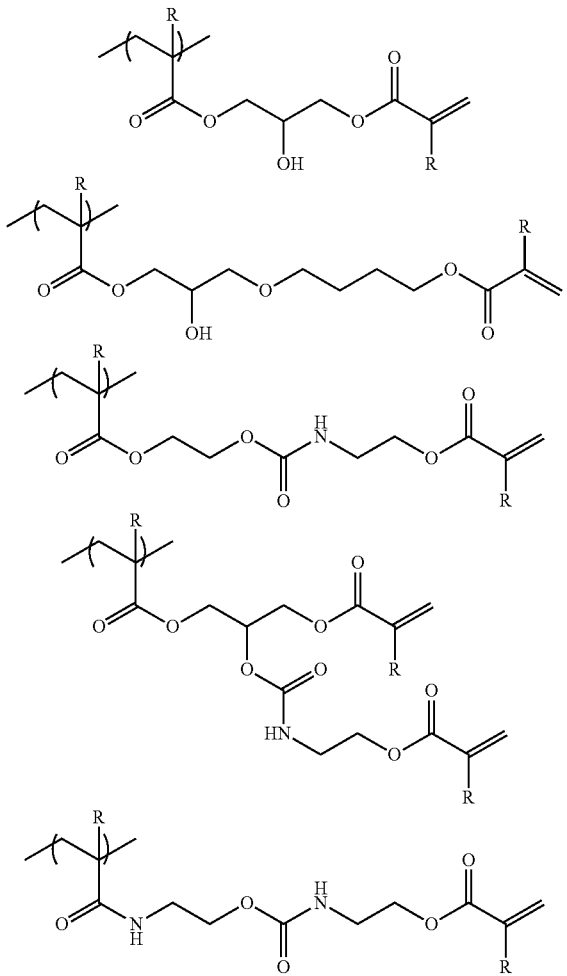

In the polymer, the content of the ethylenically unsaturated group-containing constitutional unit with respect to the total mass of the polymer is preferably 10% by mass to 70% by mass, and more preferably 20% by mass to 50% by mass.

—Acid Group-Containing Constitutional Unit—

The polymer contained in the image-recording layer in the lithographic printing plate precursor according to the present disclosure may contain an acidic group-containing constitutional unit. From the viewpoint of on-press developability and ink receptivity, it is preferable that the polymer do not contain an acidic group-containing constitutional unit.

Specifically, in the polymer, the content of the acidic group-containing constitutional unit is preferably 40% by mass or less, more preferably 35% by mass or less, and even more preferably 30% by mass or less. The lower limit of the content is not particularly limited, and may be 0% by mass.

The acid value of the polymer is preferably 200 mg KOH/g or less, more preferably 180 mg KOH/g or less, and even more preferably 150 mg KOH/g or less. The lower limit of the acid value is not particularly limited, and may be 0 mg KOH/g.

In the present disclosure, the acid value is determined by the measurement method based on JIS K0070: 1992.

—Hydrophobic Group-Containing Constitutional Unit—

From the viewpoint of ink receptivity, the polymer contained in the image-recording layer in the lithographic printing plate precursor according to the present disclosure may contain a hydrophobic group-containing constitutional unit.

Examples of the hydrophobic group include an alkyl group, an aryl group, an aralkyl group, and the like.

As the hydrophobic group-containing constitutional unit, a constitutional unit formed of an alkyl (meth)acrylate compound, an aryl (meth)acrylate compound, or an aralkyl (meth)acrylate compound is preferable, and a constitutional unit formed of an alkyl (meth)acrylate compound is more preferable.

The alkyl group in the alkyl (meth)acrylate compound preferably has 1 to 10 carbon atoms. The alkyl group may be linear or branched or may have a cyclic structure. Examples of the alkyl (meth)acrylate compound include methyl (meth)acrylate, ethyl (meth)acrylate, propyl (meth)acrylate, cyclohexyl (meth)acrylate, 2-ethylhexyl (meth)acrylate, dicyclopentanyl (meth)acrylate, and the like.

The aryl group in the aryl (meth)acrylate compound preferably has 6 to 20 carbon atoms. The aryl group is more preferably a phenyl group. The aryl group may further have a known substituent. As the aryl (meth)acrylate compound, for example, phenyl (meth)acrylate is preferable.

The alkyl group in the aralkyl (meth)acrylate compound preferably has 1 to 10 carbon atoms. The alkyl group may be linear or branched or may have a cyclic structure. The aryl group in the aralkyl (meth)acrylate compound preferably has 6 to 20 carbon atoms. The aryl group is more preferably a phenyl group. As the aralkyl (meth)acrylate compound, for example, benzyl (meth)acrylate is preferable.

In the polymer, the content of the hydrophobic group-containing constitutional unit with respect to the total mass of the polymer is preferably 5% by mass to 50% by mass, and more preferably 10% by mass to 30% by mass.

—Other Constitutional Units—

The polymer contained in the image-recording layer in the lithographic printing plate precursor according to the present disclosure may further contain other constitutional units. The polymer can contain, as those other constitutional units, constitutional units other than the constitutional units described above without particular limitations. Examples thereof include constitutional units formed of an acrylamide compound, a vinyl ether compound, and the like.

Examples of the acrylamide compound include (meth)acrylamide, N-methyl (meth)acrylamide, N-ethyl (meth)acrylamide, N-propyl (meth)acrylamide, N-butyl (meth)acrylamide, N,N'-dimethyl (meth)acrylamide, N,N'-diethyl (meth)acrylamide, N-hydroxyethyl (meth)acrylamide, N-hydroxypropyl (meth)acrylamide, N-hydroxybutyl (meth)acrylamide, and the like.

Examples of the vinyl ether compound include methyl vinyl ether, ethyl vinyl ether, propyl vinyl ether, n-butyl vinyl ether, tert-butyl vinyl ether, 2-ethylhexyl vinyl ether, n-nonyl vinyl ether, lauryl vinyl ether, cyclohexyl vinyl ether, cyclohexyl methyl vinyl ether, 4-methylcyclohexyl methyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxypolyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, phenoxypolyethylene glycol vinyl ether, and the like.

In the polymer, the content of those other constitutional units with respect to the total mass of the polymer is preferably 5% by mass to 50% by mass, and more preferably 10% by mass to 30% by mass.

For example, from the viewpoint of inhibiting on-press developability from deteriorating over time, the glass transition temperature (Tg) of the polymer contained in the image-recording layer in the lithographic printing plate precursor according to the present disclosure is preferably 50° C. or higher, more preferably 70° C. or higher, even more preferably 80° C. or higher, and particularly preferably 90° C. or higher.

Furthermore, from the viewpoint of ease of permeation of water into the image-recording layer, the upper limit of the glass transition temperature of the polymer is preferably 200° C., and more preferably 120° C. or lower.

From the viewpoint of further inhibiting on-press developability from deteriorating over time, as the polymer having the above glass transition temperature, polyvinyl acetal is preferable.

Polyvinyl acetal is a resin obtained by acetalizing hydroxyl groups of polyvinyl alcohol with an aldehyde.

Particularly, polyvinyl butyral is preferable which is obtained by acetalizing (that is, butyralizing) hydroxyl groups of polyvinyl alcohol with butyraldehyde.

The polyvinyl acetal preferably has a constitutional unit represented by the following (a) which is obtained by acetalizing hydroxyl groups of polyvinyl alcohol with an aldehyde.

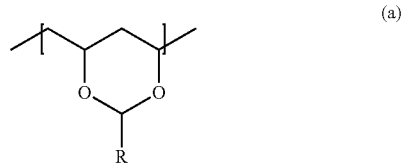

(a)

R represents a residue of aldehyde used for acetalization.

Examples of R include a hydrogen atom, an alkyl group, and an ethylenically unsaturated group which will be described later.

The content of the constitutional unit represented by (a) (also described as the amount of ethylene groups in the main chain contained in the constitutional unit represented by (a), which is also called degree of acetalization) with respect to the total content of constitutional units of the polyvinyl acetal (total amount of ethylene groups in the main chain) is preferably 50 mol % to 90 mol %, more preferably 55 mol % to 85 mol %, and even more preferably 55 mol % to 80 mol %.

The degree of acetalization is a value obtained by dividing the amount of ethylene groups to which acetal groups are bonded (amount of ethylene groups in the main chain contained in the constitutional unit represented by (a)) by the total amount of ethylene groups in the main chain and expressing the thus obtained molar fraction as a percentage.

The same shall be applied to the content of each constitutional unit of polyvinyl acetal which will be described later.

From the viewpoint of improving printing durability, the polyvinyl acetal preferably has an ethylenically unsaturated group.

The ethylenically unsaturated group that the polyvinyl acetal has is not particularly limited. From the viewpoint of reactivity, on-press developability, and printing durability, the ethylenically unsaturated group is preferably at least one kind of group selected from the group consisting of a vinyl phenyl group (styryl group), a vinyl ester group, a vinyl ether group, an allyl group, a (meth)acryloxy group, and a (meth)acrylamide group. Among these, a vinyl group, an allyl group, a (meth)acryloxy group, and the like are more preferable.

From the viewpoint of improving printing durability, the polyvinyl acetal preferably has an ethylenically unsaturated group-containing constitutional unit.

The ethylenically unsaturated group-containing constitutional unit may be the aforementioned constitutional unit having an acetal ring or a constitutional unit other than the constitutional unit having an acetal ring.

Particularly, from the viewpoint of increasing crosslink density during exposure, the polyvinyl acetal is preferably a compound in which an ethylenically unsaturated group is introduced into an acetal ring. That is, it is preferable that the constitutional unit represented by (a) have an ethylenically unsaturated group as R.

In a case where the ethylenically unsaturated group-containing constitutional unit is a constitutional unit other than the constitutional unit having an acetal ring, for example, the ethylenically unsaturated group-containing constitutional unit may be a constitutional unit having an acrylate group, specifically, a constitutional unit represented by (d).

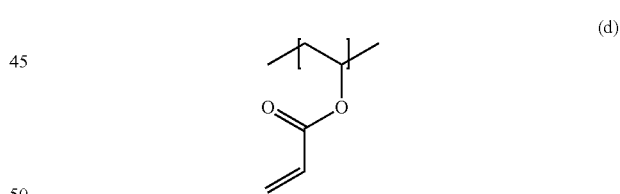

(d)

In a case where the ethylenically unsaturated group-containing constitutional unit is a constitutional unit other than the constitutional unit having an acetal ring, the content of the ethylenically unsaturated group-containing constitutional unit (also called amount of acrylate groups) with respect to the total content of constitutional units of the polyvinyl acetal is preferably 1 mol % to 15 mol %, and more preferably 1 mol % to 10 mol %.

From the viewpoint of on-press developability, the polyvinyl acetal preferably further has a hydroxyl group-containing constitutional unit. That is, the polyvinyl acetal preferably contains a constitutional unit derived from vinyl alcohol.

Examples of the hydroxyl group-containing constitutional unit include a constitutional unit represented by (b).

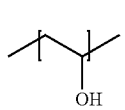

(b)

From the viewpoint of on-press developability, the content of the constitutional unit represented by (b) (also called amount of hydroxyl groups) with respect to the total content of constitutional units of the polyvinyl acetal is preferably 5 mol % to 50 mol %, more preferably 10 mol % to 40 mol %, and even more preferably 20 mol % to 40 mol %.

The polyvinyl acetal may further have other constitutional units.

Examples of those other constitutional units include a constitutional unit having an acetyl group, specifically, a constitutional unit represented by (c).

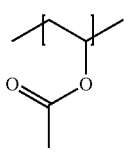

(c)

The content of the constitutional unit represented by (c) (also called amount of acetyl groups) with respect to the total content of constitutional units of the polyvinyl acetal is preferably 0.5 mol % to 10 mol %, more preferably 0.5 mol % to 8 mol %, and even more preferably 1 mol % to 3 mol %.

The degree of acetalization, the amount of acrylate groups, the amount of hydroxyl groups, and the amount of acetyl groups can be determined as follows.

That is, by $^1$H NMR spectroscopy, the content expressed as mol % is calculated from the ratio of peak surface area of protons of a methyl or methylene moiety of acetal, a methyl moiety of an acrylate group, and a methyl moiety of a hydroxyl group and an acetyl group.

The weight-average molecular weight of the polyvinyl acetal is preferably 10,000 to 150,000.

The Hansen solubility parameter (also called SP value) of the polyvinyl acetal is preferably 17.5 MPa$^{1/2}$ to 20.0 MPa$^{1/2}$, and more preferably 18.0 MPa$^{1/2}$ to 19.5 MPa$^{1/2}$.

Furthermore, in the present disclosure, in a case where a compound is an addition polymerization-type polymer, a polycondensation-type polymer, or the like, the SP value of the compound is expressed as the total SP value obtained by multiplying the SP values of monomer units by molar fractions. Furthermore, in a case where a compound is a low-molecular-weight compound having no monomer unit, the SP value is expressed as the total SP value of the compound.

In the present disclosure, the SP value of a polymer may be calculated from the molecular structure of the polymer by the Hoy method described in Polymer Handbook (fourth edition).

Specific examples of the polyvinyl acetal are shown in the following [P-1 to P-3]. However, the polyvinyl acetal used in the present disclosure is not limited thereto.

In the following structures, "1" is 50 mol % to 90 mol %, "m" is 0.5 mol % to 10 mol %, "n" is 5 mol % to 50 mol %, and "o" is 1 mol % to 15 mol %.

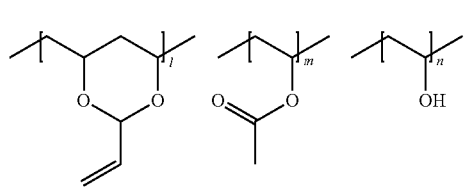

P-1

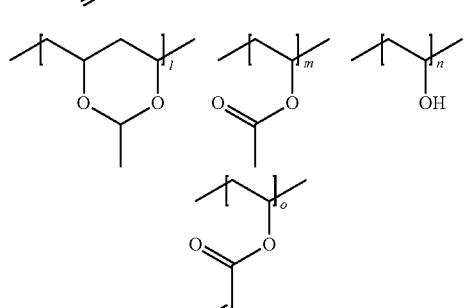

P-2

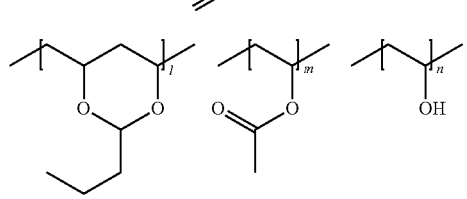

P-3

As the polyvinyl acetal, commercially available products can be used.

Examples of commercially available products of polyvinyl acetal include S-LEC BL series (specifically, S-LEC BL-10, BL-1, BL-5Z, BL-7Z, and the like), S-LEC BM series (specifically, S-LEC BM-1, BM-S(Z), BM-5, and the like), S-LEC BH series (specifically, S-LEC BH-S, BH-6, and BH-3(Z)), S-LEC BX series (S-LEC BX-L and the like), and S-LEC KS series (S-LEC KS-10 and the like) manufactured by SEKISUI CHEMICAL CO., LTD.

In a case where the polymer in the image-recording layer includes polymer particles, from the viewpoint of UV printing durability and on-press developability, the polymer particles preferably have a hydrophilic group.

The hydrophilic group is not particularly limited as long as it has a hydrophilic structure, and examples thereof include an acid group such as a carboxy group, a hydroxyl group, an amino group, a cyano group, a polyalkylene oxide structure, and the like.

Among the above hydrophilic groups, from the viewpoint of UV printing durability and on-press developability, a group having a polyalkylene oxide structure, a group having a polyester structure, or a sulfonic acid group is preferable, a group having a polyalkylene oxide structure or a sulfonic acid group is more preferable, and a group having a polyalkylene oxide structure is even more preferable.

Furthermore, the polymer contained in the polymer particles is preferably an addition polymerization-type resin. From the viewpoint of UV printing durability and on-press developability, the polymer contained in the polymer particles preferably has a constitutional unit formed of an aromatic vinyl compound and a constitutional unit having a cyano group. The polymer is more preferably an addition polymerization-type resin having a constitutional unit formed of an aromatic vinyl compound and a constitutional unit formed of an acrylonitrile compound.

The constitutional unit formed of an aromatic vinyl compound and the constitutional unit formed of an acrylonitrile compound have the same definition as the constitutional unit formed of an aromatic vinyl compound and the constitutional unit formed of an acrylonitrile compound described above, and preferred aspects thereof are also the same.

From the viewpoint of on-press developability, the polyalkylene oxide structure is preferably a polyethylene oxide structure, a polypropylene oxide structure, or a poly(ethylene oxide/propylene oxide) structure.

Furthermore, from the viewpoint of on-press developability and suppressing the occurrence of development residues during on-press development, the polyalkylene oxide structure preferably has a polypropylene oxide structure, and more preferably has a polyethylene oxide structure and a polypropylene oxide structure.

From the viewpoint of on-press developability, the number of alkylene oxide structures in the polyalkylene oxide structure is preferably 2 or more, more preferably 5 or more, even more preferably 5 to 200, and particularly preferably 8 to 150.

Furthermore, from the viewpoint of on-press developability, the polymer particles preferably contain, as a hydrophilic group, a group represented by Formula Z, and more preferably contain a polymer having a group represented by Formula Z. The polymer particles are even more preferably an addition polymerization-type resin having a constitutional unit having a group represented by Formula Z.

-Q-W—Y    Formula Z

In Formula Z, Q represents a divalent linking group, W represents a divalent group having a hydrophilic structure or a divalent group having a hydrophobic structure, Y represents a monovalent group having a hydrophilic structure or a monovalent group having a hydrophobic structure, and any of W or Y has a hydrophilic structure.

Q is preferably a divalent linking group having 1 to 20 carbon atoms, and more preferably a divalent linking group having 1 to 10 carbon atoms.

Furthermore, Q is preferably an alkylene group, an arylene group, an ester bond, an amide bond, or a group formed by combining two or more of these, and more preferably a phenylene group, an ester bond, or an amide bond.

The divalent group having a hydrophilic structure represented by W is preferably a polyalkyleneoxy group or a group in which —CH$_2$CH$_2$NR$^W$— is bonded to one terminal of a polyalkyleneoxy group. R$^W$ represents a hydrogen atom or an alkyl group.

The divalent group having a hydrophobic structure represented by W is preferably —R$^{WA}$—, —O—R$^{WA}$—O—, —R$^W$N—R$^{WA}$—NR$^W$—, —OOC—R$^{WA}$—O—, or —OOC—R$^{WA}$—O—. R$^{WA}$ each independently represents a linear, branched, or cyclic alkylene group having 6 to 120 carbon atoms, a haloalkylene group having 6 to 120 carbon atoms, an arylene group having 6 to 120 carbon atoms, an alkarylene group having 6 to 120 carbon atoms (divalent group formed by removing one hydrogen atom from an alkylaryl group), or an aralkylene group having 6 to 120 carbon atoms. R$^W$ represents a hydrogen atom or an alkyl group.

The monovalent group having a hydrophilic structure represented by Y in Formula Z is preferably OH, COOH, a polyalkyleneoxy group having a hydrogen atom or an alkyl group on a terminal, or a group in which —CH$_2$CH$_2$N(R$^W$)— is bonded to one terminal of a polyalkyleneoxy group having a hydrogen atom or an alkyl group on the other terminal. R$^W$ represents a hydrogen atom or an alkyl group.

The monovalent group having a hydrophobic structure represented by Y in Formula Z is preferably a linear, branched, or cyclic alkyl group having 6 to 120 carbon atoms, a haloalkyl group having 6 to 120 carbon atoms, an aryl group having 6 to 120 carbon atoms, an alkaryl group having 6 to 120 carbon atoms (alkylaryl group), an aralkyl group having 6 to 120 carbon atoms, OR$^{WB}$, COOR$^{WB}$, or OOCR$^{WB}$. R$^{WB}$ represents an alkyl group having 6 to 20 carbon atoms.

From the viewpoint of UV printing durability and on-press developability, in the polymer particles having a group represented by formula Z, W is more preferably a divalent group having a hydrophilic structure, Q is more preferably a phenylene group, an ester bond, or an amide bond, W is more preferably a polyalkyleneoxy group, and Y is more preferably a polyalkyleneoxy group having a hydrogen atom or an alkyl group on a terminal.

From the viewpoint of UV printing durability and on-press developability, the polymer particles are preferably polymers having a constitutional unit represented by Formula (D).

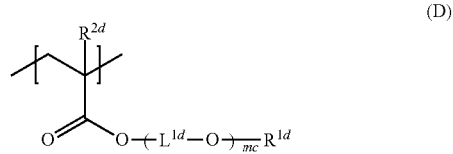

(D)

In Formula D, L$^{1d}$ represents an ethylene group or a propylene group, R$^{1d}$ represents a hydrogen atom, an alkyl group, or an aryl group, R$^{2d}$ represents a hydrogen atom or a methyl group, and mc represents an integer of 2 to 200.

L$^{1d}$ is preferably an ethylene group or a 1,2-propylene group.

R$^{1d}$ is preferably a hydrogen atom or an alkyl group having 1 to 4 carbon atoms or a phenyl group, more preferably a hydrogen atom or an alkyl group having 1 to 4 carbon atoms, and even more preferably a hydrogen atom or a methyl group.

mc is preferably an integer of 2 to 200, more preferably an integer of 2 to 100, and even more preferably an integer of 2 to 50.

Specifically, preferable examples of the hydrophilic group-containing constitutional unit include constitutional units represented by Formula D-1 or D-2. However, it goes without saying that the hydrophilic group-containing constitutional unit is not limited thereto.

nc represents an integer of 2 or more, and is preferably an integer of 2 to 200.

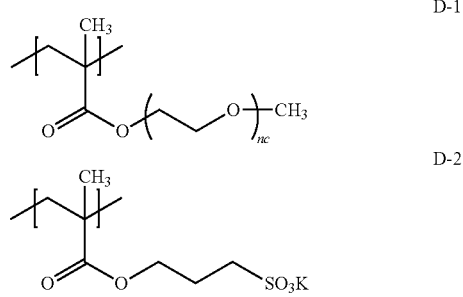

D-1

D-2

From the viewpoint of on-press developability, the content of the hydrophilic group-containing constitutional unit with respect to the total mass of the polymer contained in the polymer particles is preferably 1% by mass or more and less than 20% by mass, more preferably 1% by mass to 18% by mass, and particularly preferably 2% by mass to 15% by mass.

One kind of hydrophilic group-containing constitutional unit may be used alone, or two or more kinds of hydrophilic group-containing constitutional units may be used.

The molecular weight (Mw) of the polymer contained in the polymer particles is not particularly limited. Mw of the polymer is 10,000 or more, and more preferably 10,000 to 2,000,000.

From the viewpoint of UV printing durability, the content of the polymer contained in the polymer particles with respect to the total mass of the polymer particles is preferably 50% by mass or more, more preferably 60% by mass or more, and particularly preferably 70% by mass to 100% by mass. The polymer particles may contain only one kind of polymer or two or more kinds of polymers described above.

The polymer particles may include particles selected from the group consisting of thermoplastic polymer particles, thermally reactive polymer particles, polymer particles having a polymerizable group, microcapsules encapsulating a hydrophobic compound, and microgel (crosslinked polymer particles). Among these, from the viewpoint of UV printing durability, polymer particles having a polymerizable group or microgel is preferable. In a particularly preferable embodiment, the polymer particles have at least one ethylenically unsaturated polymerizable group. The presence of such polymer particles brings about effects of improving the printing durability of an exposed portion and improving the on-press developability of a non-exposed portion.

Furthermore, the polymer particles are preferably thermoplastic polymer particles.

As the thermoplastic polymer particles, the thermoplastic polymer particles described in Research Disclosure No. 33303 published in January 1992, JP1997-123387A (JP-H09-123387A), JP1997-131850A (JP-H09-131850A), JP1997-171249A (JP-H09-171249A), JP1997-171250A (JP-H09-171250A), EP931647B, and the like are preferable.

Specific examples of polymers constituting the thermoplastic polymer particles include homopolymers or copolymers of monomers of ethylene, styrene, vinyl chloride, methyl acrylate, ethyl acrylate, methyl methacrylate, ethyl methacrylate, vinylidene chloride, acrylonitrile, vinylcarbazole, acrylates or methacrylates having polyalkylene structures, and the like and mixtures of these. For example, copolymers having polystyrene, styrene, and acrylonitrile or polymethyl methacrylate are preferable. The average particle diameter of the thermoplastic polymer particle is preferably 0.01 μm to 3.0 μm.

Examples of the thermally reactive polymer particles include polymer particles having a thermally reactive group. The thermally reactive polymer particles form a hydrophobilized region through crosslinking by a thermal reaction and the accompanying change in functional groups.

The thermally reactive group in the polymer particles having a thermally reactive group may be a functional group that causes any reaction as long as chemical bonds are formed. The thermally reactive group is preferably a polymerizable group. As the polymerizable group, for example, an ethylenically unsaturated group that causes a radical polymerization reaction (for example, an acryloyl group, a methacryloyl group, a vinyl group, an allyl group, and the like), a cationically polymerizable group (for example, a vinyl group, a vinyloxy group, an epoxy group, an oxetanyl group, and the like), an isocyanate group or a blocked isocyanate group that causes an addition reaction, an epoxy group, a vinyloxy group, an active hydrogen atom-containing functional group that is a reaction partner thereof (for example, an amino group, a hydroxyl group, a carboxy group, and the like), a carboxy group that causes a condensation reaction, a hydroxyl group or an amino group that is a reaction partner of the carboxy group, an acid anhydride that causes a ring-opening addition reaction, an amino group or a hydroxyl group which is a reaction partner of the acid anhydride, and the like are preferable.

Examples of the microcapsules include microcapsules encapsulating at least some of the constituent components of the image-recording layer as described in JP2001-277740A and JP2001-277742A. The constituent components of the image-recording layer can also be incorporated into the exterior of the microcapsules. In a preferred aspect, the image-recording layer containing microcapsules is composed so that hydrophobic constituent components are encapsulated in the microcapsules and hydrophilic constituent components are incorporated into the exterior of the microcapsules.

The microgel (crosslinked polymer particles) can contain some of the constituent components of the image-recording layer, in at least one of the surface or the interior of the microgel. From the viewpoint of sensitivity of the lithographic printing plate precursor to be obtained and printing durability of the lithographic printing plate to be obtained, reactive microgel having a radically polymerizable group on the surface thereof is particularly preferable.

In order to encapsulate the constituent components of the image-recording layer in microcapsules or microgel, known methods can be used.

As the polymer particles, from the viewpoint of printing durability, antifouling properties, and storage stability of the lithographic printing plate to be obtained, polymer particles are preferable which are obtained by a reaction between a polyvalent isocyanate compound that is an adduct of a polyhydric phenol compound having two or more hydroxyl groups in a molecule and isophorone diisocyanate and a compound having active hydrogen.

As the polyhydric phenol compound, a compound having a plurality of benzene rings having a phenolic hydroxyl group is preferable.

As the compound having active hydrogen, a polyol compound or a polyamine compound is preferable, a polyol compound is more preferable, and at least one kind of compound selected from the group consisting of propylene glycol, glycerin, and trimethylol propane is even more preferable.

As resin particles obtained by the reaction between a polyvalent isocyanate compound that is an adduct of a polyhydric phenol compound having two or more hydroxyl groups in a molecule and isophorone diisocyanate and a compound having active hydrogen, for example, the polymer particles described in paragraphs "0032" to "0095" of JP2012-206495A are preferable.

Furthermore, from the viewpoint of printing durability and solvent resistance of the lithographic printing plate to be obtained, the polymer particles preferably have a hydrophobic main chain and include both i) constitutional unit having a pendant cyano group directly bonded to the hydrophobic main chain and ii) constitutional unit having a pendant group including a hydrophilic polyalkylene oxide segment.

As the hydrophobic main chain, for example, an acrylic resin chain is preferable.

As the pendant cyano group, for example, —[CH$_2$CH(C≡N)—] or —[CHC(CH$_3$)(C≡N)—] is preferable.

In addition, the constitutional unit having the pendant cyano group can be easily derived from an ethylenically unsaturated monomer, for example, acrylonitrile, or methacrylonitrile, or a combination of these.

Furthermore, as an alkylene oxide in the hydrophilic polyalkylene oxide segment, ethylene oxide or a propylene oxide is preferable, and ethylene oxide is more preferable.

The number of repeating alkylene oxide structures in the hydrophilic polyalkylene oxide segment is preferably 10 to 100, more preferably 25 to 75, and even more preferably 40 to 50.

As the resin particles having a hydrophobic main chain and including both i) constitutional unit having the pendant cyano group directly bonded to the hydrophobic main chain and ii) constitutional unit having a pendant group including the hydrophilic polyalkylene oxide segment, for example, the particles described in paragraphs "0039" to "0068" of JP2008-503365A are preferable.

From the viewpoint of printing durability, the aforementioned polymer preferably includes polymer particles having a polymerizable group, and more preferably includes polymer particles having a polymerizable group on the particle surface.

The polymerizable group may be a cationically polymerizable group or a radically polymerizable group. From the viewpoint of reactivity, the polymerizable group is preferably a radically polymerizable group.

The aforementioned polymerizable group is not particularly limited as long as it is a polymerizable group. From the viewpoint of reactivity, an ethylenically unsaturated group is preferable, a vinylphenyl group (styryl group), a (meth)acryloxy group, or a (meth)acrylamide group is more preferable, and a (meth)acryloxy group is particularly preferable.

In addition, the polymer in the polymer particles having a polymerizable group preferably has a constitutional unit having a polymerizable group.

The polymerizable group may be introduced into the surface of the polymer particles by a polymer reaction.

Furthermore, from the viewpoint of printing durability, receptivity, temporal stability under white light, on-press developability, and suppressing development residues during on-press development, the polymer particles preferably contain a resin having a urea bond, more preferably contain a resin having a structure obtained by reacting at least an isocyanate compound represented by Formula (Iso) with water, and particularly preferably contain a resin that has a structure obtained by reacting at least an isocyanate compound represented by Formula (Iso) with water and has a polyethylene oxide structure and a polypropylene oxide structure as polyalkylene oxide structures. Furthermore, the particles containing the resin having a urea bond are preferably microgel.

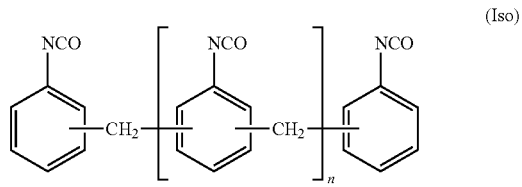

(Iso)

In Formula (Iso), n represents an integer of 0 to 10.

An example of the reaction between the isocyanate compound represented by Formula (Iso) and water is the reaction shown below. In the following example, a 4,4-isomer in which n=0 is used.

As shown below, in a case where the isocyanate compound represented by Formula (Iso) is reacted with water, the isocyanate group is partially hydrolyzed by water and generates an amino group. The generated amino group reacts with the isocyanate group and generates a urea bond, and a dimer is consequently formed. Furthermore, the following reaction is repeated to form a resin having a urea bond.

In the following reaction, by adding a compound (compound having active hydrogen) such as an alcohol compound or an amine compound reactive with an isocyanate group, it is possible to introduce the structure of an alcohol compound, an amine compound, or the like to the resin having a urea bond.

As the compound having active hydrogen, for example, the compounds described above regarding the microgel are preferable.

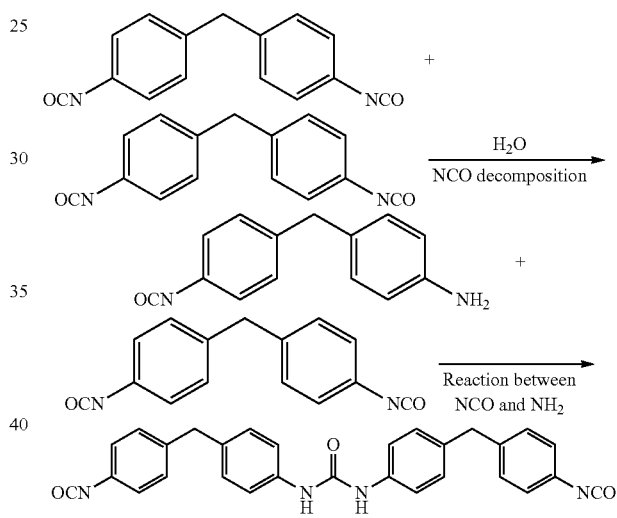

The resin having a urea bond preferably has an ethylenically unsaturated group, and more preferably has a group represented by Formula (PETA).

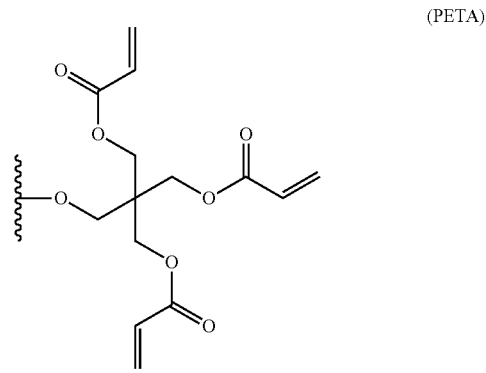 [SMILES: *OCC(COC(=O)C=C)(COC(=O)C=C)COC(=O)C=C]

(PETA)

In Formula (PETA), the portion of the wavy line represents a binding position with other structures.

The particle diameter of the above polymer particles is preferably 0.01 µm to 3.0 µm, more preferably 0.03 µm to 2.0 µm, and even more preferably 0.10 µm to 1.0 µm. In a case where the particle diameter is in this range, excellent resolution and temporal stability are obtained.

In the present disclosure, the average primary particle diameter of the polymer particles is measured using a light scattering method or by capturing an electron micrograph of the polymer particles, measuring the particle diameter of a total of 5,000 polymer particles in the photograph, and calculating the average thereof. For non-spherical particles, the value of particle diameter of spherical particles having the same area as the area of the particles on the photograph is adopted as the particle diameter.

Note that unless otherwise specified, the average particle diameter in the present disclosure means a volume average particle diameter.

The image-recording layer may contain only one kind of polymer having a molecular weight of 10,000 or more or two or more kinds of such polymers.

Furthermore, the image-recording layer may contain, as the polymer having a molecular weight of 10,000 or more, only one kind of particles (preferably polymer particles) or two or more particles.

<<Wp/Wm>>

The ratio Wp/Wm of the content Wp of the polymer having a molecular weight of 10,000 or more to the content Wm of the polymerizable compound having 7 or more functional groups is 1.00 or less.

The lower limit of Wp/Wm is not particularly limited, but is preferably 0 or more. In a case where Wp/Wm is 0, this means that the image-recording layer does not contain a polymer having a molecular weight of 10,000 or more. That is, the polymer having a molecular weight of 10,000 or more in the image-recording layer may be an optional component.

In the image-recording layer, in a case where the ratio of the content of the polymer having a molecular weight of 10,000 or more to the content of the polymerizable compound having 7 or more functional groups is 1.00 or less, under the condition where there are few polymerization initiation species, the polymer having a molecular weight higher than that of the polymerizable compound having 7 or more functional groups is suppressed from causing polymerization of the polymerizable compound in the image-recording layer. Presumably, as a result, in the image-recording layer under the condition where there are few polymerization initiation species, the formation of a three-dimensional crosslink may be suppressed, and developability is unlikely to deteriorate, which may result in excellent temporal stability under white light.

From the viewpoint described above, Wp/Wm is preferably 0.8 or less, more preferably 0.7 or less, and even more preferably 0.5 or less.

—Content Wp—

From the viewpoint of UV printing durability and temporal stability under white light, in the image-recording layer, the content of the polymer having a molecular weight of 10,000 or more is preferably 0% or the content Wp of such a polymer with respect to the total mass of the image-recording layer is preferably more than 0% by mass and 35% by mass or less.

For the same reason as described above, in the image-recording layer, the content of the polymer having a molecular weight of 10,000 or more is more preferably 0%, or the content Wp of such a polymer with respect to the total mass of the image-recording layer is more preferably more than 0% by mass and 20% by mass or less. It is even more preferable that the content of the polymer having a molecular weight of 10,000 or more be 0%, or the content Wp of such a polymer with respect to the total mass of the image-recording layer is even more preferably more than 0% by mass and 10% by mass or less.

—Binder Polymer—

The image-recording layer may contain a binder polymer. However, from the viewpoint of on-press developability and UV printing durability, it is preferable that the image-recording layer do not contain a binder polymer. The binder polymer is a polymer which is not the polymer having a molecular weight of 10,000 or more and not in the form of particles. That is, the binder polymer does not correspond to the aforementioned polymer having a molecular weight of 10,000 or more and the aforementioned polymer particles.

The binder polymer is preferably a (meth)acrylic resin, a polyvinyl acetal resin, or a polyurethane resin.

Among these, as the binder polymer, known binder polymers that can be used in an image-recording layer in lithographic printing plate precursors can be suitably used. As an example, a binder polymer that is used for an on-press development-type lithographic printing plate precursor (hereinafter, also called binder polymer for on-press development) will be specifically described.

As the binder polymer for on-press development, a binder polymer having an alkylene oxide chain is preferable. The binder polymer having an alkylene oxide chain may have a poly(alkylene oxide) moiety in a main chain or side chain. In addition, the binder polymer may be a graft polymer having poly(alkylene oxide) in a side chain or a block copolymer of a block constituted with a poly(alkylene oxide)-containing repeating unit and a block constituted with an (alkylene oxide)-free repeating unit.

As a binder polymer having a poly(alkylene oxide) moiety in the main chain, a polyurethane resin is preferable. In a case where the binder polymer has a poly(alkylene oxide) moiety in the side chain, examples of polymers include a (meth)acrylic resin, a polyvinyl acetal resin, a polyurethane resin, a polyurea resin, a polyimide resin, a polyamide resin, an epoxy resin, a polystyrene resin, a novolac-type phenol resin, a polyester resin, synthetic rubber, and natural rubber. Among these, a (meth)acrylic resin is particularly preferable.

In addition, as the binder polymer, for example, a polymer compound is also preferable which has a polyfunctional thiol having 6 or more and 10 or less functional groups as a nucleus and a polymer chain that is bonded to the nucleus by a sulfide bond and has a polymerizable group (hereinafter, this compound will be also called star-shaped polymer compound). As the star-shaped polymer compound, for example, the compounds described in JP2012-148555A can be preferably used.

Examples of the star-shaped polymer compound include the compound described in JP2008-195018A that has a polymerizable group such as an ethylenically unsaturated bond for improving the film hardness of an image area in a main chain or side chain and preferably in a side chain. The polymerizable group forms a crosslink between polymer molecules, which facilitates curing.

As the polymerizable group, an ethylenically unsaturated group such as a (meth)acryloyl group, a vinyl group, an allyl group, or a styryl group, an epoxy group, or the like is preferable, a (meth)acryloyl group, a vinyl group, or a styryl group is more preferable from the viewpoint of polymerization reactivity, and a (meth)acryloyl group is particularly preferable. These groups can be introduced into the polymer by a polymer reaction or copolymerization. For example, it is possible to use a reaction between a polymer having a carboxy group in a side chain and glycidyl methacrylate or a reaction between a polymer having an epoxy group and an ethylenically unsaturated group-containing carboxylic acid such as methacrylic acid. These groups may be used in combination.

The molecular weight of the binder polymer that is a weight-average molecular weight (Mw) expressed in terms of polystyrene by GPC is preferably 2,000 or more, and more preferably 5,000 or more. The upper limit of the molecular weight of the binder polymer may be less than 10,000 in terms of weight-average molecular weight.

If necessary, a hydrophilic polymer such as polyacrylic acid or polyvinyl alcohol described in JP2008-195018A can be used in combination. In addition, a lipophilic polymer and a hydrophilic polymer can be used in combination.

In the image-recording layer used in the present disclosure, one kind of binder polymer may be used alone, or two or more kinds of binder polymers may be used in combination.

The amount of the binder polymer to be incorporated into the image-recording layer can be randomly set. From the viewpoint of on-press developability, and UV printing durability, in the image-recording layer, the content of the binder polymer is preferably 0% or more than 0% by mass and 35% by mass or less with respect to the total mass of the image-recording layer, more preferably 0% or more than 0% by mass and 20% by mass or less with respect to the total mass of the image-recording layer, even more preferably 0% or more than 0% by mass and 10% by mass or less with respect to the total mass of the image-recording layer, particularly preferably 0% or more than 0% by mass and 5% by mass or less with respect to the total mass of the image-recording layer, and most preferably 0%.

—Polymer Manufacturing Method—

The method for manufacturing the polymer contained in the image-recording layer is not particularly limited. The polymer can be manufactured by known methods.

For example, the polymer is obtained by polymerizing a styrene compound, an acrylonitrile compound, and at least one kind of optional compound selected from the group consisting of the aforementioned N-vinyl heterocyclic compound, a compound used for forming the aforementioned ethylenically unsaturated group-containing constitutional unit, a compound used for forming the aforementioned acidic group-containing constitutional unit, a compound used for forming the aforementioned hydrophobic group-containing constitutional unit, and a compound used for forming the aforementioned other constitutional units by known methods.

Specific Examples

Specific examples of the polymer having a molecular weight of 10,000 or more will be shown below. However, the polymer used in the lithographic printing plate precursor according to the present disclosure is not limited thereto.

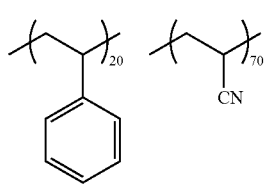

RR-1

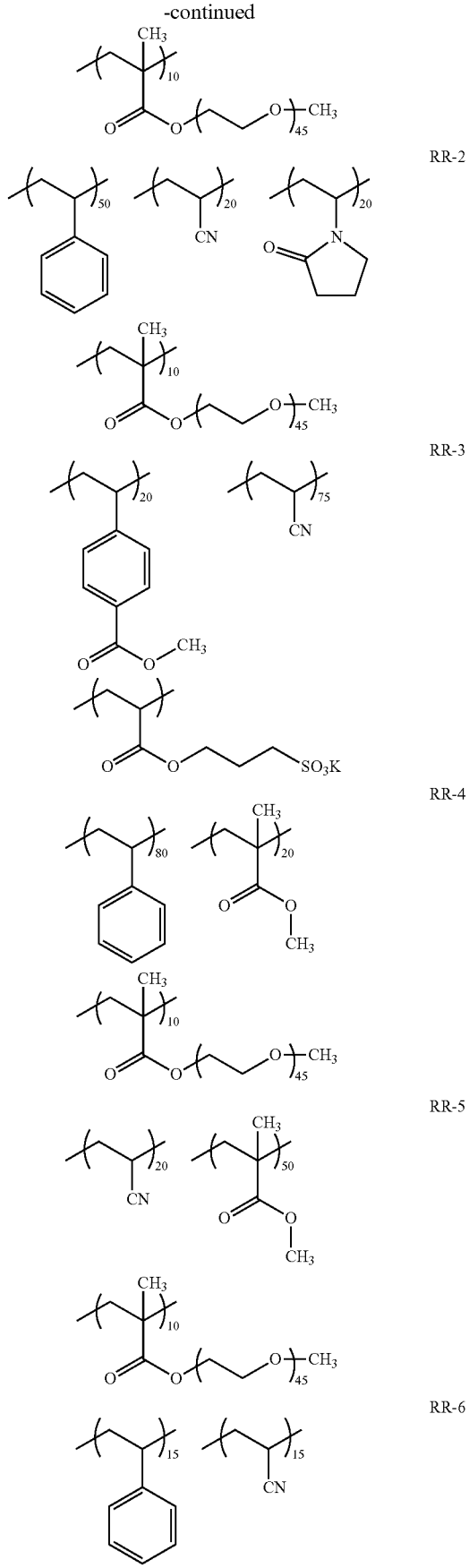

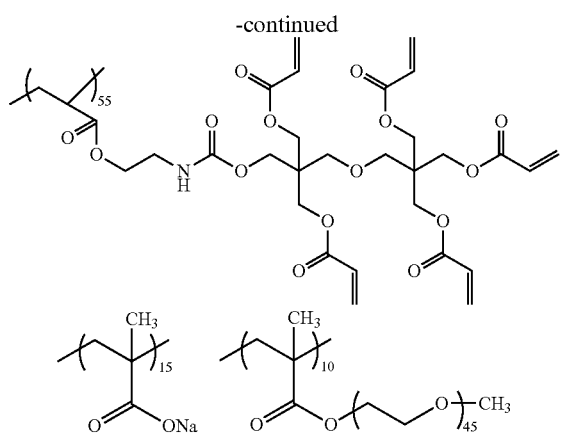

—Color Developing Agent—

From the viewpoint of visibility, the image-recording layer preferably contains a color developing agent, and more preferably contains an acid color-developing agent. Furthermore, the color developing agent preferably includes a leuco compound.

"Color developing agent" used in the present disclosure means a compound that has a property of developing or removing color by a stimulus such as light or an acid and thus changing the color of the image-recording layer. Furthermore, "acid color-developing agent" means a compound having a property of developing or removing color by being heated in a state of accepting an electron accepting compound (for example, a proton of an acid or the like) and thus changing the color of the image-recording layer. The acid color-developing agent is particularly preferably a colorless compound which has a partial skeleton such as lactone, lactam, sultone, spiropyran, an ester, or an amide and allows such a partial skeleton to rapidly open the ring or to be cleaved when coming into contact with an electron accepting compound.

Examples of such an acid color-developing agent include phthalides such as 3,3-bis(4-dimethylaminophenyl)-6-dimethylaminophthalide (called "crystal violet lactone"), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-6-dimethylaminophthalide, 3,3-bis(2-phenylindol-3-yl)-6-dimethylaminophthalide, 3-(4-dimethylaminophenyl)-3-(1-methylpyrrol-3-yl)-6-dimethylaminophthalide, 3,3-bis[1,1-bis(4-dimethylaminophenyl)ethylen-2-yl]-4,5,6,7-tetrachlorophthalide, 3,3-bis[1,1-bis(4-pyrrolidinophenyl)ethylen-2-yl]-4,5,6,7-tetrabromophthalide, 3,3-bis[1-(4-dimethylaminophenyl)-1-(4-methoxyphenyl)ethylen-2-yl]-4,5,6,7-tetrachlorophthalide, 3,3-bis[1-(4-pyrrolidinophenyl)-1-(4-methoxyphenyl)ethylen-2-yl]-4,5,6,7-tetrachlorophthalide, 3-[1,1-di(1-ethyl-2-methylindol-3-yl)ethylen-2-yl]-3-(4-diethylaminophenyl)phthalide, 3-[1,1-di(1-ethyl-2-methylindol-3-yl)ethylen-2-yl]-3-(4-N-ethyl-N-phenylaminophenyl)phthalide, 3-(2-ethoxy-4-diethylaminophenyl)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, 4,4-bis-dimethylaminobenzhydrinbenzyl ether, N-halophenyl-leucoauramine, N-2,4,5-trichlorophenylleucoauramine, rhodamine-B-anilinolactam, rhodamine-(4-nitroanilino)lactam, rhodamine-B-(4-chloroanilino)lactam, 3,7-bis(diethylamino)-10-benzoylphenoxazine, benzoyl leucomethylene blue, 4-nitrobenzoyl methylene blue, fluorans such as 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexylaminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-diethylamino-7-(3'-trifluoromethylphenylamino)fluoran, 3-di-n-butylamino-7-(2'-fluorophenylamino)fluoran, 3-di-n-butylamino-7-(2'-chlorophenylamino)fluoran, 3-N-isopentyl-N-ethylamino-7-(2'-chlorophenylamino)fluoran, 3-N-n-hexyl-N-ethylamino-7-(2'-chlorophenylamino) fluoran, 3-diethylamino-6-chloro-7-anilinofluoran, 3-di-n-butylamino-6-chloro-7-anilinofluoran, 3-diethylamino-6-methoxy-7-anilinofluoran, 3-di-n-butylamino-6-ethoxy-7-anilinofluoran, 3-pyrrolidino-6-methyl-7-anilinofluoran, 3-piperidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methylamino-6-methyl-7-anilinofluoran, 3-N-n-propyl-N-methylamino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-methylamino-6-methyl-7-anilinofluoran, 3-N-isobutyl-N-ethylamino-6-methyl-7-anilinofluoran, 3-N-isopentyl-N-ethylamino-6-methyl-7-anilinofluoran, 3-N-n-hexyl-N-methylamino-6-methyl-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-methylamino-6-methyl-7-anilinofluoran, 3-N-(3'-ethoxypropyl)-N-ethylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-ethyl-7-anilinofluoran, 3-diethylamino-6-methyl-7-(3'-methylphenylamino)fluoran, 3-diethylamino-6-methyl-7-(2',6'-dimethylphenylamino)fluoran, 3-di-n-butylamino-6-methyl-7-(2',6'-dimethylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl]

propane, 3-[4'-(4-phenylaminophenyl)aminophenyl]amino-6-methyl-7-chlorofluoran, and 3-[4'-(dimethylaminophenyl)]amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di-n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-diethylaminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-diethylaminophenyl)-3-(1-ethyl-2-phenylindol-3-yl)-4 or 7-azaphthalide 3-methyl-spiro-dinaphthopyran, 3-ethyl-spiro-dinaphthopyran, 3-phenyl-spiro-dinaphthopyran, 3-benzyl-spiro-dinaphthopyran, 3-methyl-naphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide, 2'-anilino-6'-(N-ethyl-N-isopentyl)amino-3'-methylspiro[isobenzofuran-1(3H),9'-(9H)xanthen-3-one, 2'-anilino-6'-(N-ethyl-N-(4-methylphenyl))amino-3'-methylspiro[isobenzofuran-1(3H),9'-(9H)xanthen]-3-one, 3'-N,N-dibenzylamino-6'-N,N-diethylaminospiro[isobenzofuran-1(3H),9'-(9H)xanthen]-3-one, 2'-(N-methyl-N-phenyl)amino-6'-(N-ethyl-N-(4-methylphenyl))aminospiro[isobenzofuran-1(3H),9'-(9H)xanthen]-3-one, and the like.

Particularly, from the viewpoint of color developability, the color developing agent used in the present disclosure is preferably at least one kind of compound selected from the group consisting of a spiropyran compound, a spirooxazine compound, a spirolactone compound, and a spirolactam compound.

From the viewpoint of visibility, the hue of the colorant after color development is preferably green, blue, or black.

Furthermore, from the viewpoint of color developability and visibility of exposed portions, the acid color-developing agent is preferably a leuco colorant.

The leuco colorant is not particularly limited as long as it has a leuco structure. The leuco colorant preferably has a spiro structure, and more preferably has a spirolactone ring structure.

From the viewpoint of color developability and visibility of exposed portions, the leuco colorant is preferably a leuco colorant having a phthalide structure or a fluoran structure.

Furthermore, from the viewpoint of color developability and visibility of exposed portions, the leuco colorant having a phthalide structure or a fluoran structure is preferably a compound represented by any of Formula (Le-1) to Formula (Le-3), and more preferably a compound represented by Formula (Le-2).

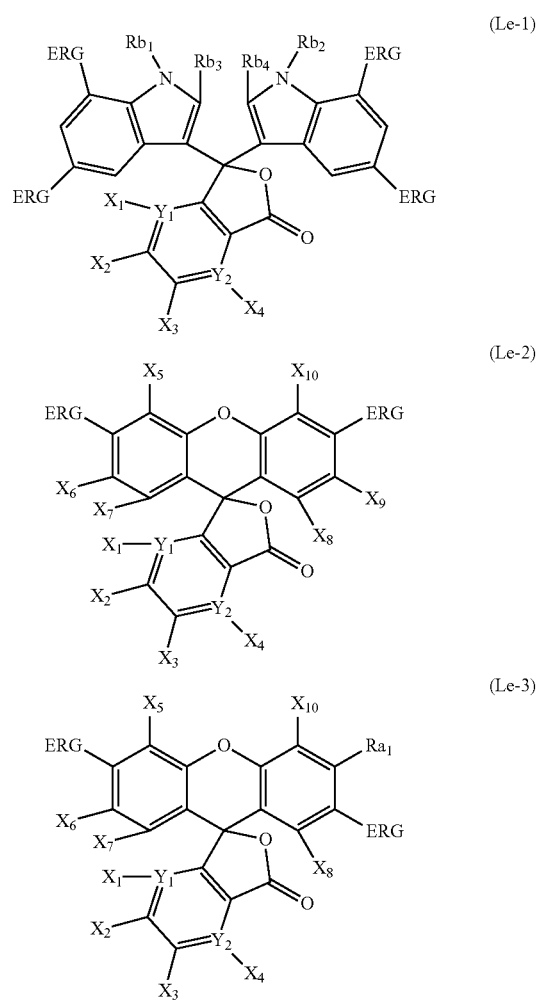

In Formula (Le-1) to Formula (Le-3), ERG each independently represents an electron donating group, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

As the electron donating groups represented by ERG in Formula (Le-1) to Formula (Le-3), from the viewpoint of color developability and visibility of exposed portions, an amino group, an alkylamino group, an arylamino group, a dialkylamino group, a monoalkyl monoarylamino group, a diarylamino group, an alkoxy group, an aryloxy group or an alkyl group is preferable, an amino group, alkylamino group, arylamino group, dialkylamino group, monoalkyl monoarylamino group, diarylamino group, alkoxy group, or an aryloxy group is more preferable, a monoalkyl monoarylamino group or a diarylamino group is even more preferable, and a monoalkyl monoarylamino group is particularly preferable.

From the viewpoint of color developability and visibility of exposed portions, $X_1$ to $X_4$ in Formula (Le-1) to Formula (Le-3) preferably each independently represent a hydrogen atom or a chlorine atom, and more preferably each independently represent a hydrogen atom.

From the viewpoint of color developability and visibility of exposed portions, $X_5$ to $X_{10}$ in Formula (Le-2) or Formula (Le-3) preferably each independently represent a hydrogen atom, a halogen atom, an alkyl group, an aryl group, an amino group, an alkylamino group, an arylamino group, a dialkylamino group, a monoalkyl monoarylamino group, a diarylamino group, a hydroxyl group, an alkoxy group, an aryloxy group, an acyl group, an alkoxycarbonyl group, an aryloxycarbonyl group, or an cyano group, more preferably each independently represent a hydrogen atom, a halogen atom, an alkyl group, an aryl group, an alkoxy group, or an aryloxy group, even more preferably each independently represent a hydrogen atom, a halogen atom, an alkyl group, or an aryl group, and particularly preferably each independently represent a hydrogen atom.

From the viewpoint of color developability and visibility of exposed portions, it is preferable that at least one of $Y_1$ or $Y_2$ in Formula (Le-1) to Formula (Le-3) be C, and it is more preferable that both of $Y_1$ and $Y_2$ be C.

From the viewpoint of color developability and visibility of exposed portions, $Ra_1$ in Formula (Le-1) to Formula (Le-3) is preferably an alkyl group or an alkoxy group, more preferably an alkoxy group, and particularly preferably a methoxy group.

From the viewpoint of color developability and visibility of exposed portions, $Rb_1$ to $Rb_4$ in Formula (Le-1) to Formula (Le-3) preferably each independently represent a hydrogen atom or an alkyl group, more preferably each independently represent an alkyl group, and particularly preferably each independently represent a methyl group.

Furthermore, from the viewpoint of color developability and visibility of exposed portions, the leuco colorant having a phthalide structure or a fluoran structure is more preferably a compound represented by any of Formula (Le-4) to Formula (Le-6), and even more preferably a compound represented by Formula (Le-5).

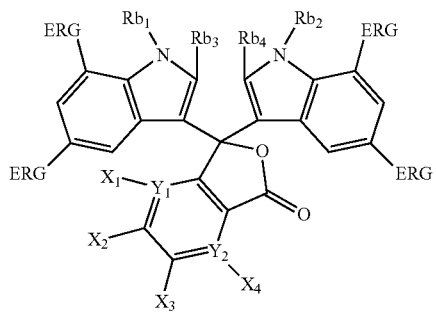

(Le-4)

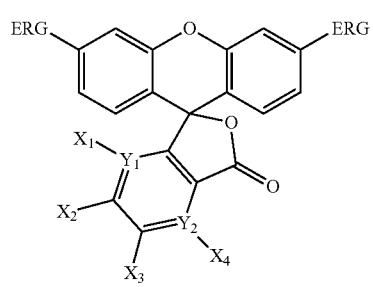

(Le-5)

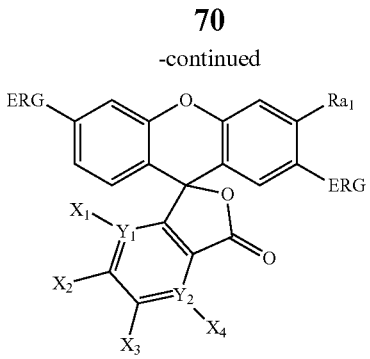

(Le-6)

In Formula (Le-4) to Formula (Le-6), ERG each independently represents an electron donating group, $X_1$ to $X_4$ each independently represent a hydrogen atom, a halogen atom, or a dialkylanilino group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

ERG, $X_1$ to $X_4$, $Y_1$, $Y_2$, $Ra_1$, and $Rb_1$ to $Rb_4$ in Formula (Le-4) to Formula (Le-6) have the same definitions as ERG, $X_1$ to $X_4$, $Y_1$, $Y_2$, $Ra_1$, and $Rb_1$ to $Rb_4$ in Formula (Le-1) to Formula (Le-3) respectively, and preferred aspects thereof are also the same.

Furthermore, from the viewpoint of color developability and visibility of exposed portions, the leuco colorant having a phthalide structure or a fluoran structure is more preferably a compound represented by any of Formula (Le-7) to Formula (Le-9), and particularly preferably a compound represented by Formula (Le-8).

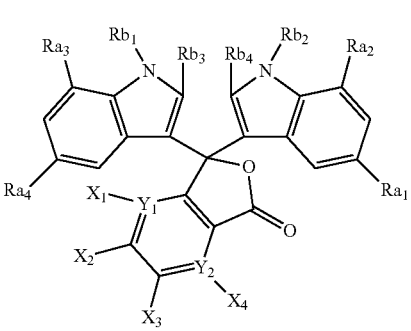

(Le-7)

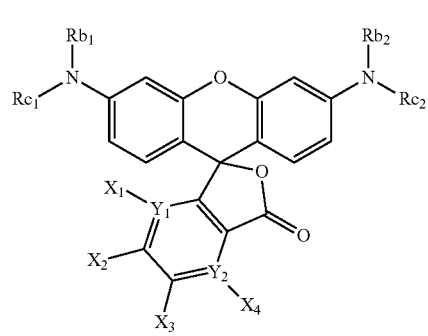

(Le-8)

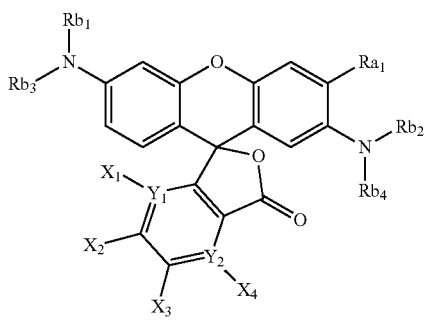

(Le-9)

In Formula (Le-7) to Formula (Le-9), $X_1$ to $X_4$ each independently represent a hydrogen atom, a halogen atom, or a dialkylanilino group, $Y_1$ and $Y_2$ each independently represent C or N, $X_1$ does not exist in a case where $Y_j$ is N, $X_4$ does not exist in a case where $Y_2$ is N, $Ra_1$ to $Ra_4$ each independently represent a hydrogen atom, an alkyl group, or an alkoxy group, $Rb_1$ to $Rb_4$ each independently represent an alkyl group or an aryl group, and $Rc_1$ and $Rc_2$ each independently represent an aryl group.

$X_1$ to $X_4$, $Y_1$, and $Y_2$ in Formula (Le-7) to Formula (Le-9) have the same definition as $X_1$ to $X_4$, $Y_1$, and $Y_2$ in Formula (Le-1) to Formula (Le-3) respectively, and preferred aspects thereof are also the same.

From the viewpoint of color developability and visibility of exposed portions, $Ra_1$ to $Ra_4$ in Formula (Le-7) to Formula (Le-9) preferably each independently represent an alkyl group or an alkoxy group, more preferably each independently represent an alkoxy group, and particularly preferably each independently represent a methoxy group.

From the viewpoint of color developability and visibility of exposed portions, $Rb_1$ to $Rb_4$ in Formula (Le-7) to Formula (Le-9) preferably each independently represent an alkyl group or an aryl group substituted with an alkoxy group, more preferably each independently represent an alkyl group, and particularly preferably each independently represent a methyl group.

From the viewpoint of color developability and visibility of exposed portions, $Rc_1$ and $Rc_2$ in Formula (Le-7) to Formula (Le-9) preferably each independently represent a phenyl group or an alkylphenyl group, and more preferably each independently represent a phenyl group.

In Formula (Le-8), from the viewpoint of color developability and visibility of exposed portions, $X_1$ to $X_4$ preferably each represent a hydrogen atom, and $Y_1$ and $Y_2$ preferably each represent C.

Furthermore, from the viewpoint of color developability and visibility of exposed portions, in Formula (Le-8), $Rb_1$ and $Rb_2$ preferably each independently represent an alkyl group or an aryl group substituted with an alkoxy group.

The alkyl group in Formula (Le-1) to Formula (Le-9) may be linear or branched or may have a ring structure.

The number of carbon atoms in the alkyl group in Formula (Le-1) to Formula (Le-9) is preferably 1 to 20, more preferably 1 to 8, even more preferably 1 to 4, and particularly preferably 1 or 2.

The number of carbon atoms in the aryl group in Formula (Le-1) to Formula (Le-9) is preferably 6 to 20, more preferably 6 to 10, and particularly preferably 6 to 8.

Each of the groups in Formula (Le-1) to Formula (Le-9), such as a monovalent organic group, an alkyl group, an aryl group, a dialkylanilino group, an alkylamino group, and an alkoxy group, may have a substituent. Examples of the substituent include an alkyl group, an aryl group, a halogen atom, an amino group, an alkylamino group, an arylamino group, a dialkylamino group, a monoalkyl monoarylamino group, a diarylamino group, a hydroxyl group, an alkoxy group, an aryloxy group, an acyl group, an alkoxycarbonyl group, an aryloxycarbonyl group, a cyano group, and the like. These substituents may be further substituted with these substituents.

Examples of the leuco colorant having a phthalide structure or a fluoran structure that are suitably used include the following compounds. Me represents a methyl group.

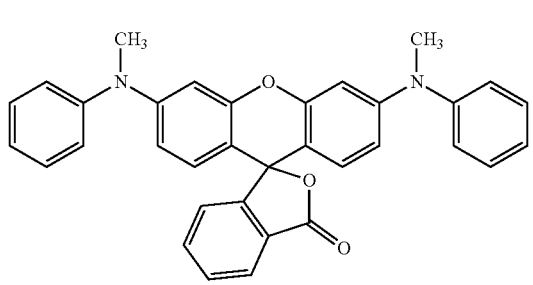

S-1

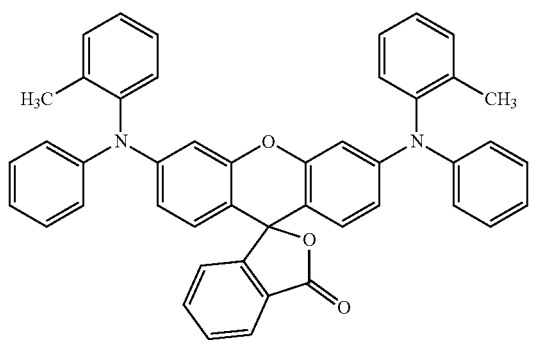

S-2

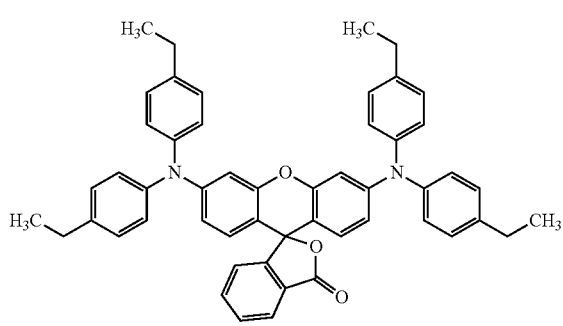

S-3

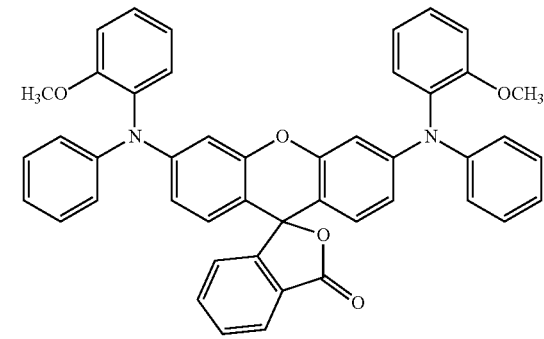

S-4

-continued
S-5
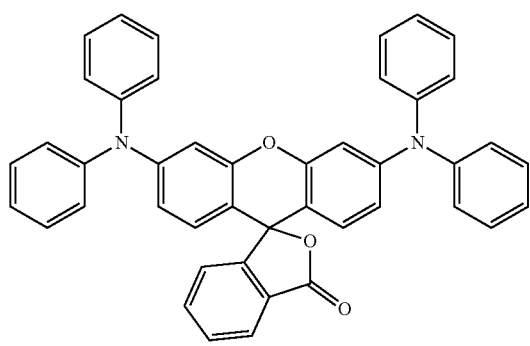
S-6
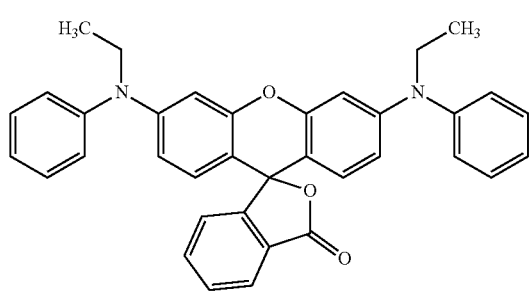
S-7
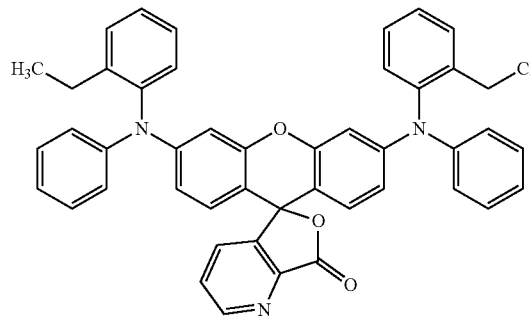
S-8
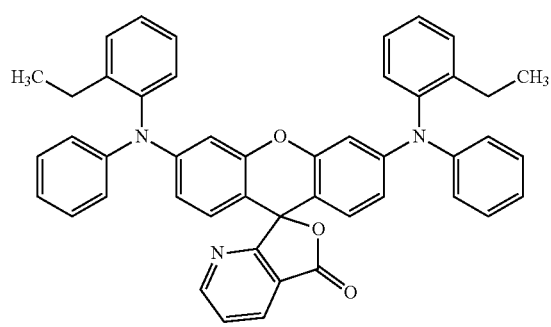
S-9
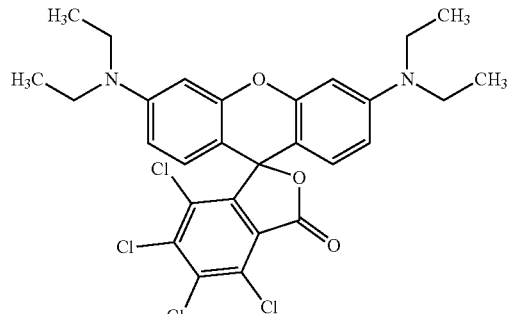
S-10
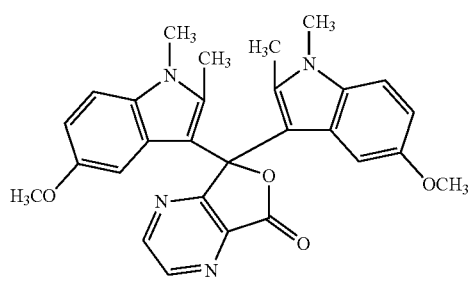
S-11
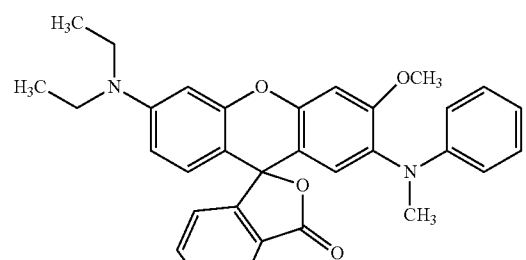
S-12
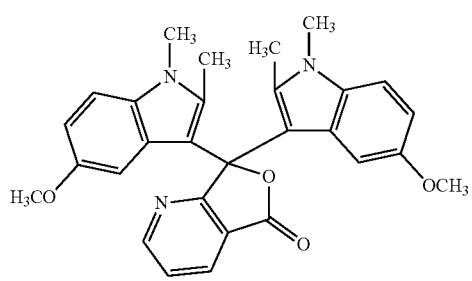
S-13
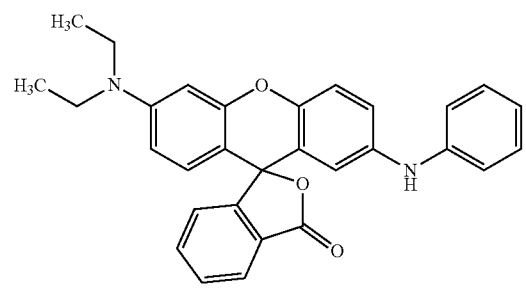

S-14

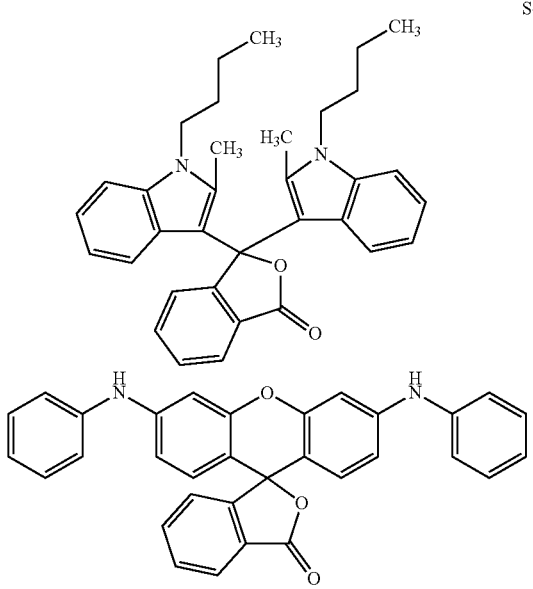

As the acid color-developing agent, commercially available products can be used. Examples thereof include ETAC, RED500, RED520, CVL, S-205, BLACK305, BLACK400, BLACK100, BLACK500, H-7001, GREEN300, NIR-BLACK78, BLUE220, H-3035, BLUE203, ATP, H-1046, and H-2114 (all manufactured by Fukui Yamada Chemical Co., Ltd.), ORANGE-DCF, Vermilion-DCF, PINK-DCF, RED-DCF, BLMB, CVL, GREEN-DCF, and TH-107 (all manufactured by Hodogaya Chemical Co., Ltd.), ODB, ODB-2, ODB-4, ODB-250, ODB-BlackXV, Blue-63, Blue-502, GN-169, GN-2, Green-118, Red-40, and Red-8 (all manufactured by Yamamoto Chemicals, Inc.), crystal violet lactone (manufactured by Tokyo Chemical Industry Co., Ltd.), and the like. Among these commercially available products, ETAC, S-205, BLACK305, BLACK400, BLACK100, BLACK500, H-7001, GREEN300, NIR-BLACK78, H-3035, ATP, H-1046, H-2114, GREEN-DCF, Blue-63, GN-169, and crystal violet lactone are preferable because these form a film having excellent visible light absorbance.

One kind of each of these color developing agents may be used alone. Alternatively, two or more kinds of components can be used in combination.

The content of the color developing agent with respect to the total mass of the image-recording layer is preferably 0.5% by mass to 10% by mass, and more preferably 1% by mass to 5% by mass.

—Chain Transfer Agent—

The image-recording layer used in the present disclosure may contain a chain transfer agent. The chain transfer agent contributes to the improvement of printing durability of the lithographic printing plate.

As the chain transfer agent, a thiol compound is preferable, a thiol having 7 or more carbon atoms is more preferable from the viewpoint of boiling point (low volatility), and a compound having a mercapto group on an aromatic ring (aromatic thiol compound) is even more preferable. The thiol compound is preferably a monofunctional thiol compound.

Specific examples of the chain transfer agent include the following compounds.

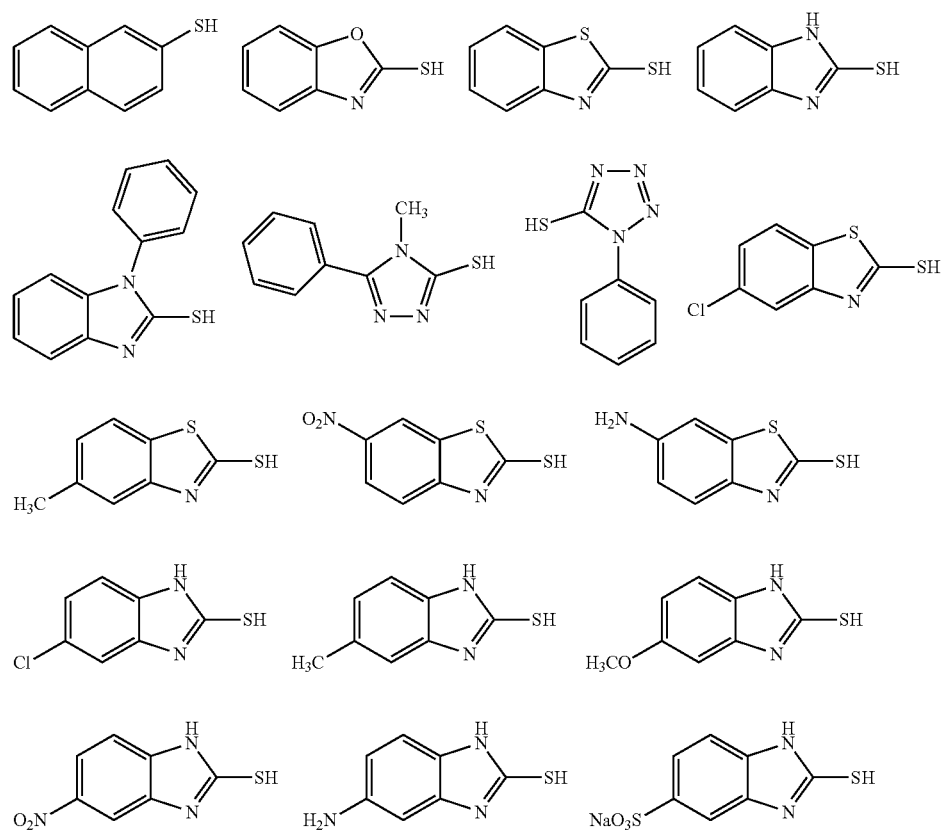

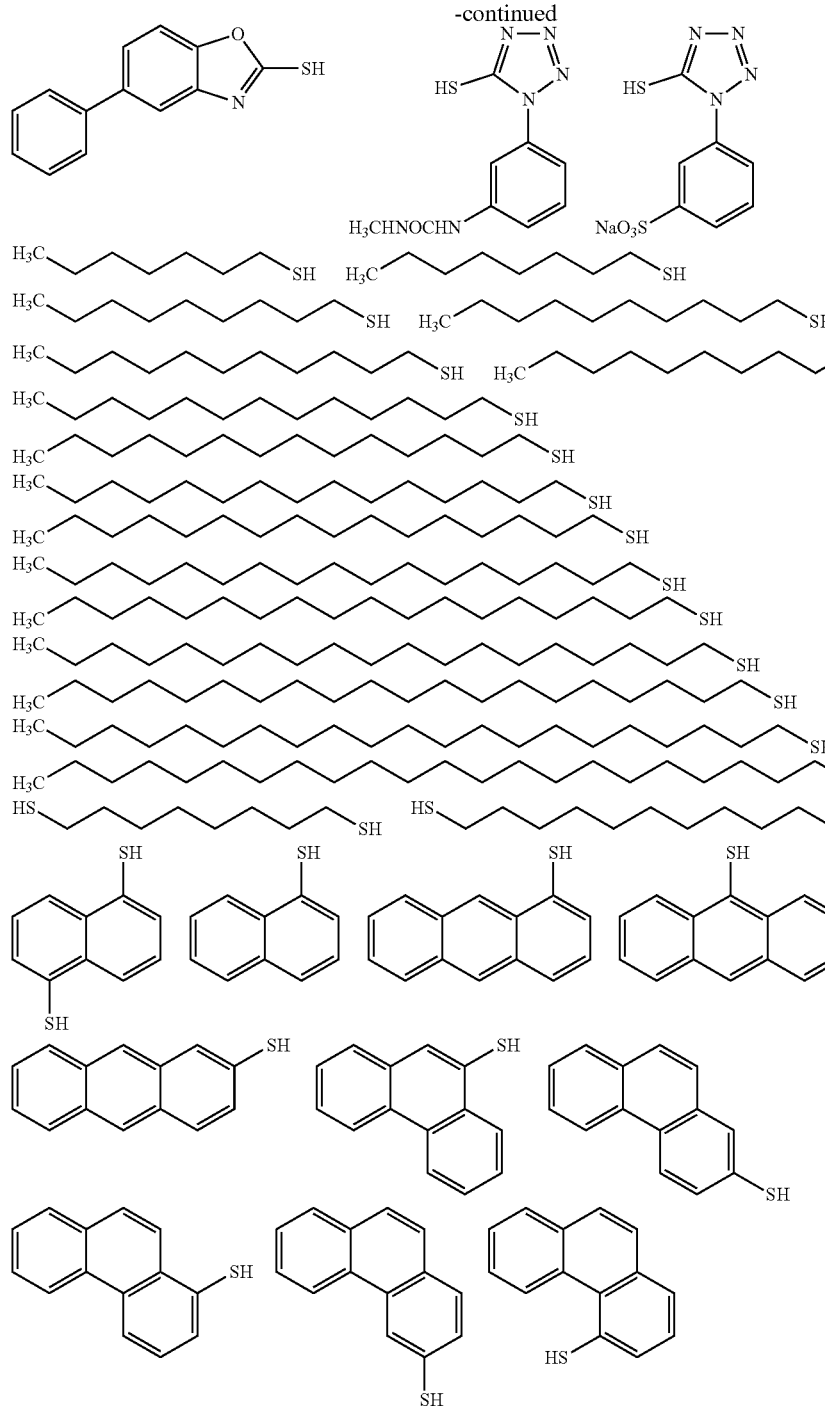

-continued

Only one kind of chain transfer agent may be added to the image-recording layer, or two or more kinds of chain transfer agents may be used in combination.

The content of the chain transfer agent with respect to the total mass of the image-recording layer is preferably 0.01% by mass to 50% by mass, more preferably 0.05% by mass to 40% by mass, and even more preferably 0.1% by mass to 30% by mass.

—Low-Molecular-Weight Hydrophilic Compound—

In order to suppress the deterioration of printing durability and improve on-press developability, the image-recording layer may contain a low-molecular-weight hydrophilic compound. The low-molecular-weight hydrophilic compound is preferably a compound having a molecular weight less than 1,000, more preferably a compound having a molecular weight less than 800, and even more preferably a compound having a molecular weight less than 500.

Examples of the low-molecular-weight hydrophilic compound include water-soluble organic compounds including glycols such as ethylene glycol, diethylene glycol, triethylene glycol, propylene glycol, dipropylene glycol, and tripropylene glycol, ether or ester derivatives of these glycols, polyols such as glycerin, pentaerythritol, and tris(2-hydroxyethyl)isocyanurate, organic amines and salts thereof such as triethanolamine, diethanolamine, and monoethanolamine, organic sulfonic acids and salts thereof such as alkyl sulfonate, toluene sulfonate, and benzene sulfonate, organic sulfamic acids and salts thereof such as alkylsulfamate, organic sulfuric acids and salts thereof such as alkyl sulfate and alkyl ether sulfate, organic phosphonic acids and salts thereof such as phenyl phosphate, organic carboxylic acids and salts thereof such as tartaric acid, oxalic acid, citric acid, malic acid, lactic acid, gluconic acid, and amino acid, betaines, and the like.

As the low-molecular-weight hydrophilic compound, at least one compound selected from polyols, organic sulfates, organic sulfonates, and betaines is preferably incorporated into the image-recording layer.

Specific examples of the organic sulfonates include alkyl sulfonates such as sodium n-butyl sulfonate, sodium n-hexyl sulfonate, sodium 2-ethylhexyl sulfonate, sodium cyclohexyl sulfonate, and sodium n-octyl sulfonate; alkyl sulfonates having an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, and sodium 5,8,11,14-tetraoxatetracosane-1-sulfonate; aryl sulfonates such as sodium benzenesulfonate, sodium p-toluenesulfonate, sodium p-hydroxybenzene sulfonate, sodium p-styrene sulfonate, sodium dimethyl isophthalate-5-sulfonate, sodium 1-naphthyl sulfonate, sodium 4-hydroxynaphthyl sulfonate, disodium 1,5-naphthalene disulfonate, and trisodium 1,3,6-naphthalene trisulfonate, the compounds described in paragraphs "0026" to "0031" of JP2007-276454A and paragraphs "0020" to "0047" of JP2009-154525A, and the like. The salt may be a potassium salt or a lithium salt.

Examples of the organic sulfates include sulfates of alkyl, alkenyl, alkynyl, aryl, or heterocyclic monoether of polyethylene oxide. The number of ethylene oxide units is preferably 1 to 4, and the salt is preferably a sodium salt, a potassium salt, or a lithium salt. Specific examples thereof include the compounds described in paragraphs "0034" to "0038" of JP2007-276454A.

As the betaines, compounds in which a nitrogen atom is substituted with a hydrocarbon substituent having 1 to 5 carbon atoms are preferable. Specifically, examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium methanesulfonate, dimethylpropylammonium methanesulfonate, 3-trimethylammonio-1-propanesulfonate, 3-(1-pyridinio)-1-propanesulfonate, and the like.

The low-molecular-weight hydrophilic compound substantially does not have a surface activation action because a hydrophobic portion in this compound has a small structure. Therefore, this compound prevents dampening water from permeating the exposed portion of the image-recording layer (image area) and deteriorating hydrophobicity or film hardness of the image area. Accordingly, the image-recording layer can maintain excellent ink receiving properties and printing durability.

The content of the low-molecular-weight hydrophilic compound with respect to the total mass of the image-recording layer is preferably 0.5% by mass to 20% by mass, more preferably 1% by mass to 15% by mass, and even more preferably 2% by mass to 10% by mass. In a case where the content is within this range, excellent on-press developability and printing durability can be obtained.

One kind of low-molecular-weight hydrophilic compound may be used alone, or two or more kinds of low-molecular-weight hydrophilic compounds may be used by being mixed together.

—Oil Sensitizing Agent—

In order to improve receptivity, the image-recording layer may contain an oil sensitizing agent such as a phosphonium compound, a nitrogen-containing low-molecular-weight compound, or an ammonium group-containing polymer. Particularly, in a case where an inorganic lamellar compound is incorporated into a protective layer, these compounds function as a surface coating agent for the inorganic lamellar compound and can inhibit the receptivity deterioration caused in the middle of printing by the inorganic lamellar compound.

As the oil sensitizing agent, it is preferable to use a phosphonium compound, a nitrogen-containing low-molecular-weight compound, and an ammonium group-containing polymer in combination, and it is more preferable to use a phosphonium compound, quaternary ammonium salts, and an ammonium group-containing polymer in combination.

Examples of the phosphonium compound include the phosphonium compounds described in JP2006-297907A and JP2007-50660A. Specific examples thereof include tetrabutylphosphonium iodide, butyltriphenylphosphonium bromide, tetraphenylphosphonium bromide, 1,4-bis(triphenylphosphonio)butane=di(hexafluorophosphate), 1,7-bis(triphenylphosphonio)heptane=sulfate, 1,9-bis(triphenylphosphonio)nonane=naphthalene-2,7-disulfonate, and the like.

Examples of the nitrogen-containing low-molecular-weight compound include amine salts and quaternary ammonium salts. In addition, examples thereof also include imidazolinium salts, benzimidazolinium salts, pyridinium salts, and quinolinium salts. Among these, quaternary ammonium salts and pyridinium salts are preferable. Specific examples thereof include tetramethylammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, compounds described in paragraphs "0021" to "0037" of JP2008-284858A and paragraphs "0030" to "0057" of JP2009-90645A, and the like.

The ammonium group-containing polymer may have an ammonium group in the structure. As such a polymer, a polymer is preferable in which the content of (meth)acrylate having an ammonium group in a side chain as a copolymerization component is 5 mol % to 80 mol %. Specific examples thereof include the polymers described in paragraphs "0089" to "0105" of JP2009-208458A.

The reduced specific viscosity (unit: ml/g) of an ammonium group-containing polymer determined according to the measurement method described in JP2009-208458A is preferably in a range of 5 to 120, more preferably in a range of 10 to 110, and particularly preferably in a range of 15 to 100. In a case where the reduced specific viscosity is converted into a weight-average molecular weight (Mw), the weight-average molecular weight is preferably 10,000 to 1,500,000, more preferably 17,000 to 140,000, and particularly preferably 20,000 to 130,000.

Specific examples of the ammonium group-containing polymer will be shown below.

(1) 2-(Trimethylammonio)ethylmethacrylate=p-toluenesulfonate/3,6-dioxaheptylmethacrylate copolymer (molar ratio: 10/90, Mw: 45,000)
(2) 2-(Trimethylammonio)ethylmethacrylate=hexa- fluorophosphate/3,6-dioxaheptylmethacrylate copolymer (molar ratio: 20/80, Mw: 60,000)
(3) 2-(Ethyldimethylammonio)ethylmethacrylate=p-toluenesulfonate/hexylmethacrylate copolymer (molar ratio: 30/70, Mw: 45,000)
(4) 2-(Trimethylammonio)ethylmethacrylate=hexa- fluorophosphate/2-ethylhexylmethacrylate copolymer (molar ratio: 20/80, Mw: 60,000)
(5) 2-(Trimethylammonio)ethylmethacrylate=methylsulfate/hexylmethacrylate copolymer (molar ratio: 40/60, Mw: 70,000)
(6) 2-(Butyldimethylammonio)ethylmethacrylate=hexafluorophosphate/3,6-dioxaheptylmethacrylate copolymer (molar ratio: 25/75, Mw: 65,000)
(7) 2-(Butyldimethylammonio)ethylacrylate=hexafluorophosphate/3,6-dioxaheptylmethacrylate copolymer (molar ratio: 20/80, Mw: 65,000)
(8) 2-(Butyldimethylammonio)ethylmethacrylate=13-ethyl-5,8,11-trioxa-1-heptadecanesulfonate/3,6-dioxaheptylmethacrylate copolymer (molar ratio: 20/80, Mw: 75,000)
(9) 2-(Butyldimethylammonio)ethylmethacrylate=hexafluorophosphate/3,6-dioxaheptylmethacrylate/2-hydroxy-3-methacryloyloxypropylmethacrylate copolymer (molar ratio: 15/80/5, Mw: 65,000)

The content of the oil sensitizing agent with respect to the total mass of the image-recording layer is preferably 0.01% by mass to 30.0% by mass, more preferably 0.1% by mass to 15.0% by mass, and even more preferably 1% by mass to 10% by mass.

—Fluorine-Containing Copolymer—

The image-recording layer in the present disclosure preferably contains a fluorine-containing copolymer, and more preferably contains a fluorine-containing copolymer having a constitutional unit formed of a fluorine-containing monomer. Among fluorine-containing copolymers, a fluoroaliphatic group-containing copolymer is preferable.

In a case where the fluorine-containing copolymer (preferably a fluoroaliphatic group-containing copolymer) is used, it is possible to inhibit surface abnormalities resulting from foaming during the formation of the image-recording layer and to improve the condition of the coating surface, and the formed image-recording layer has higher ink receptivity.

In addition, the image-recording layer containing the fluorine-containing copolymer (preferably a fluoroaliphatic group-containing copolymer) has high gradation and is highly sensitive, for example, to laser light. Therefore, the obtained lithographic printing plate exhibits excellent fogging properties by scattered light, reflected light, and the like and has excellent printing durability.

The fluoroaliphatic group-containing copolymer preferably has a constitutional unit formed of a fluoroaliphatic group-containing monomer. Particularly, the fluoroaliphatic group-containing copolymer preferably has a constitutional unit formed of a compound represented by any of Formula (F1) or Formula (F2).

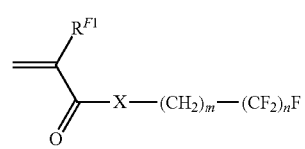

(F1)

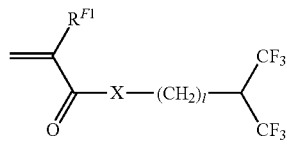

(F2)

In Formulas (F1) and (F2), $R^{F1}$ each independently represents a hydrogen atom or a methyl group, X each independently represents an oxygen atom, a sulfur atom, or —N($R^{F2}$)—, m represents an integer of 1 to 6, n represents an integer of 1 to 10, l represents an integer of 0 to 10, and $R^{F2}$ represents a hydrogen atom or an alkyl group having 1 to 4 carbon atoms.

The alkyl group having 1 to 4 carbon atoms represented by $R^{F2}$ in Formulas (F1) and (F2) is preferably a methyl group, an ethyl group, a n-propyl group, or a n-butyl group, and more preferably a hydrogen atom or a methyl group.

X in Formula (F1) and Formula (F2) is preferably an oxygen atom.

m in Formula (F1) is preferably 1 or 2, and more preferably 2.

n in Formula (F1) is preferably 2, 4, 6, 8, or 10, and more preferably 4 or 6.

l in Formula (F2) is preferably 0.

Specific examples of the fluoroaliphatic group-containing monomer containing the compound represented by any of Formula (F1) or Formula (F2) and the fluorine-containing monomer will be shown below, but the fluoroaliphatic group-containing monomer and the fluorine-containing monomer are not limited thereto.

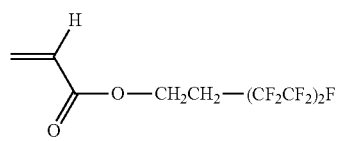

F-1

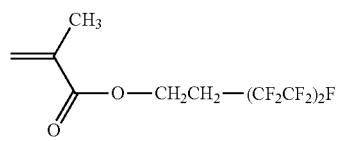

F-2

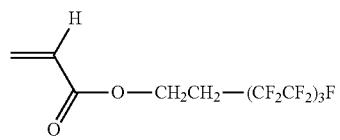

F-3

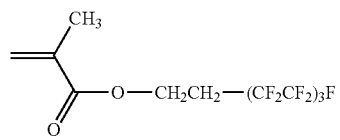

F-4

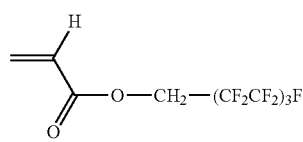

F-5

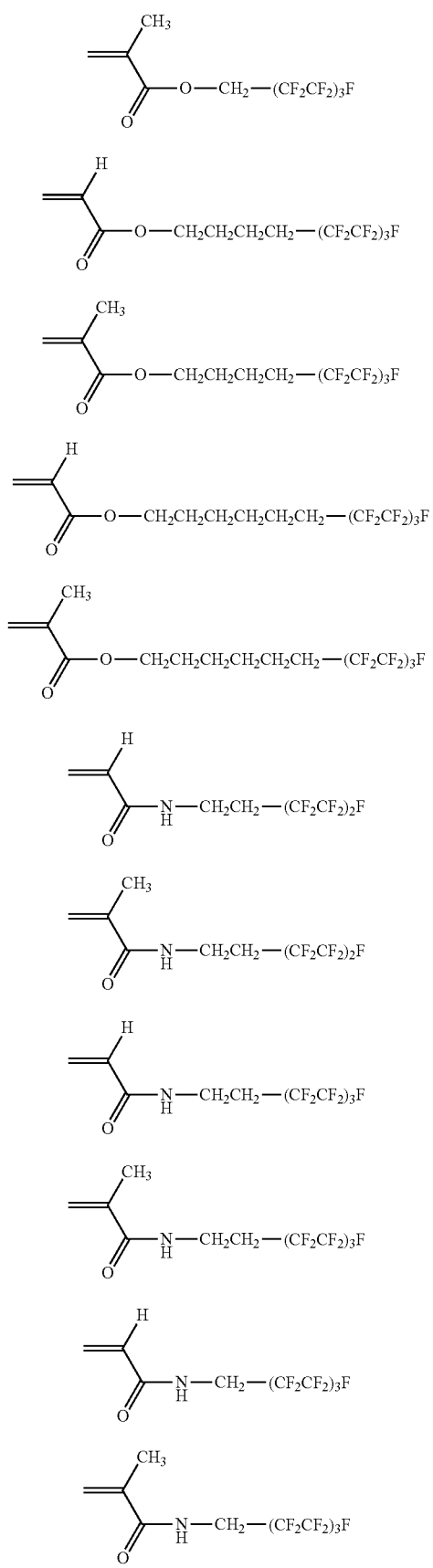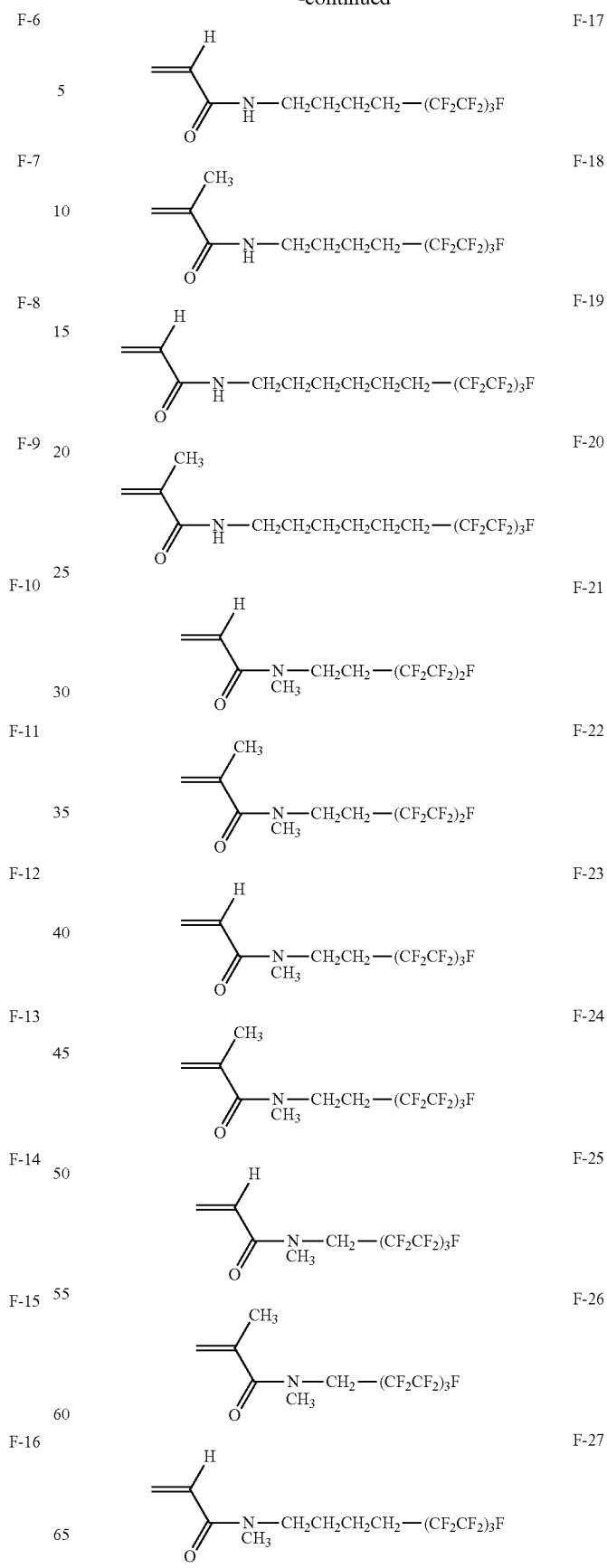

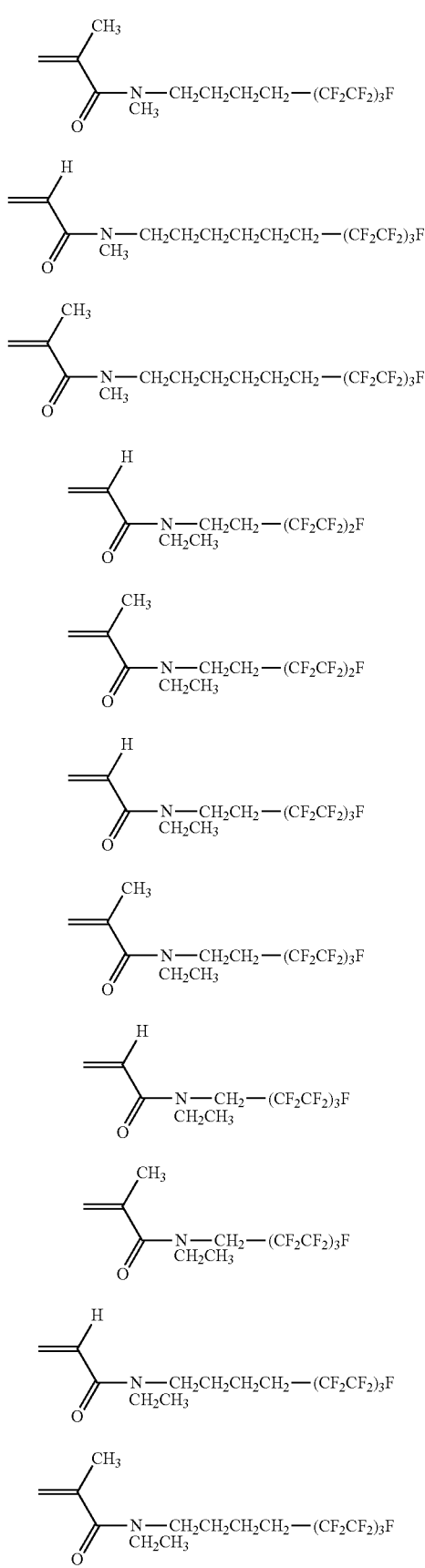
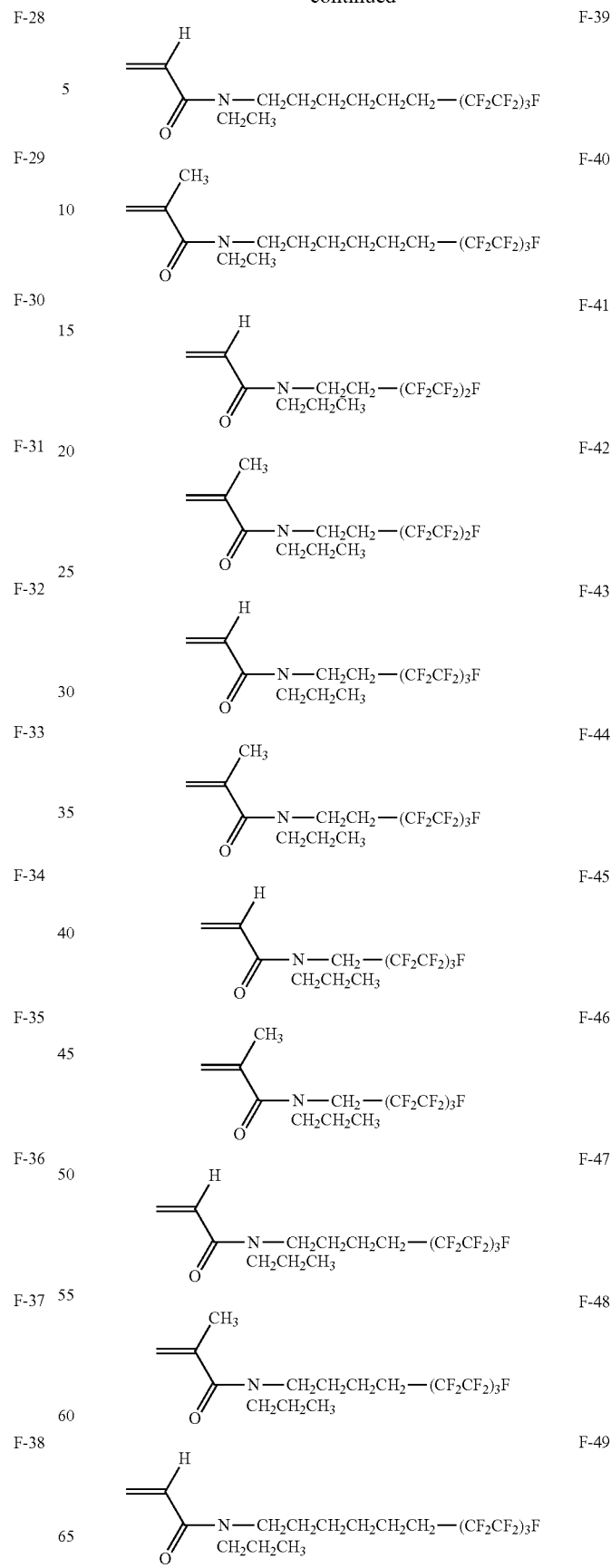

-continued
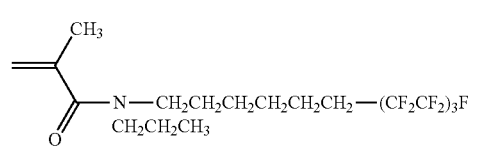
F-50
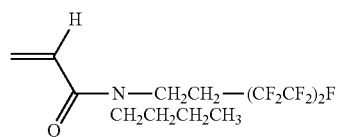
F-51
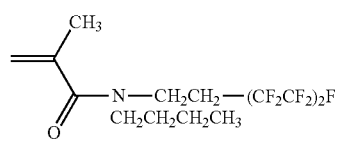
F-52
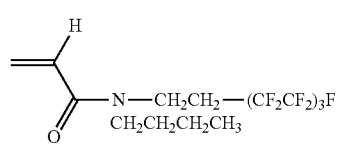
F-53
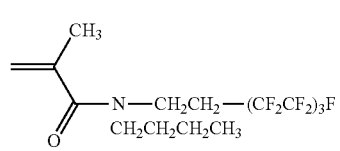
F-54
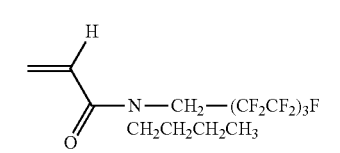
F-55
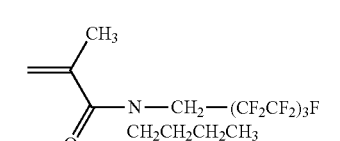
F-56
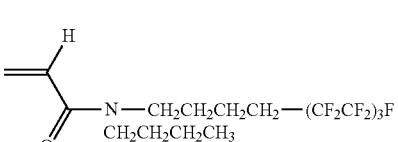
F-57
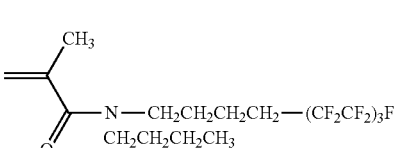
F-58
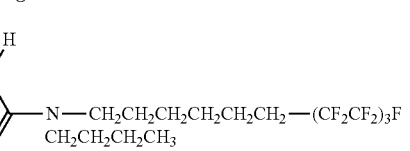
F-59
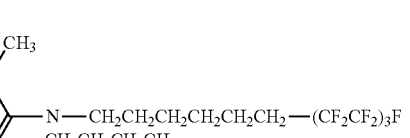
F-60
-continued
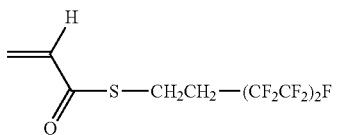
F-61
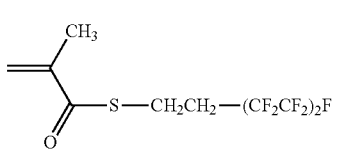
F-62
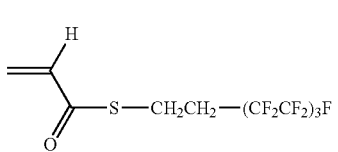
F-63
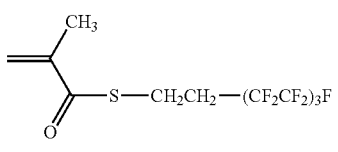
F-64
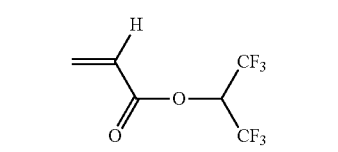
F-65
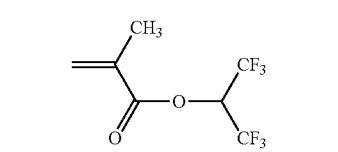
F-66
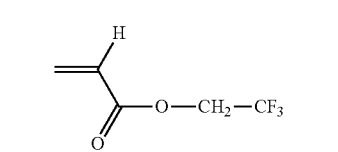
F-67
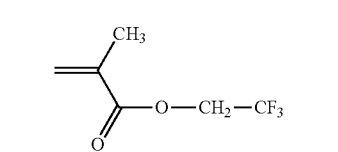
F-68
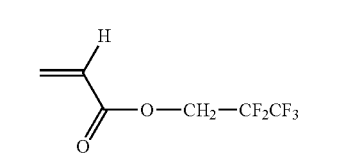
F-69
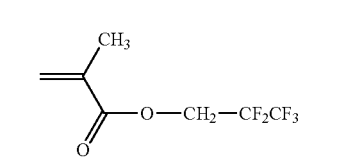
F-70
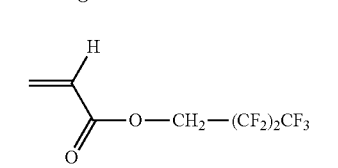
F-71

| | |
|---|---|
| F-72: CH2=C(CH3)-C(=O)-O-CH2-(CF2)2CF3 | F-83: CH2=CH-C(=O)-O-CH2CH2-CF2CF3 |
| F-73: CH2=CH-C(=O)-O-CH2-(CF2)4CF3 | F-84: CH2=C(CH3)-C(=O)-O-CH2CH2-CF2CF3 |
| F-74: CH2=C(CH3)-C(=O)-O-CH2-(CF2)4CF3 | F-85: CH2=CH-C(=O)-O-CH2CH2-(CF2)2CF3 |
| F-75: CH2=CH-C(=O)-O-CH2-(CF2)6CF3 | F-86: CH2=C(CH3)-C(=O)-O-CH2CH2-(CF2)2CF3 |
| F-76: CH2=C(CH3)-C(=O)-O-CH2-(CF2)6CF3 | F-87: CH2=CH-C(=O)-O-CH2CH2-(CF2)4CF3 |
| F-77: CH2=CH-C(=O)-O-CH2-(CF2)7CF3 | F-88: CH2=C(CH3)-C(=O)-O-CH2CH2-(CF2)4CF3 |
| F-78: CH2=C(CH3)-C(=O)-O-CH2-(CF2)7CF3 | F-89: CH2=CH-C(=O)-O-CH2CH2-(CF2)6CF3 |
| F-79: CH2=CH-C(=O)-O-CH2-(CF2)8CF3 | F-90: CH2=C(CH3)-C(=O)-O-CH2CH2-(CF2)6CF3 |
| F-80: CH2=C(CH3)-C(=O)-O-CH2-(CF2)8CF3 | F-91: CH2=CH-C(=O)-O-CH2CH2-(CF2)7CF3 |
| F-81: CH2=CH-C(=O)-O-CH2CH2-CF3 | F-92: CH2=C(CH3)-C(=O)-O-CH2CH2-(CF2)7CF3 |
| F-82: CH2=C(CH3)-C(=O)-O-CH2CH2-CF3 | F-93: CH2=CH-C(=O)-O-CH2CH2-(CF2)9CF3 |

-continued

F-94 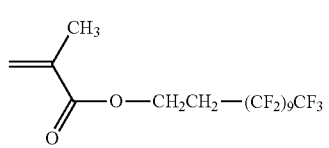

F-95 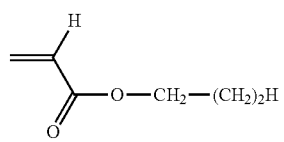

F-96 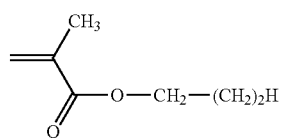

F-97 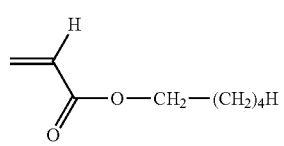

F-98 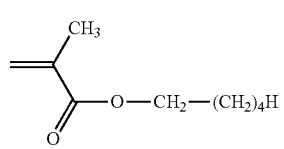

F-99 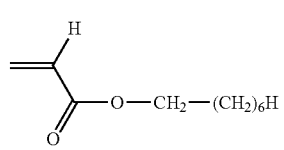

F-100 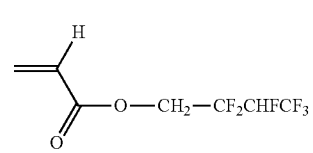

F-101 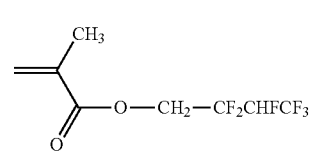

F-102 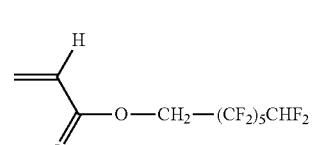

F-103 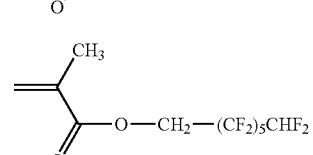

F-104 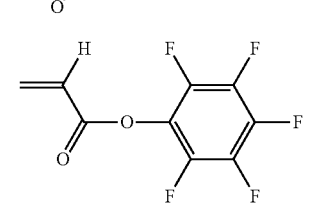

-continued

F-105 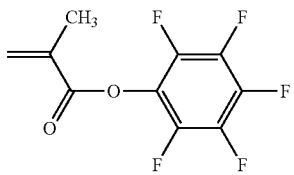

F-106 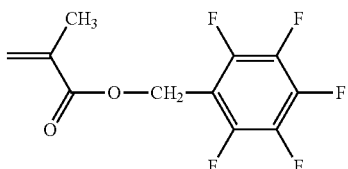

F-107 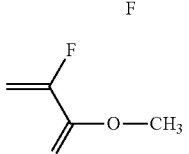

F-108 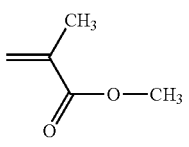

F-109 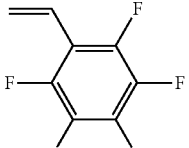

It is preferable that the fluorine-containing copolymer further has a constitutional unit formed of at least one kind of compound selected from the group consisting of poly (oxyalkylene) acrylate and a poly(oxyalkylene) methacrylate, in addition to the constitutional unit formed of a fluorine-containing monomer.

Furthermore, the fluoroaliphatic group-containing copolymer preferably further has a constitutional unit formed of at least one kind of compound selected from the group consisting of poly(oxyalkylene) acrylate and a poly(oxyalkylene) methacrylate, in addition to the constitutional unit formed of a compound represented by any of Formula (F1) or Formula (F2).

The polyoxyalkylene group in the poly(oxyatkylene) acrylate and poly(oxyalkylene) methacrylate can be represented by —(OR$^{F3}$)$_x$—. R$^{F3}$ represents an alkyl group, and x represents an integer of 2 or more. R$^{F3}$ is preferably a linear or branched alkylene group having 2 to 4 carbon atoms. As the linear or branched alkylene group having 2 to 4 carbon atoms, —CH$_2$CH$_2$—, —CH$_2$CH$_2$CH$_2$—, —CH(CH$_3$)CH$_2$—, or —CH(CH$_3$)CH(CH$_3$)— is preferable. x is preferably an integer of 2 to 100.

In the polyoxyalkylene groups, x pieces of "OR$^{F3}$" may be the same as or different from each other. That is, the polyoxyalkylene group may be composed of two or more kinds of "OR$^{F3}$" that are regularly or irregularly bonded to each other. For example, the polyoxyalkylene group may be composed of a linear or branched oxypropylene unit and an oxyethylene unit that are regularly or irregularly bonded to each other. More specifically, the polyoxyalkylene group may be composed of a block of a linear or branched oxypropylene unit and a block of an oxyethylene unit that are bonded to each other.

The polyoxyalkylene group may have one or more linking groups (for example, —CONH-Ph-NHCO—, —S—, and the like, in which Ph represents a phenylene group).

The molecular weight of the polyoxyalkylene group is preferably 250 to 3,000.

As the poly(oxyalkylene) acrylate and the poly(oxyalkylene) methacrylate described above, commercially available products or synthetic products may be used.

The poly(oxyalkylene) acrylate and the poly(oxyalkylene) methacrylate can be synthesized, for example, by reacting a hydroxypoly(oxyalkylene) compound with acrylic acid, methacrylic acid, acryloyl chloride, methacryloyl chloride, acrylic acid anhydride, or the like by known methods.

As the aforementioned hydroxypoly(oxyalkylene) compound, commercially available products may be used. Examples thereof include ADEKA (registered trademark) PLURONIC manufactured by ADEKA Corporation, ADEKA polyether manufactured by ADEKA Corporation, Carbowax (registered trademark) manufactured by Union Carbide Corporation, Triton manufactured by The Dow Chemical Company, PEG manufactured by DKS Co. Ltd., and the like.

As the poly(oxyalkylene) acrylate and the poly(oxyalkylene) methacrylate, poly(oxyalkylene) diacrylate or the like synthesized by known methods may also be used.

—Other Components—

As other components, a surfactant, a polymerization inhibitor, a higher fatty acid derivative, a plasticizer, inorganic particles, an inorganic lamellar compound, and the like can be incorporated into the image-recording layer. Specifically, the description in paragraphs "0114" to "0159" of JP2008-284817A can be referred to.

—Formation of Image-Recording Layer—

The image-recording layer in the lithographic printing plate precursor according to the present disclosure can be formed, for example, by preparing a coating solution by dispersing or dissolving the necessary components described above in a known solvent, coating a support with the coating solution by a known method such as bar coating, and drying the coating solution, as described in paragraphs "0142" and "0143" of JP2008-195018A.

As the solvent, known solvents can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy methoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, and the like. One kind of solvent may be used alone, or two or more kinds of the solvents may be used in combination. The concentration of solid contents in the coating solution is preferably about 1% by mass to 50% by mass.

The coating amount (solid content) of the image-recording layer after coating and drying varies with uses. However, from the viewpoint of obtaining excellent sensitivity and excellent film characteristics of the image-recording layer, the coating amount is preferably about 0.3 g/m$^2$ to 3.0 g/m$^2$.

<<Contact Angle>>

From the viewpoint of printing durability and ink receptivity, a water contact angle on a surface of the outermost layer of the lithographic printing plate precursor that is determined by an airborne water droplet method is preferably 30° to 80°, more preferably 30° to 60°, even more preferably 30° to 50°, and particularly preferably 30° to 40°.

In a case where the image-recording layer is the outermost layer, the surface of the image-recording layer is the surface of the outermost layer on the side provided with the image-recording layer. In a case where the protective layer is the outermost layer, the surface of the protective layer is the surface of the outermost layer on the side provided with the image-recording layer.

In the present disclosure, the water contact angle on the surface of the outermost layer that is determined by an airborne water droplet method is measured by the following method.

By using DMo-701 (manufactured by Kyowa Interface Science Co., Ltd.), a water contact angle on the surface of the outermost layer in the lithographic printing plate precursor is determined by an airborne water droplet method. The volume of water droplets used for the measurement is 1 μL.

<Protective Layer>

The lithographic printing plate precursor according to the present disclosure may have a protective layer (also called "overcoat layer" in some cases) as the outermost layer on the image-recording layer. The protective layer has a function of suppressing the reaction inhibiting image formation by blocking oxygen and a function of preventing the damage of the image-recording layer and preventing ablation during exposure to high-illuminance lasers.

The protective layer having such characteristics is described, for example, in U.S. Pat. No. 3,458,311A and JP1980-49729B (JP-S55-49729B). As polymers with low oxygen permeability that are used in the protective layer, any of water-soluble polymers and water-insoluble polymers can be appropriately selected and used. If necessary, two or more kinds of such polymers can be used by being mixed together. Specifically, examples of such polymers include polyvinyl alcohol, modified polyvinyl alcohol, polyvinylpyrrolidone, a water-soluble cellulose derivative, poly(meth)acrylonitrile, and the like.

As the modified polyvinyl alcohol, acid-modified polyvinyl alcohol having a carboxy group or a sulfo group is preferably used. Specific examples thereof include modified polyvinyl alcohols described in JP2005-250216A and JP2006-259137A.

In order to improve oxygen barrier properties, it is preferable that the protective layer contain an inorganic lamellar compound. The inorganic lamellar compound refers to particles in the form of a thin flat plate, and examples thereof include mica groups such as natural mica and synthetic mica, talc represented by Formula 3MgO·4SiO·H$_2$O, taeniolite, montmorillonite, saponite, hectorite, zirconium phosphate, and the like.

As the inorganic lamellar compound, a mica compound is preferably used. Examples of the mica compound include mica groups such as natural mica and synthetic mica represented by Formula: A(B, C)$_{2-5}$D$_4$O$_{10}$(OH, F, O)$_2$ [here, A represents any of K, Na, and Ca, B and C represent any of Fe (II), Fe (III), Mn, Al, Mg, and V, and D represents Si or Al.].

In the mica groups, examples of natural mica include white mica, soda mica, gold mica, black mica, and lepidolite. Examples of synthetic mica include non-swelling mica such as fluorophlogopite $KMg_3(AlSi_3O_{10})F_2$, potassium tetrasilic mica $KMg_{2.5}(Si_4O_{10})F_2$, and, Na tetrasilylic mica $NaMg_{2.5}(Si_4O_{10})F_2$, swelling mica such as Na or Li taeniolite $(Na, Li)Mg_2Li(Si_4O_{10})F_2$, montmorillonite-based Na or Li hectorite $(Na, Li)_{1/8}Mg_{2/5}Li_{1/8}(Si_4O_{10})F_2$, and the like. Furthermore, synthetic smectite is also useful.

Among the aforementioned mica compounds, fluorine-based swelling mica is particularly useful. That is, swelling synthetic mica has a laminated structure consisting of unit crystal lattice layers having a thickness in a range of approximately 10 Å to 15 Å (1 Å is equal to 0.1 nm), and metal atoms in lattices are more actively substituted than in any other clay minerals. As a result, positive charges are deficient in the lattice layers, and positive ions such as $Li^+$, $Na^+$, $Ca^{2+}$, and $Mg^{2+}$ are adsorbed between the layers in order to compensate for the deficiency. Positive ions interposed between the layers are referred to as exchangeable positive ions and are exchangeable with various positive ions. Particularly, in a case where the positive ions between the layers are $Li^+$ and $Na^+$, the ionic radii are small, and thus the bonds between lamellar crystal lattices are weak, and mica is significantly swollen by water. In a case where shear is applied in this state, mica easily cleavages and forms a stable sol in water. Swelling synthetic mica is particularly preferably used because it clearly exhibits such a tendency.

From the viewpoint of diffusion control, regarding the shapes of the mica compounds, the thickness is preferably thin, and the planar size is preferably large as long as the smoothness and actinic ray-transmitting property of coated surfaces are not impaired. Therefore, the aspect ratio is preferably 20 or higher, more preferably 100 or higher, and particularly preferably 200 or higher. The aspect ratio is the ratio of the long diameter to the thickness of a particle and can be measured from projection views obtained from the microphotograph of the particle. The higher the aspect ratio is, the stronger the obtained effect is.

Regarding the particle diameter of the mica compound, the average long diameter thereof is preferably 0.3 μm to 20 μm, more preferably 0.5 μm to 10 μm, and particularly preferably 1 μm to 5 μm. The average thickness of the particles is preferably 0.1 μm or less, more preferably 0.05 μm or less, and particularly preferably 0.01 μm or less. Specifically, for example, in the case of swelling synthetic mica which is a typical compound, an aspect is preferable in which the compound has a thickness of about 1 nm to 50 nm and a surface size (long diameter) of about 1 μm to 20 μm.

The content of the inorganic lamellar compound with respect to the total solid content of the protective layer is preferably 1% by mass to 60% by mass, and more preferably 3% by mass to 50% by mass. Even in a case where two or more kinds of inorganic lamellar compounds are used in combination, the total amount of the inorganic lamellar compounds preferable equals the content described above. In a case where the content is within the above range, the oxygen barrier properties are improved, and excellent sensitivity is obtained. In addition, the deterioration of receptivity can be prevented.

The protective layer may contain known additives such as a plasticizer for imparting flexibility, a surfactant for improving coating properties, and inorganic particles for controlling surface slipperiness. In addition, the oil sensitizing agent described above regarding the image-recording layer may be incorporated into the protective layer.

(Hydrophobic Polymer)

The protective layer may contain a hydrophobic polymer.

The hydrophobic polymer refers to a polymer that dissolves less than 5 g or does not dissolve in 100 g of pure water at 125° C.

Examples of the hydrophobic polymer include polyethylene, polystyrene, polyvinyl chloride, polyvinylidene chloride, polyalkyl (meth)acrylate ester (for example, polymethyl (meth)acrylate, polyethyl (meth)acrylate, polybutyl (meth)acrylate, and the like), a copolymer obtained by combining raw material monomers of these resins, and the like.

The hydrophobic polymer preferably includes a polyvinylidene chloride resin.

Furthermore, the hydrophobic polymer preferably includes a styrene-acrylic copolymer (also called styrene acrylic resin).

From the viewpoint of on-press developability, the hydrophobic polymer is preferably hydrophobic polymer particles.

One kind of hydrophobic polymer may be used alone, or two or more kinds of hydrophobic polymers may be used in combination.

In a case where the protective layer contains a hydrophobic polymer, the content of the hydrophobic polymer with respect to the total mass of the protective layer is preferably 1% by mass to 70% by mass, more preferably 5% by mass to 50% by mass, and even more preferably 10% by mass to 40% by mass.

In the present disclosure, the proportion of the area of the hydrophobic polymer occupying the surface of the protective layer is preferably 30 area % or higher, more preferably 40 area % or higher, and even more preferably 50 area % or higher.

The upper limit of the proportion of the area of the hydrophobic polymer occupying the surface of the protective layer is, for example, 90 area %.

The proportion of the area of the hydrophobic polymer occupying the surface of the protective layer can be measured as follows.

By using PHI nano TOFII time-of-flight secondary ion mass spectrometer (TOF-SIMS) manufactured by ULVAC-PHI, INCORPORATED, the surface of the protective layer is irradiated with Bi ion beams (primary ions) at an acceleration voltage of 30 kV, and the peak of ions (secondary ions) corresponding to a hydrophobic portion (that is, a region formed of the hydrophobic polymer) that are emitted from the surface is measured so that the hydrophobic portion is mapped. By measuring the area of the hydrophobic portion in an area of 1 μm², the proportion of the area occupied by the hydrophobic portion is determined and adopted as "proportion of the area of the hydrophobic polymer occupying the surface of the protective layer".

For example, in a case where the hydrophobic polymer is an acrylic resin, the proportion is measured using the peak of $C_6H_{13}O^-$. Furthermore, in a case where the hydrophobic polymer is polyvinylidene chloride, the proportion is measured using the peak of $C_2H_2Cl^+$.

The proportion of occupied area can be adjusted by the amount of the hydrophobic polymer added or the like.

(Discoloring Compound)

From the viewpoint of improving visibility of exposed portions, the protective layer may contain a discoloring compound.

In a case where the protective layer contains the discoloring compound, a brightness change ΔL in the lithographic printing plate precursor that will be described later can be easily set to 2.0 or more.

From the viewpoint of improving visibility of exposed portions, in a case where the lithographic printing plate precursor according to the present disclosure is exposed to infrared with a wavelength of 830 nm at an energy density of 110 mJ/cm², a brightness change ΔL between the brightness of the precursor before exposure and the brightness of the precursor after exposure is preferably 2.0 or more.

The brightness change ΔL is more preferably 3.0 or more, even more preferably 5.0 or more, particularly preferably 8.0 or more, and most preferably 10.0 or more.

An upper limit of the brightness change ΔL is, for example, 20.0.

The brightness change ΔL is measured by the following method.

In Luxel PLATESETTER T-9800 manufactured by FUJIFILM Graphic Systems that is equipped with an infrared semiconductor laser with a wavelength of 830 nm, the lithographic printing plate precursor is exposed under the conditions of output of 99.5%, outer drum rotation speed of 220 rpm, and resolution of 2,400 dpi (dots per inch, 1 inch=25.4 mm (energy density of 110 mJ/cm²). The exposure is performed in an environment of 25° C. and 50% RH.

The brightness change of the lithographic printing plate precursor before and after exposure is measured.

The brightness change is measured using a spectrocolorimeter eXact manufactured by X-Rite, Incorporated. By using the L* value (brightness) in the L*a*b* color space, the absolute value of a difference between the L* value of the image-recording layer after the exposure and the L* value of the image-recording layer before the exposure is adopted as the brightness change ΔL.

In the present disclosure, "discoloring compound" refers to a compound which undergoes change in absorption in the visible light region (wavelength: 400 nm or more and less than 750 nm) due to the exposure to infrared. That is, in the present disclosure, "discoloring" means that the absorption in the visible light region (wavelength: 400 nm or more and less than 750 nm) changes due to the exposure to infrared.

Specifically, examples of the discoloring compound in the present disclosure include (1) compound that absorbs more light in the visible light region due to the exposure to infrared than before the exposure to infrared, (2) compound that is made capable of absorbing light in the visible light region due to the exposure to infrared, and (3) compound that is made incapable of absorbing light in the visible light region due to the exposure to infrared.

The infrared in the present disclosure is a ray having a wavelength of 750 nm to 1 mm, and preferably a ray having a wavelength of 750 nm to 1,400 nm.

The discoloring compound preferably includes a compound that develops color due to the exposure to infrared.

Furthermore, the discoloring compound is preferably an infrared absorber.

In addition, the discoloring compound preferably includes a decomposable compound that decomposes due to the exposure to infrared, and particularly preferably includes a decomposable compound that decomposes by either or both of heat and electron transfer due to the exposure to infrared.

More specifically, the discoloring compound in the present disclosure is preferably a compound that decomposes due to the exposure to infrared (more preferably, decomposes by either or both of heat or electron transfer due to the exposure to infrared) and absorbs more light in the visible light region than before the exposure to infrared or is made capable of absorbing light of longer wavelengths and thus capable of absorbing light in the visible light region.

"Decomposes by electron transfer" mentioned herein means that electrons of the discoloring compound excited to the lowest unoccupied molecular orbital (LUMO) from the highest occupied molecular orbital (HOMO) by exposure to infrared move to electron accepting groups (groups having potential close to LUMO) in a molecule by means of intramolecular electron transfer and thus result in decomposition.

Hereinafter, as an example of the discoloring compound, a decomposable compound will be described.

There are no limitations on the decomposable compound as long as it absorbs at least a part of light in the infrared wavelength region (wavelength region of 750 nm to 1 mm, preferably a wavelength region of 750 nm to 1,400 nm) and decomposes. The decomposable compound is preferably a compound having maximum absorption wavelength in a wavelength region of 750 nm to 1,400 nm.

More specifically, the decomposable compound is preferably a compound that decomposes due to the exposure to infrared and generates a compound having maximum absorption wavelength in a wavelength region of 500 nm to 600 nm.0376

From the viewpoint of improving visibility of exposed portions, the decomposable compound is preferably a cyanine dye having a group that decomposes by the exposure to infrared (specifically, $R^1$ in Formula 1-1 to Formula 1-7).

From the viewpoint of improving visibility of exposed portions, the decomposable compound is more preferably a compound represented by Formula 1-1.

Formula 1-1

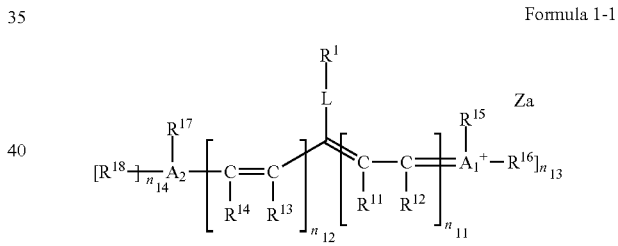

In Formula 1-1, $R^1$ represents a group that is represented by any of Formula 2 to Formula 4, $R^{11}$ to $R^{18}$ each independently represent a hydrogen atom, a halogen atom, —$R^a$, —$OR^b$, —$SR^c$, or —$NR^dR^e$, $R^a$ to $R^e$ each independently represent a hydrocarbon group, $A_1$, $A_2$, and a plurality of $R_{11}$ to $R_{18}$ may be linked to each other to form a monocyclic or polycyclic ring, $A_1$ and $A_2$ each independently represent an oxygen atom, a sulfur atom, or a nitrogen atom, $n_{11}$ and $n_{12}$ each independently represent an integer of 0 to 5, the sum of $n_{11}$ and $n_{12}$ is 2 or more, $n_{13}$ and $n_{14}$ each independently represent 0 or 1, L represents an oxygen atom, a sulfur atom, or —$NR^{10}$—, $R^{10}$ represents a hydrogen atom, an alkyl group, or an aryl group, and Za represents a counterion that neutralizes charge.

Formula 2

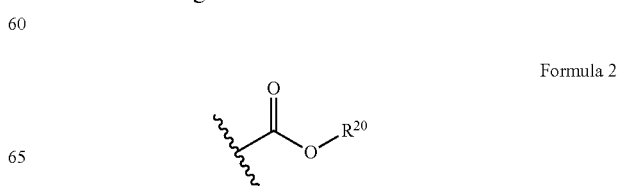

Formula 3

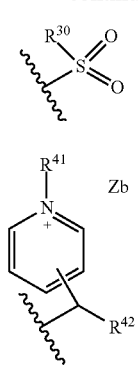

Formula 4

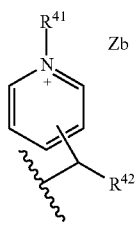

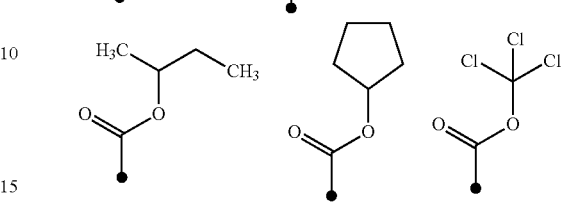

In Formula 2 to Formula 4, $R^{20}$, $R^{30}$, $R^{41}$, and $R^{42}$ each independently represent an alkyl group or an aryl group, Zb represents a counterion that neutralizes charge, the wavy line represents a binding site with the group represented by L in Formula 1-1.

In a case where the compound represented by Formula 1-1 is exposed to infrared, the $R^1$-L bond is cleaved, L turns into =O, =S, or =NR$^{10}$, and the compound is discolored.

In Formula 1-1, $R^1$ represents a group represented by any of Formula 2 to Formula 4.

Hereinafter, each of the group represented by Formula 2, the group represented by Formula 3, and the group represented by Formula 4 will be described.

In Formula 2, $R^{20}$ represents an alkyl group or an aryl group, and the portion of the wavy line represents a binding site with the group represented by L in Formula 1-1.

As the alkyl group represented by $R^{20}$, an alkyl group having 1 to 30 carbon atoms is preferable, an alkyl group having 1 to 15 carbon atoms is more preferable, and an alkyl group having 1 to 10 carbon atoms is even more preferable.

The alkyl group may be linear or branched, or may have a ring structure.

The aryl group represented by $R^{20}$ is preferably an aryl group having 6 to 30 carbon atoms, more preferably an aryl group having 6 to 20 carbon atoms, and even more preferably an aryl group having 6 to 12 carbon atoms.

From the viewpoint of color developability, $R^{20}$ is preferably an alkyl group.

From the viewpoint of decomposition properties and color developability, the alkyl group represented by $R^{20}$ is preferably a secondary alkyl group or a tertiary alkyl group, and more preferably a tertiary alkyl group.

Furthermore, from the viewpoint of decomposition properties and color developability, the alkyl group represented by $R^{20}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

The alkyl group represented by $R^{20}$ may be a substituted alkyl group substituted with a halogen atom (for example, a chloro group) or the like.

Specific examples of the group represented by Formula 2 will be shown below. However, the present disclosure is not limited thereto. In the following structural formulas, • represents a binding site with the group represented by L in Formula 1-1.

In Formula 3, $R^{30}$ represents an alkyl group or an aryl group, and the portion of the wavy line represents a binding site with the group represented by L in Formula 1-1.

The alkyl group and aryl group represented by $R^{30}$ are the same as the alkyl group and aryl group represented by $R^{20}$ in Formula 2, and the preferred aspects thereof are also the same.

From the viewpoint of decomposition properties and color developability, the alkyl group represented by $R^{30}$ is preferably a secondary alkyl group or a tertiary alkyl group, and more preferably a tertiary alkyl group.

Furthermore, from the viewpoint of decomposition properties and color developability, the alkyl group represented by $R^{30}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

In addition, from the viewpoint of decomposition properties and color developability, the alkyl group represented by $R^{30}$ is preferably a substituted alkyl group, more preferably a fluoro-substituted alkyl group, even more preferably a perfluoroalkyl group, and particularly preferably a trifluoromethyl group.

From the viewpoint of decomposition properties and color developability, the aryl group represented by $R^{30}$ is preferably a substituted aryl group. Examples of the substituent include an alkyl group (preferably an alkyl group having 1 to 4 carbon atoms), an alkoxy group (preferably an alkoxy group having 1 to 4 carbon atoms), and the like.

Specific examples of the group represented by Formula 3 will be shown below. However, the present disclosure is not limited thereto. In the following structural formulas, s represents a binding site with the group represented by L in Formula 1-1.

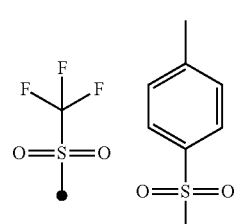

In Formula 4, $R^{41}$ and $R^{42}$ each independently represent an alkyl group or an aryl group, Zb represents a counterion that neutralizes charge, and the portion of the wavy line represents a binding site with the group represented by L in Formula 1-1.

The alkyl group and aryl group represented by $R^{41}$ or $R^{42}$ are the same as the alkyl group and aryl group represented by $R^{20}$ in Formula 2, and preferred aspects thereof are also the same.

From the viewpoint of decomposition properties and color developability, $R^{41}$ is preferably an alkyl group.

From the viewpoint of decomposition properties and color developability, $R^{42}$ is preferably an alkyl group.

From the viewpoint of decomposition properties and color developability, the alkyl group represented by $R^{41}$ is preferably an alkyl group having 1 to 8 carbon atoms, more preferably an alkyl group having 1 to 4 carbon atoms, and particularly preferably a methyl group.

From the viewpoint of decomposition properties and color developability, the alkyl group represented by $R^{42}$ is preferably a secondary alkyl group or a tertiary alkyl group, and more preferably a tertiary alkyl group.

Furthermore, from the viewpoint of decomposition properties and color developability, the alkyl group represented by $R^{42}$ is preferably an alkyl group having 1 to 8 carbon atoms, more preferably a branched alkyl group having 3 to 10 carbon atoms, even more preferably a branched alkyl group having 3 to 6 carbon atoms, particularly preferably an isopropyl group or a tert-butyl group, and most preferably a tert-butyl group.

Zb in Formula 4 may be a counterion that neutralizes charge, and may be included in Za in Formula 1-1 in the entirety of the compound.

Zb is preferably a sulfonate ion, a carboxylate ion, a tetrafluoroborate ion, a hexafluorophosphate ion, a p-toluenesulfonate ion, or a perchlorate ion, and more preferably a tetrafluoroborate ion.

Specific examples of the group represented by Formula 4 will be shown below. However, the present disclosure is not limited thereto. In the following structural formulas, • represents a binding site with the group represented by L in Formula 1-1.

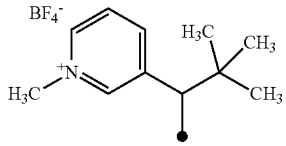

L in Formula 1-1 is preferably an oxygen atom or $-NR^{10}-$, and particularly preferably an oxygen atom.

Furthermore, $R^{10}$ in $-NR^{10}-$ is preferably an alkyl group. The alkyl group represented by $R^{10}$ is preferably an alkyl group having 1 to 10 carbon atoms. The alkyl group represented by $R^{10}$ may be linear or branched, or may have a ring structure.

Among the alkyl groups, a methyl group or a cyclohexyl group is preferable.

In a case where $R^{10}$ in $-NR^{10}-$ represents an aryl group, the aryl group is preferably an aryl group having 6 to 30 carbon atoms, more preferably an aryl group having 6 to 20 carbon atoms, and even more preferably an aryl group having 6 to 12 carbon atoms. These aryl groups may have a substituent.

In Formula 1-1, $R^{11}$ to $R^{18}$ preferably each independently represent a hydrogen atom, $-R^a$, $-OR^b$, $-SR^c$, or $-NR^dR^e$.

The hydrocarbon group represented by $R^a$ to $R^e$ is preferably a hydrocarbon group having 1 to 30 carbon atoms, more preferably a hydrocarbon group having 1 to 15 carbon atoms, and even more preferably a hydrocarbon group having 1 to 10 carbon atoms.

The hydrocarbon group may be linear or branched or may have a ring structure.

As the hydrocarbon group, an alkyl group is particularly preferable.

The aforementioned alkyl group is preferably an alkyl group having 1 to 30 carbon atoms, more preferably an alkyl group having 1 to 15 carbon atoms, and even more preferably an alkyl group having 1 to 10 carbon atoms.

The alkyl group may be linear or branched, or may have a ring structure.

Specific examples of the alkyl group include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, or a butyl group is preferable.

The above alkyl group may have a substituent.

Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, groups obtained by combining these, and the like.

$R^{11}$ to $R^{14}$ in Formula 1-1 preferably each independently represent a hydrogen atom or $-R^a$ (that is, a hydrocarbon group), more preferably each independently represent a hydrogen atom or an alkyl group, and even more preferably each independently represent a hydrogen atom except in the cases described below.

Particularly, each of $R^{11}$ and $R^{13}$ bonded to the carbon atom that is bonded to the carbon atom to which L is bonded is preferably an alkyl group. It is more preferable that $R^{11}$ and $R^{13}$ be linked to each other to form a ring. The ring to be formed in this way may be a monocyclic or polycyclic ring. Specifically, examples of the ring to be formed include a monocyclic ring such as a cyclopentene ring, a cyclopentadiene ring, a cyclohexene ring, or a cyclohexadiene ring, and a polycyclic ring such as an indene ring or an indole ring.

Furthermore, it is preferable that $R^{12}$ bonded to the carbon atom to which $A_1^+$ is bonded be linked to $R^{15}$ or $R^{16}$ (preferably $R^{16}$) to form a ring, and $R^{14}$ bonded to the carbon atom to which $A_2$ is bonded be linked to $R^{17}$ or $R^{18}$ (preferably $R^{18}$) to form a ring.

In Formula 1-1, $n_{13}$ is preferably 1, and $R^{16}$ is preferably $-R^a$ (that is, a hydrocarbon group).

Furthermore, it is preferable that $R^{16}$ be linked to $R^{12}$ bonded to the carbon atom to which $A_1^+$ is bonded, so as to form a ring. As the ring to be formed, an indolium ring, a pyrylium ring, a thiopyrylium ring, a benzoxazoline ring, or a benzimidazoline ring is preferable, and an indolium ring is more preferable from the viewpoint of improving visibility of exposed portions. These rings may further have a substituent.

In Formula 1-1, $n_{14}$ is preferably 1, and $R^{18}$ is preferably $-R^a$ (that is, a hydrocarbon group).

Furthermore, it is preferable that $R^{18}$ be linked to $R^{14}$ bonded to the carbon atom to which $A_2$ is bonded, so as to form a ring. As the ring to be formed, an indole ring, a pyran ring, a thiopyran ring, a benzoxazole ring, or a benzimidazole ring is preferable, and an indole ring is more preferable from the viewpoint of improving visibility of exposed portions. These rings may further have a substituent.

It is preferable that $R^{16}$ and $R^{18}$ in Formula 1-1 be the same group. In a case where $R^{16}$ and $R^{18}$ each form a ring, it is preferable that the formed rings have the same structure except for $A_1^+$ and $A_2$.

It is preferable that $R^{15}$ and $R^{17}$ in Formula 1-1 be the same group. Furthermore, $R^{15}$ and $R^{17}$ are preferably $-R^a$ (that is, a hydrocarbon group), more preferably an alkyl group, and even more preferably a substituted alkyl group.

From the viewpoint of improving water solubility, $R^{15}$ and $R^{17}$ in the compound represented by Formula 1-1 are preferably a substituted alkyl group.

Examples of the substituted alkyl group represented by $R^{15}$ or $R^{17}$ include a group represented by any of Formula (a1) to Formula (a4).

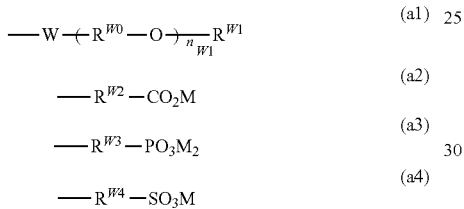

In Formula (a1) to Formula (a4), $R^{w0}$ represents an alkylene group having 2 to 6 carbon atoms, W represents a single bond or an oxygen atom, and $n_W^1$ represents an integer of 1 to 45, $R^{W1}$ represents an alkyl group having 1 to 12 carbon atoms or $-C(=O)-R^{W5}$, $R^{W5}$ represents an alkyl group having 1 to 12 carbon atoms, $R^{W2}$ to $R^{W4}$ each independently represent a single bond or an alkylene group having 1 to 12 carbon atoms, and M represents a hydrogen atom, a sodium atom, a potassium atom, or an onium group.

Specific examples of the alkylene group represented by $R^{W0}$ in Formula (a1) include an ethylene group, a n-propylene group, an isopropylene group, a n-butylene group, an isobutylene group, a n-pentylene group, an isopentylene group, a n-hexyl group, an isohexyl group, and the like. Among these, an ethylene group, a n-propylene group, an isopropylene group, or a n-butylene group is preferable, and a n-propylene group is particularly preferable.

$n_{w1}$ is preferably 1 to 10, more preferably 1 to 5, and particularly preferably 1 to 3.

Specific examples of the alkyl group represented by $R^{W1}$ include a methyl group, an ethyl group, a n-propyl group, an isopropyl group, a n-butyl group, an isobutyl group, a tert-butyl group, a n-pentyl group, an isopentyl group, a neopentyl group, a n-hexyl group, a n-octyl group, a n-dodecyl group, and the like. Among these, a methyl group, an ethyl group, a n-propyl group, an isopropyl group, a n-butyl group, or a tert-butyl group is preferable, a methyl group or an ethyl group is more preferable, and a methyl group is particularly preferable.

The alkyl group represented by $R^{W5}$ is the same as the alkyl group represented by $R^{W1}$. Preferred aspects of the alkyl group represented by $R^{W5}$ are the same as preferred aspects of the alkyl group represented by $R^{W1}$.

Specific examples of the group represented by Formula (a1) will be shown below. However, the present disclosure is not limited thereto. In the following structural formulas, Me represents a methyl group, Et represents an ethyl group, and * represents a binding site.

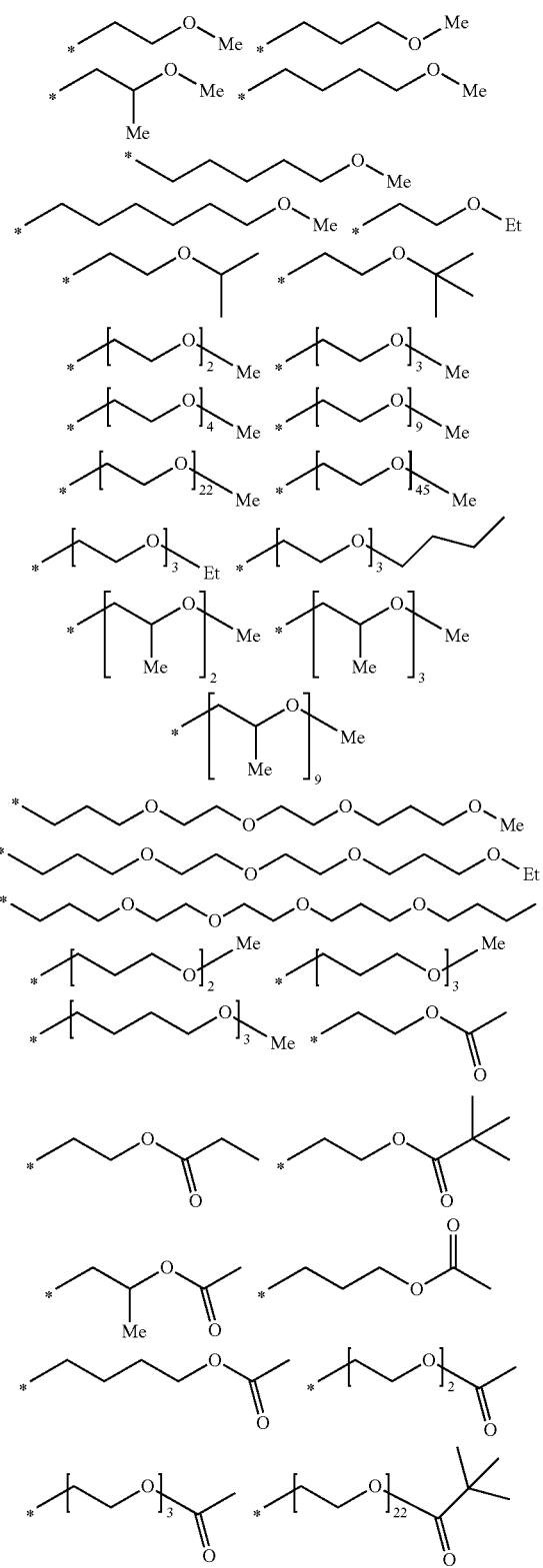

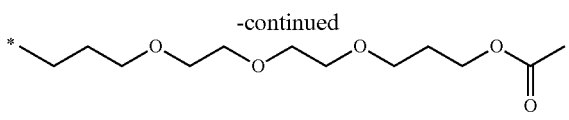

Specific examples of the alkylene group represented by $R^{W2}$ to $R^{W4}$ in Formula (a2) to Formula (a4) include a methylene group, an ethylene group, a n-propylene group, an isopropylene group, a n-butylene group, an isobutylene group, a n-pentylene group, an isopentylene group, a n-hexyl group, an isohexyl group, a n-octylene group, a n-dodecylene group, and the like. Among these, an ethylene group, a n-propylene group, an isopropylene group, or a n-butylene group is preferable, and an ethylene group or a n-propylene group is particularly preferable.

In Formula (a3), two Ms may be the same or different from each other.

Examples of the onium group represented by M in Formula (a2) to Formula (a4) include an ammonium group, an iodonium group, a phosphonium group, a sulfonium group, and the like.

All of $CO_2M$ in Formula (a2), $PO_3M_2$ in Formula (a2), and $SO_3M$ in Formula (a4) may have an anion structure from which M is dissociated. The countercation of the anion structure may be $A_1^+$ or a cation that can be contained in $R^1$-L in Formula 1-1.

Among the groups represented by Formula (a1) to Formula (a4), the group represented by Formula (a1), Formula (a2), or Formula (a4) is preferable.

$n_{11}$ and $n_{12}$ in Formula 1-1 are preferably the same as each other, and preferably both represent an integer of 1 to 5, more preferably both represent an integer of 1 to 3, even more preferably both represent 1 or 2, and particularly preferably both represent 2.

$A_1$ and $A_2$ in Formula 1-1 each independently represent an oxygen atom, a sulfur atom, or a nitrogen atom. Among these, a nitrogen atom is preferable.

$A_1$ and $A_2$ in Formula 1-1 are preferably the same atoms.

Za in Formula 1-1 represents a counterion that neutralizes charge.

In a case where all of $R^{11}$ to $R^{18}$ and $R^1$-L are groups having a neutral charge, Za is a monovalent counteranion. Here, $R^{11}$ to $R^{18}$ and $R^1$-L may have an anion structure or a cation structure. For example, in a case where two or more among $R^{11}$ to $R^{18}$ and $R^1$-L have an anion structure, Za can also be a countercation.

In a case where the cyanine dye represented by Formula 1-1 has such a structure that the overall charge of the compound is neutral except for Za, Za is unnecessary.

In a case where Za is a counteranion, examples thereof include a sulfonate ion, a carboxylate ion, a tetrafluoroborate ion, a hexafluorophosphate ion, a p-toluenesulfonate ion, a perchlorate ion, and the like. Among these, a tetrafluoroborate ion is preferable.

In a case where Za is a countercation, examples thereof include an alkali metal ion, an alkaline earth metal ion, an ammonium ion, a pyridinium ion, sulfonium ion, and the like. Among these, a sodium ion, a potassium ion, an ammonium ion, a pyridinium ion, or a sulfonium ion is preferable, and a sodium ion, a potassium ion, or an ammonium ion is more preferable.

From the viewpoint of improving visibility of exposed portions, the decomposable compound is more preferably a compound represented by Formula 1-2 (that is, a cyanine dye).

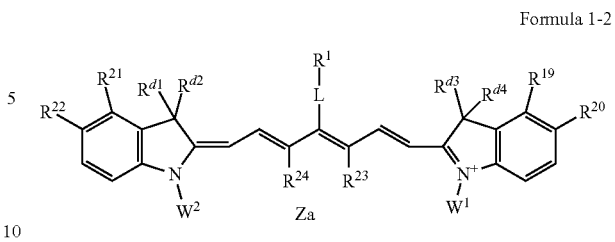

Formula 1-2

In Formula 1-2, $R^1$ represents a group represented by any of Formula 2 to Formula 4, $R^{19}$ to $R^{22}$ each independently represent a hydrogen atom, a halogen atom, $-R^a$, $-OR^b$, $-CN$, $-SR^c$, or $-NR^dR^e$, $R^{23}$ and $R^{24}$ each independently represent a hydrogen atom or $-R^a$, $R^a$ to $R^e$ each independently represent a hydrocarbon group, $R^{19}$ and $R^{20}$, $R^{21}$ and $R^{22}$, or $R^{23}$ and $R^{24}$ may be linked to each other to form a monocyclic or polycyclic ring, L represents an oxygen atom, a sulfur atom, or $-NR^{10}-$, $R^{10}$ represents a hydrogen atom, an alkyl group, or an aryl group, $R^{d1}$ to $R^{d4}$ $W^1$, and $W^2$ each independently represent an alkyl group which may have a substituent, and Za represents a counterion that neutralizes charge.

$R^1$ in Formula 1-2 has the same definition as $R^1$ in Formula 1-1, and preferred aspects thereof are also the same.

In Formula 1-2, $R^{19}$ to $R^{22}$ preferably each independently represent a hydrogen atom, a halogen atom, $-R^a$, $-OR^b$, or $-CN$.

More specifically, $R^{19}$ and $R^{21}$ are preferably a hydrogen atom or $-R^a$.

Furthermore, $R^{20}$ and $R^{22}$ are preferably a hydrogen atom, $-R^a$, $-OR^b$, or $-CN$.

$-R^a$ represented by $R^{19}$ to $R^{22}$ is preferably an alkyl group or an alkenyl group.

In a case where all of $R^{19}$ to $R^{22}$ are $-R^a$, it is preferable that $R^{19}$ and $R^{20}$ and $R^{21}$ and $R^{22}$ be linked to each other to form a monocyclic or polycyclic ring.

Examples of the ring formed of $R^{19}$ and $R^{20}$ or $R^{21}$ and $R^{22}$ linked to each other include a benzene ring, a naphthalene ring, and the like.

$R^{23}$ and $R^{24}$ in Formula 1-2 are preferably linked to each other to form a monocyclic or polycyclic ring.

The ring formed of $R^{23}$ and $R^{24}$ linked to each other may be a monocyclic or polycyclic ring. Specific examples of the ring to be formed include a monocyclic ring such as a cyclopentene ring, a cyclopentadiene ring, a cyclohexene ring, or a cyclohexadiene ring, and a polycyclic ring such as an indene ring.

$R^{d1}$ to $R^{d4}$ in Formula 1-2 are preferably an unsubstituted alkyl group. Furthermore, all of $R^{d1}$ to $R^{d4}$ are preferably the same group.

Examples of the unsubstituted alkyl group include unsubstituted alkyl groups having 1 to 4 carbon atoms. Among these, a methyl group is preferable.

From the viewpoint of improving water solubility of the compound represented by Formula 1-2, $W^1$ and $W^2$ in Formula 1-2 preferably each independently represent a substituted alkyl group.

Examples of the substituted alkyl group represented by $W^1$ and $W^2$ include a group represented by any of Formula (a1) to Formula (a4) in Formula 1-1, and preferred aspects thereof are also the same.

From the viewpoint of on-press developability, $W^1$ and $W^2$ preferably each independently represent an alkyl group having a substituent. The alkyl group preferably has at least —(OCH$_2$CH$_2$)—, a sulfo group, a salt of a sulfo group, a carboxy group, or a salt of a carboxy group, as the substituent.

Za represents a counterion that neutralizes charge in the molecule.

In a case where all of R$^{19}$ to R$^{22}$, R$^{23}$ and R$^{24}$, R$^{d1}$ to R$^{d4}$, W$^1$, W$^2$, and R$^1$-L are groups having a neutral charge, Za is a monovalent counteranion. Here, R$^{19}$ to R$^{22}$, R$^{23}$ and R$^{24}$, R$^{d1}$ to R$^{d4}$, W$^1$, W$^2$, and R$^1$-L may have an anion structure or a cation structure. For example, in a case where two among R$^{19}$ to R$^{22}$, R$^{23}$ and R$^{24}$, R$^{d1}$ to R$^{d4}$, W$^1$, W$^2$, and R$^1$-L have an anion structure, Za can be a countercation.

In a case where the compound represented by Formula 1-2 has such a structure that the overall charge of the compound is neutral except for Za, Za is unnecessary.

Examples of the case where Za is a counteranion are the same as such examples of Za in Formula 1-1, and preferred aspects thereof are also the same. Furthermore, examples of the case where Za is a countercation are the same as such examples of Za in Formula 1-1, and preferred aspects thereof are also the same.

From the viewpoint of decomposition properties and color developability, the cyanine dye as a decomposable compound is even more preferably a compound represented by any of Formula 1-3 to Formula 1-7.

Particularly, from the viewpoint of decomposition properties and color developability, the cyanine dye is preferably a compound represented by any of Formula 1-3, Formula 1-5, or Formula 1-6.

Formula 1-3

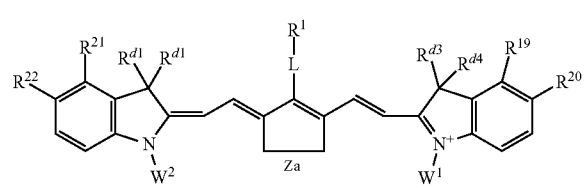

Formula 1-4

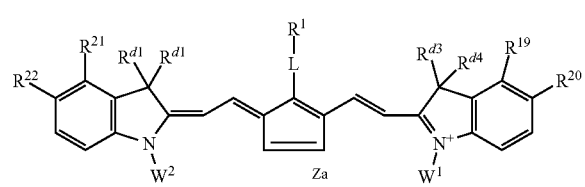

Formula 1-5

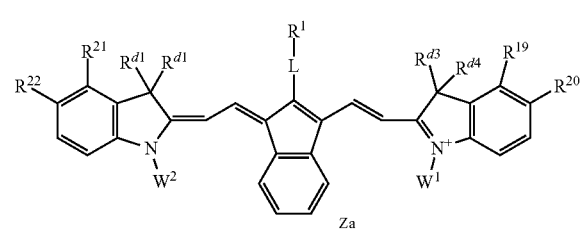

Formula 1-6

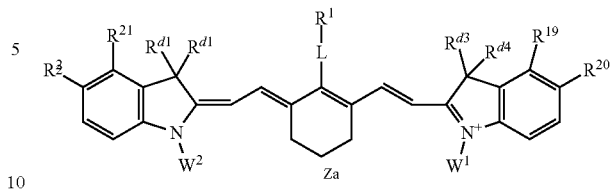

Formula 1-7

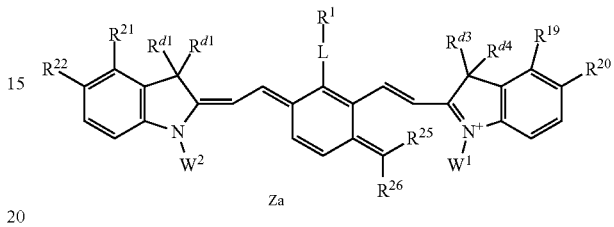

In Formula 1-3 to Formula 1-7, R$^1$ represents a group represented by any of Formula 2 to Formula 4, and R$^{19}$ to R$^{22}$ each independently represent a hydrogen atom, a halogen atom, —R$^a$, —OR$^b$, —CN, —SR$^c$, or —NR$^d$R$^e$, and R$^{25}$ and R$^{26}$ each independently represent a hydrogen atom, a halogen atom, or —R$^a$, and R$^a$ to R$^e$ each independently represent a hydrocarbon group, R$^{19}$ and R$^{20}$, R$^{21}$ and R$^{22}$, or R$^{25}$ and R$^{26}$ may be linked to each other to form a monocyclic or polycyclic ring, L represents an oxygen atom, a sulfur atom, or —NR$^{10}$—, R$^{10}$ represents a hydrogen atom, an alkyl group, or an aryl group, and R$^{d1}$ to R$^{d4}$, W$^1$, and W$^2$ each independently represent an alkyl group which may have a substituent, and Za represents a counterion that neutralizes charge.

R$^1$, R$^{19}$ to R$^{22}$, R$^{d1}$ to R$^{d4}$, W$^1$, W$^2$, and L in Formula 1-3 to Formula 1-7 have the same definitions as R$^1$, R$^{19}$ to R$^{22}$, R$^{d1}$ to R$^{d4}$, W$^1$, W$^2$, and L in Formula 1-2, and preferred aspects thereof are also the same.

R$^{25}$ and R$^{26}$ in Formula 1-7 preferably each independently represent a hydrogen atom or an alkyl group, more preferably each independently represent an alkyl group, and particularly preferably each independently represent a methyl group.

Specific examples of the cyanine dye as a decomposable compound will be shown below. However, the present disclosure is not limited thereto.

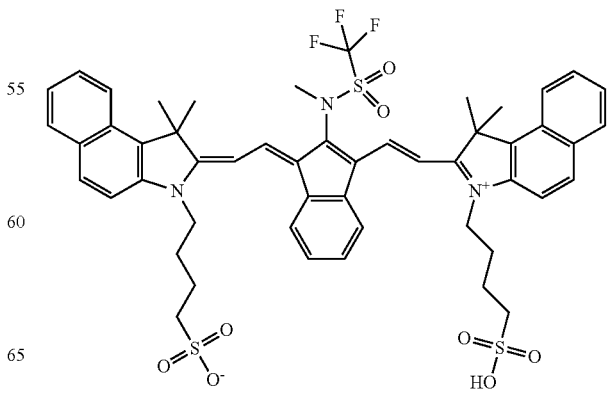

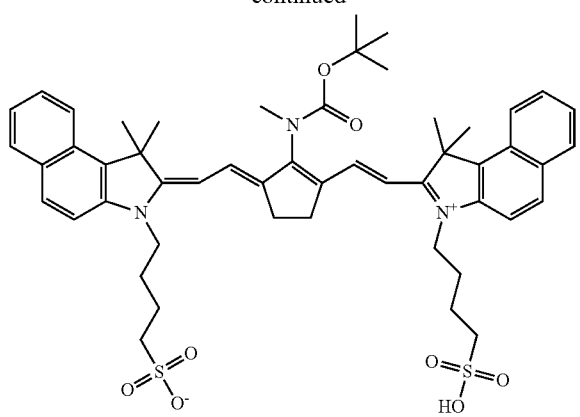

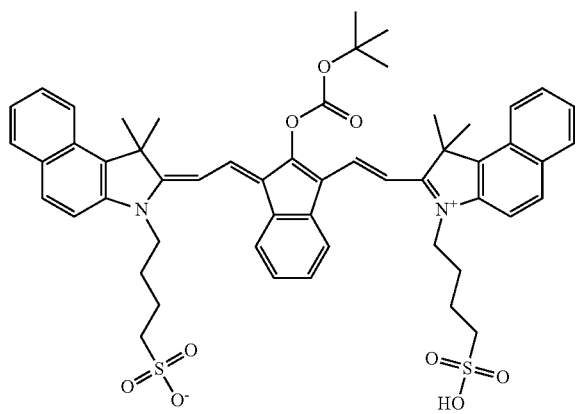

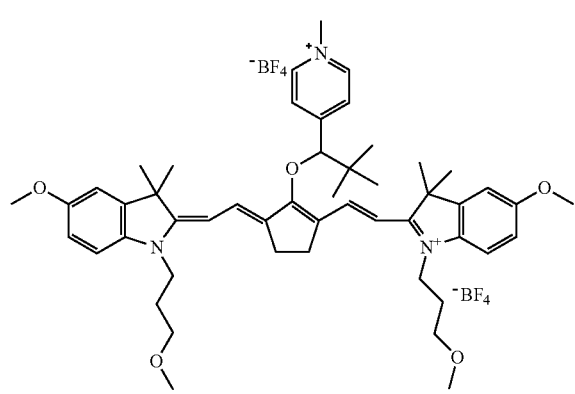

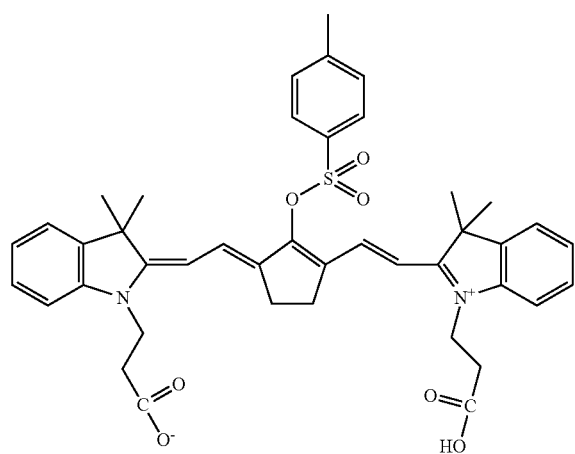

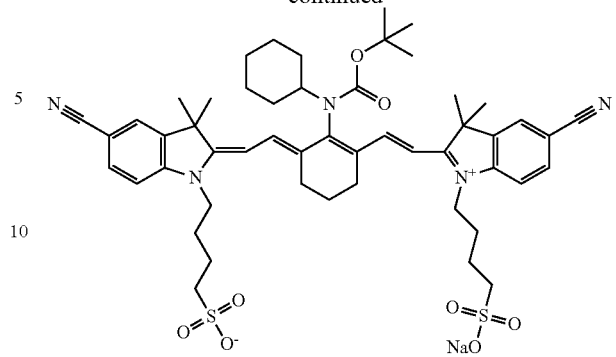

Furthermore, as the cyanine dye which is a decomposable compound, the infrared absorbing compound described in WO2019/219560A can be suitably used.

As the discoloring compound, an acid color-developing agent may also be used.

As the acid color-developing agent, it is possible to use the compounds described as acid color-developing agents in the image-recording layer, and preferred aspects thereof are also the same.

One kind of discoloring compound may be used alone, or two or more kinds of components may be combined and used as the discoloring compound.

As the discoloring compound, the acid color-developing agent described above and a known acid color-developing agent may be used in combination.

From the viewpoint of color developability, the content of the discoloring compound in the protective layer with respect to the total mass of the protective layer is preferably 0.10% by mass to 50% by mass, more preferably 0.50% by mass to 30% by mass, and even more preferably 1.0% by mass to 20% by mass.

From the viewpoint of color developability, $M^X/M^Y$ which is a ratio of a content $M^X$ of the discoloring compound in the protective layer to a content $M^Y$ of the infrared absorber in the image-recording layer is preferably 0.1 or more, more preferably 0.2 or more, and particularly preferably 0.3 or more and 3.0 or less.

The protective layer is formed by known coating methods. The coating amount of the protective layer (solid content) is preferably 0.01 g/m² to 10 g/m², more preferably 0.02 g/m² to 3 g/m², and particularly preferably 0.02 g/m² to 1 g/m².

<Aluminum Support>

The aluminum support of the lithographic printing plate precursor according to the present disclosure to be used can be appropriately selected from known aluminum supports for a lithographic printing plate precursor. Hereinafter, the aluminum support will be also simply called "support".

As the aluminum support, an aluminum support having a hydrophilic surface (hereinafter, also called "hydrophilic aluminum support") is preferable.

For the aluminum support in the lithographic printing plate precursor according to the present disclosure, from the viewpoint of suppressing scratches and contamination, a water contact angle on a surface of the aluminum support on the image-recording layer side that is determined by an airborne water droplet method is preferably 110° or less, more preferably 90° or less, even more preferably 80° or less, still more preferably 50° or less, particularly preferably 30° or less, more particularly preferably 20° or less, and most preferably 10° or less.

In the present disclosure, the water contact angle on a surface of the aluminum support on the image-recording layer side that is determined by an airborne water droplet method is measured by the following method.

The lithographic printing plate precursor is immersed in a solvent capable of removing the image-recording layer (for example, a solvent used in a coating solution for an image-recording layer), and the image-recording layer is scraped off with at least one of sponge or cotton or dissolved in a solvent, so that the surface of the aluminum support is exposed.

There may be the hydrophilic compound, which will be described later, on the surface of the aluminum support exposed by the above method. Therefore, the water contact angle on the surface may be adjusted, for example, by the hydrophilic compound remaining on the surface of the aluminum support.

The water contact angle on a surface of the exposed aluminum support on the image-recording layer side is measured using a measurement device, a fully automatic contact angle meter (for example, DM-501 manufactured by Kyowa Interface Science Co., Ltd.), as a water droplet contact angle on the surface at 25° C. (after 0.2 seconds).

As the aluminum support in the present disclosure, an aluminum plate is preferable which has been roughened using a known method and has undergone an anodic oxidation treatment. That is, the aluminum support in the present disclosure preferably has an aluminum plate and an aluminum anodic oxide film disposed on the aluminum plate.

[Preferred Aspect of Support]

One of the examples of preferred aspects of the aluminum support used in the present disclosure (the aluminum support according to this example is also called "support (1)") is as below.

That is, the support (1) has an aluminum plate and an anodic oxide film of aluminum disposed on the aluminum plate, the anodic oxide film is at a position closer to a side of the image-recording layer than the aluminum plate and has micropores extending in a depth direction from the surface of the anodic oxide film on the side of the image-recording layer, the average diameter of the micropores within the surface of the anodic oxide film is more than 10 nm and 100 nm or less, and a value of brightness L* of the surface of the anodic oxide film on the side of the image-recording layer is 70 to 100 in the L*a*b* color space.

FIG. 1 is a schematic cross-sectional view of an embodiment of an aluminum support 12a.

The aluminum support 12a has a laminated structure in which an aluminum plate 18 and an anodic oxide film 20a of aluminum (hereinafter, also simply called "anodic oxide film 20a") are laminated in this order. The anodic oxide film 20a in the aluminum support 12a is positioned so that the anodic oxide film 20a is closer to the image-recording layer side than the aluminum plate 18. That is, it is preferable that the lithographic printing plate precursor according to the present disclosure have at least an anodic oxide film, an image-recording layer, and an optionally provided protective layer in this order on an aluminum plate.

—Anodic Oxide Film—

Hereinafter, preferred aspects of the anodic oxide film 20a will be described.

The anodic oxide film 20a is a film prepared on a surface of the aluminum plate 18 by an anodic oxidation treatment. This film has uniformly distributed ultrafine micropores 22a approximately perpendicular to the surface of the film. The micropores 22a extend from a surface of the anodic oxide film 20a on the image-recording layer side (a surface of the anodic oxide film 20a opposite to the aluminum plate 18) along the thickness direction (toward the aluminum plate 18).

Within the surface of the anodic oxide film, the average diameter (average opening diameter) of the micropores 22a in the anodic oxide film 20a is preferably more than 10 nm and 100 nm or less. Particularly, from the viewpoint of balance between printing durability, antifouling properties, and image visibility, the average diameter of the micropores 22a is more preferably 15 nm to 60 nm, even more preferably 20 nm to 50 nm, and particularly preferably 25 nm to 40 nm. The internal diameter of the pores may be larger or smaller than the pore diameter within the surface layer.

In a case where the average diameter is more than 10 nm, printing durability and image visibility are further improved. Furthermore, in a case where the average diameter is 100 nm or less, printing durability is further improved.

The average diameter of the micropores 22a is determined by observing the surface of the anodic oxide film 20a with a field emission scanning electron microscope (FE-SEM) at 150,000× magnification (N=4), measuring the size (diameter) of 50 micropores existing in a range of 400×600 nm² in the obtained 4 images, and calculating the arithmetic mean thereof.

In a case where the shape of the micropores 22a is not circular, the equivalent circular diameter is used. "Equivalent circular diameter" is a diameter determined on an assumption that the opening portion is in the form of a circle having the same projected area as the projected area of the opening portion.

The depth of the micropores 22a is not particularly limited, but is preferably 10 nm to 3,000 nm, more preferably 50 nm to 2,000 nm, and even more preferably 300 nm to 1,600 nm.

The depth is a value obtained by taking a photograph (150,000× magnification) of a cross section of the anodic oxide film 20a, measuring the depths of 25 or more micropores 22a, and calculating the average thereof.

Figure 2:
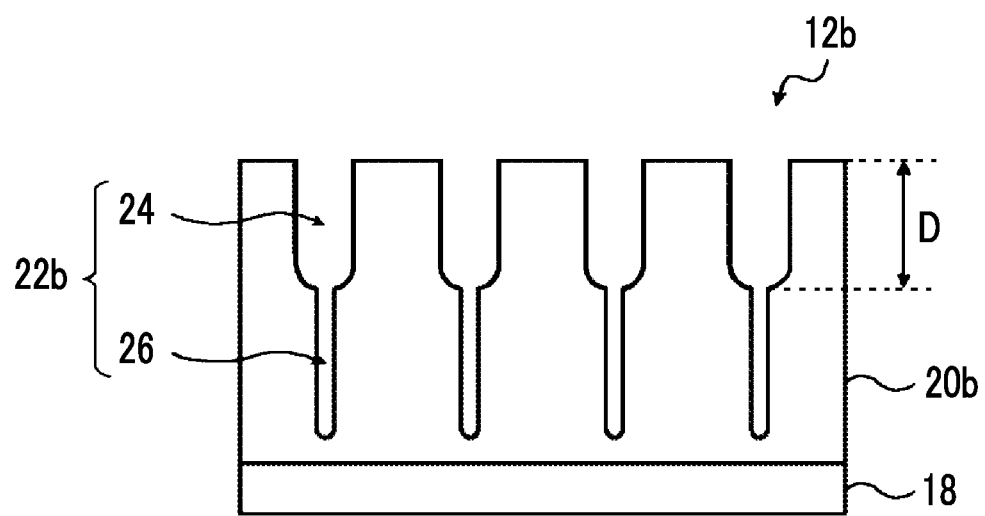
FIG. 2 is a schematic cross-sectional view of another embodiment of the aluminum support.

The shape of the micropores 22a is not particularly limited. In FIG. 2, the micropores 22a have a substantially straight tubular shape (substantially cylindrical shape). However, the micropores 22a may have a conical shape that tapers along the depth direction (thickness direction). The shape of the bottom portion of the micropores 22a is not particularly limited, and may be a curved (convex) or flat surface shape.

In the L*a*b* color space, the value of brightness L* of the surface of the aluminum support 12a on the image-recording layer side (surface of the anodic oxide film 20a on the image-recording layer side) is preferably 70 to 100. Especially, the value of brightness L* is preferably 75 to 100 and more preferably 75 to 90, because printing durability and image visibility are better balanced in this range.

The brightness L* is measured using a color difference meter Spectro Eye manufactured by X-Rite, Incorporated.

For example, an aspect is also preferable in which the micropores in the support (1) are each constituted with a large diameter portion that extends to a position at a depth of 10 nm to 1,000 nm from the surface of the anodic oxide film and a small diameter portion that is in communication with the bottom portion of the large diameter portion and extends to a position at a depth of 20 nm to 2,000 nm from a communication position, an average diameter of the large diameter portion within the surface of the anodic oxide film is 15 nm to 100 nm, and an average diameter of the small diameter portion at a communication position is 13 nm or less (hereinafter, the support according to this aspect will be also called "support (2)").

FIG. 2 is a schematic cross-sectional view of an embodiment of the aluminum support 12a that is different from what is shown in FIG. 1. A support B is an aspect of the aluminum support 12a shown in FIG. 2.

In FIG. 2, an aluminum support 12b includes an aluminum plate 18 and an anodic oxide film 20b having micropores 22b each composed of a large diameter portion 24 and a small diameter portion 26.

The micropores 22b in the anodic oxide film 20b are each composed of the large diameter portion 24 that extends to a position at a depth of 10 nm to 1,000 nm (depth D: see FIG. 2) from the surface of the anodic oxide film and the small diameter portion 26 that is in communication with the bottom portion of the large diameter portion 24 and further extends from the communication position to a position at a depth of 20 nm to 2,000 nm. Hereinafter, the large diameter portion 24 and the small diameter portion 26 will be specifically described.

The average diameter of the large diameter portion 24 within the surface of the anodic oxide film 20b is the same as the average diameter of the micropores 22a in the aforementioned anodic oxide film 20a within the surface of the anodic oxide film, which is more than 10 nm and 100 nm or less. The suitable range thereof is also the same.

The method for measuring the average diameter of the large diameter portion 24 within the surface of the anodic oxide film 20b is the same as the method for measuring the average diameter of the micropores 22a in the anodic oxide film 20a within the surface of the anodic oxide film.

The bottom portion of the large diameter portion 24 is in a position at a depth of 10 nm to 1,000 nm (hereinafter, also called depth D) from the surface of the anodic oxide film. That is, the large diameter portion 24 is a pore portion extending to a position at a depth of 10 nm to 1,000 nm from the surface of the anodic oxide film in the depth direction (thickness direction). The depth is preferably 10 nm to 200 nm.

The depth is a value obtained by taking a photograph (150,000× magnification) of a cross section of the anodic oxide film 20b, measuring the depths of 25 or more large diameter portions 24, and calculating the average thereof.

The shape of the large diameter portion 24 is not particularly limited. Examples of the shape of the large diameter portion 24 include a substantially straight tubular shape (substantially cylindrical shape) and a conical shape that tapers along the depth direction (thickness direction). Among these, a substantially straight tubular shape is preferable.

As shown in FIG. 2, the small diameter portion 26 is a pore portion that is in communication with the bottom portion of the large diameter portion 24 and further extends from the communication position in the depth direction (thickness direction).

The average diameter of the small diameter portion 26 at the communication position is preferably 13 nm or less. Particularly, the average diameter is preferably 11 nm or less, and more preferably 10 nm or less. The lower limit thereof is not particularly limited, but is 5 nm or more in many cases.

The average diameter of the small diameter portion 26 is obtained by observing the surface of the anodic oxide film 20a with FE-SEM at 150,000× magnification (N=4), measuring the size (diameter) of the micropores (small diameter portion) existing in a range of 400 nm×600 nm in the obtained 4 images, and calculating the arithmetic mean thereof. In a case where the large diameter portion is deep, if necessary, the upper portion of the anodic oxide film 20b (region where the large diameter portion is located) may be cut (for example, by using argon gas), then the surface of the anodic oxide film 20b may be observed with FE-SEM described above, and the average diameter of the small diameter portion may be determined.

In a case where the shape of the small diameter portion 26 is not circular, the equivalent circular diameter is used. "Equivalent circular diameter" is a diameter determined on an assumption that the opening portion is in the form of a circle having the same projected area as the projected area of the opening portion.

The bottom portion of the small diameter portion 26 is in a position 20 nm to 2,000 nm distant from the communication position with the large diameter portion 24 in the depth direction. In other words, the small diameter portion 26 is a pore portion that extends further from the communication position with the large diameter portion 24 in the depth direction (thickness direction), and the depth of the small diameter portion 26 is 20 nm to 2,000 nm. The depth is preferably 500 nm to 1,500 nm.

The depth is a value determined by taking a photograph (50,000× magnification) of a cross section of the anodic oxide film 20b, measuring the depths of 25 or more small diameter portions, and calculating the average thereof.

The shape of the small diameter portion 26 is not particularly limited. Examples of the shape of the small diameter portion 26 include a substantially straight tubular shape (substantially cylindrical shape) and a conical shape that tapers along the depth direction. Among these, a substantially straight tubular shape is preferable.

[Method for Manufacturing Aluminum Support]

As a method for manufacturing the aluminum support in the present disclosure, for example, a manufacturing method is preferable in which the following steps are sequentially performed.

Roughening treatment step: step of performing roughening treatment on aluminum plate Anodic oxidation treatment step: step of subjecting aluminum plate having undergone roughening treatment to anodic oxidation Pore widening treatment step: step of bringing aluminum plate having anodic oxide film obtained by anodic oxidation treatment step into contact with aqueous acid solution or aqueous alkali solution so that diameter of micropores in anodic oxide film increases Hereinafter, the procedure of each step will be specifically described.

[Roughening Treatment Step]

The roughening treatment step is a step of performing a roughening treatment including an electrochemical roughening treatment on the surface of the aluminum plate. This step is preferably performed before the anodic oxidation treatment step which will be described later. However, in a case where the surface of the aluminum plate already has a preferable shape, the roughening treatment step may not be performed.

As the roughening treatment, only an electrochemical roughening treatment may be performed, or an electrochemical roughening treatment and mechanical roughening treatment and/or a chemical roughening treatment may be performed in combination.

In a case where the mechanical roughening treatment and the electrochemical roughening treatment are combined, it is preferable to perform the electrochemical roughening treatment after the mechanical roughening treatment.

It is preferable to perform the electrochemical roughening treatment by using direct current or alternating current in an aqueous solution containing nitric acid or hydrochloric acid as a main component.

The method of the mechanical roughening treatment is not particularly limited. Examples thereof include the method described in JP1975-40047B (JP-S50-40047B).

Furthermore, the chemical roughening treatment is not particularly limited, and examples thereof include known methods.

After the mechanical roughening treatment, it is preferable to perform the following chemical etching treatment.

By the chemical etching treatment performed after the mechanical roughening treatment, the edge portion of surface irregularities of the aluminum plate smoothed, so that ink clotting that may occur during printing is prevented, the antifouling properties of the printing plate are improved, and unnecessary substances such as abrasive particles remaining on the surface are removed.

Examples of the chemical etching treatment include etching with an acid and etching with an alkali. One of the examples of particularly efficient etching methods is a chemical etching treatment using an aqueous alkali solution (hereinafter, also called "alkaline etching treatment").

The alkaline agent used in the aqueous alkali solution is not particularly limited. Examples thereof include caustic soda, caustic potash, sodium metasilicate, sodium carbonate, sodium aluminate, and sodium gluconate.

The aqueous alkali solution may contain aluminum ions.

The concentration of the alkaline agent in the aqueous alkali solution is preferably 0.01% by mass or more, and more preferably 3% by mass or more. Furthermore, the concentration of the alkaline agent is preferably 30% by mass or less.

In a case where the alkaline etching treatment is performed, in order to remove products generated by the alkaline etching treatment, it is preferable to perform the chemical etching treatment by using a low-temperature aqueous acidic solution (hereinafter, also called "desmutting treatment").

The acid used in the aqueous acidic solution is not particularly limited, and examples thereof include sulfuric acid, nitric acid, and hydrochloric acid. The temperature of the aqueous acidic solution is preferably 20° C. to 80° C.

As the roughening treatment step, a method is preferable in which the treatments described in an aspect A or an aspect B are performed in the following order.

—Aspect A—
(2) Chemical etching treatment using aqueous alkali solution (first alkaline etching treatment)
(3) Chemical etching treatment using aqueous acidic solution (first desmutting treatment)
(4) Electrochemical roughening treatment using aqueous solution containing nitric acid as main component (first electrochemical roughening treatment)
(5) Chemical etching treatment using aqueous alkali solution (second alkaline etching treatment)
(6) Chemical etching treatment using aqueous acidic solution (second desmutting treatment)
(7) Electrochemical roughening treatment in aqueous solution containing hydrochloric acid as main component (second electrochemical roughening treatment)
(8) Chemical etching treatment using aqueous alkali solution (third alkaline etching treatment)
(9) Chemical etching treatment using aqueous acidic solution (third desmutting treatment)

—Aspect B—
(10) Chemical etching treatment using aqueous alkali solution (fourth alkaline etching treatment)
(11) Chemical etching treatment using aqueous acidic solution (fourth desmutting treatment)
(12) Electrochemical roughening treatment using aqueous solution containing hydrochloric acid as main component (third electrochemical roughening treatment)
(13) Chemical etching treatment using aqueous alkali solution (fifth alkaline etching treatment)
(14) Chemical etching treatment using aqueous acidic solution (fifth desmutting treatment)

If necessary, (1) mechanical roughening treatment may be performed before the treatment (2) of the aspect A or before the treatment (10) of the aspect B.

The amount of the aluminum plate dissolved by the first alkaline etching treatment and the fourth alkaline etching treatment is preferably 0.5 g/m$^2$ to 30 g/m$^2$, and more preferably 1.0 g/m$^2$ to 20 g/m$^2$.

Examples of the aqueous solution containing nitric acid as a main component used in the first electrochemical roughening treatment of the aspect A include aqueous solutions used in the electrochemical roughening treatment using direct current or alternating current. Examples thereof include an aqueous solution obtained by adding aluminum nitrate, sodium nitrate, ammonium nitrate, or the like to a 1 to 100 g/L aqueous nitric acid solution.

Examples of the aqueous solution containing hydrochloric acid as a main component used in the second electrochemical roughening treatment of the aspect A and in the third electrochemical roughening treatment of the aspect B include aqueous solutions used in the general electrochemical roughening treatment using direct current or alternating current. Examples thereof include an aqueous solution obtained by adding 0 g/L to 30 g/L of sulfuric acid to a 1 g/L to 100 g/L aqueous hydrochloric acid solution. Nitrate ions such as aluminum nitrate, sodium nitrate, and ammonium nitrate; hydrochloric acid ions such as aluminum chloride, sodium chloride, and ammonium chloride may be further added to this solution.

As the waveform of an alternating current power source for the electrochemical roughening treatment, a sine wave, a square wave, a trapezoidal wave, a triangular wave, and the like can be used. The frequency is preferably 0.1 Hz to 250 Hz.

Figure 3:
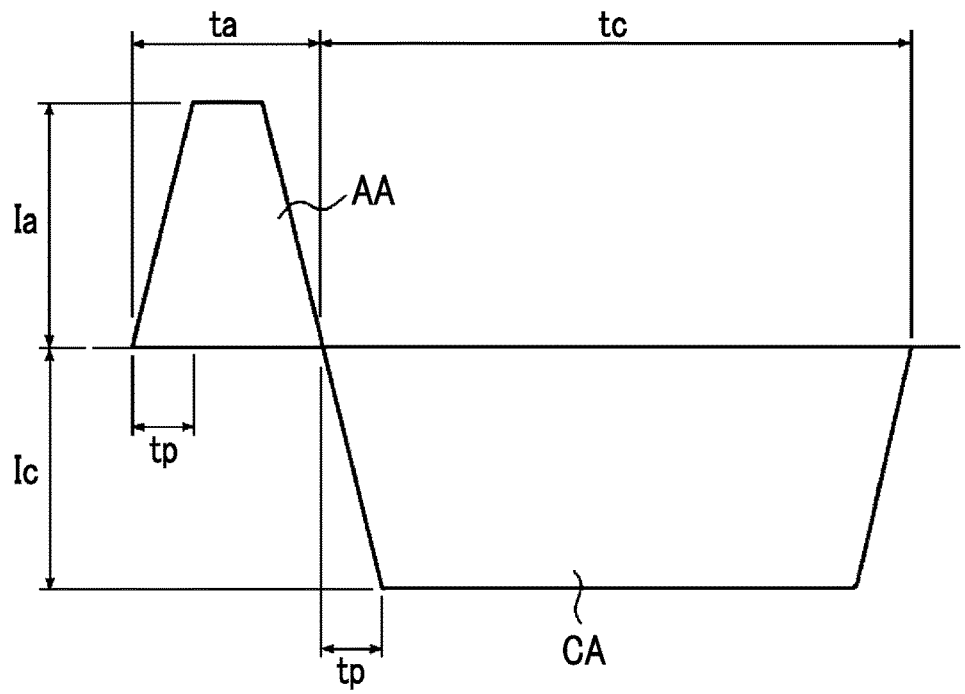
FIG. 3 is an example of a waveform graph of alternating current used for an electrochemical roughening treatment in a method for manufacturing an aluminum support.

FIG. 3 is an example of a waveform graph of alternating current used for an electrochemical roughening treatment.

In FIG. 3, ta represents an anodic reaction time, tc represents a cathodic reaction time, tp represents the time taken for current to reach a peak from 0, Ia represents the peak current on the anodic cycle side, Ic represents the peak current on the cathodic cycle side, AA represents current for an anodic reaction of an aluminum plate, and CA represents current for a cathodic reaction of an aluminum plate. For a trapezoidal wave, the time tp taken for current to reach a peak from 0 is preferably 1 ms to 10 ms. Regarding the conditions of one cycle of alternating current used for the electrochemical roughening, a ratio tc/ta of the cathodic reaction time tc to the anodic reaction time ta of the aluminum plate is preferably within a range of 1 to 20, a ratio Qc/Qa of an electricity quantity Qc during the cathodic reaction to an electricity quantity Qa during the anodic reaction of the aluminum plate is preferably within a range of 0.3 to 20, and the anodic reaction time ta is preferably within a range of 5 ms to 1,000 ms. The peak current density of the trapezoidal wave is preferably 10 A/dm² to 200 A/dm² at both the anodic cycle side Ia and the cathodic cycle side Ic of the current. Ic/Ia is preferably 0.3 to 20. At a point time when the electrochemical roughening has ended, the total quantity of electricity that participates in the anodic reaction of the aluminum plate is preferably 25 C/dm² to 1,000 C/dm².

Figure 4:
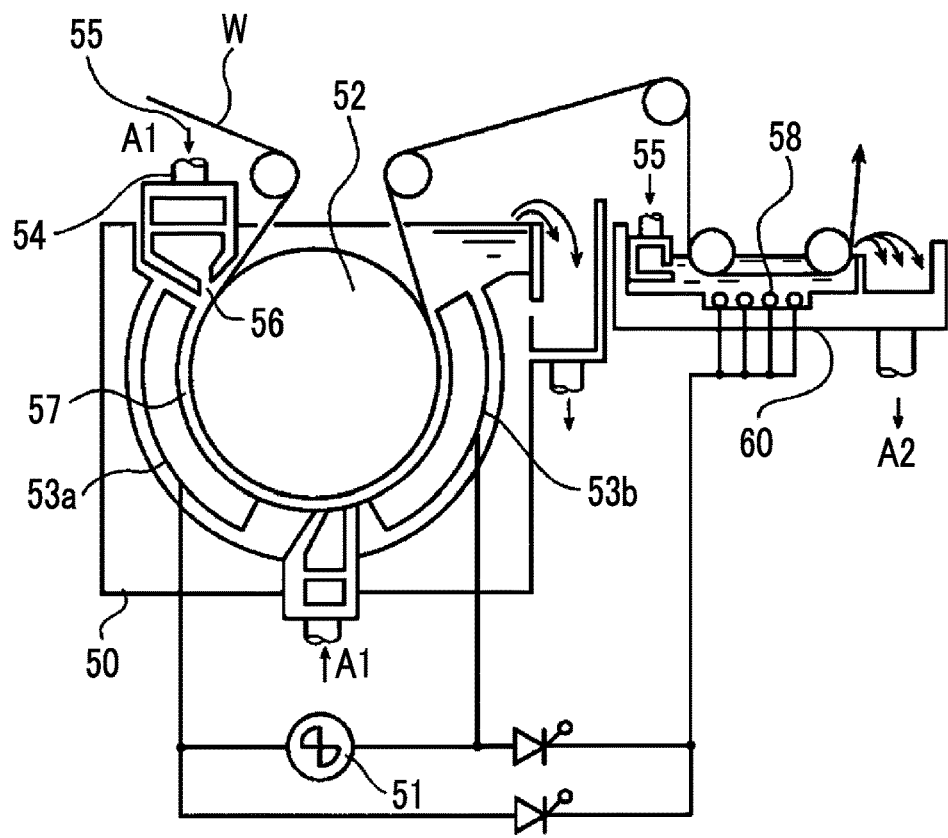
FIG. 4 is a lateral view showing an example of a radial cell in an electrochemical roughening treatment using alternating current in a method for manufacturing an aluminum support.

The electrochemical roughening using alternating current can be performed using the device shown in FIG. 4.

FIG. 4 is a lateral view showing an example of a radial cell in an electrochemical roughening treatment using alternating current.

In FIG. 4, 50 represents a main electrolytic cell, 51 represents an alternating current power source, 52 represents a radial drum roller, 53a and 53b represent main poles, 54 represents an electrolytic solution supply port, 55 represents an electrolytic solution, 56 represents a slit, 57 represents an electrolytic solution path, 58 represents an auxiliary anode, 60 represents an auxiliary anode tank, and W represents an aluminum plate. In FIG. 4, the arrow A1 represents a supply direction of an electrolytic solution, and the arrow A2 represents a discharge direction of the electrolytic solution. In a case where two or more electrolytic cells are used, the electrolysis conditions may be the same as or different from each other.

The aluminum plate W is wound around the radial drum roller 52 immersed and disposed in the main electrolytic cell 50. While being transported, the aluminum plate W is electrolyzed by the main poles 53a and 53b connected to the alternating current power source 51. From the electrolytic solution supply port 54, the electrolytic solution 55 is supplied to the electrolytic solution path 57 between the radial drum roller 52 and the main poles 53a and 53b through the slit 56. The aluminum plate W treated in the main electrolytic cell 50 is then electrolyzed in the auxiliary anode tank 60. In the auxiliary anode tank 60, the auxiliary anode 58 is disposed to face the aluminum plate W. The electrolytic solution 55 is supplied to flow in the space between the auxiliary anode 58 and the aluminum plate W.

In view of easily manufacturing a predetermined printing plate precursor, the amount of the aluminum plate dissolved by the second alkaline etching treatment is preferably 1.0 g/m² or more, and more preferably 2.0 g/m² to 10 g/m².

In view of easily manufacturing a predetermined printing plate precursor, the amount of the aluminum plate dissolved by the third alkaline etching treatment and the fourth alkaline etching treatment is preferably 0.01 g/m² to 0.8 g/m², and more preferably 0.05 g/m² to 0.3 g/m².

In the chemical etching treatment (first to fifth desmutting treatments) using an aqueous acidic solution, an aqueous acidic solution containing phosphoric acid, nitric acid, sulfuric acid, chromic acid, hydrochloric acid, or a mixed acid consisting of two or more of these acids is suitably used.

The concentration of the acid in the aqueous acidic solution is preferably 0.5% by mass to 60% by mass.

[Anodic Oxidation Treatment Step]

The procedure of the anodic oxidation treatment step is not particularly limited as long as the aforementioned micropores can be obtained. Examples thereof include known methods.

In the anodic oxidation treatment step, an aqueous solution of sulfuric acid, phosphoric acid, oxalic acid, or the like can be used as an electrolytic cell. For example, the concentration of sulfuric acid is 100 g/L to 300 g/L.

The conditions of the anodic oxidation treatment are appropriately set depending on the electrolytic solution used. For example, the liquid temperature is 5° C. to 70° C. (preferably 10° C. to 60° C.), the current density is 0.5 A/dm² to 60 A/dm² (preferably 5 A/dm² to 60 A/dm²), the voltage is 1 V to 100 V (preferably 5 V to 50 V), the electrolysis time is 1 second to 100 seconds (preferably 5 seconds to 60 seconds), and the film amount is 0.1 g/m² to 5 g/m² (preferably 0.2 g/m² to 3 g/m²).

[Pore Widening Treatment]

The pore widening treatment is a treatment of enlarging the diameter of micropores (pore diameter) present in the anodic oxide film formed by the aforementioned anodic oxidation treatment step (pore diameter enlarging treatment).

The pore widening treatment can be carried out by bringing the aluminum plate obtained by the anodic oxidation treatment step into contact with an aqueous acid solution or an aqueous alkali solution. The contact method is not particularly limited, and examples thereof include a dipping method and a spraying method.

<Undercoat Layer>

The lithographic printing plate precursor according to the present disclosure preferably has an undercoat layer (called interlayer in some cases) between the image-recording layer and the support. The undercoat layer enhances the adhesiveness between the support and the image-recording layer in an exposed portion, and enables the image-recording layer to be easily peeled from the support in a non-exposed portion. Therefore, the undercoat layer contributes to the improvement of developability without deteriorating printing durability. Furthermore, in the case of exposure to infrared laser, the undercoat layer functions as a heat insulating layer and thus brings about an effect of preventing sensitivity reduction resulting from the diffusion of heat generated by exposure to the support.

Examples of compounds that are used in the undercoat layer include polymers having adsorbent group that can be adsorbed onto the surface of the support and hydrophilic groups. In order to improve adhesiveness to the image-recording layer, polymers having adsorbent groups and hydrophilic groups plus crosslinking groups are preferable. The compounds that are used in the undercoat layer may be low-molecular-weight compounds or polymers. If necessary, as the compounds that are used in the undercoat layer, two or more kinds of compounds may be used by being mixed together.

In a case where the compound used in the undercoat layer is a polymer, a copolymer of a monomer having an adsorbent group, a monomer having a hydrophilic group, and a monomer having a crosslinking group is preferable.

As the adsorbent group groups that can be adsorbed onto the surface of the support, a phenolic hydroxyl group, a carboxy group, $-PO_3H_2$, $-OPO_3H_2$, $-CONHSO_2-$, $-SO_2NHSO_2-$, and $-COCH_2COCH_3$ are preferable. As the hydrophilic groups, a sulfo group or salts thereof and salts of a carboxy group are preferable. As the crosslinking groups, an acryloyl group, a methacryloyl group, an acrylamide group, a methacrylamide group, an allyl group, and the like are preferable.

The polymer may have a crosslinking group introduced by the formation of a salt of a polar substituent of the polymer and a compound that has a substituent having charge opposite to that of the polar substituent and an ethylenically unsaturated bond, or may be further copolymerized with monomers other than the monomers described above and preferably with hydrophilic monomers.

Specifically, for example, silane coupling agents having addition polymerizable ethylenic double bond reactive groups described in JP1998-282679A (JP-H10-282679A)

and phosphorus compounds having ethylenic double bond reactive groups described in JP1990-304441A (JP-H02-304441A) are suitable. The low-molecular-weight compounds or polymer compounds having crosslinking groups (preferably ethylenically unsaturated bonding groups), functional groups that interact with the surface of the support, and hydrophilic groups described in JP2005-238816A, JP2005-125749A, JP2006-239867A, and JP2006-215263A are also preferably used.

For example, the high-molecular-weight polymers having adsorbent groups that can be adsorbed onto the surface of the support, hydrophilic groups, and crosslinking groups described in JP2005-125749A and JP2006-188038A are more preferable.

The content of ethylenically unsaturated bonding group in the polymer used in the undercoat layer is preferably 0.1 mmol to 10.0 mmol per gram of the polymer, and more preferably 0.2 mmol to 5.5 mmol per gram of the polymer.

The weight-average molecular weight (Mw) of the polymer used in the undercoat layer is preferably 5,000 or more, and more preferably 10,000 to 300,000.

[Hydrophilic Compound]

From the viewpoint of developability, it is preferable that the undercoat layer contain a hydrophilic compound.

The hydrophilic compound is not particularly limited, and known hydrophilic compounds used for the undercoat layer can be used.

Preferable examples of hydrophilic compounds include phosphonic acids having an amino group such as carboxymethyl cellulose and dextrin, an organic phosphonic acid, an organic phosphoric acid, an organic phosphinic acid, an amino acid, a hydrochloride of amine having a hydroxyl group, and the like.

In addition, preferable examples of hydrophilic compounds include a compound having an amino group or a functional group capable of inhibiting polymerization and a group that interacts with the surface of the support (for example, 1,4-diazabicyclo[2.2.2]octane (DABCO), 2,3,5,6-tetrahydroxy-p-quinone, chloranil, sulfophthalic acid, ethylenediaminetetraacetic acid (EDTA) or a salt thereof, hydroxyethyl ethylenediaminetriacetic acid or a salt thereof, dihydroxyethyl ethylenediaminediacetic acid or a salt thereof, hydroxyethyl iminodiacetic acid or a salt thereof, and the like).

From the viewpoint of suppressing scratches and contamination, it is preferable that the hydrophilic compound include hydroxycarboxylic acid or a salt thereof.

Furthermore, from the viewpoint of suppressing scratches and contamination, it is preferable that the hydrophilic compound (preferably hydroxycarboxylic acid or a salt thereof) be contained not only in the undercoat layer but also in a layer on the aluminum support. The layer on the aluminum support is preferably a layer on the side where the image-recording layer is formed or a layer in contact with the aluminum support.

Preferable examples of the layer on the aluminum support include a layer in contact with the aluminum support, such as the undercoat layer or the image-recording layer. Furthermore, a layer other than the layer in contact with the aluminum support, for example, the protective layer or the image-recording layer may contain a hydrophilic compound and preferably contains hydroxycarboxylic acid or a salt thereof.

In the lithographic printing plate precursor according to the present disclosure, from the viewpoint of suppressing scratches and contamination, it is preferable that the image-recording layer contain hydroxycarboxylic acid or a salt thereof.

Moreover, regarding the lithographic printing plate precursor according to the present disclosure, for example, an aspect is also preferable in which the surface of the aluminum support on the image-recording layer side is treated with a composition (for example, an aqueous solution or the like) containing at least hydroxycarboxylic acid or a salt thereof. In a case where the above aspect is adopted, at least some of the hydroxycarboxylic acid or a salt thereof used for treatment can be detected in a state of being contained in the layer on the image-recording layer side (for example, the image-recording layer or the undercoat layer) that is in contact with the aluminum support.

In a case where the layer on the image-recording layer side that is in contact with the aluminum support, such as the undercoat layer, contains hydroxycarboxylic acid or a salt thereof, the surface of the aluminum support on the image-recording layer side can be hydrophilized, and it is easy for the surface of the aluminum support on the image-recording layer side to have a water contact angle of 1100 or less measured by an airborne water droplet method. Therefore, scratches and contamination are excellently suppressed.

"Hydroxycarboxylic acid" is the generic term for organic compounds having one or more carboxy groups and one or more hydroxyl groups in one molecule. These compounds are also called hydroxy acid, oxy acid, oxycarboxylic acid, or alcoholic acid (see Iwanami Dictionary of Physics and Chemistry, 5th Edition, published by Iwanami Shoten, Publishers. (1998)).

The hydroxycarboxylic acid or a salt thereof is preferably represented by Formula (HC).

　　Formula (HC)

In Formula (HC), $R^{HC}$ represents an (mhc+nhc)-valent organic group, $M^{HC}$ each independently represents a hydrogen atom, an alkali metal, or an onium, and mhc and nhc each independently represent an integer of 1 or more. In a case where n is 2 or more, Ms may be the same or different from each other.

Examples of the (mhc+nhc)-valent organic group represented by $R^{HC}$ in Formula (HC) include an (mhc+nhc)-valent hydrocarbon group and the like. The hydrocarbon group may have a substituent and/or a linking group.

Examples of the hydrocarbon group include an (mhc+nhc)-valent group derived from aliphatic hydrocarbon, such as an alkylene group, an alkanetriyl group, an alkanetetrayl group, an alkanepentayl group, an alkenylene group, an alkenetriyl group, an alkenetetrayl group, and alkenepentayl group, an alkynylene group, an alkynetriyl group, alkynetetrayl group, or an alkynepentayl group, an (mhc+nhc)-valent group derived from aromatic hydrocarbon, such as an arylene group, an arenetriyl group, an arenetetrayl group, or an arenepentayl group, and the like. Examples of the substituent other than a hydroxyl group and a carboxy group include an alkyl group, an alkenyl group, an alkynyl group, an aralkyl group, an aryl group, and the like. Specific examples of the substituent include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, eicosyl group, isopropyl group, isobutyl group, s-butyl group, t-butyl group, isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a methoxymethyl group, a methoxyethoxyethyl group, an allyloxymethyl group, a phenoxymethyl group, an acetyloxymethyl group, a benzoyloxymethyl group, a benzyl group, a phenethyl group, an α-methylbenzyl group, a 1-methyl-1-phenylethyl group, a β-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, a 3-butynyl group, a phenyl group, a biphenyl group, a naphthyl group, a tolyl group, a xylyl group, a mesityl group, a cumenyl group, a methoxyphenyl group, an ethoxyphenyl group, a phenoxyphenyl group, an acetoxyphenyl group, a benzoyloxyphenyl group, a methoxycarbonylphenyl group, an ethoxycarbonylphenyl group, a phenoxycarbonylphenyl group, and the like. Furthermore, the linking group is composed of at least one atom selected from the group consisting of a hydrogen atom, a carbon atom, an oxygen atom, a nitrogen atom, a sulfur atom, and a halogen atom, and the number of atoms is preferably 1 to 50. Specific examples thereof include an alkylene group, a substituted alkylene group, an arylene group, a substituted arylene group, and the like. The linking group may have a structure in which a plurality of these divalent groups are linked through any of an amide bond, an ether bond, a urethane bond, a urea bond, and an ester bond.

Examples of the alkali metal represented by $M^{HC}$ include lithium, sodium, potassium, and the like. Among these, sodium is particularly preferable. Examples of the onium include ammonium, phosphonium, sulfonium, and the like. Among these, ammonium is particularly preferable.

From the viewpoint of suppressing a scratches and contamination, $M^{HC}$ is preferably an alkali metal or an onium, and more preferably an alkali metal.

The total number of mhc and nhc is preferably 3 or more, more preferably 3 to 8, and even more preferably 4 to 6.

The molecular weight of the hydroxycarboxylic acid or a salt thereof is preferably 600 or less, more preferably 500 or less, and particularly preferably 300 or less. The molecular weight is preferably 76 or more.

Specifically, examples of the hydroxycarboxylic acid constituting the hydroxycarboxylic acid or a salt of the hydroxycarboxylic acid include gluconic acid, glycolic acid, lactic acid, tartronic acid, hydroxybutyrate (such as 2-hydroxybutyrate, 3-hydroxybutyrate, or γ-hydroxybutyrate, malic acid, tartaric acid, citramalic acid, citric acid, isocitric acid, leucine acid, mevalonic acid, pantoic acid, ricinoleic acid, ricineraidic acid, cerebronic acid, quinic acid, shikimic acid, a monohydroxybenzoic acid derivative (such as salicylic acid, creosotic acid (homosalicylic acid, hydroxy(methyl) benzoate), vanillic acid, or syringic acid), a dihydroxybenzoic acid derivative (such as pyrocatechuic acid, resorcylic acid, protocatechuic acid, gentisic acid, or orsellinic acid), a trihydroxybenzoic acid derivative (such as gallic acid), a phenyl acetate derivative (such as mandelic acid, benzilic acid, or atrolactic acid), a hydrocinnamic acid derivative (such as melilotic acid, phloretic acid, coumaric acid, umbellic acid, caffeic acid, ferulic acid, sinapic acid, cerebronic acid, or carminic acid), and the like.

Among these, as the aforementioned hydroxycarboxylic acid or a hydroxycarboxylic acid constituting a salt of the hydroxycarboxylic acid, from the viewpoint of suppressing scratches and contamination, a compound having two or more hydroxyl groups is preferable, a compound having 3 or more hydroxyl groups is more preferable, a compound having 5 or more hydroxyl groups is even more preferable, and a compound having 5 to 8 hydroxyl groups is particularly preferable.

Furthermore, as a hydroxycarboxylic acid having one carboxy group and two or more hydroxyl groups, gluconic acid or shikimic acid is preferable.

As hydroxycarboxylic acid having two or more carboxy groups and one hydroxyl group, citric acid or malic acid is preferable.

As hydroxycarboxylic acid having two or more carboxy groups and two or more hydroxyl groups, tartaric acid is preferable.

Among these, gluconic acid is particularly preferable as the aforementioned hydroxycarboxylic acid.

One kind of hydrophilic compound may be used alone, or two or more kinds of hydrophilic compounds may be used in combination.

In a case where the undercoat layer contains a hydrophilic compound which is preferably hydroxycarboxylic acid or a salt thereof, the content of the hydrophilic compound, preferably the content of hydroxycarboxylic acid and a salt thereof, with respect to the total mass of the undercoat layer is preferably 0.01% by mass to 20% by mass, more preferably 0.01% by mass to 50% by mass, even more preferably 0.1% by mass to 40% by mass, and particularly preferably 1.0% by mass to 30% by mass.

In order to prevent contamination over time, the undercoat layer may contain a chelating agent, a secondary or tertiary amine, a polymerization inhibitor, and the like, in addition to the following compounds for the undercoat layer.

The undercoat layer is formed by known coating methods. The coating amount (solid content) of the undercoat layer is preferably 0.1 mg/m² to 100 mg/m², and more preferably 1 mg/m² to 30 mg/m².

(Method for Preparing Lithographic Printing Plate and Lithographic Printing Method)

It is possible to prepare a lithographic printing plate by performing image exposure and a development treatment on the lithographic printing plate precursor according to the present disclosure.

The method for preparing a lithographic printing plate according to the present disclosure preferably includes a step of exposing the lithographic printing plate precursor according to the present disclosure in the shape of an image (hereinafter, this step will be also called "exposure step") and a step of removing the image-recording layer in a non-image area on a printer by supplying at least one material selected from the group consisting of a printing ink and dampening water (hereinafter, this step will be also called "on-press development step").

The lithographic printing method according to the present disclosure preferably includes a step of exposing the lithographic printing plate precursor according to the present disclosure in the shape of an image (exposure step), a step of removing the image-recording layer in a non-image area on a printer by supplying at least one material selected from the group consisting of a printing ink and dampening water so that a lithographic printing plate is prepared (on-press development step), and a step of performing printing by using the obtained lithographic printing plate (printing step).

Hereinafter, regarding the method for preparing a lithographic printing plate according to the present disclosure and the lithographic printing method according to the present disclosure, preferred aspects of each step will be described in order. Note that the lithographic printing plate precursor according to the present disclosure can also be developed using a developer.

Hereinafter, the exposure step and the on-press development step in the method for preparing a lithographic printing plate will be described. The exposure step in the method for preparing a lithographic printing plate according to the present disclosure is the same step as the exposure step in the lithographic printing method according to the present disclosure. Furthermore, the on-press development step in the method for preparing a lithographic printing plate according to the present disclosure is the same step as the on-press development step in the lithographic printing method according to the present disclosure.

<Exposure Step>

The method for preparing a lithographic printing plate according to the present disclosure preferably includes an exposure step of exposing the lithographic printing plate precursor according to the present disclosure in the shape of an image so that an exposed portion and a non-exposed portion are formed. The lithographic printing plate precursor according to the present disclosure is preferably exposed to a laser through a transparent original picture having a linear image, a halftone dot image, or the like or exposed in the shape of an image by laser light scanning according to digital data or the like.

The wavelength of a light source to be used is preferably 750 nm to 1,400 nm. As the light source of 750 nm to 1,400 nm, a solid-state laser or a semiconductor laser that radiates infrared is suitable. In a case where an infrared laser is used, the output is preferably 100 mW or higher, the exposure time per pixel is preferably 20 microseconds or less, and the amount of irradiation energy is preferably 10 mJ/cm$^2$ to 300 mJ/cm$^2$. In addition, in order to shorten the exposure time, a multibeam laser device is preferably used. The exposure mechanism may be any one of an in-plane drum method, an external surface drum method, a flat head method, or the like.

The image exposure can be carried out by a common method using a platesetter or the like. In the case of on-press development, image exposure may be carried out on a printer after the lithographic printing plate precursor is mounted on the printer.

<On-Press Development Step>

The method for preparing a lithographic printing plate according to the present disclosure preferably includes an on-press development step of removing the image-recording layer in a non-image area on a printer by supplying at least one material selected from the group consisting of a printing ink and dampening water.

Hereinafter, the on-press development method will be described.

[On-Press Development Method]

In the on-press development method, the lithographic printing plate precursor having undergone image exposure is preferably supplied with an oil-based ink and an aqueous component on a printer, so that the image-recording layer in a non-image area is removed and a lithographic printing plate is prepared.

That is, in a case where the lithographic printing plate precursor is subjected to image exposure and then directly mounted on a printer without being subjected to any development treatment, or in a case where the lithographic printing plate precursor is mounted on a printer, then subjected to image exposure on the printer, and then supplied with an oil-based ink and an aqueous component for printing, at the initial stage in the middle of printing, in a non-image area, a non-cured image-recording layer is removed by either or both of the supplied oil-based ink and the aqueous component by means of dissolution or dispersion, and the hydrophilic surface is exposed in that portion. On the other hand, in an exposed portion, the image-recording layer cured by exposure forms an oil-based ink-receiving portion having a lipophilic surface. What is supplied first to the surface of the plate may be any of the oil-based ink or the aqueous component. However, in view of preventing the plate from being contaminated by the components of the image-recording layer from which aqueous components are removed, it is preferable that the oil-based ink be supplied first. In the manner described above, the lithographic printing plate precursor is subjected to on-press development on a printer and used as it is for printing a number of sheets. As the oil-based ink and the aqueous component, ordinary printing ink and ordinary dampening water for lithographic printing are suitably used.

As the laser used for performing image exposure on the lithographic printing plate precursor according to the present disclosure, a light source having a wavelength of 300 nm to 450 nm or 750 nm to 1,400 nm is preferably used. A light source of 300 nm to 450 nm is preferable for a lithographic printing plate precursor including an image-recording layer containing sensitizing dye having maximum absorption in such a wavelength range. As the light source of 750 nm to 1,400 nm, those described above are preferably used. As the light source of 300 nm to 450 nm, a semiconductor laser is suitable.

<Development Step Using Developer>

The method for preparing a lithographic printing plate according to the present disclosure may be a method including a step of exposing the lithographic printing plate precursor according to the present disclosure in the shape of an image and a step of preparing a lithographic printing plate by removing the image-recording layer in a non-image area by using a developer (also called "development step using a developer)".

Furthermore, the lithographic printing method according to the present disclosure may be a method including a step of exposing the lithographic printing plate precursor according to the present disclosure in the shape of an image, a step of preparing a lithographic printing plate by removing the image-recording layer in a non-image area by using a developer, and a step of performing printing by using the obtained lithographic printing plate.

As the developer, known developers can be used.

The pH of the developer is not particularly limited, and the developer may be a strongly alkaline developer. Preferable examples of the developer include a developer having a pH of 2 to 11. Preferable examples of the developer having a pH of 2 to 11 include a developer containing at least one kind of component among surfactants and water-soluble polymer compounds.

Examples of the development treatment using a strongly alkaline developer include a method of removing the protective layer by a pre-rinsing step, then performing development using an alkali, rinsing and removing the alkali by a post-rinsing step, performing a gum solution treatment, and performing drying by a drying step.

In a case where the aforementioned developer containing a surfactant or a water-soluble polymer compound is used, development and the gum solution treatment can be simultaneously performed. As a result, the post-rinsing step is unnecessary, and it is possible to perform both the development and gum solution treatment by using one solution and to subsequently perform the drying step. Furthermore, because the removal of the protective layer can be performed simultaneously with the development and the gum solution treatment, the pre-rinsing step is unnecessary as well. After the development treatment, it is preferable to remove an excess of developer by using a squeeze roller or the like and to subsequently perform drying.

<Printing Step>

The lithographic printing method according to the present disclosure includes a printing step of printing a recording medium by supplying a printing ink to the lithographic printing plate.

The printing ink is not particularly limited, and various known inks can be used as desired. In addition, preferable examples of the printing ink include oil-based ink or ultraviolet-curable ink (UV ink).

In the printing step, if necessary, dampening water may be supplied.

Furthermore, the printing step may be successively carried out after the on-press development step or the development step using a developer, without stopping the printer.

The recording medium is not particularly limited, and known recording media can be used as desired.

In the method for preparing a lithographic printing plate from the lithographic printing plate precursor according to the present disclosure and in the lithographic printing method according to the present disclosure, if necessary, the entire surface of the lithographic printing plate precursor may be heated as necessary before exposure, in the middle of exposure, or during a period of time from exposure to development. In a case where the lithographic printing plate precursor is heated as above, an image-forming reaction in the image-recording layer is accelerated, which can result in advantages such as improvement of sensitivity and printing durability, stabilization of sensitivity, and the like. Heating before development is preferably carried out under a mild condition of 150° C. or lower. In a case where this aspect is adopted, it is possible to prevent problems such as curing of a non-image area. For heating after development, it is preferable to use an extremely severe condition which is preferably in a range of 100° C. to 500° C. In a case where this aspect is adopted, a sufficient image-strengthening action is obtained, and it is possible to inhibit problems such as the deterioration of the support or the thermal decomposition of the image area.

EXAMPLES

Hereinafter, the present disclosure will be specifically described based on examples, but the present disclosure is not limited thereto. In the present examples, unless otherwise specified, "%" and "part" mean "% by mass" and "part by mass" respectively. Unless otherwise described, the molecular weight of a polymer compound is a weight-average molecular weight (Mw), and the ratio of repeating constitutional units of a polymer compound is expressed as molar percentage. The weight-average molecular weight (Mw) is a value measured by gel permeation chromatography (GPC) and expressed in terms of polystyrene. In addition, unless otherwise specified, the average particle diameter means a volume average particle diameter.

In the examples, the value of 6p in the Hansen solubility parameters, HOMO and LUMO of the infrared absorber, LUMO of the electron-accepting polymerization initiator, HOMO of the electron-donating polymerization initiator, the average diameter of micropores, the value of L* of the anodic oxide film, and the value of water contact angle determined by an airborne water droplet method were measured by the methods described above.

(Preparation of Support A)

<Treatment (B)>

(B-a) Alkaline Etching Treatment

From a spray, an aqueous solution of caustic soda having a caustic soda concentration of 26% by mass and an aluminum ion concentration of 6.5% by mass was sprayed onto an aluminum plate having a thickness of 0.3 mm at a temperature of 70° C., thereby performing an etching treatment. Then, rinsing was performed by means of spraying. The amount of dissolved aluminum within the surface to be subjected to the electrochemical roughening treatment later was 5 g/m$^2$.

(B-b) Desmutting Treatment Using Aqueous Acidic Solution (First Desmutting Treatment)

Next, a desmutting treatment was performed using an aqueous acidic solution. In the desmutting treatment, a 150 g/L aqueous sulfuric acid solution was used as the aqueous acidic solution. The liquid temperature was 30° C. The desmutting treatment was performed for 3 seconds by spraying the aqueous acidic solution onto the aluminum plate. Then, a rinsing treatment was performed.

(B-c) Electrochemical Roughening Treatment

Next, an electrochemical roughening treatment was performed using alternating current and an electrolytic solution having a hydrochloric acid concentration of 14 g/L, an aluminum ion concentration of 13 g/L, and a sulfuric acid concentration of 3 g/L. The liquid temperature of the electrolytic solution was 30° C. The aluminum ion concentration was adjusted by adding aluminum chloride.

The waveform of the alternating current was a sine wave in which positive and negative waveforms are symmetrical, the frequency was 50 Hz, the ratio of the anodic reaction time and the cathodic reaction time in one cycle of the alternating current was 1:1, and the current density was 75 A/dm$^2$ in terms of the peak current value of the alternating current waveform. In addition, the quantity of electricity was 450 C/dm$^2$ which was the total quantity of electricity used for the aluminum plate to have an anodic reaction, and the electrolysis treatment was performed 4 times by conducting electricity of 112.5 C/dm$^2$ for 4 seconds at each treatment session. A carbon electrode was used as the counter electrode of the aluminum plate. Then, a rinsing treatment was performed.

(B-d) Alkaline Etching Treatment

An aqueous solution of caustic soda having a caustic soda concentration of 5% by mass and an aluminum ion concentration of 0.5% by mass was sprayed onto the aluminum plate having undergone the electrochemical roughening treatment at a temperature of 45° C., thereby performing an etching treatment. The amount of dissolved aluminum within the surface having undergone the electrochemical roughening treatment was 0.2 g/m$^2$. Then, a rinsing treatment was performed.

(B-e) Desmutting Treatment Using Aqueous Acidic Solution

Next, a desmutting treatment was performed using an aqueous acidic solution. Specifically, the desmutting treatment was performed for 3 seconds by spraying the aqueous acidic solution onto the aluminum plate. In the desmutting treatment, an aqueous solution having a sulfuric acid concentration of 170 g/L and an aluminum ion concentration of 5 g/L was used as aqueous acidic solution. The liquid temperature was 30° C.

(B-f) Anodic Oxidation Treatment

Figure 5:
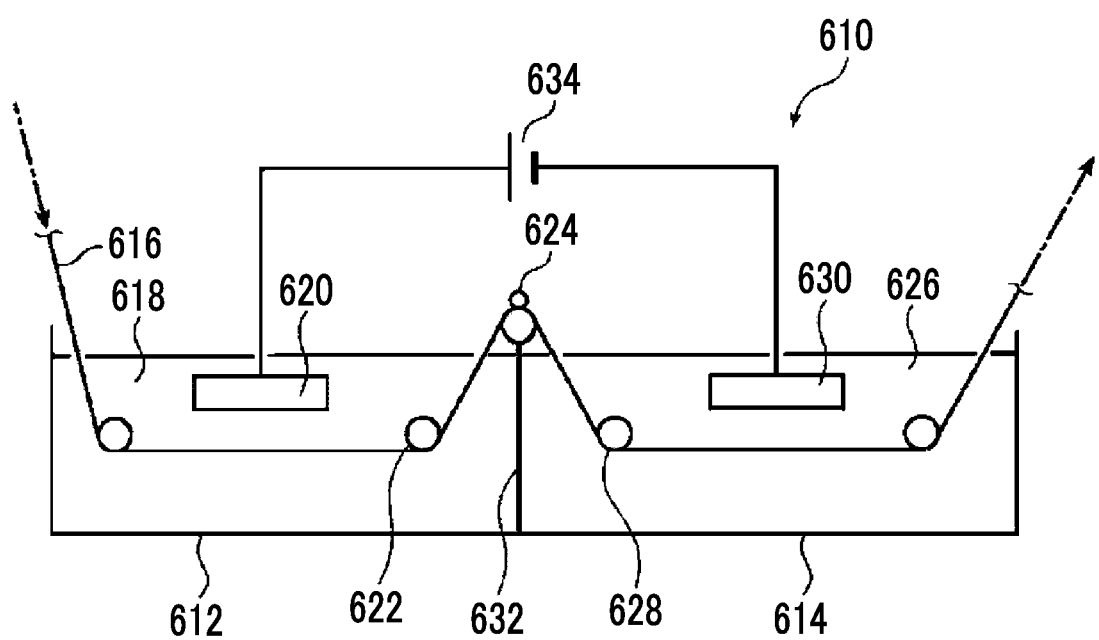
FIG. 5 is a schematic view of an anodic oxidation treatment device used for an anodic oxidation treatment in preparing an aluminum support.

By using the anodic oxidation device for direct current electrolysis having the structure shown in FIG. 5, an anodic oxidation treatment was performed. The anodic oxidation treatment was performed using an electrolytic solution having a sulfuric acid concentration 170 g/L under the conditions of a temperature of 50° C. and a current density of 30 A/dm$^2$, thereby forming an anodic oxide film having a film amount of 2.4 g/m$^3$.

In an anodic oxidation treatment device 610, an aluminum plate 616 is transported as indicated by the arrow in FIG. 5. In a power supply tank 612 containing an electrolytic solution 618, the aluminum plate 616 is positively (+) charged by a power supply electrode 620. Then, the aluminum plate 616 is transported upwards by a roller 622 in the power supply tank 612, makes a turn downwards by a nip roller 624, then transported toward an electrolytic treatment tank 614 containing an electrolytic solution 626, and makes a turn by a roller 628 so as to move in the horizontal direction. Subsequently, the aluminum plate 616 is negatively (−) charged by an electrolysis electrode 630. As a result, an anodic oxide film is formed on the surface of the aluminum plate 616. The aluminum plate 616 exits from the electrolytic treatment tank 614 and is then transported for the next step. In the anodic oxidation treatment device 610, the roller 622, the nip roller 624, and the roller 628 constitute a direction change unit. Furthermore, in the inter-tank portion between the power supply tank 612 and the electrolytic treatment tank 614, the aluminum plate 616 is transported in a ridge shape and an inverted U shape by the roller 622 and the nip rollers 624 and 628. The power supply electrode 620 and the electrolysis electrode 630 are connected to a direct current power source 634.

(B-g) Pore Widening Treatment

The aluminum plate having undergone the above anodic oxidation treatment was immersed in an aqueous solution of caustic soda at a temperature of 40° C. and having a caustic soda concentration of 5% by mass and an aluminum ion concentration of 0.5% by mass for 3 seconds, thereby performing a pore widening treatment. Then, the aluminum plate was rinsed with water by a spray, thereby obtaining an aluminum support A.

The values of physical properties of the support A are as below.

Average diameter of micropores within surface of anodic oxide film: 12 nm

Value of brightness L* of surface of anodic oxide film on the image-recording layer side in the L*a*b* color space: 81

(Preparation of Support B)

An aluminum alloy plate made of a material IS having a thickness of 0.3 mm was subjected to (A-a) Mechanical roughening treatment (brush grain method) and (A-i) Desmutting treatment in aqueous acidic solution described in paragraphs "0126" to "0134" of JP2012-158022A.

Then, the treatment conditions of (A-j) First-stage anodic oxidation treatment to (A-m) Third-stage anodic oxidation treatment described in paragraphs "0135" to "0138" of JP2012-158022A were appropriately adjusted, and an anodic oxide film was formed which had a large diameter portion having an average diameter of 35 nm and a depth of 100 nm and a small diameter portion having an average diameter of 10 nm and a depth of 1,000 nm, and in which a ratio of the depth of the large diameter portion to the average diameter of the large diameter portion is 2.9. The obtained film was adopted as an aluminum support B.

A rinsing treatment was performed between all the treatment steps. After the rinsing treatment, water was drained using a nip roller.

The values of physical properties of the support B are as below.

Value of brightness L* of surface of anodic oxide film on the image-recording layer side in the L*a*b* color space: 83

The average diameter of the micropores was determined by observing the surface with a field emission scanning electron microscope (FE-SEM) at 150,000× magnification (N=4), measuring the size (diameter) of 50 micropores existing in a range of 400 $nm^2 \times 600$ $nm^2$ in the obtained 4 images, and calculating the average thereof.

In a case where the shape of the micropores is not circular, the equivalent circular diameter is used. "Equivalent circular diameter" is a diameter determined on an assumption that the opening portion is in the form of a circle having the same projected area as the projected area of the opening portion.

The average diameter of the micropores (average diameter of the large diameter portion and the small diameter portion) is a value obtained by observing the surface of the large diameter portion and the surface of the small diameter portion with FE-SEM at 150,000× magnification (N=4), and measuring the diameters of 50 micropores (large diameter portion and small diameter portion) in a range of 400 $nm^2 \times 600$ $nm^2$ in the obtained 4 images, and calculating the average thereof. In a case where the large diameter portion was deep, and it was difficult to measure the diameter of the small diameter portion, the upper portion of the anodic oxide film was cut, and then various diameters were calculated.

The depth of the micropores (depth of the large diameter portion and the small diameter portion) is a value obtained by observing the cross section of the support (anodic oxide film) with FE-SEM (observation of the depth of the large diameter portion: 150,000× magnification, observation of depth of small diameter portion: 50,000× magnification), measuring the depths of 25 random micropores in the obtained image, and calculating the average thereof.

Furthermore, the value of the brightness L* of the surface of the anodic oxide film (surface of the anodic oxide film opposite to the aluminum plate side) in the obtained aluminum support in the L*a*b* color space was measured using a color difference meter Spectro Eye manufactured by X-Rite, Incorporated.

<Preparation of Coating Solution for Undercoat Layer>

A coating solution (1) for an undercoat layer having the following composition was prepared.

—Coating Solution (1) for Undercoat Layer—

Polymer (P-1) [the following structure]: 0.18 parts

Hydroxyethyl iminodiacetic acid: 0.10 parts

Water: 61.4 parts

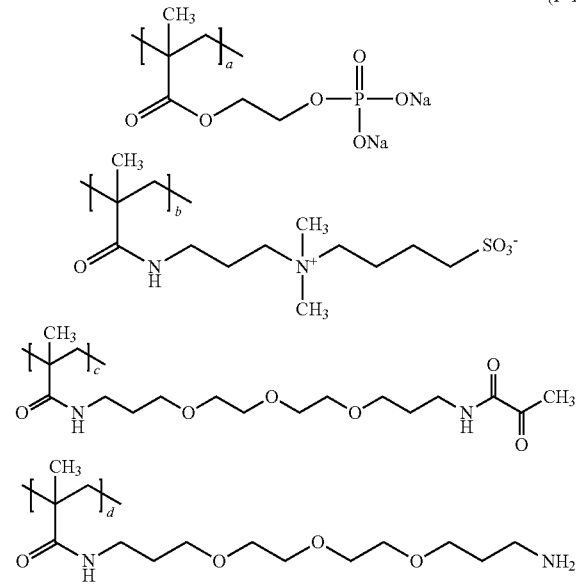

-continued

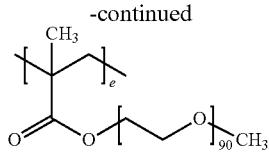

a/b/c/d/e = 14.2/71.8/8.9/0.1/5.0 (% by mass)
a/b/c/d/e = 19.0/72.8/7.7/0.1/0.4 (mol %)
Weight-average molecular weight = 200,000

<Preparation of Coating Solution (1) for Image-Recording Layer>

The following photosensitive solution (1) was prepared. Furthermore, according to the description in Table 1 or Table 2, a coating solution (1) for an image-recording layer was prepared. The amount of each material added shown in Table 1 or Table 2 is the amount of solid content. The photosensitive solution obtained by mixing together the components described in Table 1 or Table 2 other than polymer particles and a polymer particle dispersion were mixed and stirred together immediately before coating so that the composition described in Table 1 or Table 2 was obtained, thereby preparing a coating solution for an image-recording layer containing polymer particles.

—Photosensitive Solution (1)—
  Electron-accepting polymerization initiator described in Table 1 or Table 2: 0.100 parts by mass
  Infrared-absorbing polymethine colorant described in Table 1 or Table 2: 0.030 parts by mass.
  Electron-donating polymerization initiator described in Table 1 or Table 2: 0.030 parts by mass
  Polymerizable compound described in Table 1 or Table 2: amount described in Table 1 or Table 2
  Polymer described in Table 1 or Table 2: amount described in Table 1 or Table 2
  Leuco colorant (color developing agent) described in Table 1 or Table 2: 0.060 parts by mass.
  Hydrophilic compound A-1: 0.010 parts by mass
  Surfactant W-1: 0.005 parts by mass
  2-Butanone: 1.091 parts by mass
  1-Methoxy-2-propanol: 8.609 parts by mass
  Distilled water: 2.425 parts by mass Examples 1 to 23 and Comparative Examples 1 to 3

<Preparation of Lithographic Printing Plate Precursor>

The support described in Table 1 or Table 2 was coated with the coating solution (1) for an undercoat layer having the above composition so that the dry coating amount was 10 mg/m$^2$, thereby forming an undercoat layer. The undercoat layer was bar-coated with each coating solution (1) for an image-recording layer having the composition described in Table 1 or Table 2 and dried in an oven at 120° C. for 40 seconds, thereby forming an image-recording layer having a dry coating amount of 1.0 g/m$^2$.

A described above, the coating solution (1) for an image-recording layer containing polymer particles was prepared by mixing and stirring polymer particles immediately before coating.

(Evaluation of Lithographic Printing Plate Precursor)
[UV Printing Durability]

By using Magnus 800 Quantum manufactured by Kodak Japan Ltd. that was equipped with an infrared semiconductor laser, the lithographic printing plate precursor prepared as above was exposed under the conditions of output of 27 W, an outer drum rotation speed of 450 rpm (revolutions per minute), and a resolution of 2,400 dpi (dot per inch, 1 inch is equal to 2.54 cm) (irradiation energy equivalent to 110 mJ/cm$^2$). The exposure image included a solid image and a 3% halftone dot chart of Amplitude Modulated Screening (AM screen).

The obtained exposed precursor was mounted on a Kikuban-sized cylinder of a printer SX-74 manufactured by Heidelberger Druckmaschinen AG without being developed. This printer was connected to a 100 L-capacity dampening water circulation tank having a non-woven fabric filter and a temperature control device. A circulation device was filled with dampening water (80 L) containing 2.0% dampening water S-Z1 (manufactured by FUJIFILM Corporation), and T&K UV OFS K-HS black GE-M (manufactured by T&K TOKA CO., LTD.) was used as printing ink. The dampening water and ink were supplied by a standard automatic printing start method, and then printing was performed on TOKUBISHI art paper (manufactured by MITSUBISHI PAPER MILLS LIMITED, ream weight: 76.5 kg) at a printing rate of 10,000 sheets/hour.

As the number of printing sheets increased, the image area gradually wore out, and thus the ink density on the printed matter decreased. For the AM screen 3% halftone dots in the printed matter, the area ratio of the 3% halftone dot AM screen was measured using a Gretag density meter (manufactured by GretagMacbeth). The number of printing sheets at a point in time when the measured area ratio was 1% lower than the area ratio measured after 500 sheets were printed was adopted as the number of sheets of completed printing and used for evaluation of printing durability. The evaluation was based on relative printing durability to 100 which represents the printing durability of a lithographic printing plate precursor capable of printing 50,000 sheets. The higher the numerical value, the better the UV printing durability. The results are shown in Table 1.

Relative printing durability=(number of printing sheets obtained from subject lithographic printing plate precursor)/50,000×100

[On-Press Developability]

In Luxel PLATESETTER T-6000III manufactured by FUJIFILM Corporation that was equipped with an infrared semiconductor laser, each of the obtained lithographic printing plate precursors was exposed under the conditions of an outer drum rotation speed of 1,000 rpm, a laser output of 70%, and resolution of 2,400 dpi. The exposure image included a solid image, a 50% halftone dot chart of a 20 μm dot FM screen, and a non-image area.

The obtained exposed precursor was mounted on a plate cylinder of a printer LITHRONE26 manufactured by KOMORI Corporation, without being subjected to a development treatment. By using dampening water containing Ecolity-2 (manufactured by FUJIFILM Corporation)/tap water=2/98 (volume ratio)) and SPACE COLOR FUSION G yellow ink (manufactured by DIC Graphics Corporation), on-press development was performed by supplying the dampening water and ink according to the standard automatic printing start method of a printer LITHRONE26 manufactured by KOMORI Corporation. Thereafter, printing was performed on 500 sheets of TOKUBISHI art paper (manufactured by MITSUBISHI PAPER MILLS LIMITED, ream weight: 76.5 kg) at a printing rate of 10,000 sheets/hour.

The number of sheets of printing paper used until no ink was transferred to a non-image area after the on-press development of the non-exposed portion of the image-recording layer on the printer was finished was counted as on-press developability. It can be said that the smaller the number of printing papers, the better the on-press developability. The results are shown in Table 1.

[Temporal Stability Under White Light]

The lithographic printing plate precursor was set at a position of an illuminance of 1,000 lx by using a pocket-type illuminance meter ANA-F9 manufactured by TOKYO PHOTOELECTRIC CO., LTD., and irradiated for 2 hours with white light from a light source, OSRAM FLR40SW fluorescent lamp manufactured by Mitsubishi Electric Corporation, in an environment with a room temperature (25° C.) and a humidity of 50%.

In Luxel PLATESETTER T-6000III manufactured by FUJIFILM Corporation that was equipped with an infrared semiconductor laser, the lithographic printing plate precursor was exposed under the conditions of an outer drum rotation speed of 1,000 rpm, a laser output of 70%, and resolution of 2,400 dpi. The exposure image included a solid image and a 50% halftone dot chart of a 20 µm dot FM screen.

The exposed lithographic printing plate precursor was mounted on a plate cylinder of a printer LITHRONE26 manufactured by KOMORI Corporation, without being subjected to a development treatment. By using dampening water containing Ecolity-2 (manufactured by FUJIFILM Corporation)/tap water=2/98 (volume ratio)) and Values-G (N) black ink (manufactured by DIC Graphics Corporation), printing was performed on 500 sheets of TOKUBISHI art paper (76.5 kg) (manufactured by MITSUBISHI PAPER MILLS LIMITED.) at a printing rate of 10,000 sheets/hour by supplying the dampening water and ink according to the standard automatic printing start method of LITHRONE26.

The number of printing paper used until no ink was transferred to a non-image area after the on-press development of the non-exposed portion of the image-recording layer on the printer was finished was counted, and evaluated as white light stability. The smaller the number of sheets, the better the white light stability. The results are shown in Table 1.

[Ink Receptivity]

Each of the lithographic printing plate precursors obtained in examples or comparative examples was placed in Kodak (registered trademark) Trendsetter 800II Quantum plate setter (830 nm), and exposed to an 830 nm infrared (IR) laser in the shape of an exposure image including a solid image and a 50% halftone dot chart of a 20 µm dot FM screen. The obtained exposed precursor was mounted on a plate cylinder of a printer LITHRONE26 manufactured by KOMORI Corporation, without being subjected to a development treatment. By using dampening water containing Ecolity-2 (manufactured by FUJIFILM Corporation)/tap water=2/98 (volume ratio)) and SPACE COLOR FUSION G black ink (manufactured by DIC Graphics Corporation), on-press development was performed by supplying the dampening water and ink according to the standard automatic printing start method of LITHRONE26. Thereafter, printing was performed on 100 sheets of TOKUBISHI art paper (manufactured by MITSUBISHI PAPER MILLS LIMITED, ream weight: 76.5 kg) at a printing rate of 10,000 sheets/hour.

The number of sheets of printing paper used until the ink density on the printing paper in the exposed area of the image-recording layer reached the preset standard density was counted as ink receptivity in an early stage of printing, and listed in Table 1.

It can be said that the smaller the number of sheets of printing paper, the better the ink receptivity.

[Suppression of Development Residue During On-Press Development (Suppression of Residues of On-Press Development)]

As soon as printing was performed to evaluate the UV printing durability described above, the state where the removed residues adhered to the dampening roller was evaluated. The indicators are as follows. The results are shown in Table 1.

5: No residue is found on the dampening roller.
4: Few residues are found on the dampening roller.
3: Residues are found on the dampening roller.
2: Many residues are found on the dampening roller.
1: There are so many residues found on the dampening roller.

[Visibility (Color Developability)]

In Trendsetter 3244VX manufactured by Creo that was equipped with a water cooling-type 40 W infrared semiconductor laser, each of the obtained lithographic printing plate precursors was exposed under the conditions of an output of 11.5 W, an outer drum rotation speed of 220 rpm, and a resolution of 2,400 dpi (dot per inch, 1 inch=25.4 mm). The exposure was carried out in an environment of 25° C. and 50% RH.

Immediately after being exposed or after being exposed, the lithographic printing plate precursor was stored for 2 hours in a dark place (25° C.), and then color development thereof was measured. The measurement was performed by the specular component excluded (SCE) method by using a spectrocolorimeter CM2600d and operation software CM-S100W manufactured by Konica Minolt, Inc. The color developability was evaluated by a difference ΔL between an L* value of the exposed portion and an L* value of the non-exposed portion by using L* values (brightness) of the L*a*b* color space. It can be said that the higher the value of ΔL, the better the color developability. The results are shown in Table 2.

TABLE 1

| | | | Image-recording layer | | | | | | |
|---|---|---|---|---|---|---|---|---|---|
| | | | Infrared-absorbing | | | Electron-accepting polymerization initiator | | Electron-donating polymerization initiator | |
| | | | polymethine colorant | | | | Potential difference | | Potential difference |
| | Support Type | Structure | HOMO (eV) | LUMO (eV) | Structure | LUMO (eV) | (LUMO of initiator − LUMO of colorant) | Structure | HOMO (eV) | (HOMO of colorant − HOMO of initiator) |
| Example 1 | A | D-1 | −5.27 | −3.66 | I-1 | −3.02 | 0.64 | B-6 | −6.1 | 0.78 |
| 2 | A | D-2 | −5.43 | −3.80 | I-2 | −3.02 | 0.78 | B-2 | −6 | 0.54 |
| 3 | B | D-3 | −5.35 | −3.73 | I-3 | −3.25 | 0.48 | B-3 | −5.9 | 0.56 |
| 4 | A | D-4 | −5.38 | −3.77 | I-4 | −2.81 | 0.96 | B-4 | −5.9 | 0.56 |
| 5 | A | D-5 | −5.35 | −3.73 | I-3 | −3.25 | 0.48 | B-5 | −5.8 | 0.42 |

TABLE 1-continued

|   |   |   |   |   |   |   |   |   |   |   |   |
|---|---|---|---|---|---|---|---|---|---|---|---|
|   | 6 | A | D-5 | −5.35 | −3.73 | I-3 | −3.25 | 0.48 | B-1 | −5.9 | 0.56 |
|   | 7 | A | D-5 | −5.35 | −3.73 | I-1 | −3.25 | 0.48 | B-1 | −5.9 | 0.56 |
|   | 8 | A | D-5 | −5.35 | −3.73 | I-1 | −3.25 | 0.48 | B-1 | −5.9 | 0.56 |
|   | 9 | A | D-5 | −5.35 | −3.73 | I-1 | −3.25 | 0.48 | B-1 | −5.9 | 0.56 |
|   | 10 | A | D-5 | −5.35 | −3.73 | I-1 | −3.25 | 0.48 | B-1 | −5.9 | 0.56 |
|   | 11 | A | D-5 | −5.35 | −3.73 | I-1 | −3.25 | 0.48 | B-1 | −5.9 | 0.56 |
|   | 12 | A | D-2 | −5.43 | −3.80 | I-2 | −3.02 | 0.78 | B-2 | −6 | 0.54 |
|   | 13 | A | D-2 | −5.43 | −3.80 | I-2 | −3.02 | 0.78 | B-2 | −6 | 0.54 |
| Comparative example | 1 | A | D-6 | −5.18 | −3.63 | I-4 | −2.81 | 0.82 | B-2 | −6 | 0.79 |
|   | 2 | A | D-4 | −5.38 | −3.77 | I-2 | −3.02 | 0.75 | B-1 | −5.9 | 0.53 |
|   | 3 | A | D-5 | −5.35 | −3.73 | I-1 | −3.02 | 0.71 | B-4 | −5.9 | 0.59 |

| | | | Image-recording layer | | | | | | |
|---|---|---|---|---|---|---|---|---|---|
| | | | Polymerizable compound | | | | Polymer | | | |
| | | | Structure | Content Wm (part by mass) | Structure | Content Wm (part by mass) | Type | Content Wp (part by mass) | Wp/Wm | Contact angle (°) | Color developing agent |
| Example | 1 | | M-4 | 0.360 | — | — | Acrylic resin | 0.12 | 0.333 | 55 | G-1 |
| | 2 | | M-4 | 0.600 | — | — | R-1 | 0.30 | 0.500 | 60 | G-2 |
| | 3 | | M-5 | 0.400 | — | — | R-2 | 0.05 | 0.125 | 50 | — |
| | 4 | | M-5 | 0.500 | M-2 | 0.100 | Polymer particles 1 | 0.49 | 0.980 | 45 | G-2 |
| | 5 | | M-6 | 0.450 | — | — | — | — | — | 65 | G-1 |
| | 6 | | M-6 | 0.450 | M-3 | 0.100 | Urethane resin | 0.40 | 0.889 | 55 | G-2 |
| | 7 | | M-6 | 0.450 | M-3 | 0.100 | Polymer particles 18 | 0.40 | 0.889 | 67 | — |
| | 8 | | M-6 | 0.450 | M-3 | 0.100 | Polymer particles 19 | 0.40 | 0.889 | 69 | — |
| | 9 | | M-6 | 0.450 | M-3 | 0.100 | Polymer particles 20 | 0.40 | 0.889 | 66 | — |
| | 10 | | M-6 | 0.450 | M-3 | 0.100 | Polymer particles 21 | 0.40 | 0.889 | 76 | — |
| | 11 | | M-6 | 0.450 | M-3 | 0.100 | Polymer particles 22 | 0.40 | 0.889 | 71 | — |
| | 12 | | M-4 | 0.600 | — | — | Polymer particles 21 | 0.30 | 0.500 | 77 | — |
| | 13 | | M-4 | 0.600 | — | — | Polymer particles 18 | 0.30 | 0.500 | 72 | — |
| Comparative example | 1 | | M-4 | 0.340 | — | — | Acrylic resin | 0.24 | 0.706 | 50 | G-1 |
| | 2 | | M-1 | 0.400 | — | — | Urethane resin | 0.30 | — | 60 | G-2 |
| | 3 | | M-5 | 0.200 | — | — | Urethane resin | 0.45 | 2.250 | 65 | G-2 |

| | | | Evaluation | | | | |
|---|---|---|---|---|---|---|---|
| | | | UV printing durability (sheets) | Receptivity (sheets) | On-press developability (sheets) | On-press developability under white light (sheets) | Suppression of residues of on-press development |
| Example | 1 | | 65,000 | 10 | 20 | 30 | 3 |
| | 2 | | 65,000 | 10 | 25 | 35 | 3 |
| | 3 | | 65,000 | 10 | 20 | 30 | 3 |
| | 4 | | 70,000 | 10 | 25 | 35 | 3 |
| | 5 | | 75,000 | 10 | 25 | 40 | 3 |
| | 6 | | 80,000 | 10 | 20 | 35 | 3 |
| | 7 | | 80,000 | 10 | 20 | 35 | 4 |
| | 8 | | 75,000 | 10 | 20 | 35 | 4 |
| | 9 | | 70,000 | 10 | 20 | 35 | 4 |
| | 10 | | 75,000 | 10 | 20 | 35 | 5 |
| | 11 | | 80,000 | 10 | 20 | 35 | 4 |
| | 12 | | 70,000 | 10 | 25 | 35 | 5 |
| | 13 | | 75,000 | 10 | 25 | 35 | 4 |
| Comparative example | 1 | | 30,000 | 10 | 20 | 30 | 3 |
| | 2 | | 30,000 | 10 | 20 | 30 | 3 |
| | 3 | | 65,000 | 10 | 20 | 200 | 3 |

TABLE 2

| | | | Image-recording layer | | | | | | | |
|---|---|---|---|---|---|---|---|---|---|---|
| | | | Infrared-absorbing polymethine colorant | | | Electron-accepting polymerization initiator | | | Electron-donating polymerization initiator | |
| | | Support Type | Structure | HOMO (eV) | LUMO (eV) | Structure | LUMO (eV) | Potential difference (LUMO of initiator – LUMO of colorant) | Structure | HOMO (eV) | Potential difference (HOMO of colorant – HOMO of initiator) |
| Example | 14 | A | D-5 | −5.4 | −3.73 | I-3 | −3.3 | 0.48 | B-1 | −5.9 | 0.56 |
| | 15 | A | D-5 | −5.4 | −3.73 | I-3 | −3.3 | 0.48 | B-1 | −5.9 | 0.56 |
| | 16 | A | D-5 | −5.4 | −3.73 | I-3 | −3.3 | 0.48 | B-1 | −5.9 | 0.56 |
| | 17 | A | D-5 | −5.4 | −3.73 | I-3 | −3.3 | 0.48 | B-1 | −5.9 | 0.56 |
| | 18 | A | D-5 | −5.4 | −3.73 | I-3 | −3.3 | 0.48 | B-1 | −5.9 | 0.56 |
| | 19 | A | D-5 | −5.4 | −3.73 | I-3 | −3.3 | 0.48 | B-1 | −5.9 | 0.56 |
| | 20 | A | D-5 | −5.4 | −3.73 | I-3 | −3.3 | 0.48 | B-1 | −5.9 | 0.56 |
| | 21 | A | D-5 | −5.4 | −3.73 | I-3 | −3.3 | 0.48 | B-1 | −5.9 | 0.56 |
| | 22 | A | D-5 | −5.4 | −3.73 | I-3 | −3.3 | 0.48 | B-1 | −5.9 | 0.56 |
| | 23 | A | D-5 | −5.4 | −3.73 | I-3 | −3.3 | 0.48 | B-1 | −5.9 | 0.56 |

| | | Image-recording layer | | | | | | | Image-recording layer | | | Evaluation Visibility |
|---|---|---|---|---|---|---|---|---|---|---|---|---|
| | | Polymerizable compound | | | | Polymer | | | Color developing agent | | | |
| | | Structure | Content Wm (part by mass) | Structure | Content Wm (part by mass) | Type | Content Wp (part by mass) | Wp/Wm | Contact angle (°) | Type | Added amount (part by mass) | |
| Example | 14 | M-6 | 0.450 | M-3 | 0.100 | Polymer particles 1 | 0.400 | 0.889 | 55 | S-1 | 0.060 | 12 |
| | 15 | M-6 | 0.450 | M-3 | 0.100 | Polymer particles 1 | 0.400 | 0.889 | 55 | S-1 | 0.010 | 8 |
| | 16 | M-6 | 0.450 | M-3 | 0.100 | Polymer particles 1 | 0.400 | 0.889 | 55 | S-6 | 0.060 | 11 |
| | 17 | M-6 | 0.450 | M-3 | 0.100 | Polymer particles 1 | 0.400 | 0.889 | 55 | S-4 | 0.060 | 9 |
| | 18 | M-6 | 0.450 | M-3 | 0.100 | Polymer particles 1 | 0.400 | 0.889 | 55 | S-11 | 0.060 | 6 |
| | 19 | M-6 | 0.450 | M-3 | 0.100 | Polymer particles 1 | 0.400 | 0.889 | 55 | S-12 | 0.060 | 6 |
| | 20 | M-6 | 0.450 | M-3 | 0.100 | Polymer particles 1 | 0.400 | 0.889 | 55 | S-13 | 0.060 | 4 |
| | 21 | M-6 | 0.450 | M-3 | 0.100 | Polymer particles 1 | 0.400 | 0.889 | 55 | S-14 | 0.060 | 4.5 |
| | 22 | M-6 | 0.450 | M-3 | 0.100 | Polymer particles 18 | 0.400 | 0.889 | 55 | S-1 | 0.060 | 12 |
| | 23 | M-6 | 0.450 | M-3 | 0.100 | Polymer particles 21 | 0.400 | 0.889 | 55 | S-1 | 0.060 | 12 |

In Table 1, "–" means that the example does not contain the corresponding component. Furthermore, the description of the polymerizable compounds "M-5" and "M-2" in Example 4 means that the example contains two kinds of polymerizable compounds "M-5" and "M-2". Furthermore, the potential difference (initiator LUMO—colorant LUMO) in the column of Electron-accepting polymerization initiator means the value of LUMO of the electron-accepting polymerization initiator—LUMO of infrared-absorbing polymethine colorant. Likewise, the potential difference (colorant HOMO—initiator HOMO) in the column of Electron-donating polymerization initiator means the value of HOMO of infrared-absorbing polymethine colorant—HOMO of electron-donating polymerization initiator.

S-1, S-4, S-6, and S-11 to S-14 used in Table 2 are the same compounds as S-1, S-4, S-6, and S-11 to S-14 that are specific examples of leuco colorant having a phthalide structure or a fluoran structure described above.

Details of each of the compounds listed in Table 1 and Table 2 other than those described above are as below.

[Cationic Polymethine Colorant]

D-1 to D-6: Compounds having the following structures

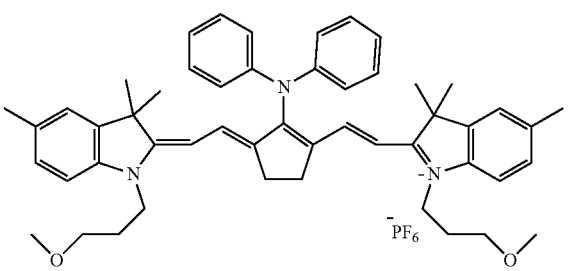

D-1

-continued
D-2
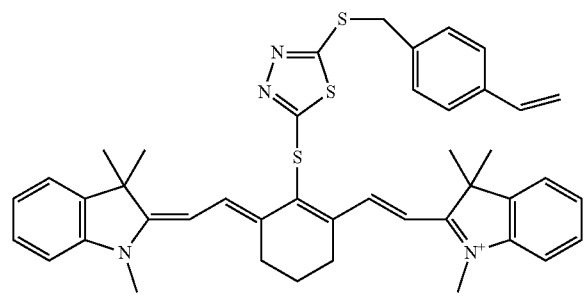
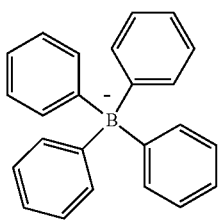
D-4
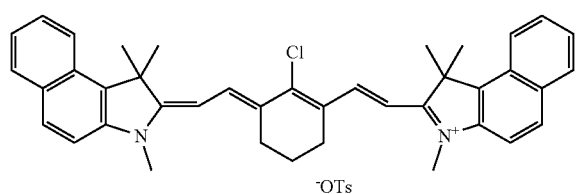
D-3
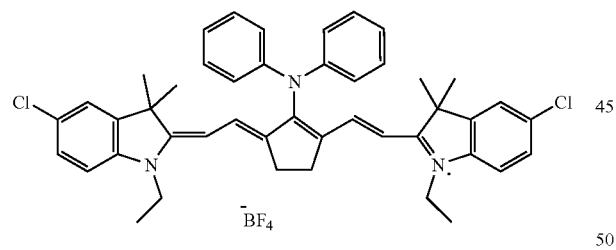
D-5
-continued
D-6
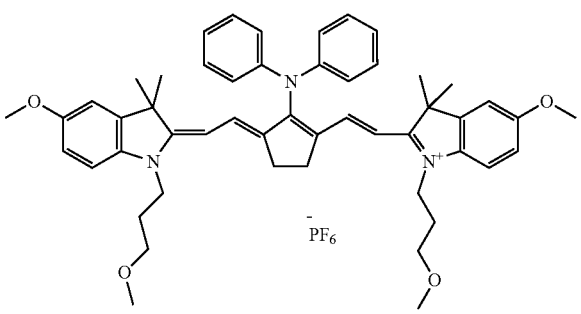
[Electron-Accepting Polymerization Initiator]
I-1 to I-4: The following compounds
I-1
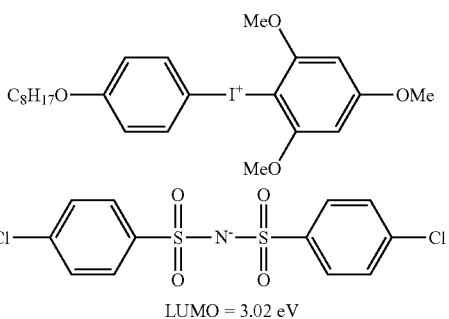
LUMO = 3.02 eV
I-2
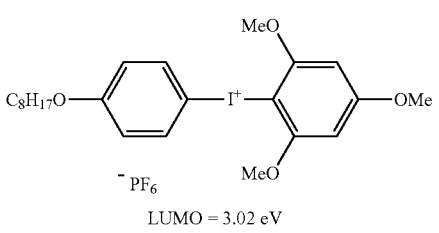
LUMO = 3.02 eV
I-3
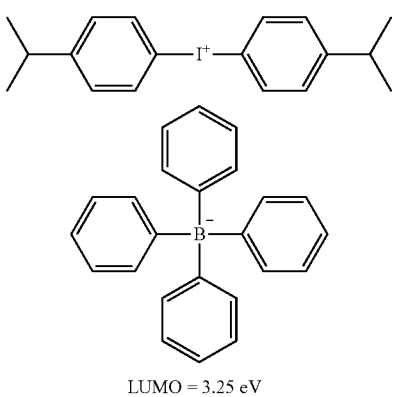
LUMO = 3.25 eV I-4
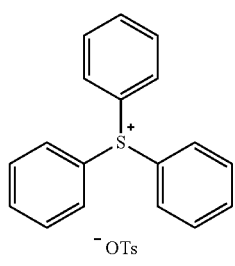
LUMO = 2.81 eV
[Electron-Donating Polymerization Initiator (Polymerization Aid)]
B-1 to B-7: The following compounds
B-1
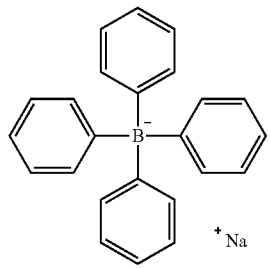
HOMO = 5.91 eV
B-2
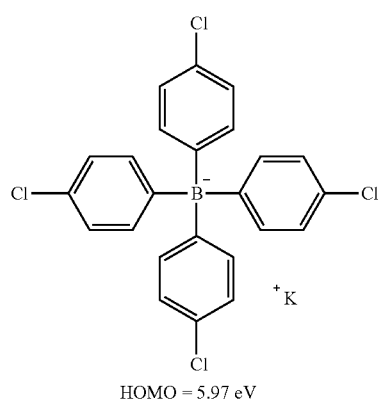
HOMO = 5.97 eV
B-3
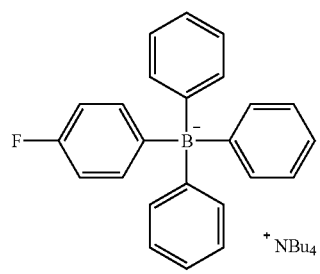
HOMO = 5.91 eV
B-4
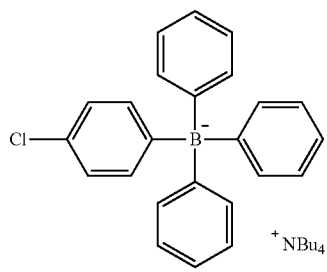
HOMO = 5.94 eV
B-5
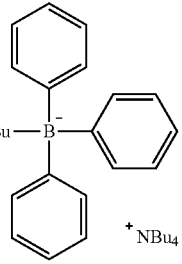
HOMO = 5.77 eV
B-6
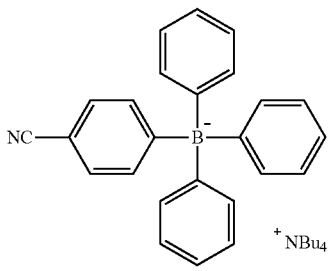
HOMO = 6.05 eV
B-7
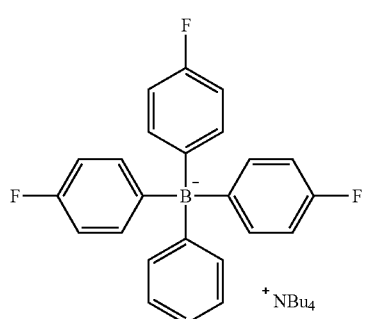
HOMO = 5.96 eV

[Color Developing Agent (Acid Color-Developing Agent)]
G-1 and G-2: The following compounds
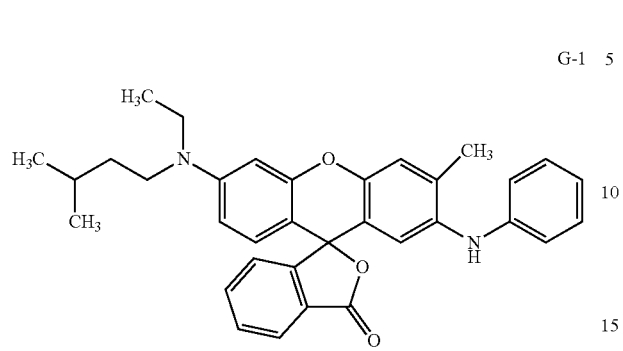
G-1
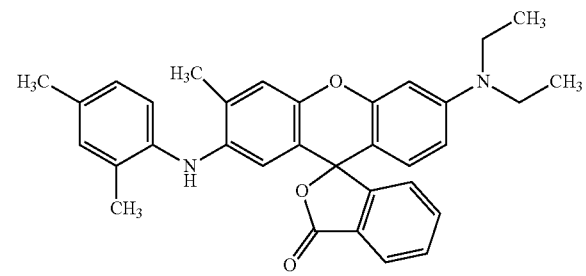
G-2
[Polymerizable Compound (Monomer)]
M-1 to M-6: Compounds having the following structures
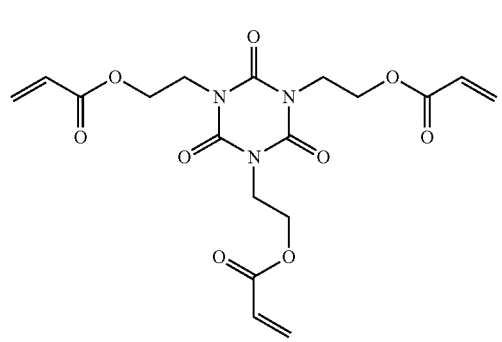
M-1
Molecular Weight: 423.38
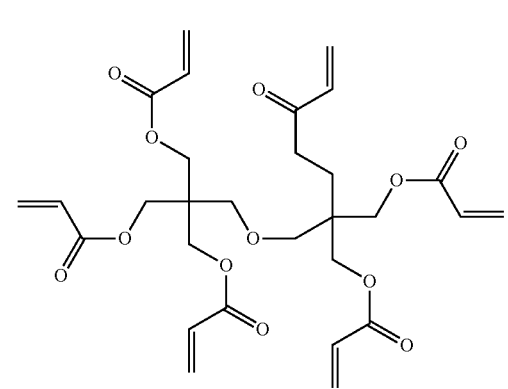
M-2
Molecular Weight: 578.57
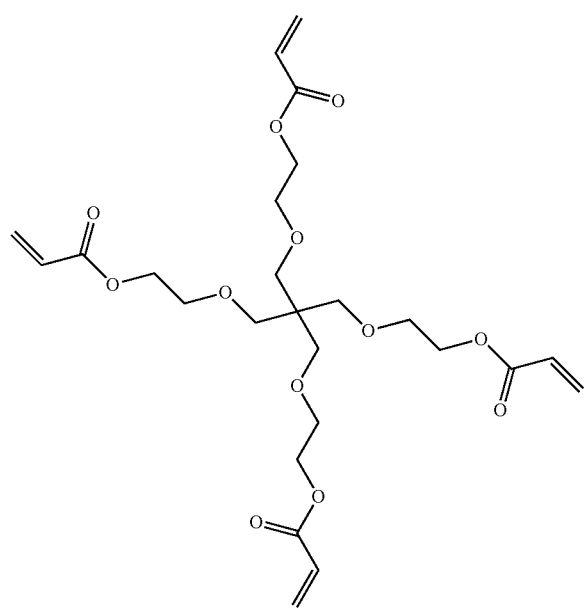
M-3
Molecular Weight: 528.55

M-4
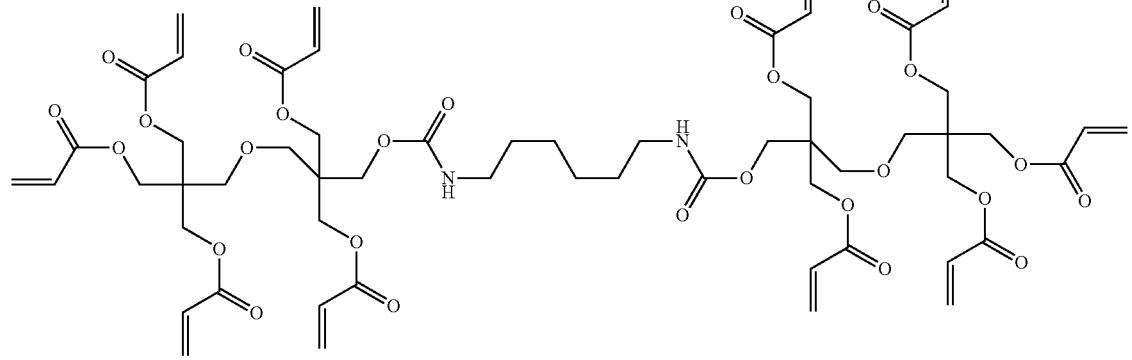
Molecular Weight: 1217.23
M-5
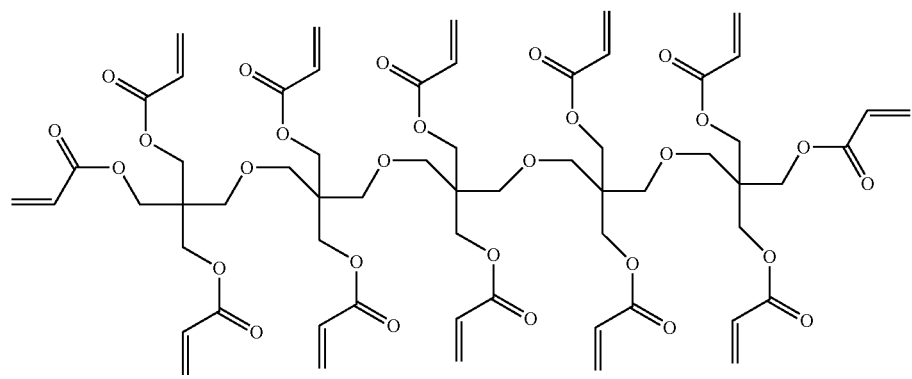
Molecular Weight: 1257.25

M-6
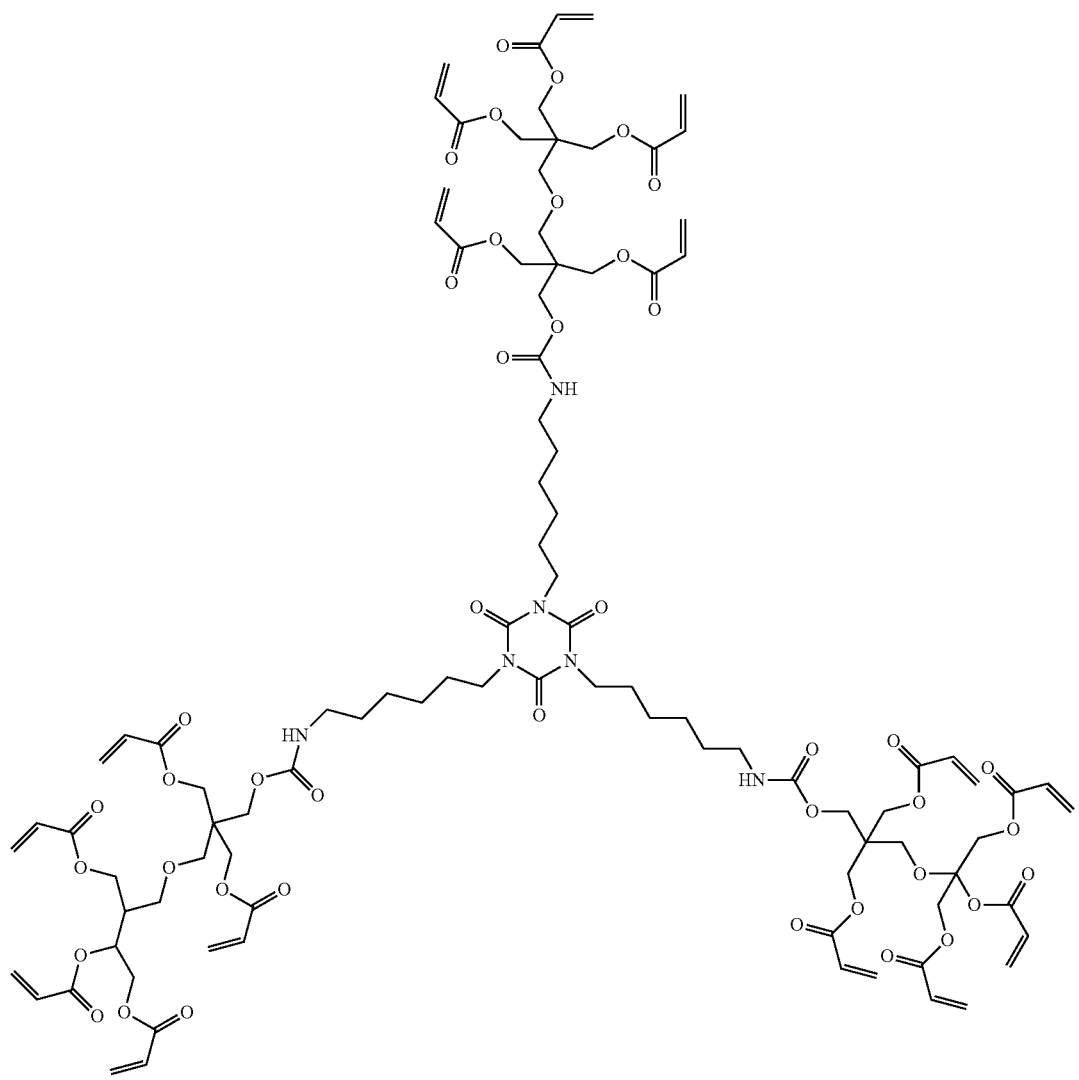
Molecular Weight: 2078.15
[Polymer]
Acrylic resin: Compound having the following structure, Mw=70,000, polymer having molecular weight of 10,000 or more
Urethane resin: Compound having the following structure, Mw=15,000, polymer having molecular weight of 10,000 or more
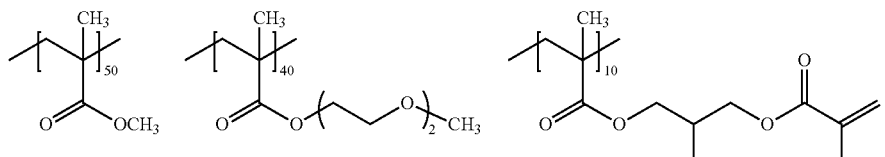
Acrylic resin
(Mw = 70,000)

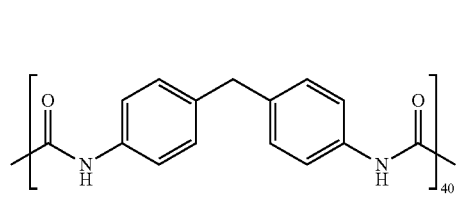 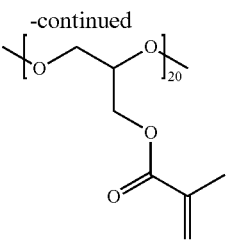 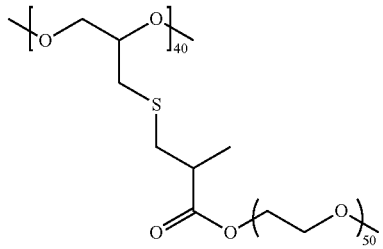

Urethane resin

R-1: Compound having the following structure, Mw=10,000, polymer having molecular weight of 10,000 or more R-2: Compound having the following structure, Mw=10,000, polymer having molecular weight of 10,000 or more R-1 and R-2 were synthesized according to the following method.

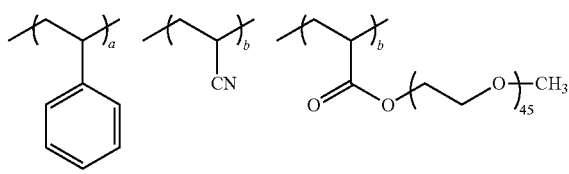

a:b:c = 1:1:1

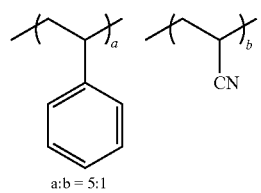

a:b = 5:1

<<Synthesis of R-2>>

Methyl ethyl ketone (300 parts) was put in a three-neck flask and heated to 80° C. under a nitrogen stream. A mixed solution consisting of 83.3 parts of styrene, 16.7 parts of acrylonitrile, 0.7 parts of azobisisobutyronitrile (AIBN), and 100 parts of methyl ethyl ketone was added dropwise to the reaction container for 30 minutes. After dropwise addition ended, the reaction was continued for 7.5 more hours. Then, 0.3 parts of AIBN was added thereto, and the reaction was continued for another 12 hours. After the reaction ended, the reaction solution was cooled to room temperature. In the obtained polymer, the compositional ratio of the constitutional unit formed of styrene and the constitutional unit formed of acrylonitrile was 5: 1 (mass ratio).

<<Synthesis of R-1>>

R-1 was prepared in the same manner as in the synthesis of R-2, except that the type and amount of the monomer used were changed.

Polymer particles 1: Polymer particles 1 obtained by the following method

<<Polymer Particles 1>>

(Microgel solution (2))

Microgel (1) 21.8% by mass: 2.243 parts

1-Methoxy-2-propanol: 0.600 parts (Preparation of Microgel (1))

Microgel (1) used in the microgel solution (2) was prepared by the following method.

<Preparation of Polyvalent Isocyanate Compound (1)>

Bismuth tris(2-ethylhexanoate) (NEOSTAN U-600, manufactured by NITTO KASEI CO., LTD., 0.043 parts) was added to an ethyl acetate (25.31 g) suspension solution of 17.78 parts (80 molar equivalents) of isophorone diisocyanate and 7.35 parts (20 molar equivalents) of the following polyhydric phenol compound (1), and the obtained solution was stirred. The reaction temperature was set to 50° C. at a point in time when heat release subsided, and the solution was stirred for 3 hours, thereby obtaining an ethyl acetate solution of the polyvalent isocyanate compound (1) (50% by mass).

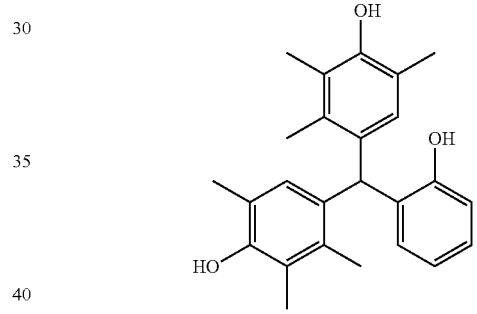

Polydric phenol compound (1)

<Preparation of Microgel (1)>

The following oil-phase components and water-phase components were mixed together and emulsified at 12,000 rpm for 10 minutes by using a homogenizer. The obtained emulsion was stirred at 45° C. for 4 hours, a 10% by mass aqueous solution of 5.20 g of 1,8-diazabicyclo[5.4.0]undec-7-ene-octylate (U-CAT SA102, manufactured by San-Apro Ltd.) was added thereto, and the solution was stirred at room temperature for 30 minutes and left to stand at 45° C. for 24 hours. Distilled water was added thereto so that the concentration of solid contents was adjusted to 21.8% by mass, thereby obtaining an aqueous dispersion of microgel (1). The volume average particle diameter was measured by light scattering method using a dynamic light scattering-type particle size distribution analyzer LB-500 (manufactured by HORIBA, Ltd.), which was 0.28 μm.

(Oil-Phase Component)

(Component 1) ethyl acetate: 12.0 parts (Component 2) An adduct obtained by addition of trimethylolpropane (6 moles), xylene diisocyanate (18 moles), and polyoxyethylene having methyl on one terminal (1 mole, the number of repeating oxyethylene units: 90) (50% by mass ethyl acetate solution, manufactured by Mitsui Chemicals, Inc.): 3.76 parts (Component 3) polyvalent isocyanate compound (1) (as 50% by mass ethyl acetate solution): 15.0 parts
(Component 4) 65% by mass ethyl acetate solution of dipentaerythritol pentaacrylate (SR-399, manufactured by Sartomer Company Inc.): 11.54 parts
(Component 5) 10% ethyl acetate solution of sulfonate type surfactant (pionin A-41-C, manufactured by TAKEMOTO OIL & FAT Co., Ltd.): 4.42 parts
(Water-Phase Component)
Distilled water: 46.87 parts
Polymer particles 18 to 22: Particles 18 to 22 prepared by the following method
<Preparation of Polymer Particles 18 (Particles 18)>
Synthesis of wall material A—

MR-200 (a compound represented by Formula (Iso), n=0 to 10, manufactured by TOSOH CORPORATION, 7.5 g), 2.5 g of PETA (pentaerythritol triacrylate, manufactured by Sartomer Company Inc., SR444), and 10 g of ethyl acetate were added to a three-neck flask, stirred at room temperature, and then heated to 60° C.

Then, 0.05 g of NEOSTANN U-600 (manufactured by NITTO KASEI CO., LTD.) was added to the three-neck flask, and the reaction solution was heated and stirred for 3 hours. Thereafter, the reaction solution was cooled to room temperature, thereby obtaining a wall material A (solid content 50% by mass).

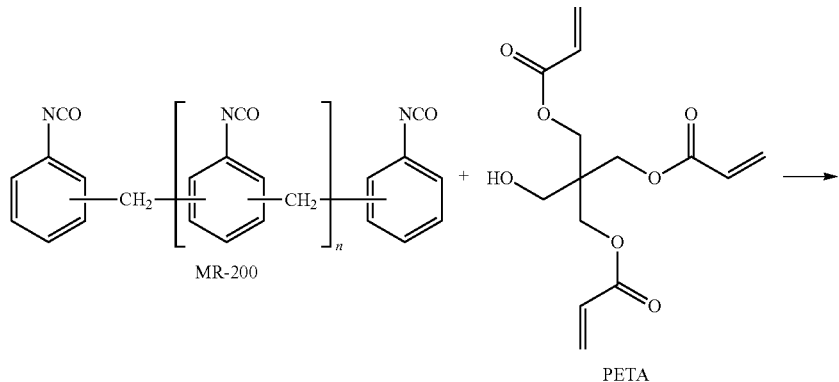

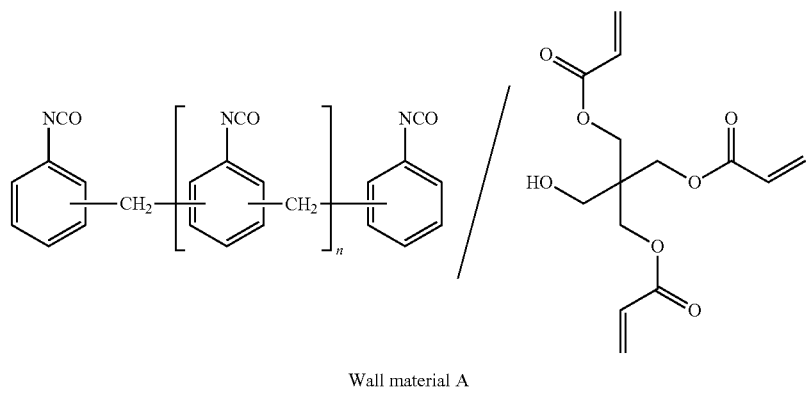

Wall material A

—Synthesis of Wall Material B—

In the following formula, Me represents a methyl group.

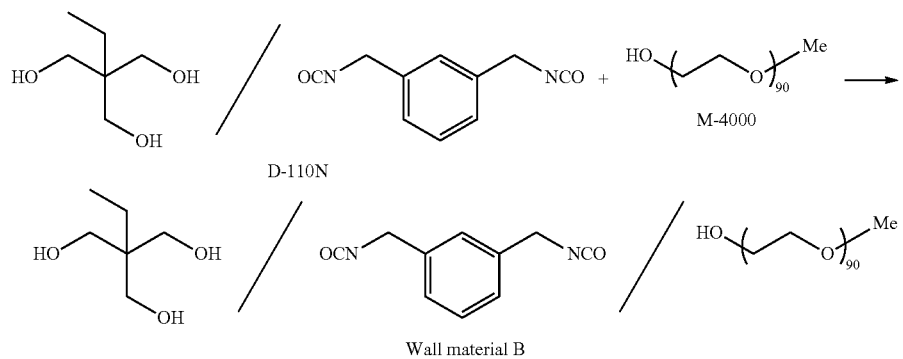

Wall material B

D-110N (manufactured by Mitsui Chemicals, Inc., 5.0 g), 5.0 g of UNIOX M-4000 (manufactured by NOF CORPORATION), and 10 g of ethyl acetate were added to a three-neck flask, stirred at room temperature, and then heated to 60° C.

Then, 0.05 g of NEOSTANN U-600 (manufactured by NITTO KASEI CO., LTD.) was added to the three-neck flask, and the reaction solution was heated and stirred for 3 hours. Thereafter, the mixture was cooled to room temperature, thereby obtaining a wall material B (solid content 50% by mass).

—Synthesis of Particles 18—

PIONIN A-41-C(manufactured by TAKEMOTO OIL & FAT Co., Ltd., 0.45 g), 14.99 g of the wall material A, 7.49 g of SR-399E (dipentaerythritol pentaacrylate, manufactured by Sartomer Company Inc.), 3.78 g of the wall material B, and 16.56 g of ethyl acetate were added to an aluminum cup, and stirred at room temperature.

Then, 46.89 g of pure water was added to the aluminum cup, and the mixture was stirred with a homogenizer at 12,000 rpm for 12 minutes. Thereafter, 16.64 g of pure water was further added, and the reaction solution was heated to 45° C. and then heated and stirred for 4 hours.

Subsequently, 5.17 g of a 10% aqueous solution of U-CAT SA 102 (manufactured by San-Apro Ltd.) was added thereto. Then, the container was put in a constant-temperature tank and aged for 48 hours, thereby obtaining a dispersion of particles 18 (solid content 20%).

The ethylenically unsaturated bond valence of the particles 18 was 2.01 mmol/g.

The particles 18 had a median diameter of 180 nm and a coefficient of variation of 29.1%.

The resin contained in the particles 18 is shown below.

In the following resin, the subscripts under each compound (monomer) and the subscripts at the right lower side of the parentheses represent the content ratio (mass ratio).

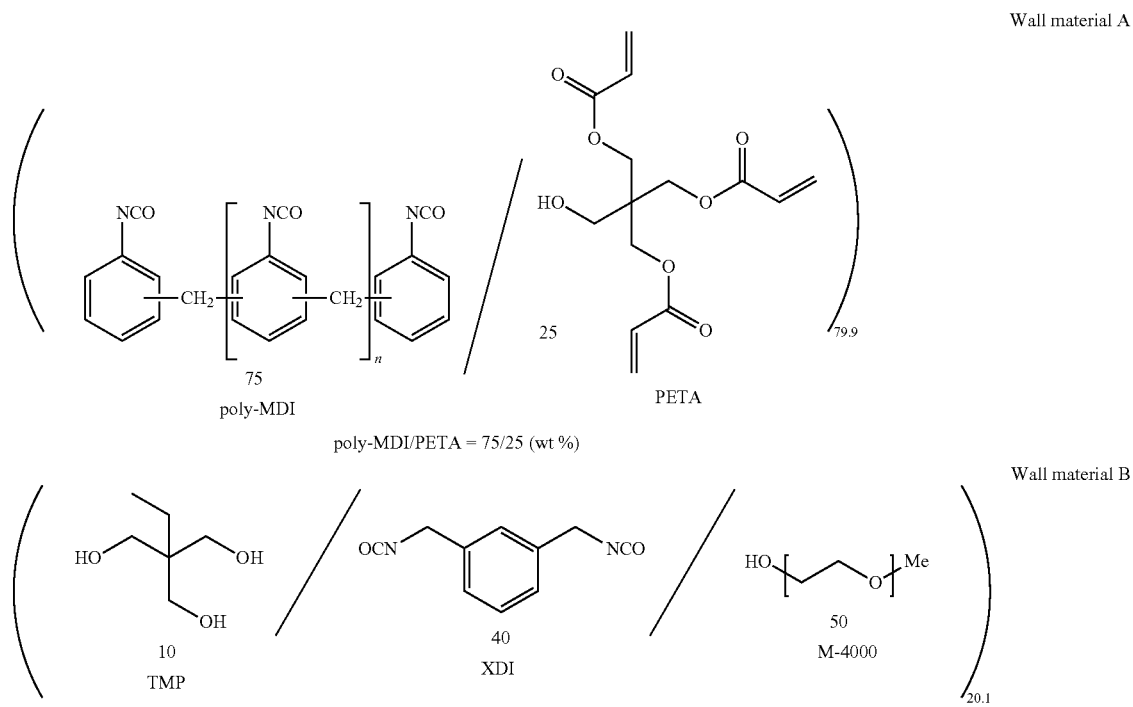

<Preparation of Polymer Particles 19 (Particles 19)>
—Synthesis of Wall Material B—
A wall material B was synthesized by the same method as that used for synthesizing the wall material B in the particles 18.
—Synthesis of Wall Material C—

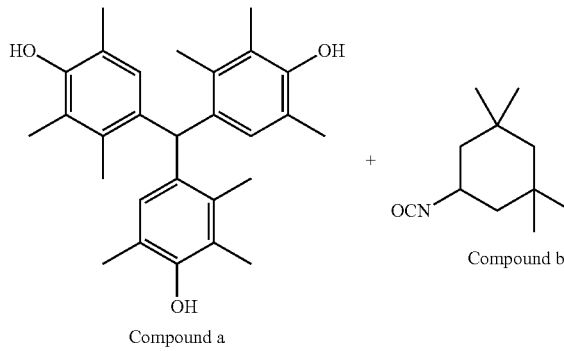

Compound a

Compound b

Compound c

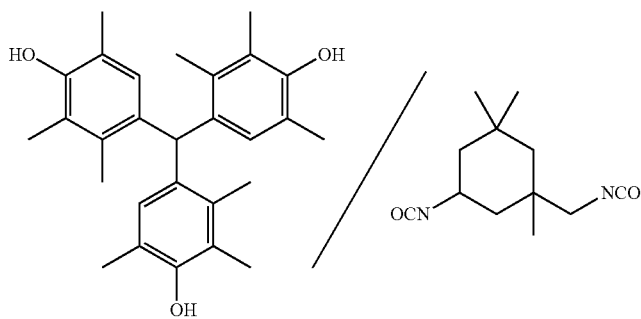

The above compound a (1.5 g), 6.0 g of the above compound b, 2.5 g of the above compound c, and 10 g of ethyl acetate were added to a three-neck flask, and the solution was stirred at room temperature and then heated to 60° C.

Then, 0.05 g of NEOSTANN U-600 (manufactured by NITTO KASEI CO., LTD.) was added to the three-neck flask, and the reaction solution was heated and stirred for 3 hours. Thereafter, the reaction solution was cooled to room temperature, thereby obtaining a wall material C (solid content 50% by mass).
—Synthesis of Wall Material D—
D-110N (manufactured by Mitsui Chemicals, Inc., 5.0 g), 5.0 g of UNISAFE PKA5014-TF (manufactured by NOF CORPORATION), and 10 g of ethyl acetate were added to a three-neck flask, stirred at room temperature, and then heated to 60° C.

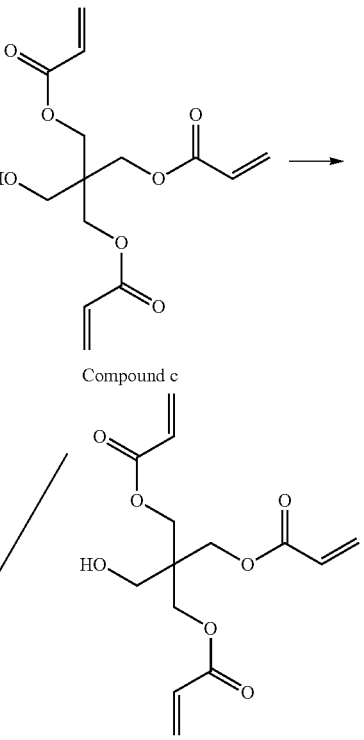

Then, 0.05 g of NEOSTANN U-600 (manufactured by NITTO KASEI CO., LTD.) was added to the three-neck flask, and the reaction solution was heated and stirred for 3 hours. Thereafter, the reaction solution was cooled to room temperature, thereby obtaining a wall material D (solid content 50% by mass).
—Synthesis of Particles 19—
PIONIN A-41-C(manufactured by TAKEMOTO OIL & FAT Co., Ltd., 0.45 g), 14.99 g of the wall material C, 7.49 g of SR399E (manufactured by Sartomer Company Inc.), 1.89 g of the wall material B, 1.89 g of the wall material D,

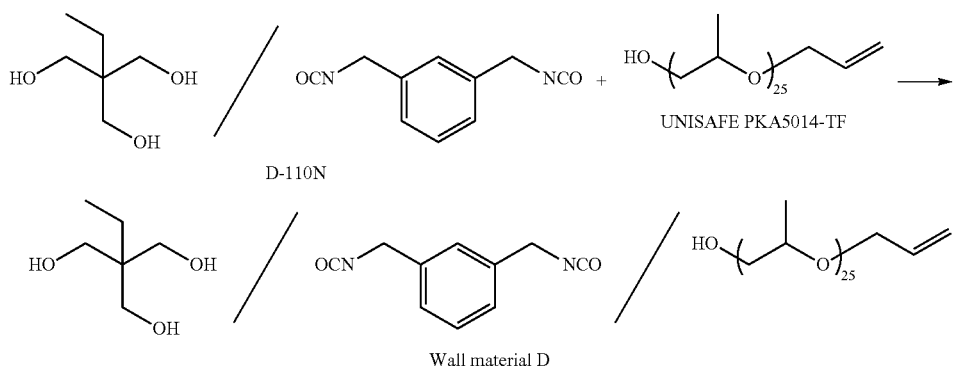

D-110N

Wall material D and 16.56 g of ethyl acetate were added to an aluminum cup, and stirred at room temperature.

Then, 46.89 g of pure water was added to the aluminum cup, and the mixture was stirred with a homogenizer at 12,000 rpm for 12 minutes. Thereafter, 16.64 g of pure water was further added, and the reaction solution was heated to 45° C. and then heated and stirred for 4 hours.

Subsequently, 5.17 g of a 10% aqueous solution of U-CAT SA 102 (manufactured by San-Apro Ltd.) was added thereto. Then, the container was put in a constant-temperature tank and aged for 48 hours, thereby obtaining a dispersion of particles 19 (solid content 20%).

The ethylenically unsaturated bond valence of the particles 19 was 2.01 mmol/g.

The particles 19 had a median diameter of 200 nm and a coefficient of variation of 28.1%.

The resin contained in the particles 19 is shown below.

In the following resin, the subscripts under each compound (monomer) and the subscripts at the right lower side of the parentheses represent the content ratio (mass ratio).

<Preparation of Polymer Particles 20 (Particles 20)>
—Synthesis of Wall Material C—
A wall material C was synthesized by the same method as that used for synthesizing the wall material C in the particles 19.
—Synthesis of Wall Material D—
A wall material D was synthesized by the same method as that used for synthesizing the wall material D in the particles 19.
—Synthesis of Particles 20—
PIONIN A-41-C(manufactured by TAKEMOTO OIL & FAT Co., Ltd., 0.45 g), 14.99 g of the wall material C, 7.49 g of SR399E (manufactured by Sartomer Company Inc.), 3.78 g of the wall material D, and 16.56 g of ethyl acetate were added to an aluminum cup, and stirred at room temperature.

Then, 46.89 g of pure water was added to the aluminum cup, and the mixture was stirred with a homogenizer at 12,000 rpm for 12 minutes. Thereafter, 16.64 g of pure water was further added, and the reaction solution was heated to 45° C. and then heated and stirred for 4 hours.

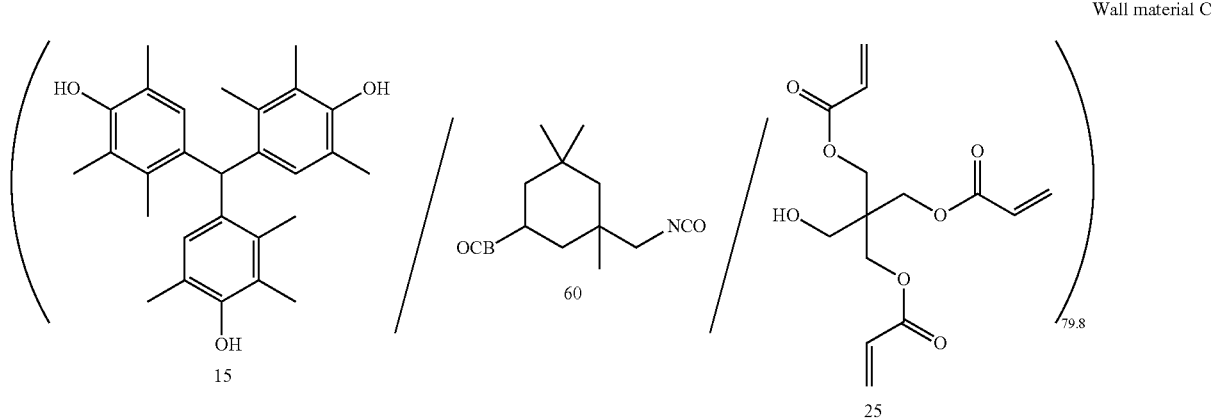

TrisP-236/IP DI/PETA = 15/60/25 (wt %)

Wall material C

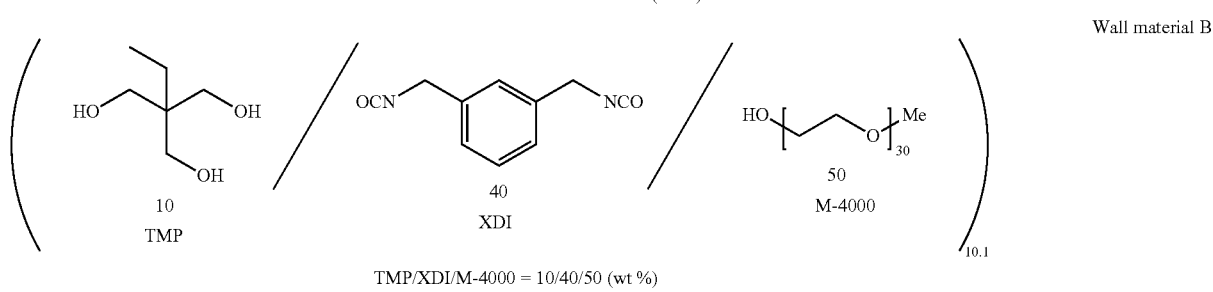

TMP/XDI/M-4000 = 10/40/50 (wt %)

Wall material B

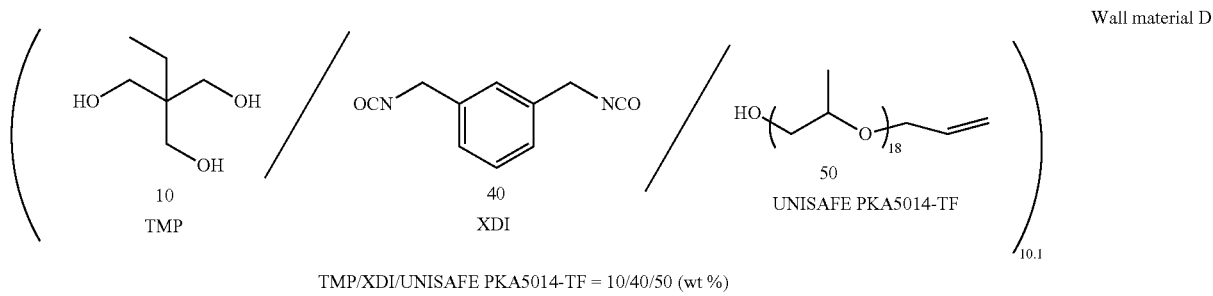

TMP/XDI/UNISAFE PKA5014-TF = 10/40/50 (wt %)

Wall material D

Subsequently, 5.17 g of a 10% aqueous solution of U-CAT SA 102 (manufactured by San-Apro Ltd.) was added thereto. Then, the container was put in a constant-temperature tank and aged for 48 hours, thereby obtaining a dispersion of particles 20 (solid content 20%).

The ethylenically unsaturated bond valence of the particles 20 was 2.01 mmol/g.

The particles 20 had a median diameter of 195 nm and a coefficient of variation of 28.5%.

The resin contained in the particles 20 is shown below.

In the following resin, the subscripts under each compound (monomer) and the subscripts at the right lower side of the parentheses represent the content ratio (mass ratio).

—Synthesis of Particles 21—

PIONIN A-41-C(manufactured by TAKEMOTO OIL & FAT Co., Ltd., 0.45 g), 14.99 g of the wall material A, 7.49 g of SR399E (manufactured by Sartomer Company Inc.), 1.89 g of the wall material B, 1.89 g of the wall material D, and 16.56 g of ethyl acetate were added to an aluminum cup, and stirred at room temperature.

Then, 46.89 g of pure water was added to the aluminum cup, and the mixture was stirred with a homogenizer at 12,000 rpm for 12 minutes. Thereafter, 16.64 g of pure water was further added, and the reaction solution was heated to 45° C. and then heated and stirred for 4 hours.

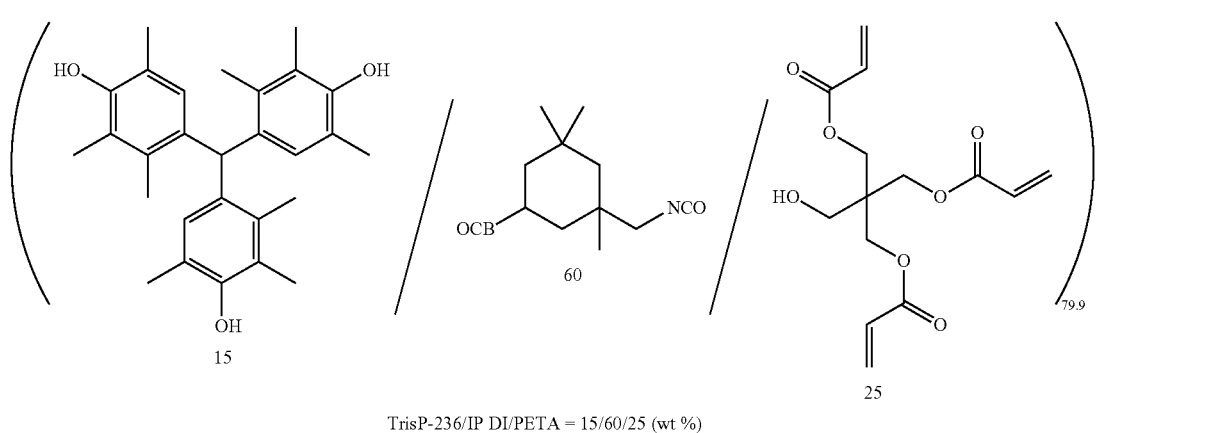

TrisP-236/IP DI/PETA = 15/60/25 (wt %)

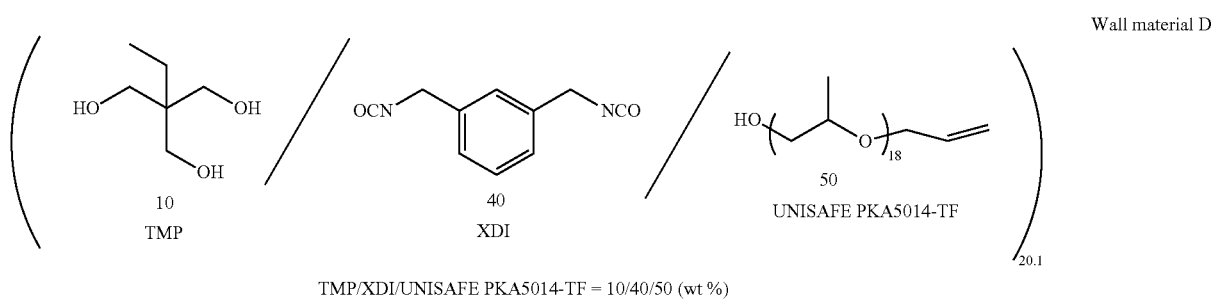

TMP/XDI/UNISAFE PKA5014-TF = 10/40/50 (wt %)

<Preparation of Polymer Particles 21 (Particles 21)>

—Synthesis of Wall Material A—

A wall material A was synthesized by the same method as that used for synthesizing the wall material A in the particles 18.

—Synthesis of Wall Material B—

A wall material B was synthesized by the same method as that used for synthesizing the wall material B in the particles 18.

—Synthesis of Wall Material D—

A wall material D was synthesized by the same method as that used for synthesizing the wall material D in the particles 19.

Subsequently, 5.17 g of a 10% aqueous solution of U-CAT SA 102 (manufactured by San-Apro Ltd.) was added thereto. Then, the container was put in a constant-temperature tank and aged for 48 hours, thereby obtaining a dispersion of particles 21 (solid content 20%).

The ethylenically unsaturated bond valence of the particles 21 was 2.01 mmol/g.

The particles 21 had a median diameter of 195 nm and a coefficient of variation of 28.5%.

The resin contained in the particles 21 is shown below.

In the following resin, the subscripts under each compound (monomer) and the subscripts at the right lower side of the parentheses represent the content ratio (mass ratio). Me represents a methyl group.

Wall material A

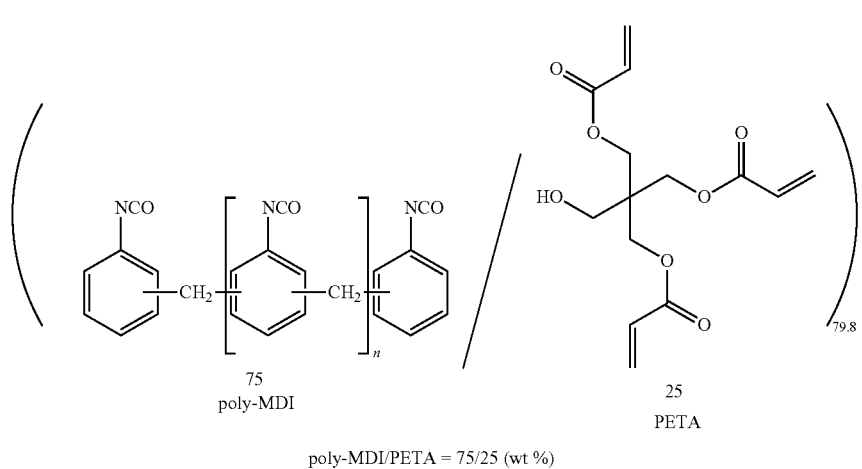

poly-MDI/PETA = 75/25 (wt %)

Wall Material B

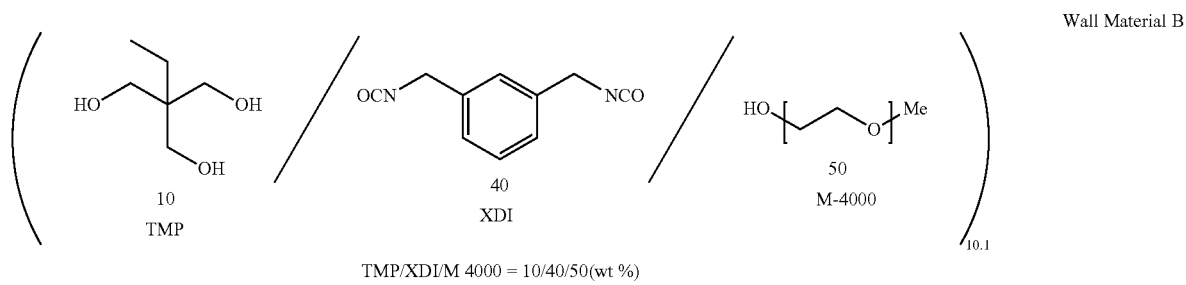

TMP/XDI/M 4000 = 10/40/50(wt %)

Wall material D

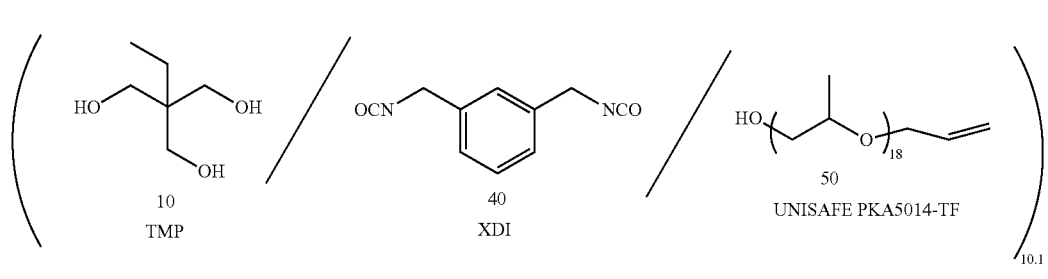

TMP/XDI/UNISAFE PKA5014-TF = 10/40/50 (wt %)

<Preparation of Polymer Particles 22 (Particles 22)>
—Synthesis of Wall Material A—
A wall material A was synthesized by the same method as that used for synthesizing the wall material A in the particles 18.
—Synthesis of Wall Material D—
A wall material D was synthesized by the same method as that used for synthesizing the wall material D in the particles 19.
—Synthesis of Particles 22—
PIONIN A-41-C(manufactured by TAKEMOTO OIL & FAT Co., Ltd., 0.45 g), 14.99 g of the wall material A, 7.49 g of SR399E (manufactured by Sartomer Company Inc.), 3.78 g of the wall material D, and 16.56 g of ethyl acetate were added to an aluminum cup, and stirred at room temperature.

Then, 46.89 g of pure water was added to the aluminum cup, and the mixture was stirred with a homogenizer at 12,000 rpm for 12 minutes. Thereafter, 16.64 g of pure water was further added, and the reaction solution was heated to 45° C. and then heated and stirred for 4 hours.

Subsequently, 5.17 g of a 10% aqueous solution of U-CAT SA 102 (manufactured by San-Apro Ltd.) was added thereto. Then, the container was put in a constant-temperature tank and aged for 48 hours, thereby obtaining a dispersion of particles 22 (solid content 20%).

The ethylenically unsaturated bond valence of the particles 22 was 2.01 mmol/g.

The particles 22 had a median diameter of 185 nm and a coefficient of variation of 27.5%.

The resin contained in the particles 22 is shown below.

In the following resin, the subscripts under each compound (monomer) and the subscripts at the right lower side of the parentheses represent the content ratio (mass ratio).

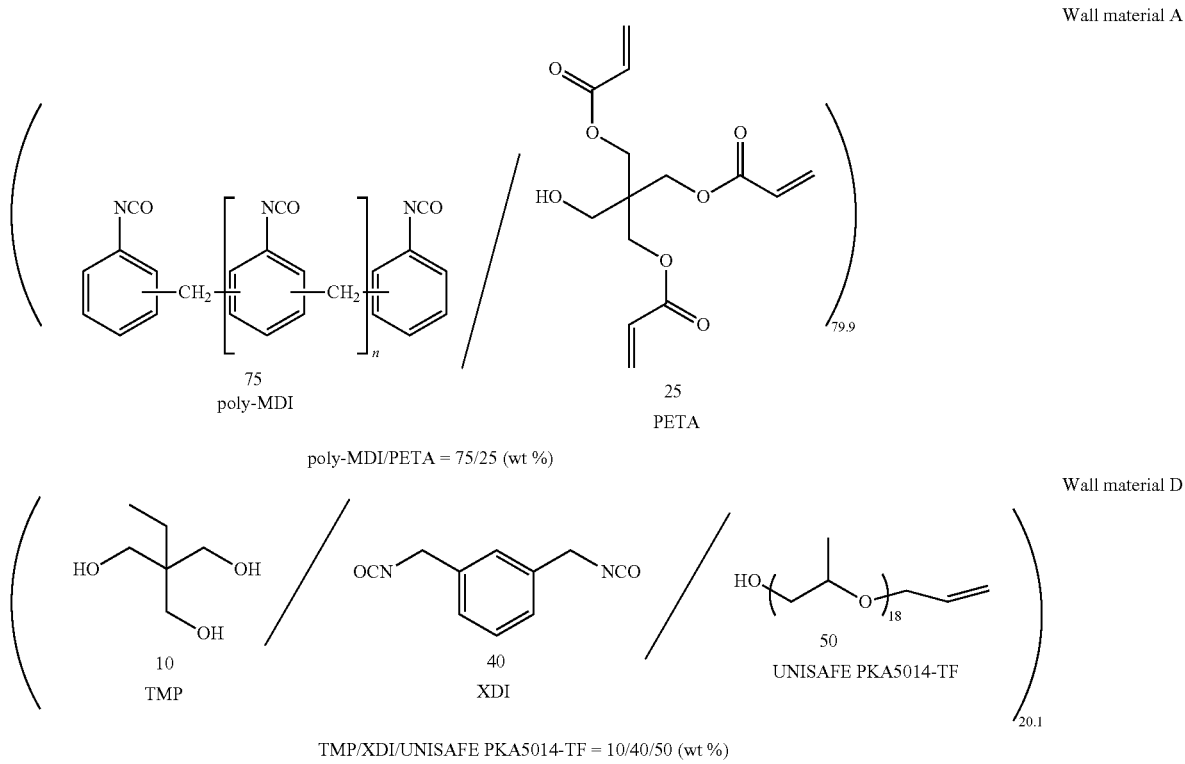

[Hydrophilic Compound]
A-1: The Following Compound

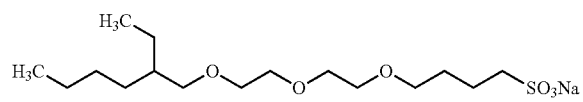

[Surfactant]
W-1: The following compound (in the following structural formula, the content of each constitutional unit (subscript at the right lower side of the parentheses) represents the mass ratio.)

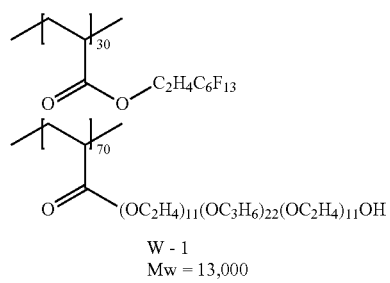

As is evident from the results shown in Table 1, the lithographic printing plate precursors according to the present disclosure shown in examples 1 to 13 have better UV printing durability and better temporal stability under white light, compared to the lithographic printing plate precursors of comparative examples.

Furthermore, as is evident from the results shown in Table 1, the lithographic printing plate precursors according to the present disclosure shown in Examples 1 to 13 also have excellent receptivity and excellent on-press developability and excellently suppress development residues during on-press development.

Furthermore, as is evident from the results shown in Table 2, the lithographic printing plate precursors according to the present disclosure shown in Examples 14 to 23 also have excellent visibility.

<Preparation of Coating Solutions (2) and (3) for Undercoat Layer>

Coating solutions (2) and (3) for an undercoat layer having the following compositions were prepared.

—Composition of Coating Solution (2) for Undercoat Layer—

Polymer (UC-1) [the following structure]: 0.18 parts
Surfactant (EMALEX (registered trademark) 710, manufactured by NIHON EMULSION Co., Ltd.): 0.03 parts by mass
Water: 28.0 parts by mass

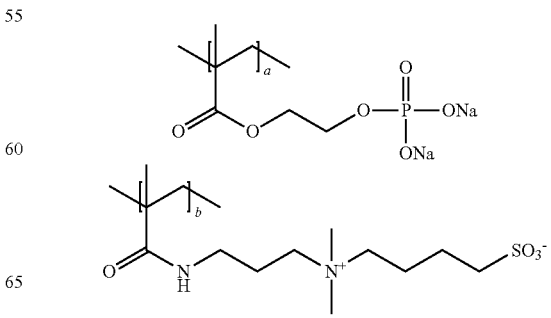

-continued

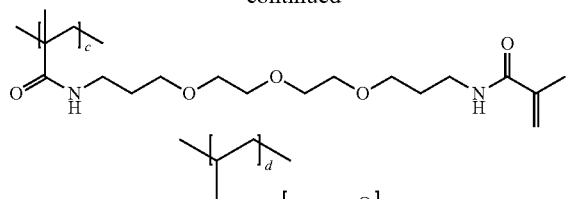

Weight-average molecular weight = 200,000
a / b / c / d = 14.2 / 71.8 / 9.0 / 5.0 (% by mass)
a / b / c / d = 19.0 / 72.8 / 7.8 / 0.4 (mol%)

—Composition of Coating Solution (3) for Undercoat Layer—
  Polymer (UC-1) [the above structure]: 0.18 parts by mass
  Surfactant (EMALEX (registered trademark) 710, manufactured by NIHON EMULSION Co., Ltd.): 0.03 parts by mass
  Hydrophilic compound: amounts listed in Table 3.
  Water: 28.0 parts by mass Examples 24 to 29

<Preparation of Lithographic Printing Plate Precursor>
The support A was coated with the coating solution for an undercoat layer described in the following Table 3 so that the dry coating amount was 20 mg/m². In this way, an undercoat layer was formed. The undercoat layer was bar-coated with the coating solution for an image-recording layer described in Table 3 (the coating solution containing the components described in Table 3, which was prepared using a mixed solvent of 2-butanone:1-methoxy-2-propanol (MFG):distilled water=5:4:5 (mass ratio) so that the solid content was 7% by mass), and dried in an oven at 120° C. for 40 seconds, thereby forming an image-recording layer having a dry coating amount of 1.0 g/m².

The coating solution for an image-recording layer was prepared by mixing in and stirring the polymer particles immediately before coating.

Example 30

<Preparation of Lithographic Printing Plate Precursor>
<<Formation of undercoat layer 2>>
The support A (printing surface side) was coated with coating solution (4) for an undercoat layer having the following composition so that the dry coating amount was 87 mg/m². In this way, an undercoat layer 2 was formed.
—Composition of Coating Solution (4) for Undercoat Layer—
  Compound for undercoat layer (P-1) [the above structure]: 0.1370 parts by mass
  Sodium gluconate: 0.0700 parts by mass
  Surfactant (EMALEX (registered trademark) 710, manufactured by NIHON EMULSION Co., Ltd.): 0.00159 parts by mass
  Preservative (BIOHOPE L, manufactured by K•I Chemical Industry Co., LTD.): 0.00149 parts by mass
  Water: 3.29 parts by mass
<Formation of Image-Recording Layer 2>
The undercoat layer 2 was bar-coated with the coating solution (2) for an image-recording layer having the following composition and dried in an oven at 120° C. for 40 seconds, thereby forming an image-recording layer 2 having a dry coating amount of 0.971 g/m². The coating solution (2) for an image-recording layer was prepared by mixing in and stirring the polymer particles immediately before coating.
—Composition of Coating Solution (2) for Image-Recording Layer—
  Infrared absorber (D-3): 0.0197 parts by mass
  Color developing agent (G-1): 0.0600 parts by mass
  Electron-accepting polymerization initiator (1-5) (the following compound): 0.110 parts by mass
  Borate compound (B-1) (sodium tetraphenylborate): 0.0300 parts by mass
  Polymerizable compound (M-7) (mixture of 70% by mass of U-15HA (manufactured by SHIN-NAKAMURA CHEMICAL CO, LTD.) and 30% by mass of diethylene glycol ethyl methyl ether): 0.490 parts by mass
  Anionic surfactant (A-1): 0.00800 parts by mass
  Fluorine-based surfactant (W-1): 0.00416 parts by mass
  2-Butanone: 4.92 parts by mass
  1-Methoxy-2-propanol: 3.10 parts by mass
  Methanol: 2.79 parts by mass
  The above microgel solution (2): 2.32 parts by mass

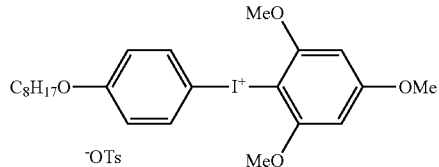

Electron-accepting polymerization initiator (1-5)

<Evaluation of Suppression of Scratches and Contamination>
In Luxel PLATESETTER T-60001II manufactured by FUJIFILM Corporation that was equipped with an infrared semiconductor laser, each of the obtained lithographic printing plate precursors was exposed under the conditions of outer drum rotation speed of 1,000 rpm (revolutions per minute), a laser output of 70%, and resolution of 2,400 dpi (dot per inch). After the exposure treatment, the lithographic printing plate obtained in an environment of a temperature of 25° C. and a humidity of 70% was scratched by a scratch tester.

As the scratch tester, HEIDON scratching Intersity TESTER HEIDEN-18 was used. In addition, a sapphire needle having a diameter of 0.1 mm was used, and the scratch load was set to 50 (g). Without being subjected to a development treatment, the scratched plate was mounted on the plate cylinder of DIA IF2 printer manufactured by Mitsubishi Heavy Industries, Ltd. By using dampening water containing IF102 (manufactured by FUJIFILM Corporation)/tap water=3/97 (volume ratio) and Values-G(N) black ink (manufactured by DIC Corporation), on-press development was performed by supplying the dampening water and the ink according to the standard automatic printing start method of DIA IF2. Then, printing was performed using TOKUBISHI art paper (ream weight: 76.5 kg) at a printing rate of 10,000 sheets/hour, and whether the scratched portion turned into a printing stain was evaluated. In addition, regarding the intermediate points such as 9 points and 7 points, in a case where the scratches and contamination of an example are at the intermediate level of the upper evaluation standard, the intermediate points were given to the example. The evaluation standards of 10 to 6 points are preferable. The results are shown in Table 3.

—Evaluation Standard—

10 points: The scratched portion does not turn into a printing stain.

8 points: Slight printing stains that cannot be visually identified are observed on the scratched portion.

6 points: Slight printing stains are visually observed on the scratched portion.

4 points: Printing stains are visually observed on the scratched portion.

2 points: Noticeable printing stains are observed on the scratched portion.

TABLE 3

| | | Support | | Layer on support | | | Image-recording layer | | | | |
|---|---|---|---|---|---|---|---|---|---|---|---|
| | | | | | | | Infrared-absorbing polymethine colorant | | | Electron-accepting polymerization initiator | |
| | | | Surface contact angle | Coating solution for undercoat layer | Compound | | | | | | |
| | | Type | | | Type | Part by mass | Structure | HOMO (eV) | LUMO (eV) | Structure | LUMO (eV) |
| Example | 24 | A | 80 | (2) | | | D-5 | −5.4 | −3.73 | I-3 | −3.3 |
| | 25 | A | 60 | (3) | Ethylenediaminetetraacetic acid 4Na | 0.01 | D-5 | −5.4 | −3.73 | I-3 | −3.3 |
| | 26 | A | 20 | (3) | Ethylenediaminetetraacetic acid 4Na | 0.03 | D-5 | −5.4 | −3.73 | I-3 | −3.3 |
| | 27 | A | 9 | (3) | Tartaric acid 2K | 0.08 | D-5 | −5.4 | −3.73 | I-3 | −3.3 |
| | 28 | A | 8 | (3) | Shikimic acid Na | 0.06 | D-5 | −5.4 | −3.73 | I-3 | −3.3 |
| | 29 | A | 6 | (3) | Gluconic acid Na | 0.07 | D-5 | −5.4 | −3.73 | I-3 | −3.3 |
| | 30 | A | 6 | (4) | Gluconic acid Na | 0.07 | D-3 | −5.4 | −3.73 | I-5 | −3.0 |

| | | Image-recording layer | | | | | | |
|---|---|---|---|---|---|---|---|---|
| | | Electron-accepting polymerization initiator | Electron-donating polymerization initiator | | | Polymerizable compound | | |
| | | Potential difference (LUMO of initiator − LUMO of colorant) | Structure | HOMO (eV) | Potential difference (HOMO of colorant − HOMO of initiator) | Structure | Content Wm (part by mass) | Structure | Content Wm (part by mass) |
| Example | 24 | 0.48 | B-1 | −5.9 | 0.56 | M-6 | 0.450 | M-3 | 0.100 |
| | 25 | 0.48 | B-1 | −5.9 | 0.56 | M-6 | 0.450 | M-3 | 0.100 |
| | 26 | 0.48 | B-1 | −5.9 | 0.56 | M-6 | 0.450 | M-3 | 0.100 |
| | 27 | 0.48 | B-1 | −5.9 | 0.56 | M-6 | 0.450 | M-3 | 0.100 |
| | 28 | 0.48 | B-1 | −5.9 | 0.56 | M-6 | 0.450 | M-3 | 0.100 |
| | 29 | 0.48 | B-1 | −5.9 | 0.56 | M-6 | 0.450 | M-3 | 0.100 |
| | 30 | 0.71 | B-1 | −5.9 | 0.56 | M-7 | 0.490 | | |

| | | Image-recording layer | | | | | Evaluation |
|---|---|---|---|---|---|---|---|
| | | Polymer | | | Color developing agent | | |
| | | Type | Content Wp (part by mass) | Wp/Wm | Contact angle (°) | Type | Added amount (part by mass) | Suppression of scratches and contamination |
| Example | 24 | Polymer particles 1 | 0.400 | 0.889 | 55 | S-1 | 0.060 | 5 |
| | 25 | Polymer particles 1 | 0.400 | 0.889 | 55 | S-1 | 0.010 | 6 |
| | 26 | Polymer particles 1 | 0.400 | 0.889 | 55 | S-6 | 0.060 | 7 |
| | 27 | Polymer particles 1 | 0.400 | 0.889 | 55 | S-4 | 0.060 | 10 |
| | 28 | Polymer particles 1 | 0.400 | 0.889 | 55 | S-11 | 0.060 | 10 |
| | 29 | Polymer particles 1 | 0.400 | 0.889 | 55 | S-12 | 0.060 | 10 |
| | 30 | Microgel (1) | 0.400 | 0.816 | 56 | G-1 | 0.060 | 10 |

"Surface contact angle" shown in Table 3 represents a water contact angle on a surface of the aluminum support on the image-recording layer side that is measured by an airborne water droplet method. The contact angle was measured by the method described above.

The details of the hydrophilic compounds shown in Table 3 are as follows.

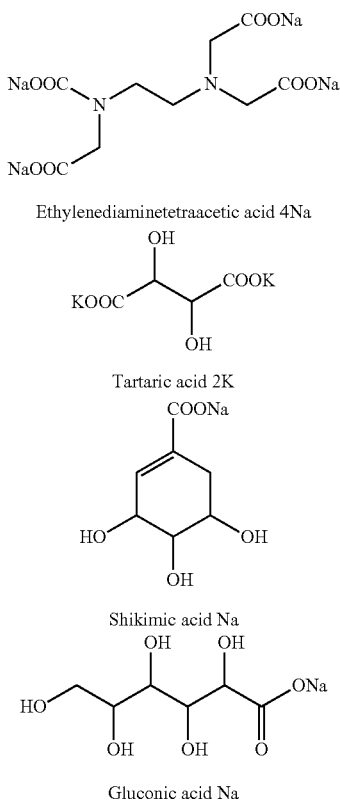

Ethylenediaminetetraacetic acid 4Na

Tartaric acid 2K

Shikimic acid Na

Gluconic acid Na

Examples 31 to 35

(Preparation of Support C)
—Alkaline Etching Treatment—

An aqueous solution of caustic soda having a caustic soda concentration of 26% by mass and an aluminum ion concentration of 6.5% by mass was sprayed onto the aluminum plate at a temperature of 55° C., thereby performing an etching treatment. Then, rinsing was performed by means of spraying. The amount of dissolved aluminum within the surface to be subjected to the electrochemical roughening treatment later was 3 g/m².

—Desmutting Treatment Using Aqueous Acidic Solution (First Desmutting Treatment)—

Next, a desmutting treatment was performed using an aqueous acidic solution. In the desmutting treatment, a 170 g/L aqueous sulfuric acid solution was used as the aqueous acidic solution. The liquid temperature was 30° C. The desmutting treatment was performed for 3 seconds by spraying the aqueous acidic solution onto the aluminum plate. Then, a rinsing treatment was performed.

—Electrochemical Roughening Treatment—

Next, an electrochemical roughening treatment was performed using an electrolytic solution at a hydrochloric acid concentration and alternating current. The liquid temperature of the electrolytic solution was 40° C. The waveform of the alternating current was a sine wave in which the positive and negative waveforms are symmetrical, and the frequency was 50 Hz. The quantity of electricity was 300 C/dm², which is the total quantity of electricity that the aluminum plate stores during the anodic reaction. A carbon electrode was used as the counter electrode of the aluminum plate. Then, a rinsing treatment was performed.

—Alkaline Etching Treatment—

An aqueous solution of caustic soda having a caustic soda concentration of 5% by mass and an aluminum ion concentration of 0.5% by mass was sprayed onto the aluminum plate having undergone the electrochemical roughening treatment at a temperature of 35° C. so that an etching amount was 0.1 g/m² or less, thereby performing an etching treatment. Then, a rinsing treatment was performed.

—Desmutting Treatment Using Aqueous Acidic Solution—

Next, a desmutting treatment was performed using an aqueous acidic solution. In the desmutting treatment, a 170 g/L aqueous sulfuric acid solution was used as the aqueous acidic solution. The liquid temperature was 30° C. The desmutting treatment was performed for 3 seconds by spraying the aqueous acidic solution onto the aluminum plate. Then, a rinsing treatment was performed.

—Anodic Oxidation Treatment—

An anodic oxidation treatment was performed using 170 g/L of a sulfuric acid solution and direct current at a liquid temperature of 40° C. so that the amount of the anodic oxide film was 3 g/m².

A support C was obtained as above.

<Preparation of Lithographic Printing Plate Precursor>

The support described in Table 4 was coated with a coating solution for an undercoat layer described in Table 4 so that the dry coating amount was 0.16 mg/m², thereby forming an undercoat layer.

The formed undercoat layer was bar-coated with each coating solution (1) for an image-recording layer having the composition described in Table 4 and dried in an oven at 120° C. for 40 seconds, thereby forming an image-recording layer having a dry coating amount of 1.0 g/m².

A described above, the coating solution (1) for an image-recording layer containing polymer particles was prepared by mixing and stirring polymer particles immediately before coating.

Thereafter, in Examples 32 to 34, the image-recording layer was bar-coated with the coating solution for forming a protective layer having the following composition and dried in an oven at 140° C. for 60 seconds, thereby forming a protective layer having a dry coating amount of 0.3 g/m².

—Composition of Coating Solution for Protective Layer—

Water-soluble polymer (compound described in Table 5): amount described in Table 5

Hydrophobic polymer particles (compound described in Table 5): amount described in Table 5

Discoloring compound (compound described in Table 5): amount described in Table 5.

1% by mass aqueous solution of surfactant (polyoxyethylene lauryl ether, EMALEX (registered trademark) 710, manufactured by NIHON EMULSION Co., Ltd.): 0.03 parts by mass Deionized water: 0.903 parts by mass

TABLE 4

| | | | Image-recording layer | | | | | |
|---|---|---|---|---|---|---|---|---|
| | | | Infrared-absorbing polymethine colorant | | | | Electron-accepting polymerization initiator | |
| | | Coating solution | | | | | | Potential difference |
| | Suppose Type | for undercoat layer | Structure | HOMO (eV) | LUMO (eV) | Structure | LUMO (eV) | (LUMO of initiator − LUMO of colorant) |
| Example 31 | A | (1) | D-1 | −5.27 | −3.66 | I-1 | −3.02 | 0.64 |
| 32 | B | (4) | D-3 | −5.35 | −3.75 | I-5 | −3.02 | 0.64 |
| 33 | B | (4) | D-7 | −5.31 | −3.78 | I-5 | −3.02 | 0.64 |
| 34 | C | (1) | D-8 | −5.38 | −3.77 | I-6 | −3.21 | 0.56 |
| 35 | C | (1) | D-8 | −5.38 | −3.77 | I-6 | −3.21 | 0.56 |

| | Image-recording layer | | | | | |
|---|---|---|---|---|---|---|
| | Electron-donating polymerization initiator | | | Polymerizable compound | | |
| | Structure | HOMO (eV) | Potential difference (HOMO of colorant − HOMO of initiator) | Structure | Content Wm (part by mass) | Structure | Content Wm (part by mass) |
| Example 31 | B-1 | −5.91 | 0.78 | M-4 | 0.360 | — | — |
| 32 | B-1 | −5.91 | 0.56 | M-8 | 0.242 | — | — |
| 33 | B-1 | −5.91 | 0.60 | M-8 | 0.242 | — | — |
| 34 | B-1 | −5.91 | 0.53 | M-8 | 0.242 | — | — |
| 35 | B-1 | −5.91 | 0.53 | M-8 | 0.121 | M-9 | 0.121 |

| | | Image-recording layer | | | | |
|---|---|---|---|---|---|---|
| | | Polymer | Additive | | | |
| | | Type | Content Wp (part by mass) | Type | Content (part by mass) | Surfactant Type | Color developing agent | Wp/Wm |
| Example 31 | Acrylic resin | 0.120 | — | — | W-2 | G-1 | 0.333 |
| 32 | Polymer particles 1 | 0.120 | O-1 | 0.040 | W-1 | S'-1 | 0.496 |
| 33 | R'-1 | 0.120 | O-1 | 0.040 | W-1 | S'-1 | 0.496 |
| 34 | P'-1 | 0.200 | — | — | W-1 | S'-2 | 0.826 |
| 35 | P'-1 | 0.200 | — | — | W-1 | S'-2 | 1.653 |

TABLE 5

| | Protective layer | | | | | | Evaluation | | | |
|---|---|---|---|---|---|---|---|---|---|---|
| | Water-soluble polymer | | Hydrophobic polymer particles | | Discoloring compound | | | | | On-press developability |
| | Type | Content (part by mass) | Type | Content (part by mass) | Type | Content (part by mass) | UV printing durability (sheets) | Receptivity (sheets) | On-press developability (sheets) | under white light (sheets) |
| Example 31 | — | — | — | — | — | — | 65,000 | 10 | 20 | 30 |
| 32 | WP'-1 | 0.050 | WR'-1 | 0.017 | — | — | 65,000 | 10 | 20 | 30 |
| 33 | WP'-1 | 0.050 | WR'-1 | 0.017 | — | — | 70,000 | 10 | 25 | 30 |
| 34 | WP'-2 | 0.480 | WR'-2 | 0.200 | wIR'-1 | 0.020 | 75,000 | 10 | 30 | 40 |
| 35 | WP'-2 | 0.480 | WR'-2 | 0.200 | wIR'-1 | 0.020 | 75,000 | 10 | 25 | 35 |

As is evident from the results shown in Table 5, the lithographic printing plate precursors shown in Examples 31 to 35 have excellent UV printing durability and excellent temporal stability under white light.

Furthermore, it has been revealed that the lithographic printing plate precursors shown in Examples 31 to 35 also have excellent receptivity and excellent on-press developability.

Details of the compounds described in Table 4 and Table 5 are as below.

[Cationic Polymethine Colorant]

D-7 and D-8: Compounds having the following structures

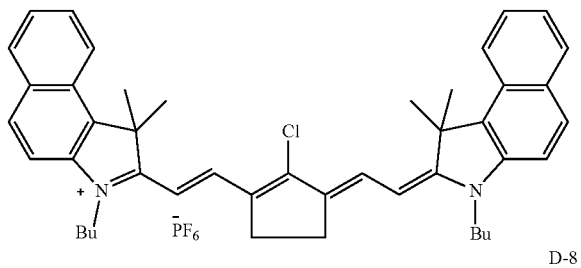

[Electron-Accepting Polymerization Initiator]

I-6: The following compound

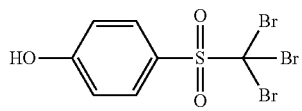

[Color Developing Agent (Acid Color-Developing Agent)]

S'-1 and S'-2: The following compounds

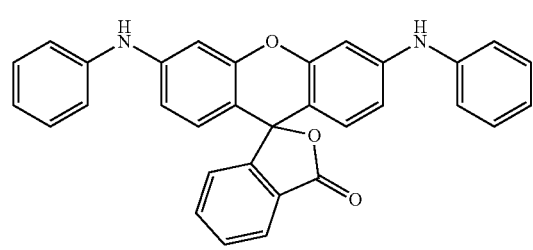

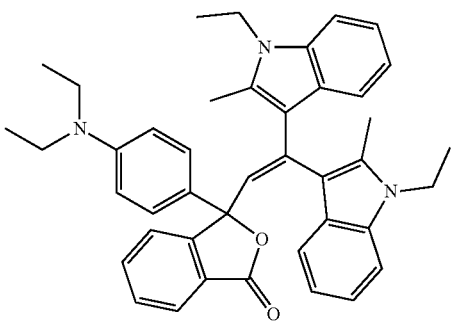

[Polymerizable Compound]

M-8: A compound synthesized by the following method (mixture containing a polymerizable compound having 7 or more functional groups as a main component, C=C valence: 6.8 mmol/g, weight-average molecular weight: 150,000).

M-9: A compound synthesized by the following method (C=C valence: 6.8 mmol/g, weight-average molecular weight: 150,000).

—Synthesis of M-8—

A mixed solution of TAKENATE (registered trademark) D-116N (manufactured by Mitsui Chemicals, Inc., 4.7 parts by mass) as polyisocyanate, ARONIX (registered trademark) M-403 (manufactured by TOAGOSEI CO., LTD.) as a hydroxyl group-containing polyfunctional acrylate in such an amount that the ratio of the NCO value of polyisocyanate to the hydroxyl number of hydroxyl group-containing polyfunctional acrylate was 1:1, 0.02 parts by mass of t-butylbenzoquinone, and 11.5 parts by mass of methyl ethyl ketone was heated at 65° C. NEOSTANN U-600 (bismuth-based polycondensation catalyst, manufactured by NITTO KASEI CO., LTD., 0.11 parts by mass) was added to the reaction solution, and the reaction solution was heated at the same temperature for 4 hours. The reaction solution was cooled to room temperature (25° C.), and methyl ethyl ketone was added thereto, thereby synthesizing a urethane acrylate solution having a solid content of 50% by mass.

Subsequently, by using recycling GPC (instrument: LC908-C60, column: JAIGEL-1H-40 and 2H-40 (manufactured by Japan Analytical Industry Co., Ltd.)) and tetrahydrofuran (THF) as an eluent, molecular weight fractionation of the urethane acrylate solution was performed.

The weight-average molecular weight of the compound M-8 was measured by the following measurement instruments and methods.

GPC measurement instrument: TOSOH HLC-8320 GPC, GPC mobile phase: THF

Inspector: Differential Refractometer (RI), flow rate: 0.35 mL/min

Columns: TSKgel SuperHZM-M, TSKgel SuperHZ4000, TSKgel SuperHZ3000, and TSKgel SuperHZ2000 were connected and used.

Column temperature: 40° C.

Standard sample for molecular weight calibration curve: polystyrene (PS)

The ethylenically unsaturated bond valence (C=C valence) of the compound M-8 was calculated based on the structure of the compound (model) obtained by the structural analysis performed by 1H-NMR spectroscopy.

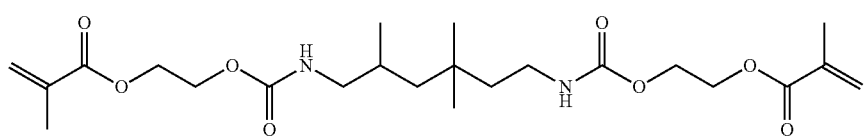

M-9

[Polymer]

P'-1: Partially acetylated polyvinyl butyral, S-LEC BL-10 manufactured by SEKISUI CHEMICAL CO., LTD. (degree of acetalization 70 mol %, amount of hydroxyl groups 28 mol %, amount of acetyl groups 2 mol %, Tg: 67° C., weight-average molecular weight 15,000)

R'-1: Polymer particles synthesized by the following method

—Synthesis of Polymer Particles R'-1—
—Preparation of Oil-Phase Component—

Polymeric MDI WANNATE (registered trademark) PM-200 (polyfunctional isocyanate compound: manufactured by Wanhua Chemical Group Co., Ltd.): 6.66 g, a 50% by mass ethyl acetate solution of TAKENATE (registered trademark) D-116N (adduct of trimethylolpropane (TMP), m-xylylene diisocyanate (XDI), and polyethylene glycol monomethyl ether (E090) (following structure)" manufactured by Mitsui Chemicals, Inc.: 5.46 g, a 65% by mass ethyl acetate solution of SR399 (dipentaerythritol pentaacrylate, manufactured by Sartomer Company Inc.): 11.24 g, ethyl acetate: 14.47 g, and PIONIN A-41-C(manufactured by TAKEMOTO OIL & FAT Co., Ltd.): 0.45 g were mixed together and stirred at room temperature (25° C.) for 15 minutes, thereby obtaining an oil-phase component.

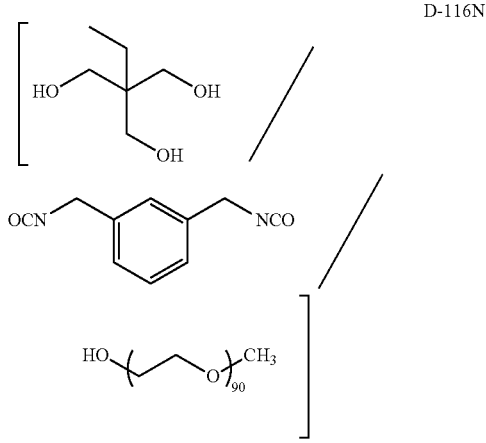

D-116N

—Preparation of Water-Phase Component—

As a water-phase component, 47.2 g of distilled water was prepared.

—Formation of Microcapsule—

The oil-phase component and the water-phase component were mixed together, and the obtained mixture was emulsified at 12,000 rpm for 16 minutes by using a homogenizer, thereby obtaining an emulsion.

Distilled water (16.8 g) was added to the obtained emulsion, and the obtained liquid was stirred at room temperature for 180 minutes.

After stirring, the liquid was heated at 45° C., and stirred for 5 hours in a state of being kept at 45° C. so that ethyl acetate was distilled away from the liquid. Distilled water was added thereto so that the concentration of solid contents was adjusted to 20% by mass, thereby obtaining an aqueous dispersion of polymer particles R'-1.

The polymer particles R'-1 had a volume average particle diameter of 165 nm that was measured using a laser diffraction/scattering type particle size distribution analyzer LA-920 (manufactured by HORIBA, Ltd.).

[Additive]

O-1: The following compound (chain transfer agent).

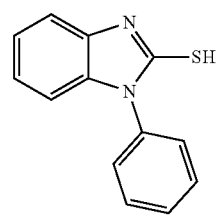

O-1

[Surfactant]

W-2: The following compound (in the following structural formula, the content of each constitutional unit (subscript at the right lower side of the parentheses) represents the mass ratio.)

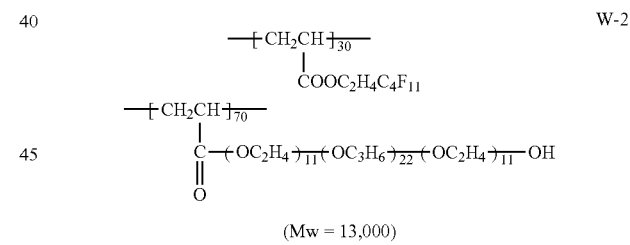

W-2

(Mw = 13,000)

[Water-Soluble Polymer]

WP'-1: Polyvinyl alcohol, GOHSENOL L-3266 manufactured by Mitsubishi Chemical Corporation, saponification degree of 86% to 89% or higher WP'-2: Polyvinyl alcohol, manufactured by Sigma-Aldrich Co. LLC., Mowiol (registered trademark) 4-88

[Hydrophobic Polymer Particles]

WR'-1: styrene-acrylic resin particles, FS-102 manufactured by Nipponpaint Industrial Coatings Co., LTD., Tg=103° C.

WR'-2: aqueous polyvinylidene chloride dispersion, Diofan (registered trademark) A50 manufactured by Solvin S.A.

[Discoloring Compound]

wIR'-1: The following compound (infrared absorber, decomposable compound).

wIR'-1

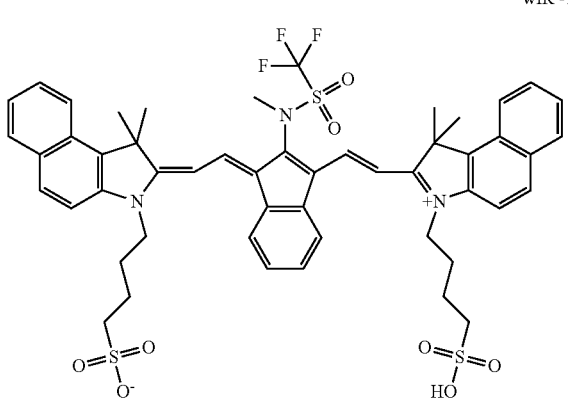

EXPLANATION OF REFERENCES

1, 18: aluminum plate, 2,4: roller-shaped brush, 3: polishing slurry liquid, 5, 6, 7, 8: support roller, ta: anodic reaction time, tc: cathodic reaction time, tp: time taken for current to reach peak from 0, Ia: peak current on anodic cycle side, Ic: peak current on cathodic cycle side, AA: current of anodic reaction of aluminum plate, CA: current of cathodic reaction of aluminum plate, 10: lithographic printing plate precursor, 12a, 12b: aluminum support, 14: undercoat layer, 16: image-recording layer, 20a, 20b: anodic oxide film, 22a, 22b: micropore, 24: large diameter portion, 26: small diameter portion, D: depth of large diameter portion, 50: main electrolytic cell, 51: alternating current power source, 52: radial drum roller, 53a, 53b: main pole, 54: electrolytic solution supply port, 55: electrolytic solution, 56: auxiliary anode, 60: auxiliary anode tank, W: aluminum plate, A1: solution supply direction, A2: electrolytic solution discharge direction, 610: anodic oxidation treatment device, 612: power supply tank, 614: electrolytic treatment tank, 616: aluminum plate, 618, 26: electrolytic solution, 620: power supply electrode, 622, 628: roller, 624: nip roller, 630: electrolysis electrode, 632: cell wall, 634: direct current power source The entirety of the disclosure of Japanese Patent Application No. 2019-122493 filed on Jun. 28, 2019, Japanese application No. 2019-158808 filed on Aug. 30, 2019, and Japanese application 2019-169800 filed on Sep. 18, 2019 is incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

What is claimed is:

1. An on-press development type lithographic printing plate precursor comprising:
    an aluminum support; and
    an image-recording layer on the aluminum support,
    wherein the image-recording layer contains an infrared-absorbing polymethine colorant having HOMO of −5.2 eV or less, a polymerization initiator, and a polymerizable compound having 7 or more polymerizable functional groups and having a molecular weight of less than 10,000 and a polymer having a molecular weight of 10,000 or more, and
    wherein a mass ratio Wp/Wm of a content Wp by mass of the polymer having a molecular weight 10,000 or more to a content Wm by mass of the polymerizable compound having 7 or more polymerizable functional groups is 1.00 or less.

2. The on-press development type lithographic printing plate precursor according to claim 1,
    wherein a water contact angle on a surface of an outermost layer of the on-press development type lithographic printing plate precursor that is determined by an airborne water droplet method is 300 to 80°.

3. The on-press development type lithographic printing plate precursor according to claim 1,
    wherein the polymerizable compound having 7 or more polymerizable functional groups includes a compound having an ethylenically unsaturated bond valence of 5.0 mmol/g or more,
    wherein the compound having an ethylenically unsaturated bond valence of 5.0 mmol/g or more has at least one kind of structure selected from the group consisting of an adduct structure, a biuret structure, and an isocyanurate structure.

4. The on-press development type lithographic printing plate precursor according to claim 1,
    wherein the polymer includes a polymer having a constitutional unit formed of an aromatic vinyl compound and a constitutional unit formed of an acrylonitrile compound.

5. The on-press development type lithographic printing plate precursor according to claim 1,
    wherein the infrared-absorbing polymethine colorant includes a cyanine dye having an electron-withdrawing group or a heavy atom-containing group in at least one of aromatic rings at both terminals.

6. The on-press development type lithographic printing precursor according to claim 1,
    wherein the image-recording layer contains an electron-accepting polymerization initiator, and
    LUMO of the electron-accepting polymerization initiator—LUMO of the infrared-absorbing polymethine colorant is 0.70 eV or less.

7. The on-press development type lithographic printing plate precursor according to claim 1,
    wherein the polymerization initiator includes an electron-accepting polymerization initiator, and
    the electron-accepting polymerization initiator includes a compound represented by Formula (II),

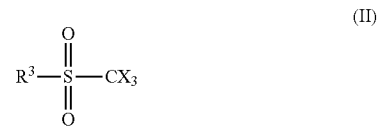

(II)

in Formula (II), X represents a halogen atom, and $R^3$ represents an aryl group.

8. The on-press development type lithographic printing plate precursor according to claim 1,
    wherein the image-recording layer contains an electron-donating polymerization initiator, and
    HOMO of the infrared-absorbing polymethine colorant—HOMO of the electron-donating polymerization initiator is 0.70 eV or less.

9. The on-press development type lithographic printing plate precursor according to claim 1, wherein the polymer includes polymer particles.

10. The on-press development type lithographic printing plate precursor according to claim 9, wherein the polymer particles include a resin having a structure obtained by reacting at least an isocyanate compound represented by Formula (Iso) and water,

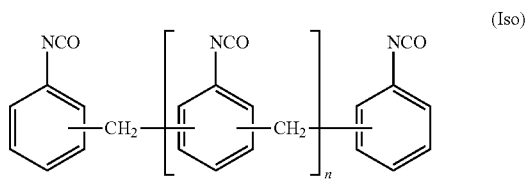

(Iso)

in Formula (Iso), n represents an integer of 0 to 10.

11. The on-press development type lithographic printing plate precursor according to claim 1, wherein the image-recording layer further contains a color developing agent, wherein the color developing agent is an acid color-developing agent, wherein the acid color-developing agent is a leuco colorant.

12. The on-press development type lithographic printing plate precursor according to claim 11, wherein the leuco colorant is a leuco colorant having a phthalide structure or a fluoran structure, wherein the leuco colorant having a phthalide structure or a fluoran structure is a compound represented by any of Formula (Le-1) to Formula (Le-3),

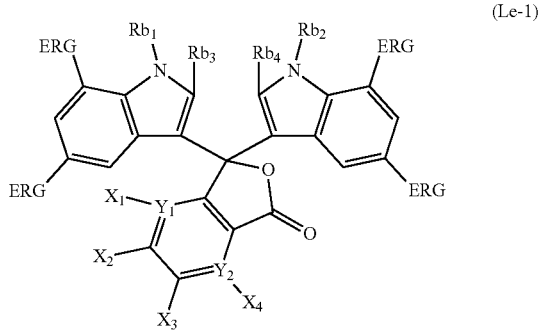

(Le-1)

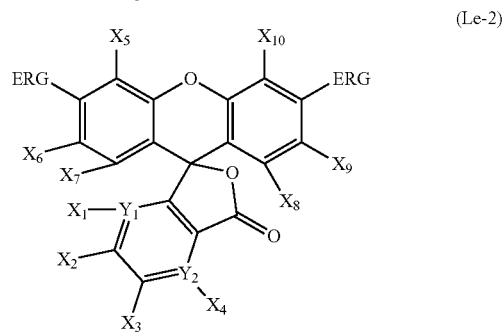

(Le-2)

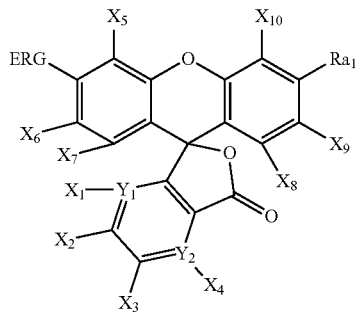

(Le-3)

in Formula (Le-1) to Formula (Le-3), ERG each independently represents an electron donating group, $X_1$ to $X_4$ each independently represent a hydrogen atom, a halogen atom, or a dialkylanilino group, $X_5$ to $X_{10}$ each independently represent a hydrogen atom, a halogen atom, or a monovalent organic group, $Y_1$ and $Y_2$ each independently represent C or N, $X_1$ does not exist in a case where $Y_1$ is N, $X_4$ does not exist in a case where $Y_2$ is N, $Ra_1$ represents a hydrogen atom, an alkyl group, or an alkoxy group, and $Rb_1$ to $Rb_4$ each independently represent an alkyl group or an aryl group.

13. The on-press development type lithographic printing plate precursor according to claim 1, wherein the image-recording layer is an outermost layer.

14. The on-press development type lithographic printing plate precursor according to claim 1, further comprising:

a protective layer as an outermost layer on the image-recording layer, wherein the protective layer contains a hydrophobic polymer.

15. The on-press development type lithographic printing plate precursor according to claim 1, further comprising:

a protective layer as an outermost layer on the image-recording layer, wherein the protective layer contains a discoloring compound, wherein the discoloring compound is an infrared absorber.

16. The on-press development type lithographic printing plate precursor according to claim 1, further comprising:

a protective layer as an outermost layer on the image-recording layer, wherein the protective layer contains a discoloring compound, wherein the discoloring compound includes a decomposable compound that decomposes due to exposure to infrared.

17. The on-press development type lithographic printing plate precursor according to claim 1, wherein the aluminum support has an aluminum plate and an anodic oxide film of aluminum disposed on the aluminum plate, the anodic oxide film is at a position closer to a side of the image-recording layer than the aluminum plate and has micropores extending in a depth direction from a surface of the anodic oxide film on the side of the image-recording layer, an average diameter of the micropores within the surface of the anodic oxide film is more than 10 nm and 100 nm or less, and in the L*a*b* color space, a value of brightness L* of the surface of the anodic oxide film on the side of the image-recording layer is 70 to 100.

18. The on-press development type lithographic printing plate precursor according to claim 17,
wherein the micropores are each composed of a large diameter portion that extends to a position at a depth of 10 nm to 1,000 nm from the surface of the anodic oxide film and a small diameter portion that is in communication with a bottom portion of the large diameter portion and extends to a position at a depth of 20 nm to 2,000 nm from a communication position,
an average diameter of the large diameter portion within the surface of the anodic oxide film is 15 nm to 100 nm, and
an average diameter of the small diameter portion at the communication position is 13 nm or less.

19. A method for preparing a lithographic printing plate, comprising:
a step of exposing the on-press development type lithographic printing plate precursor according to claim 1 in the shape of an image; and
a step of supplying at least one material selected from the group consisting of a printing ink and dampening water on a printer so as to remove an image-recording layer in a non-image area.

20. A lithographic printing method, comprising:
a step of exposing the on-press development type lithographic printing plate precursor according to claim 1 in the shape of an image;
a step of supplying at least one material selected from the group consisting of a printing ink and dampening water on a printer so as to remove an image-recording layer in a non-image area and to prepare a lithographic printing plate; and
a step of performing printing by using the obtained lithographic printing plate.

* * * * *